US012065536B2

(12) United States Patent
Koenen et al.

(10) Patent No.: US 12,065,536 B2
(45) Date of Patent: Aug. 20, 2024

(54) POLYMERS WITH AMINE-GROUP-CONTAINING REPEATING UNITS

(71) Applicant: Merck Patent GmbH, Darmstadt (DE)

(72) Inventors: Nils Koenen, Griesheim (DE); Dominik Joosten, Ober-Ramstadt (DE); Beate Burkhart, Darmstadt (DE); Katja Scheible, Darmstadt (DE); Miriam Engel, Darmstadt (DE); Holger Heil, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 633 days.

(21) Appl. No.: 17/292,338

(22) PCT Filed: Nov. 4, 2019

(86) PCT No.: PCT/EP2019/080033

§ 371 (c)(1),
(2) Date: May 7, 2021

(87) PCT Pub. No.: WO2020/094537

PCT Pub. Date: May 14, 2020

(65) Prior Publication Data

US 2022/0119590 A1 Apr. 21, 2022

(30) Foreign Application Priority Data

Nov. 7, 2018 (EP) .................................... 18205029

(51) Int. Cl.

| | |
|---|---|
| ***C08G 61/12*** | (2006.01) |
| ***C08G 73/02*** | (2006.01) |
| ***H10K 50/15*** | (2023.01) |
| ***H10K 85/10*** | (2023.01) |

(52) U.S. Cl.

CPC ......... *C08G 61/124* (2013.01); *C08G 61/125* (2013.01); *C08G 73/026* (2013.01); *H10K 85/111* (2023.02); *C08G 2261/135* (2013.01); *C08G 2261/3142* (2013.01); *C08G 2261/3162* (2013.01); *C08G 2261/3241* (2013.01); *C08G 2261/3242* (2013.01); *C08G 2261/411* (2013.01); *C08G 2261/412* (2013.01); *C08G 2261/413* (2013.01); *C08G 2261/414* (2013.01); *C08G 2261/415* (2013.01); *C08G 2261/512* (2013.01); *C08G 2261/76* (2013.01); *C08G 2261/95* (2013.01); *H10K 50/15* (2023.02)

(58) Field of Classification Search

CPC .. C08G 61/124; C08G 61/125; C08G 73/026; C08G 2261/135; C08G 2261/3142; C08G 2261/3162; C08G 2261/3241; C08G 2261/3242; C08G 2261/411; C08G 2261/412; C08G 2261/413; C08G 2261/414; C08G 2261/415; C08G 2261/512; C08G 2261/76; C08G 2261/95; H10K 86/111; H10K 50/15

USPC .......................................................... 526/258

See application file for complete search history.

(56) References Cited

U.S. PATENT DOCUMENTS 8,558,221 B2 * 10/2013 Ito ............................ C09B 3/14 428/690
11,424,410 B2 * 8/2022 Sasada ................. C08G 61/122
2010/0289014 A1 * 11/2010 Ito .......................... H05B 33/14 257/E51.026
2012/0001127 A1 1/2012 Brown et al.
2015/0076415 A1 3/2015 Heil et al.
2019/0259952 A1 * 8/2019 Sasada .................. C08G 61/12

FOREIGN PATENT DOCUMENTS

| | | | | |
|---|---|---|---|---|
| EP | 2213693 | A1 | | 8/2010 |
| EP | 3522247 | A1 | | 8/2019 |
| JP | 2009-117800 | A | | 5/2009 |
| JP | 2013-536570 | A | | 9/2013 |
| JP | 2015-063657 | A | | 4/2015 |
| JP | 2015-519424 | A | | 7/2015 |
| JP | 2015-151470 | A | | 8/2015 |
| JP | 2015151470 | A | * | 8/2015 |
| JP | 2015-164998 | A | | 9/2015 |
| JP | 2017-141322 | A | | 8/2017 |
| KR | 10-2013-0120426 | A | | 11/2013 |
| WO | 2009/066666 | A1 | | 5/2009 |

(Continued)

OTHER PUBLICATIONS

International Preliminary Report on Patentability received for PCT Patent Application No. PCT/EP2019/080033, mailed on May 20, 2021, 13 pages (8 pages of English Translation and 5 pages of Original Document).

(Continued)

*Primary Examiner* — Michael M. Bernshteyn

(74) *Attorney, Agent, or Firm* — Faegre Drinker Biddle & Reath LLP

(57) ABSTRACT

The invention relates to polymers having at least one repeating unit of the following formula (I): wherein $Ar^1$, $Ar^2$, $Ar^3$ and $Ar^4$, R and X, and a, b, c, d, e and f can have the meanings defined in claim 1, to processes for the preparation thereof and to the use thereof in electronic or optoelectronic devices, in particular in organic electroluminescent devices, so-called OLEDs (OLED=Organic Light Emitting Diodes). The present invention also relates to electronic or optoelectronic devices, in particular organic electroluminescent devices, which contain said polymers.

17 Claims, No Drawings

(56) References Cited

FOREIGN PATENT DOCUMENTS

| | | | |
|---|---|---|---|
| WO | 2010/013723 | A1 | 2/2010 |
| WO | 2012/003482 | A2 | 1/2012 |
| WO | 2013/156125 | A1 | 10/2013 |
| WO | 2018/062276 | A1 | 4/2018 |

OTHER PUBLICATIONS

International Search Report and Written Opinion received for PCT Patent Application No. PCT/EP2019/080033, mailed on Feb. 13, 2020, 16 pages (7 pages of English Translation and 9 pages of Original Document).

* cited by examiner

POLYMERS WITH AMINE-GROUP-CONTAINING REPEATING UNITS

CROSS-REFERENCE TO RELATED APPLICATIONS

This application is a national stage application (under 35 U.S.C. § 371) of PCT/EP2019/080033, filed Nov. 4, 2019, which claims benefit of European Application No. 18205029.4, filed Nov. 7, 2018, both of which are incorporated herein by reference in their entirety.

The present invention relates to polymers having repeat units containing amino groups, to processes for preparation thereof and to the use thereof in electronic or optoelectronic devices, especially in organic electroluminescent devices, called OLEDs (OLED=organic light-emitting diodes). The present invention also further relates to organic electroluminescent devices comprising these polymers.

Components of different functionality are required in electronic or optoelectronic devices, especially in organic electroluminescent devices (OLED). In OLEDs, the different functionalities are normally present in different layers. Reference is made in this case to multilayer OLED systems. The layers in these multilayer OLED systems include charge-injecting layers, for example electron- and hole-injecting layers, charge-transporting layers, for example electron- and hole-conducting layers, and layers containing light-emitting components. These multilayer OLED systems are generally produced by successive layer by layer application.

If two or more layers are applied from solution, it has to be ensured that any layer already applied, once dried, is not destroyed by the subsequent application of the solution for production of the next layer. This can be achieved, for example, by rendering a layer insoluble, for example by crosslinking. Methods of this kind are disclosed, for example, in EP 0 637 899 and WO 96/20253.

Furthermore, it is also necessary to match the functionalities of the individual layers to one another in terms of the material such that very good results, for example in terms of lifetime, efficiency, etc., are achieved. For instance, particularly the layers that directly adjoin an emitting layer, especially the hole-transporting layer (HTL=hole transport layer) have a significant influence on the properties of the adjoining emitting layer.

One of the problems addressed by the present invention was therefore that of providing compounds which can firstly be processed from solution and which secondly lead to an improvement in the properties of the device, i.e. especially of the OLED, when used in electronic or optoelectronic devices, preferably in OLEDs, and here especially in the hole transport layer thereof.

It has been found that, surprisingly, polymers having repeat units containing aryl-bisamine groups, especially when used in the hole-transporting layer of OLEDs, lead to an increase in the efficiency of these OLEDs.

The present application thus provides a polymer having at least one repeat unit of the following formula (I):

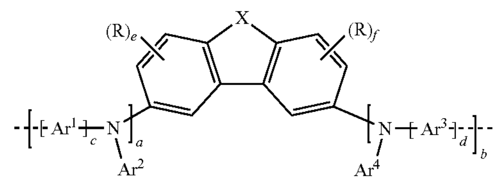

(I)

where

X is O, S, NR or $CR_2$;

$Ar^1$, $Ar^2$, $Ar^3$ and $Ar^4$ are the same or different at each instance and are independently a mono- or polycyclic, aromatic or heteroaromatic ring system which has 5 to 60 aromatic ring atoms and may be substituted by one or more R radicals;

a and b are the same or different at each instance and are independently 0 or 1; where (a+b)=1 or 2, preferably 2;

c and d are the same or different at each instance and are independently 0 or 1, preferably c=d=0 or 1, more preferably c=d=1;

e and f are the same or different at each instance and are independently 0, 1, 2 or 3, preferably 0 or 1, more preferably e=f=0;

R is the same or different at each instance and is independently H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 carbon atoms, an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C=CR^1$, C≡C, $Si(R^1)_2$, C=O, C=S, $C=NR^1$, $P(=O)(R^1)$, SO, $SO_2$, $NR^1$, O, S or $CONR^1$ and where one or more hydrogen atoms may be replaced by D, F, Cl, Br, I or CN, or a mono- or polycyclic, aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; or a crosslinkable group Q, where two or more R radicals together may also form a mono- or polycyclic, aliphatic, aromatic or heteroaromatic ring system;

$R^1$ is the same or different at each instance and is independently H, D, F or an aliphatic hydrocarbyl radical having 1 to 20 carbon atoms, an aromatic or a heteroaromatic hydrocarbyl radical having 5 to 20 carbon atoms, in which one or more hydrogen atoms may also be replaced by F; where two or more $R^1$ substituents together may also form a mono- or polycyclic, aliphatic, aromatic or heteroaromatic ring system; and the dotted lines represent bonds to adjacent repeat units in the polymer.

In the present application, the term "polymer" is understood to mean polymeric compounds, oligomeric compounds and dendrimers. The polymeric compounds of the invention preferably have 10 to 10 000, more preferably 10 to 5000 and most preferably 10 to 2000 repeat units. The oligomeric compounds of the invention preferably have 3 to 9 repeat units. The branching factor of the polymers is between 0 (linear polymer, no branching sites) and 1 (fully branched dendrimer).

The polymers of the invention preferably have a molecular weight $M_w$ in the range from 10 000 to 1 000 000 g/mol, more preferably a molecular weight $M_w$ in the range from 20 000 to 500 000 g/mol and most preferably a molecular weight $M_w$ in the range from 25 000 to 200 000 g/mol. The molecular weight $M_w$ is determined by means of GPC (=gel permeation chromatography) against an internal polystyrene standard.

The polymers of the invention are either conjugated, semi-conjugated or non-conjugated polymers. Preference is given to conjugated or semi-conjugated polymers.

According to the invention, the repeat units of the formula (I) may be incorporated into the main chain or into the side chain of the polymer. However, the repeat units of formula (I) are preferably incorporated into the main chain of the polymer. In the case of incorporation into the side chain of the polymer, the repeat units of the formula (I) may either be mono- or bivalent, meaning that they have either one or two bonds to adjacent repeat units in the polymer.

"Conjugated polymers" in the context of the present application are polymers containing mainly $sp^2$-hybridized (or else optionally sp-hybridized) carbon atoms in the main chain, which may also be replaced by correspondingly hybridized heteroatoms. In the simplest case, this means the alternating presence of double and single bonds in the main chain, but also polymers having units such as a meta-bonded phenylene, for example, should also be regarded as conjugated polymers in the context of this application. What is meant by "mainly" is that naturally (arbitrarily) occurring effects that lead to interruptions in conjugation do not invalidate the term "conjugated polymer" Conjugated polymers are likewise considered to be polymers having a conjugated main chain and non-conjugated side chains. In addition, the present application likewise refers to conjugation when, for example, arylamine units, arylphosphine units, particular heterocycles (i.e. conjugation via nitrogen, oxygen or sulfur atoms) and/or organometallic complexes (i.e. conjugation via the metal atom) are present in the main chain. The same applies to conjugated dendrimers. In contrast, units such as simple alkyl bridges, (thio)ether, ester, amide or imide linkages, for example, are unambiguously defined as non-conjugated segments.

A semi-conjugated polymer shall be understood in the present application to mean a polymer containing conjugated regions separated from one another by non-conjugated sections, deliberate conjugation breakers (for example spacer groups) or branches, for example in which comparatively long conjugated sections in the main chain are interrupted by non-conjugated sections, or containing comparatively long conjugated sections in the side chains of a polymer non-conjugated in the main chain. Conjugated and semi-conjugated polymers may also contain conjugated, semi-conjugated or non-conjugated dendrimers.

The term "dendrimer" in the present application shall be understood to mean a highly branched compound formed from a multifunctional core to which monomers branched in a regular structure are bonded, such that a tree-like structure is obtained. In this case, both the core and the monomers may assume any desired branched structures consisting both of purely organic units and organometallic compounds or coordination compounds. "Dendrimer" shall generally be understood here as described, for example, by M. Fischer and F. Vögtle (*Angew. Chem., Int. Ed.* 1999, 38, 885).

In the present application, the term "repeat unit" is understood to mean a unit which, proceeding from a monomer unit having at least two, preferably two, reactive groups, is incorporated into the main polymer skeleton as part thereof by bond-forming reaction, and is thus present bound within the polymer prepared.

The term "mono- or polycyclic aromatic ring system" is understood in the present application to mean an aromatic ring system which has 6 to 60, preferably 6 to 30 and more preferably 6 to 24 aromatic ring atoms and does not necessarily contain only aromatic groups, but in which it is also possible for two or more aromatic units to be interrupted by a short nonaromatic unit (<10% of the atoms other than H, preferably <5% of the atoms other than H), for example an $sp^3$-hybridized carbon atom or oxygen or nitrogen atom, a CO group, etc. For example, systems such as 9,9'-spirobifluorene, 9,9-diarylfluorene and 9,9-dialkylfluorene, for example, shall also be regarded as aromatic ring systems.

The aromatic ring systems may be mono- or polycyclic, meaning that they may have one ring (e.g. phenyl) or two or more rings which may also be fused (e.g. naphthyl) or covalently bonded (e.g. biphenyl), or contain a combination of fused and bonded rings.

Preferred aromatic ring systems are, for example, phenyl, biphenyl, terphenyl, [1,1':3',1" ]terphenyl-2'-yl, quaterphenyl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene and spirobifluorene.

The term "mono- or polycyclic heteroaromatic ring system" is understood in the present application to mean an aromatic ring system having 5 to 60, preferably 5 to 30 and more preferably 5 to 24 aromatic ring atoms, where one or more of these atoms is/are a heteroatom. The "mono- or polycyclic heteroaromatic ring system" does not necessarily contain only aromatic groups, but may also be interrupted by a short nonaromatic unit (<10% of the atoms other than H, preferably <5% of the atoms other than H), for example an $sp^3$-hybridized carbon atom or oxygen or nitrogen atom, a CO group, etc.

The heteroaromatic ring systems may be mono- or polycyclic, meaning that they may have one ring or two or more rings which may also be fused or covalently bonded (e.g. pyridylphenyl), or contain a combination of fused and bonded rings. Preference is given to fully conjugated heteroaryl groups.

Preferred heteroaromatic ring systems are, for example, 5-membered rings such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or groups having several rings, for example carbazole, indenocarbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3-b]thiophene, thieno[3,2-b]thiophene, dithienothiophene, isobenzothiophene, dibenzothiophene and benzothiadiazothiophene.

The mono- or polycyclic, aromatic or heteroaromatic ring system may be unsubstituted or substituted. "Substituted" in the present application means that the mono- or polycyclic, aromatic or heteroaromatic ring system has one or more R substituents.

R is preferably the same or different at each instance and is independently H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 carbon atoms, an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C{=}CR^1$, C≡C, $Si(R^1)_2$, C=O, C=S, $C{=}NR^1$, $P(=O)R^1$, SO, $SO_2$, $NR^1$, O, S or $CONR^1$ and where one or more hydrogen atoms may be replaced by D, F, Cl, Br, I or CN, or an aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; or a crosslinkable group Q; at the same time, two or more R radicals may also together form a mono- or polycyclic, aliphatic, aromatic or heteroaromatic ring system; R is more preferably the same or different at each instance and is independently H, D, F, Cl, Br, I, $N(R^1)_2$, $Si(R^1)_3$, $B(OR^1)_2$, $C(=O)R^1$, $P(=O)(R^1)_2$, a straight-chain alkyl or alkoxy group having 1 to 20 carbon atoms, an alkenyl or alkynyl group having 2 to 20 carbon atoms or a branched or cyclic alkyl or alkoxy group having 3 to 20 carbon atoms, each of which may be substituted by one or more $R^1$ radicals, where one or more nonadjacent $CH_2$ groups may be replaced by $R^1C{=}CR^1$, C≡C, $Si(R^1)_2$, C=O, $C{=}NR^1$, $P(=O)(R^1)$, $NR^1$, O or $CONR^1$, and where one or more hydrogen atoms may be replaced by F, Cl, Br or I, or an aromatic or heteroaromatic ring system which has 5 to 30 aromatic ring atoms and may be substituted in each case by one or more $R^1$ radicals, or an aryloxy or heteroaryloxy group which has 5 to 30 aromatic ring atoms and may be substituted by one or more $R^1$ radicals, or an aralkyl or heteroaralkyl group which has 5 to 30 aromatic ring atoms and may be substituted by one or more $R^1$ radicals, or a diarylamino group, diheteroarylamino group or arylheteroarylamino group which has 10 to 20 aromatic ring atoms and may be substituted by one or more $R^1$ radicals, or a crosslinkable group Q; at the same time, two or more R radicals may also together form a mono- or polycyclic, aliphatic, aromatic or heteroaromatic ring system.

R is most preferably the same or different at each instance and is independently H, a straight-chain alkyl or alkoxy group having 1 to 10 carbon atoms, an alkenyl or alkynyl group having 2 to 10 carbon atoms or a straight-chain or cyclic alkyl or alkoxy group having 3 to 10 carbon atoms, each of which may be substituted by one or more $R^1$ radicals, where one or more nonadjacent $CH_2$ groups may be replaced by $R^1C{=}CR^1$, C≡C, C=O, $C{=}NR^1$, $NR^1$, O or $CONR^1$, or an aromatic or heteroaromatic ring system which has 5 to 20 aromatic ring atoms and may be substituted in each case by one or more $R^1$ radicals, or an aryloxy or heteroaryloxy group which has 5 to 20 aromatic ring atoms and may be substituted by one or more $R^1$ radicals, or an aralkyl or heteroaralkyl group which has 5 to 20 aromatic ring atoms and may be substituted by one or more $R^1$ radicals, or a diarylamino group, diheteroarylamino group or arylheteroarylamino group which has 10 to 20 aromatic ring atoms and may be substituted by one or more $R^1$ radicals, or a crosslinkable group Q; at the same time, two or more R radicals R may also together form a mono- or polycycflic, aliphatic, aromatic or heteroaromatic ring system.

Preferred alkyl groups having 1 to 10 carbon atoms are depicted in the following table:

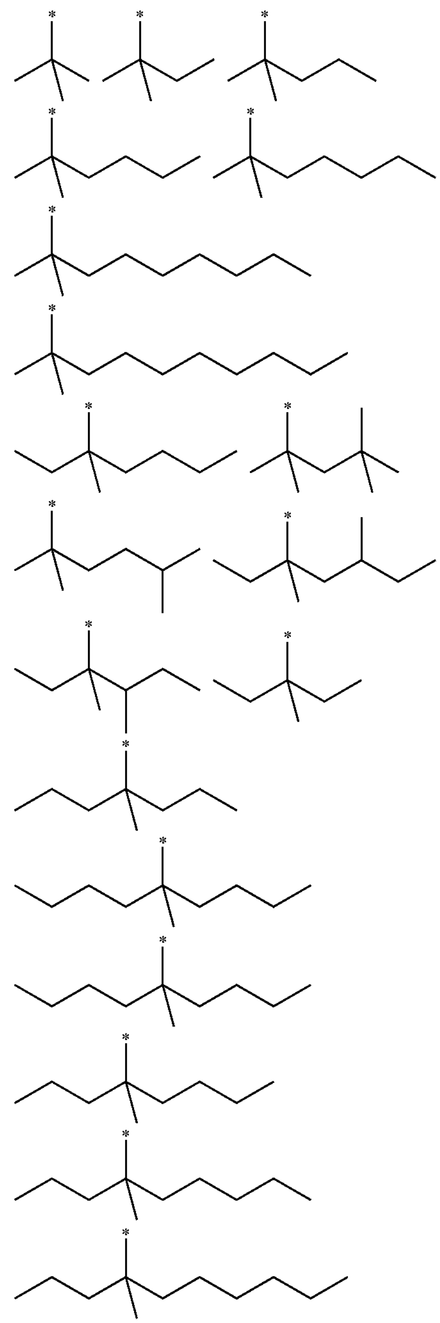

-continued

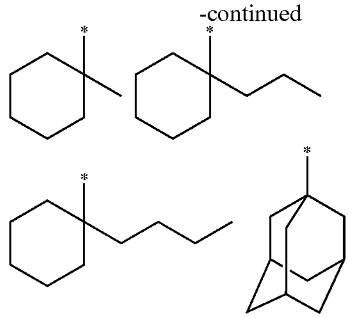

$R^1$ is preferably the same or different at each instance and is independently H, D, F or an aliphatic hydrocarbyl radical having 1 to 20 carbon atoms, an aromatic or a heteroaromatic hydrocarbyl radical having 5 to 20 carbon atoms, in which one or more hydrogen atoms may also be replaced by F; at the same time, two or more $R^1$ substituents together may also form a mono- or polycyclic, aliphatic, aromatic or heteroaromatic ring system.

$R^1$ is more preferably the same or different at each instance and is independently H, D or an aliphatic hydrocarbyl radical having 1 to 20 carbon atoms, an aromatic or a heteroaromatic hydrocarbyl radical having 5 to 20 carbon atoms; at the same time, two or more $R^1$ substituents together may also form a mono- or polycyclic, aliphatic, aromatic or heteroaromatic ring system.

$R^1$ is most preferably the same or different at each instance and is independently H or an aliphatic hydrocarbyl radical having 1 to 10 carbon atoms, an aromatic or heteroaromatic hydrocarbyl radical having 5 to 10 carbon atoms.

In a preferred 1st embodiment of the present invention, in the repeat unit of the formula (I), a=b=1, meaning that the repeat unit of the formula (I) preferably has the structure of the following formula (II):

(II)

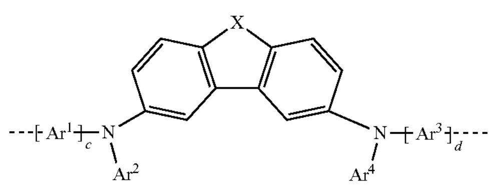

where $Ar^1$, $Ar^2$, $Ar^3$, $Ar^4$, c and d may assume the definitions given above in relation to formula (I).

In a particularly preferred 1st embodiment of the present invention, in the repeat unit of the formula (I), a=b=1 and c=d=1, meaning that the repeat unit of the formula (I) more preferably has the structure of the following formula (III):

(III)

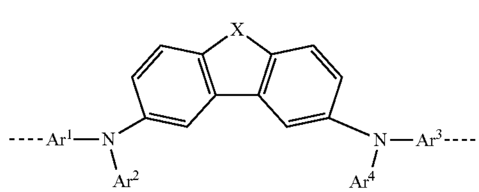

where $Ar^1$, $Ar^2$, $Ar^3$ and $Ar^4$ may assume the definitions given above in relation to formula (I).

In a first very particularly preferred 1st embodiment of the present invention, in the repeat unit of the formula (I), a=b=1; c=d=1 and X═NR, meaning that the repeat unit of the formula (I) most preferably has the structure of the following formula (IIIa):

(IIIa)

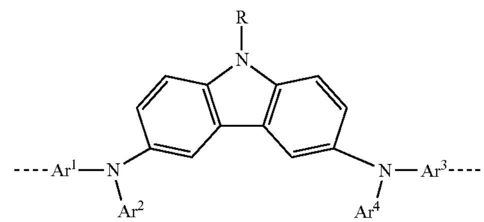

where $Ar^1$, $Ar^2$, $Ar^3$, $Ar^4$ and R may assume the definitions given above in relation to formula (I).

In a second very particularly preferred 1st embodiment of the present invention, in the repeat unit of the formula (I), a=b=1; c=d=1 and X═O, meaning that the repeat unit of the formula (I) most preferably has the structure of the following formula (IIIb):

(IIIb)

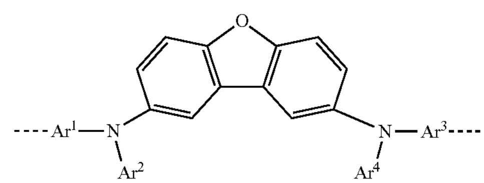

where $Ar^1$, $Ar^2$, $Ar^3$ and $Ar^4$ may assume the definitions given above in relation to formula (I).

In a third very particularly preferred 1st embodiment of the present invention, in the repeat unit of the formula (I), a=b=1; c=d=1 and X═$CR_2$, meaning that the repeat unit of the formula (I) most preferably has the structure of the following formula (IIIc):

(IIIc)

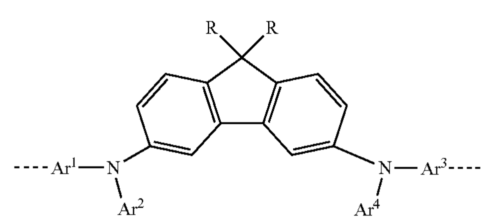

where $Ar^1$, $Ar^2$, $Ar^3$, $Ar^4$ and R may assume the definitions given above in relation to formula (I).

In a preferred 2nd embodiment of the present invention, in the repeat unit of the formula (I), a=1 and b=0, meaning that the repeat unit of the formula (I) preferably has the structure of the following formula (IV):

(IV)

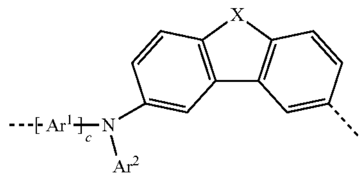

where $Ar^1$ and $Ar^2$ may assume the definitions given above in relation to formula (I) and c=0 or 1.

In a particularly preferred 2nd embodiment of the present invention, in the repeat unit of the formula (I), a=c=1 and b=0, meaning that the repeat unit of the formula (I) preferably has the structure of the following formula (V):

(V)

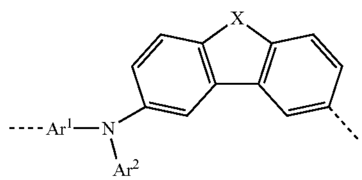

where $Ar^1$ and $Ar^2$ may assume the definitions given above in relation to formula (I).

In a first very particularly preferred 2nd embodiment of the present invention, in the repeat unit of the formula (I), a=c=1; b=0 and X═NR, meaning that the repeat unit of the formula (I) preferably has the structure of the following formula (Va):

(Va)

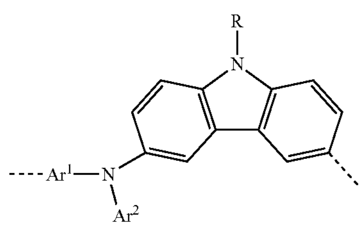

where $Ar^1$, $Ar^2$ and R may assume the definitions given above in relation to formula (I).

In a second very particularly preferred 2nd embodiment of the present invention, in the repeat unit of the formula (I), a=c=1; b=0 and X=0, meaning that the repeat unit of the formula (I) preferably has the structure of the following formula (Vb):

(Vb)

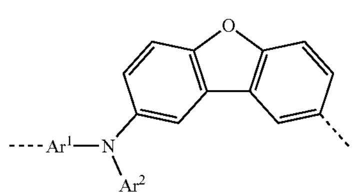

where $Ar^1$ and $Ar^2$ may assume the definitions given above in relation to formula (I).

In a third very particularly preferred 2nd embodiment of the present invention, in the repeat unit of the formula (I), a=c=1; b=0 and X═$CNR_2$, meaning that the repeat unit of the formula (I) preferably has the structure of the following formula (Vc):

(Vc)

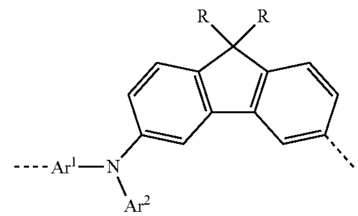

where $Ar^1$, $Ar^2$ and R may assume the definitions given above in relation to formula (I).

Of the abovementioned 1st and 2nd embodiments, preference is given to the 1st embodiments.

In the repeat units of the formulae (I), (II), (III), (IIIa), (IIIb), (IIIc), (IV), (V), (Va), (Vb) and (Vc), the mono- or polycyclic, aromatic or heteroaromatic ring systems $Ar^2$ and $Ar^4$ are preferably selected from the following units Ar1 to Ar10:

Ar1

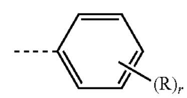

Ar2

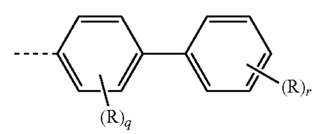

Ar3

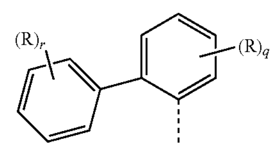

Ar4

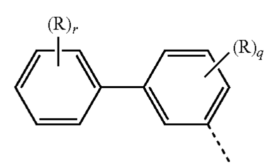

Ar5

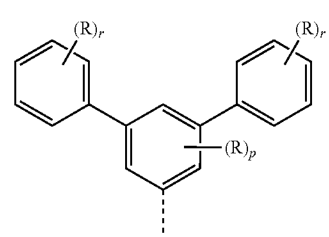

Ar6

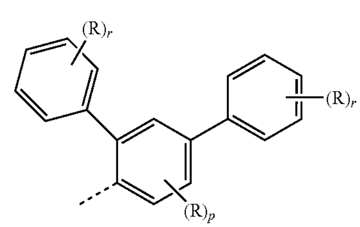

-continued

Ar7

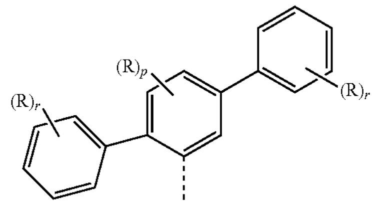

Ar8

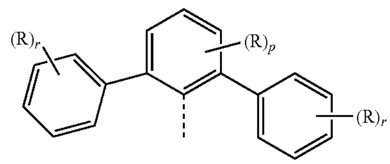

Ar9

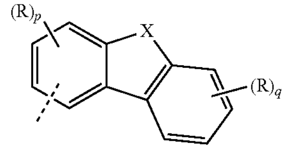

Ar10

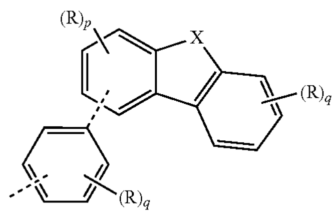

where R may assume the definitions given above in relation to formula (I),

X=$CR^2$, NR, $SiR^2$, O, S, C=O or P=O, preferably $CR^2$, NR, O or S, p=0, 1, 2 or 3, q=0, 1, 2, 3 or 4, and r=0, 1, 2, 3, 4 or 5.

In the repeat units of the formulae (I), (II), (III), (IIIa), (IIIb), (IIIc), (IV), (V), (Va), (Vb) and (Vc), the mono- or polycyclic, aromatic or heteroaromatic ring systems $Ar^2$ and $Ar^4$ are more preferably selected from the units Ar1 to Ar10, where X in the units Ar9 and Ar10 is selected from $CR_2$, O, NR and S.

In the repeat units of the formulae (I), (II), (III), (IIIa), (IIIb), (IIIc), (IV), (V), (Va), (Vb) and (Vc), the mono- or polycyclic, aromatic or heteroaromatic ring systems $Ar^2$ and $Ar^4$ are most preferably selected from the following units Ar1a to Ar10c:

Ar1a

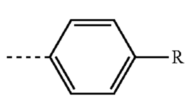

Ar1b

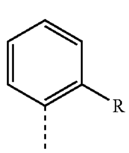

Ar2a

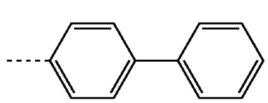

-continued

Ar2b

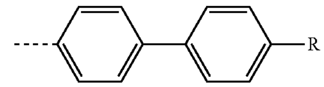

Ar3a

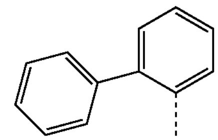

Ar3b

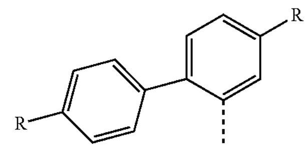

Ar3c

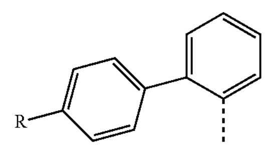

Ar4a

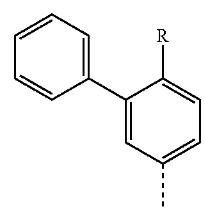

Ar5a

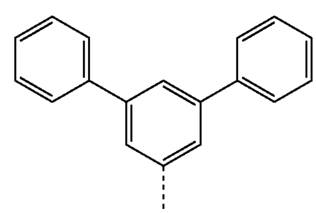

Ar6a

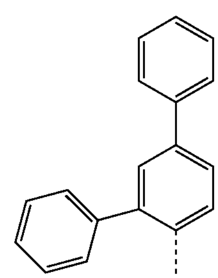

Ar7a

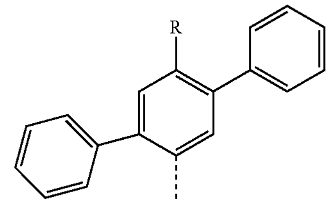

Ar8a

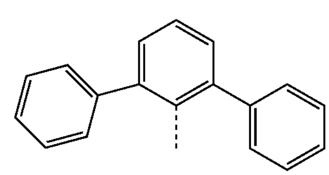

-continued

Ar9a

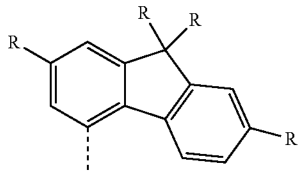

Ar9b

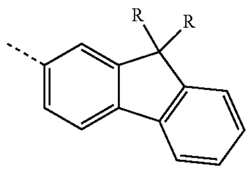

Ar9c

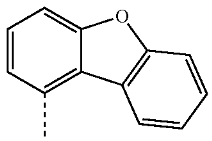

Ar9d

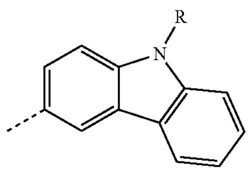

Ar10a

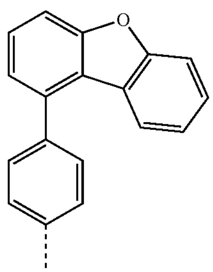

Ar10b

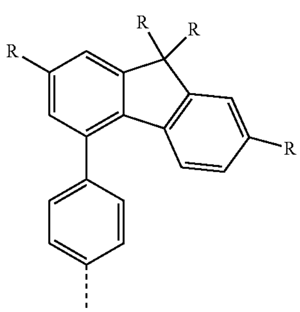

Ar10c

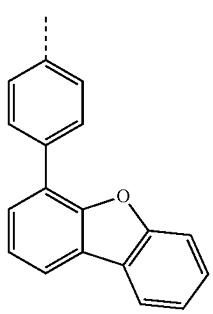

where R may assume the definitions given above in relation to formula (I).

In the repeat units of the formulae (I), (II), (III), (IIIa), (IIIb), (IIIc), (IV), (V), (Va), (Vb) and (Vc), the mono- or polycyclic, aromatic or heteroaromatic ring systems $Ar^1$ and $Ar^3$ are preferably selected from the following units Ar11 to Ar18:

Ar11

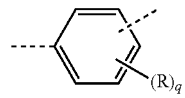

Ar12

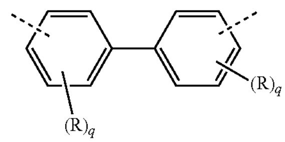

Ar13

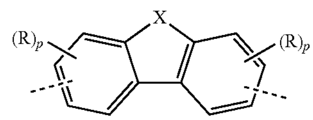

Ar14

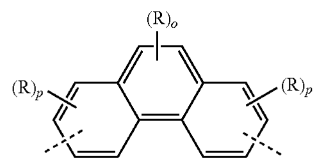

Ar15

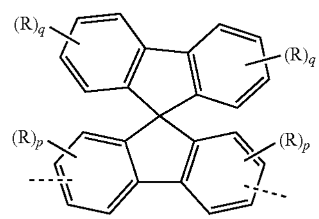

Ar16

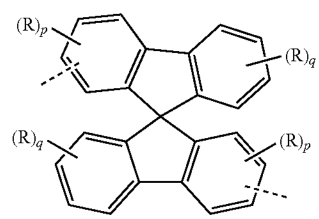

Ar17

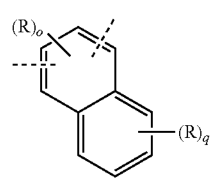

Ar18

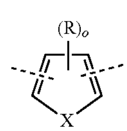

where R may assume the definitions given above in relation to formula (I),

X=CR$^2$, NR, SiR$^2$, O, S, C=O or P=O, preferably CR$^2$, NR, O or S, o=0, 1 or 2, p=0, 1, 2 or 3, and q=0, 1, 2, 3 or 4.

In the repeat units of the formulae (I), (II), (III), (IIIa), (IIIb), (IIIc), (IV), (V), (Va), (Vb) and (Vc), the mono- or polycyclic, aromatic or heteroaromatic ring systems $Ar^1$ and $Ar^3$ are more preferably selected from the following units Ar11a to Ar18d:
Ar11a
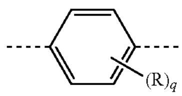
Ar11b
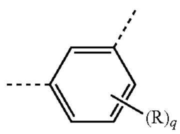
Ar11c
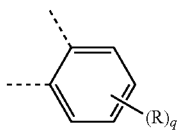
Ar12a
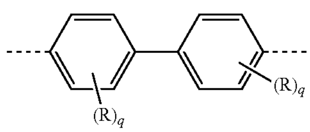
Ar12b
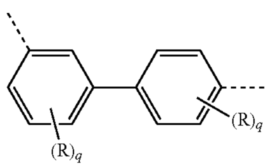
Ar12c
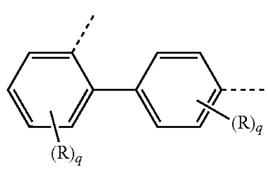
Ar12d
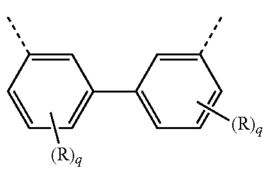
Ar12e
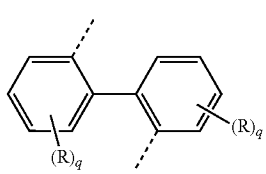
A13a
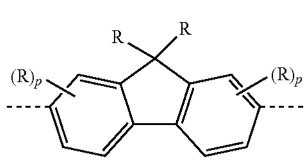
-continued
A13b
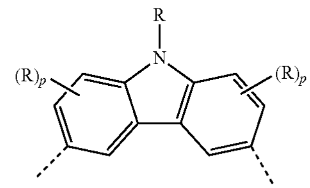
Ar13c
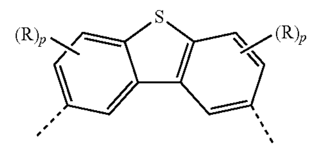
Ar13d
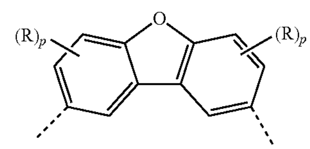
Ar14a
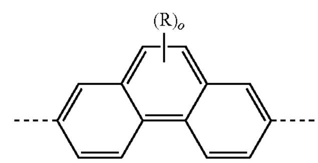
Ar15a
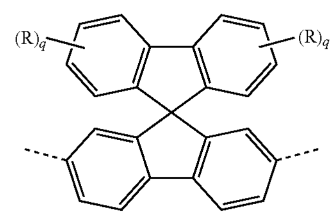
Ar16a
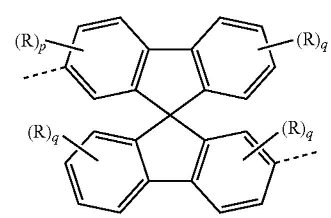
Ar17a
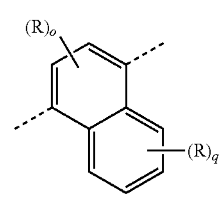
Ar18a
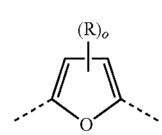
Ar18b
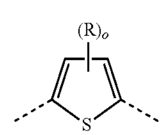

-continued

Ar18c

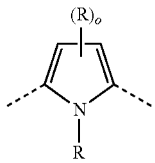

Ar18d

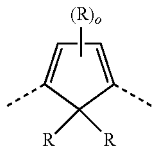

where R may assume the definitions given above in relation to formula (I), o=0, 1 or 2, p=0, 1, 2 or 3, and q=0, 1, 2, 3 or 4.

In the repeat units of the formulae (I), (II), (III), (IIIa), (IIIb), (IIIc), (IV), (V), (Va), (Vb) and (Vc), the mono- or polycyclic, aromatic or heteroaromatic ring systems $Ar^1$ and $Ar^3$ are most preferably selected from the following units Ar11aa to Ar17aa:

Ar11aa

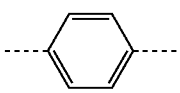

Ar11ab

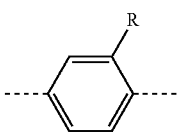

Ar11ac

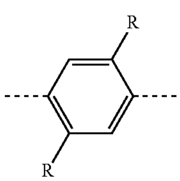

Ar11ad

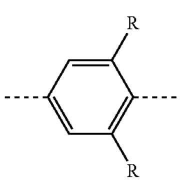

Ar11ba

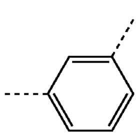

Ar11bb

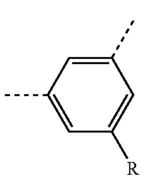

-continued

Ar12aa

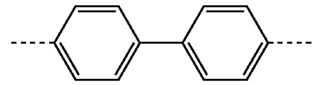

Ar12ab

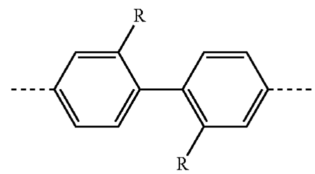

Ar12ba

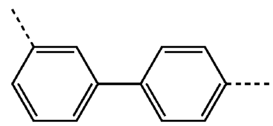

Ar12da

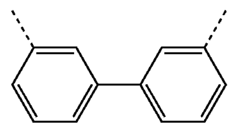

Ar13aa

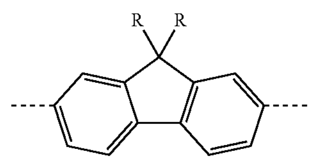

Ar13ba

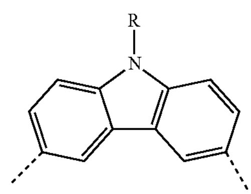

Ar14aa

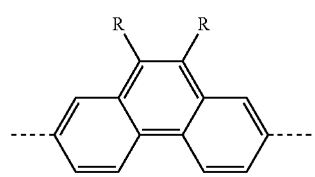

Ar15aa

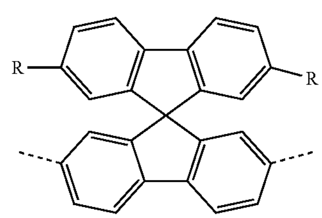

Ar17aa

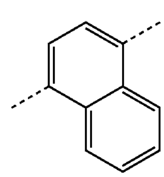

where R may assume the definitions given above in relation to formula (I).

Preferred repeat units of the formula (I) are the repeat units shown in the table below, which are composed of the respective components $Ar^1$, $Ar^2$, $Ar^3$ and $Ar^4$.

| Monomer | Ar1 | Ar2 | Ar3 | Ar4 |
|---|---|---|---|---|
| M1 | Ar11 | Ar1 | Ar1 | Ar11 |
| M2 | Ar11 | Ar2 | Ar2 | Ar11 |
| M3 | Ar11 | Ar3 | Ar3 | Ar11 |
| M4 | Ar11 | Ar4 | Ar4 | Ar11 |
| M5 | Ar11 | Ar5 | Ar5 | Ar11 |
| M6 | Ar11 | Ar6 | Ar6 | Ar11 |
| M7 | Ar11 | Ar7 | Ar7 | Ar11 |
| M8 | Ar11 | Ar8 | Ar8 | Ar11 |
| M9 | Ar11 | Ar9 | Ar9 | Ar11 |
| M10 | Ar11 | Ar10 | Ar10 | Ar11 |
| M11 | Ar12 | Ar1 | Ar1 | Ar12 |
| M12 | Ar12 | Ar2 | Ar2 | Ar12 |
| M13 | Ar12 | Ar3 | Ar3 | Ar12 |
| M14 | Ar12 | Ar4 | Ar4 | Ar12 |
| M15 | Ar12 | Ar5 | Ar5 | Ar12 |
| M16 | Ar12 | Ar6 | Ar6 | Ar12 |
| M17 | Ar12 | Ar7 | Ar7 | Ar12 |
| M18 | Ar12 | Ar8 | Ar8 | Ar12 |
| M19 | Ar12 | Ar9 | Ar9 | Ar12 |
| M20 | Ar12 | Ar10 | Ar10 | Ar12 |
| M21 | Ar13 | Ar1 | Ar1 | Ar13 |
| M22 | Ar13 | Ar2 | Ar2 | Ar13 |
| M23 | Ar13 | Ar3 | Ar3 | Ar13 |
| M24 | Ar13 | Ar4 | Ar4 | Ar13 |
| M25 | Ar13 | Ar5 | Ar5 | Ar13 |
| M26 | Ar13 | Ar6 | Ar6 | Ar13 |
| M27 | Ar13 | Ar7 | Ar7 | Ar13 |
| M28 | Ar13 | Ar8 | Ar8 | Ar13 |
| M29 | Ar13 | Ar9 | Ar9 | Ar13 |
| M30 | Ar13 | Ar10 | Ar10 | Ar13 |
| M31 | Ar14 | Ar1 | Ar1 | Ar14 |
| M32 | Ar14 | Ar2 | Ar2 | Ar14 |
| M33 | Ar14 | Ar3 | Ar3 | Ar14 |
| M34 | Ar14 | Ar4 | Ar4 | Ar14 |
| M35 | Ar14 | Ar5 | Ar5 | Ar14 |
| M36 | Ar14 | Ar6 | Ar6 | Ar14 |
| M37 | Ar14 | Ar7 | Ar7 | Ar14 |
| M38 | Ar14 | Ar8 | Ar8 | Ar14 |
| M39 | Ar14 | Ar9 | Ar9 | Ar14 |
| M40 | Ar14 | Ar10 | Ar10 | Ar14 |
| M41 | Ar15 | Ar1 | Ar1 | Ar15 |
| M42 | Ar15 | Ar2 | Ar2 | Ar15 |
| M43 | Ar15 | Ar3 | Ar3 | Ar15 |
| M44 | Ar15 | Ar4 | Ar4 | Ar15 |
| M45 | Ar15 | Ar5 | Ar5 | Ar15 |
| M46 | Ar15 | Ar6 | Ar6 | Ar15 |
| M47 | Ar15 | Ar7 | Ar7 | Ar15 |
| M48 | Ar15 | Ar8 | Ar8 | Ar15 |
| M49 | Ar15 | Ar9 | Ar9 | Ar15 |
| M50 | Ar15 | Ar10 | Ar10 | Ar15 |
| M51 | Ar16 | Ar1 | Ar1 | Ar16 |
| M52 | Ar16 | Ar2 | Ar2 | Ar16 |
| M53 | Ar16 | Ar3 | Ar3 | Ar16 |
| M54 | Ar16 | Ar4 | Ar4 | Ar16 |
| M55 | Ar16 | Ar5 | Ar5 | Ar16 |
| M56 | Ar16 | Ar6 | Ar6 | Ar16 |
| M57 | Ar16 | Ar7 | Ar7 | Ar16 |
| M58 | Ar16 | Ar8 | Ar8 | Ar16 |
| M59 | Ar16 | Ar9 | Ar9 | Ar16 |
| M60 | Ar16 | Ar10 | Ar10 | Ar16 |
| M61 | Ar17 | Ar1 | Ar1 | Ar17 |
| M62 | Ar17 | Ar2 | Ar2 | Ar17 |
| M63 | Ar17 | Ar3 | Ar3 | Ar17 |
| M64 | Ar17 | Ar4 | Ar4 | Ar17 |
| M65 | Ar17 | Ar5 | Ar5 | Ar17 |
| M66 | Ar17 | Ar6 | Ar6 | Ar17 |
| M67 | Ar17 | Ar7 | Ar7 | Ar17 |
| M68 | Ar17 | Ar8 | Ar8 | Ar17 |
| M69 | Ar17 | Ar9 | Ar9 | Ar17 |
| M70 | Ar17 | Ar10 | Ar10 | Ar17 |
| M71 | Ar18 | Ar1 | Ar1 | Ar18 |
| M72 | Ar18 | Ar2 | Ar2 | Ar18 |
| M73 | Ar18 | Ar3 | Ar3 | Ar18 |
| M74 | Ar18 | Ar4 | Ar4 | Ar18 |
| M75 | Ar18 | Ar5 | Ar5 | Ar18 |
| M76 | Ar18 | Ar6 | Ar6 | Ar18 |
| M77 | Ar18 | Ar7 | Ar7 | Ar18 |
| M78 | Ar18 | Ar8 | Ar8 | Ar18 |
| M79 | Ar18 | Ar9 | Ar9 | Ar18 |

-continued

| Monomer | Ar1 | Ar2 | Ar3 | Ar4 |
|---|---|---|---|---|
| M80 | Ar18 | Ar10 | Ar10 | Ar18 |
| M81 | Ar11 | Ar1 | Ar1 | Ar11 |
| M82 | Ar12 | Ar3 | Ar3 | Ar12 |
| M83 | Ar11 | Ar9 | Ar9 | Ar11 |
| M84 | Ar11 | Ar3 | Ar3 | Ar11 |
| M85 | Ar12 | Ar7 | Ar7 | Ar12 |
| M86 | Ar11 | Ar3 | Ar3 | Ar11 |
| M87 | Ar11 | Ar3 | Ar3 | Ar11 |
| M88 | Ar11 | Ar3 | Ar3 | Ar11 |
| M89 | Ar11 | Ar3 | Ar3 | Ar11 |
| M90 | Ar11 | Ar3 | Ar3 | Ar11 |
| M91 | Ar11 | Ar1 | | |
| M92 | Ar11 | Ar2 | | |
| M93 | Ar11 | Ar3 | | |
| M94 | Ar11 | Ar4 | | |
| M95 | Ar11 | Ar5 | | |
| M96 | Ar11 | Ar6 | | |
| M97 | Ar11 | Ar7 | | |
| M98 | Ar11 | Ar8 | | |
| M99 | Ar11 | Ar9 | | |
| M100 | Ar11 | Ar10 | | |
| M101 | Ar12 | Ar1 | | |
| M102 | Ar12 | Ar2 | | |
| M103 | Ar12 | Ar3 | | |
| M104 | Ar12 | Ar4 | | |
| M105 | Ar12 | Ar5 | | |
| M106 | Ar12 | Ar6 | | |
| M107 | Ar12 | Ar7 | | |
| M108 | Ar12 | Ar8 | | |
| M109 | Ar12 | Ar9 | | |
| M110 | Ar12 | Ar10 | | |
| M111 | Ar13 | Ar1 | | |
| M112 | Ar13 | Ar2 | | |
| M113 | Ar13 | Ar3 | | |
| M114 | Ar13 | Ar4 | | |
| M115 | Ar13 | Ar5 | | |
| M116 | Ar13 | Ar6 | | |
| M117 | Ar13 | Ar7 | | |
| M118 | Ar13 | Ar8 | | |
| M119 | Ar13 | Ar9 | | |
| M120 | Ar13 | Ar10 | | |
| M121 | Ar14 | Ar1 | | |
| M122 | Ar14 | Ar2 | | |
| M123 | Ar14 | Ar3 | | |
| M124 | Ar14 | Ar4 | | |
| M125 | Ar14 | Ar5 | | |
| M126 | Ar14 | Ar6 | | |
| M127 | Ar14 | Ar7 | | |
| M128 | Ar14 | Ar8 | | |
| M129 | Ar14 | Ar9 | | |
| M130 | Ar14 | Ar10 | | |
| M131 | Ar15 | Ar1 | | |
| M132 | Ar15 | Ar2 | | |
| M133 | Ar15 | Ar3 | | |
| M134 | Ar15 | Ar4 | | |
| M135 | Ar15 | Ar5 | | |
| M136 | Ar15 | Ar6 | | |
| M137 | Ar15 | Ar7 | | |
| M138 | Ar15 | Ar8 | | |
| M139 | Ar15 | Ar9 | | |
| M140 | Ar15 | Ar10 | | |
| M141 | Ar16 | Ar1 | | |
| M142 | Ar16 | Ar2 | | |
| M143 | Ar16 | Ar3 | | |
| M144 | Ar16 | Ar4 | | |
| M145 | Ar16 | Ar5 | | |
| M146 | Ar16 | Ar6 | | |
| M147 | Ar16 | Ar7 | | |
| M148 | Ar16 | Ar8 | | |
| M149 | Ar16 | Ar9 | | |
| M150 | Ar16 | Ar10 | | |
| M151 | Ar17 | Ar1 | | |
| M152 | Ar17 | Ar2 | | |
| M153 | Ar17 | Ar3 | | |
| M154 | Ar17 | Ar4 | | |
| M155 | Ar17 | Ar5 | | |
| M156 | Ar17 | Ar6 | | |

-continued

| Monomer | Ar1 | Ar2 | Ar3 | Ar4 |
|---|---|---|---|---|
| M157 | Ar17 | Ar7 | | |
| M158 | Ar17 | Ar8 | | |
| M159 | Ar17 | Ar9 | | |
| M160 | Ar17 | Ar10 | | |
| M161 | Ar18 | Ar1 | | |
| M162 | Ar18 | Ar2 | | |
| M163 | Ar18 | Ar3 | | |
| M164 | Ar18 | Ar4 | | |
| M165 | Ar18 | Ar5 | | |
| M166 | Ar18 | Ar6 | | |
| M167 | Ar18 | Ar7 | | |
| M168 | Ar18 | Ar8 | | |
| M169 | Ar18 | Ar9 | | |
| M170 | Ar18 | Ar10 | | |
| M171 | Ar11 | Ar1 | | |
| M172 | Ar12 | Ar3 | | |
| M173 | Ar11 | Ar9 | | |
| M174 | Ar11 | Ar3 | | |
| M175 | Ar12 | Ar7 | | |
| M176 | Ar11 | Ar3 | | |
| M177 | Ar11 | Ar3 | | |
| M178 | Ar11 | Ar3 | | |
| M179 | Ar11 | Ar3 | | |
| M180 | Ar11 | Ar3 | | |
| M181 | Ar11 | Ar1 | Ar2 | Ar11 |
| M182 | Ar11 | Ar3 | Ar9 | Ar11 |
| M183 | Ar11 | Ar3 | Ar4 | Ar11 |
| M184 | Ar11 | Ar2 | Ar3 | Ar11 |
| M185 | Ar11 | Ar5 | Ar8 | Ar11 |
| M186 | Ar12 | Ar3 | Ar6 | Ar12 |
| M187 | Ar12 | Ar3 | Ar7 | Ar12 |
| M188 | Ar12 | Ar3 | Ar3 | Ar11 |
| M189 | Ar11 | Ar3 | Ar3 | Ar13 |

Particularly preferred repeat units of the formula (I) are the repeat units shown in the table below, which are composed of the respective components $Ar^1$, $Ar^2$, $Ar^3$ and $Ar^4$.

| Monomer | Ar1 | Ar2 | Ar3 | Ar4 |
|---|---|---|---|---|
| Mo1 | Ar11a | Ar1a | Ar1a | Ar11a |
| Mo2 | Ar11b | Ar1a | Ar1a | Ar11b |
| Mo3 | Ar11c | Ar1a | Ar1a | Ar11c |
| Mo4 | Ar11a | Ar1b | Ar1b | Ar11a |
| Mo5 | Ar12a | Ar1b | Ar1b | Ar12a |
| Mo6 | Ar12d | Ar2a | Ar2a | Ar12d |
| Mo7 | Ar11a | Ar3a | Ar3a | Ar11a |
| Mo8 | Ar12a | Ar3a | Ar3a | Ar12a |
| Mo9 | Ar13a | Ar3a | Ar3a | Ar13a |
| Mo10 | Ar15a | Ar3a | Ar3a | Ar15a |
| Mo11 | Ar11a | Ar3b | Ar3b | Ar11a |
| Mo12 | Ar11a | Ar3c | Ar3c | Ar11a |
| Mo13 | Ar12d | Ar3c | Ar3c | Ar12d |
| Mo14 | Ar12d | Ar4a | Ar4a | Ar12d |
| Mo15 | Ar16a | Ar5a | Ar5a | Ar16a |
| Mo16 | Ar11b | Ar6a | Ar6a | Ar11b |
| Mo17 | Ar11a | Ar7a | Ar7a | Ar11a |
| Mo18 | Ar13c | Ar8a | Ar8a | Ar13c |
| Mo19 | Ar11a | Ar9a | Ar9a | Ar11a |
| Mo20 | Ar17a | Ar9b | Ar9b | Ar17a |
| Mo21 | Ar13d | Ar9c | Ar9c | Ar13d |
| Mo22 | Ar12e | Ar9d | Ar9d | Ar12e |
| Mo23 | Ar11a | Ar10a | Ar10a | Ar11a |
| Mo24 | Ar18a | Ar10b | Ar10b | Ar18a |
| Mo25 | Ar18c | Ar10c | Ar10c | Ar18c |
| Mo26 | Ar11a | Ar3a | Ar3a | Ar11a |
| Mo27 | Ar11a | Ar9a | Ar9a | Ar11a |
| Mo28 | Ar12d | Ar9a | Ar9a | Ar12d |
| Mo29 | Ar13a | Ar5a | Ar5a | Ar13a |
| Mo30 | Ar12c | Ar8a | Ar8a | Ar12c |
| Mo31 | Ar11a | Ar3a | Ar3a | Ar11a |
| Mo32 | Ar12a | Ar9a | Ar9a | Ar12a |
| Mo33 | Ar11a | Ar9c | Ar9c | Ar11a |
| Mo34 | Ar12d | Ar3c | Ar3c | Ar12d |
| Mo35 | Ar18c | Ar7a | Ar7a | Ar18c |
| Mo36 | Ar13d | Ar9d | Ar9d | Ar13d |
| Mo37 | Ar18a | Ar8a | Ar8a | Ar18a |
| Mo38 | Ar11a | Ar1a | | |
| Mo39 | Ar11b | Ar1a | | |
| Mo40 | Ar11c | Ar1a | | |
| Mo41 | Ar11a | Ar1b | | |
| Mo42 | Ar12a | Ar1b | | |
| Mo43 | Ar12d | Ar2a | | |
| Mo44 | Ar11a | Ar3a | | |
| Mo45 | Ar12a | Ar3a | | |
| Mo46 | Ar13a | Ar3a | | |
| Mo47 | Ar15a | Ar3a | | |
| Mo48 | Ar11a | Ar3b | | |
| Mo49 | Ar11a | Ar3c | | |
| Mo50 | Ar12d | Ar3c | | |
| Mo51 | Ar12d | Ar4a | | |
| Mo52 | Ar16a | Ar5a | | |
| Mo53 | Ar11b | Ar6a | | |
| Mo54 | Ar11a | Ar7a | | |
| Mo55 | Ar13c | Ar8a | | |
| Mo56 | Ar11a | Ar9a | | |
| Mo57 | Ar17a | Ar9b | | |
| Mo58 | Ar13d | Ar9c | | |
| Mo59 | Ar12e | Ar9d | | |
| Mo60 | Ar11a | Ar10a | | |
| Mo61 | Ar18a | Ar10b | | |
| Mo62 | Ar18c | Ar10c | | |
| Mo63 | Ar11a | Ar3a | | |
| Mo64 | Ar11a | Ar9a | | |
| Mo65 | Ar12d | Ar9a | | |
| Mo66 | Ar13a | Ar5a | | |
| Mo67 | Ar12c | Ar8a | | |
| Mo68 | Ar11a | Ar3a | | |
| Mo69 | Ar12a | Ar9a | | |
| Mo70 | Ar11a | Ar9c | | |
| Mo71 | Ar12d | Ar3c | | |
| Mo72 | Ar18c | Ar7a | | |
| Mo73 | Ar13d | Ar9d | | |
| Mo74 | Ar18a | Ar8a | | |
| Mo75 | Ar11a | Ar3a | Ar3b | Ar11a |
| Mo76 | Ar11a | Ar3a | Ar9a | Ar11a |
| Mo77 | Ar12a | Ar2a | Ar2b | Ar12a |
| Mo78 | Ar11a | Ar3a | Ar3a | Ar11b |
| Mo79 | Ar12a | Ar3c | Ar3a | Ar12d |
| Mo80 | Ar11a | Ar9a | Ar9a | Ar12a |

Very particularly preferred repeat units of the formula (I) are the repeat units shown in the table below, which are composed of the respective components $Ar^1$, $Ar^2$, $Ar^3$ and $Ar^4$.

| Monomer | Ar1 | Ar2 | Ar3 | Ar4 |
|---|---|---|---|---|
| Mon1 | Ar11aa | Ar3a | Ar3a | Ar11aa |
| Mon2 | Ar11aa | Ar3b | Ar3b | Ar11aa |
| Mon3 | Ar11aa | Ar3c | Ar3c | Ar11aa |
| Mon4 | Ar11aa | Ar9a | Ar9a | Ar11aa |
| Mon5 | Ar11aa | Ar2a | Ar2a | Ar11aa |
| Mon6 | Ar12aa | Ar3a | Ar3a | Ar12aa |
| Mon7 | Ar12ab | Ar3c | Ar3c | Ar12ab |
| Mon8 | Ar12da | Ar1a | Ar1a | Ar12da |
| Mon9 | Ar13aa | Ar2a | Ar2a | Ar13aa |
| Mon10 | Ar11aa | Ar3a | Ar3a | Ar11aa |
| Mon11 | Ar11aa | Ar3b | Ar3b | Ar11aa |
| Mon12 | Ar11aa | Ar3c | Ar3c | Ar11aa |
| Mon13 | Ar11aa | Ar9a | Ar9a | Ar11aa |
| Mon14 | Ar11aa | Ar2a | Ar2a | Ar11aa |
| Mon15 | Ar12aa | Ar9a | Ar9a | Ar12aa |
| Mon16 | Ar11aa | Ar3a | Ar3a | Ar11aa |
| Mon17 | Ar11aa | Ar3b | Ar3b | Ar11aa |
| Mon18 | Ar11aa | Ar3c | Ar3c | Ar11aa |
| Mon19 | Ar11aa | Ar9a | Ar9a | Ar11aa |
| Mon20 | Ar11aa | Ar2b | Ar2b | Ar11aa |
| Mon21 | Ar11aa | Ar3a | Ar3a | Ar11aa |

-continued

| Monomer | Ar1 | Ar2 | Ar3 | Ar4 |
|---|---|---|---|---|
| Mon22 | Ar12aa | Ar8a | Ar8a | Ar12aa |
| Mon23 | Ar11aa | Ar3c | Ar3c | Ar11aa |
| Mon24 | Ar11bb | Ar10b | Ar10b | Ar11bb |
| Mon25 | Ar17aa | Ar5a | Ar5a | A17aa |
| Mon26 | A11aa | Ar3a | Ar3a | A11aa |
| Mon27 | A12aa | Ar9a | Ar9a | A12aa |
| Mon28 | A13ba | Ar10c | Ar10c | A13ba |
| Mon29 | Ar11aa | Ar3a | | |
| Mon30 | Ar11aa | Ar3b | | |
| Mon31 | Ar11aa | Ar3c | | |
| Mon32 | Ar11aa | Ar9a | | |
| Mon33 | Ar11aa | Ar2a | | |
| Mon34 | Ar12aa | Ar3a | | |
| Mon35 | Ar12ab | Ar3c | | |
| Mon36 | Ar12da | Ar1a | | |
| Mon37 | Ar13aa | Ar2a | | |
| Mon38 | Ar11aa | Ar3a | | |
| Mon39 | Ar11aa | Ar3b | | |
| Mon40 | Ar11aa | Ar3c | | |
| Mon41 | Ar11aa | Ar9a | | |
| Mon42 | Ar11aa | Ar2a | | |
| Mon43 | Ar12aa | Ar9a | | |
| Mon44 | Ar11aa | Ar3a | | |
| Mon45 | Ar11aa | Ar3b | | |
| Mon46 | Ar11aa | Ar3c | | |
| Mon47 | Ar11aa | Ar9a | | |
| Mon48 | Ar11aa | Ar2b | | |
| Mon49 | Ar11aa | Ar3a | | |
| Mon50 | Ar12aa | Ar8a | | |
| Mon51 | Ar11aa | Ar3c | | |
| Mon52 | Ar11bb | Ar10b | | |
| Mon53 | Ar17aa | Ar5a | | |
| Mon54 | A11aa | Ar3a | | |
| Mon55 | A12aa | Ar9a | | |
| Mon56 | A13ba | Ar10c | | |
| Mon57 | Ar11aa | Ar3a | Ar3b | Ar11aa |
| Mon58 | Ar11aa | Ar9a | Ar9a | Ar12aa |

The proportion of repeat units of the formula (I), (II), (III), (IIIa), (IIIb), (IIIc), (IV), (V), (Va), (Vb) and/or (Vc) in the polymer is in the range from 1 to 100 mol %.

In a first preferred embodiment, the polymer of the invention contains just one repeat unit of the formula (I), (II), (III), (IIIa), (IIIb), (IIIc), (IV), (V), (Va), (Vb) or (Vc), i.e. the proportion thereof in the polymer is 100 mol %. In this case, the polymer of the invention is a homopolymer.

In a second preferred embodiment, the proportion of repeat units of the formula (I), (II), (III), (IIIa), (IIIb), (IIIc), (IV), (V), (Va), (Vb) and/or (Vc) in the polymer is in the range from 5 to 75 mol %, more preferably in the range from 20 to 60 mol %, and most preferably in the range from 25 to 50 mol %, based on 100 mol % of all copolymerizable monomers present as repeat units in the polymer, meaning that the polymer of the invention, as well as one or more repeat units of the formula (I), (II), (III), (IIIa), (IIIb), (IIIc), (IV), (V), (Va), (Vb) and/or (Vc), also includes further repeat units other than the repeat units of the formulae (I), (II), (III), (IIIa), (IIIb), (IIIc), (IV), (V), (Va), (Vb) and (Vc).

These repeat units other than the repeat units of the formulae (I), (II), (III), (IIIa), (IIIb), (IIIc), (IV), (V), (Va), (Vb) and (Vc) include those as disclosed and listed extensively in WO 02/077060 A1, in WO 2005/014689 A2 and in WO 2013/156130. These are considered to form part of the present invention by reference. The further repeat units may come, for example, from the following classes:

Group 1: units which influence the hole injection and/or hole transport properties of the polymers;

Group 2: units which influence the electron injection and/or electron transport properties of the polymers;

Group 3: units having combinations of individual units of group 1 and group 2;

Group 4: units which alter the emission characteristics in such a way that electrophosphorescence rather than electrofluorescence is obtainable;

Group 5: units which improve the transition from the singlet to the triplet state;

Group 6: units which affect the emission color of the resulting polymers;

Group 7: units which are typically used as polymer backbone;

Group 8: units which interrupt the delocalization of the π electrons in the polymer and hence shorten the conjugation length in the polymer.

Preferred polymers of the invention are those in which at least one repeat unit has charge transport properties, i.e. those which contain the units from group 1 and/or 2.

Repeat units from group 1 having hole injection and/or hole transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiine, carbazole, azulene, thiophene, pyrrole and furan derivatives and further O—, S- or N-containing heterocycles.

Preferred repeat units having hole injection and/or hole transport properties are units formed from triarylamine derivatives.

More preferably, the triarylamine derivatives have the structure of the following formula (A):

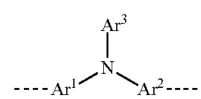

(A)

where $Ar^1$ to $Ar^3$ are the same or different at each instance and are independently a mono- or polycyclic, aromatic or heteroaromatic ring system which has 5 to 60 aromatic ring atoms and may be substituted by one or more R radicals;

R is the same or different at each instance and is independently H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 carbon atoms, an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C{=}CR^1$, CC, $Si(R^1)_2$, C═O, C═S, $C{=}NR^1$, $P(=O)R^1$, SO, $SO_2$, $NR^1$, O, S or $CONR^1$ and where one or more hydrogen atoms may be replaced by D, F, Cl, Br, I or CN, or a mono- or polycyclic, aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; or a crosslinkable group Q, where two or more R radicals together may also form a mono- or polycyclic, aliphatic, aromatic or heteroaromatic ring system;

$R^1$ is the same or different at each instance and is independently H, D, F or an aliphatic hydrocarbyl radical having 1 to 20 carbon atoms, an aromatic and/or a heteroaromatic hydrocarbyl radical having 5 to 20 carbon atoms, in which one or more hydrogen atoms may also be replaced by F; where two or more $R^1$ substituents together may also form a mono- or polycyclic, aliphatic, aromatic or heteroaromatic ring system; and the dotted lines represent bonds to adjacent repeat units in the polymer.

The triarylamine derivatives, in a preferred embodiment, have the structure of the following formula (A):

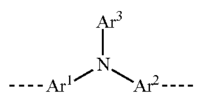

(A)

where $Ar^1$, $Ar^2$ and $Ar^3$ may assume the definitions given above, but characterized in that $Ar^3$ is substituted by $Ar^4$ in at least one, preferably in one of the two, ortho positions, where $Ar^4$ is a mono- or polycyclic, aromatic or heteroaromatic ring system which has 5 to 60 aromatic ring atoms and may be substituted by one or more R radicals, where R may assume the definitions given above.

$Ar^4$ may be joined to $Ar^3$ either directly, i.e. by a single bond, or else via a linking group X.

The repeat unit of the formula (A), in a first embodiment, thus preferably has the structure of the following formula (A1):

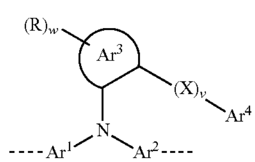

(A1)

where $Ar^1$, $Ar^2$, $Ar^3$, $Ar^4$ and R may assume the definitions given above in relation to formula A, w=0, 1, 2, 3, 4, 5 or 6, preferably 0, 1, 2, 3 or 4, X=$CR_2$, NR, $SiR_2$, O, S, C=O or P=O, preferably $CR_2$, NR, O or S, and v=0 or 1, preferably 0.

In a second embodiment of the present invention, the at least one repeat unit of the formula (A) in the polymer of the invention is characterized in that $Ar^3$ is substituted by $Ar^4$ in one of the two ortho positions, and $Ar^3$ is additionally bonded to $Ar^4$ in the meta position adjacent to the substituted ortho position.

The repeat unit of the formula (A), in a second embodiment, thus preferably has the structure of the following formula (A2):

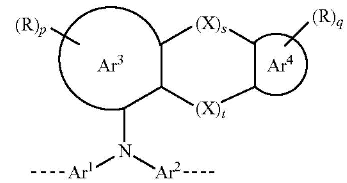

(A2)

where $Ar^1$, $Ar^2$, $Ar^3$, $Ar^4$ and R may assume the definitions given above in relation to formula A, p=0, 1, 2 or 3, q=0, 1, 2, 3 or 4, X=$CR_2$, NR, $SiR_2$, O, S, C=O or P=O, preferably $CR_2$, NR, O or S, and s and t are each 0 or 1, where the sum of (s+t)=1 or 2, preferably 1.

In a preferred embodiment, the at least one repeat unit of the formula (A) is selected from the repeat units of the following formulae (A3), (A4) and (A5):

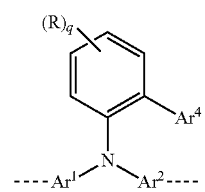

(A3)

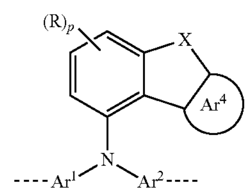

(A4)

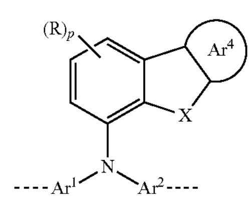

(A5)

where $Ar^1$, $Ar^2$, $Ar^4$ and R may assume the definitions given above in relation to formula A, p=0, 1, 2 or 3, q=0, 1, 2, 3 or 4, and X=$CR_2$, NR, $SiR_2$, O, S, C=O or P=O, preferably $CR_2$, NR, O or S.

In a particularly preferred embodiment, the at least one repeat unit of the formula (A3) is selected from the repeat unit of the following formula (A6):

(A6)

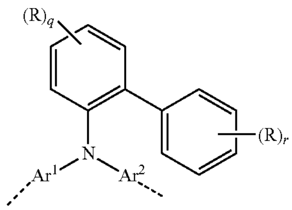

where $Ar^1$, $Ar^2$, R and q may assume the definitions given above in relation to formulae A and A2, and r=0, 1, 2, 3, 4 or 5.

Examples of preferred repeat units of the formula (A6) are shown in the following table:

(A6a)

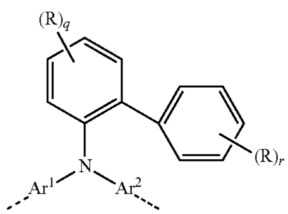

(A6b)

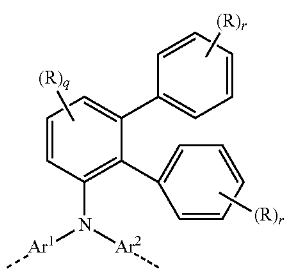

(A6c)

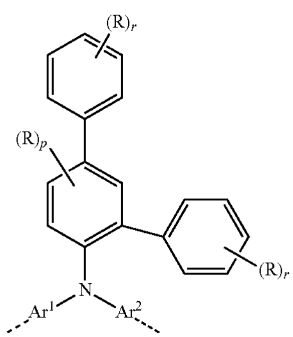

(A6d)

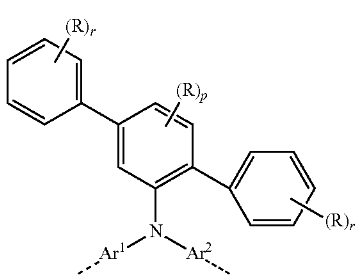

-continued (A6e)

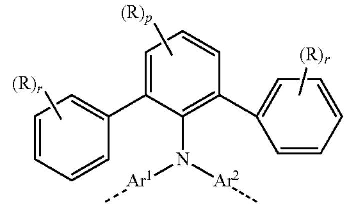

(A6f)

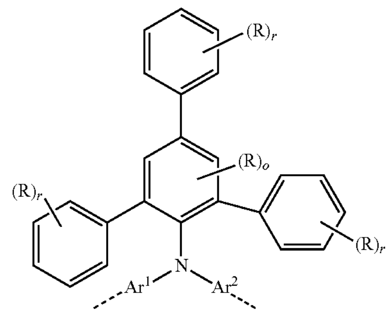

(A6g)

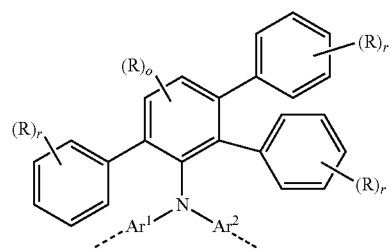

(A6h)

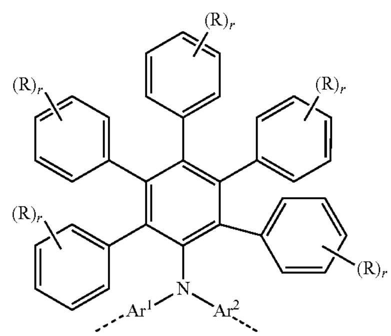

where $Ar^1$, $Ar^2$, R, p, q and r may assume the definitions given above, and o=0, 1 or 2.

In a further particularly preferred embodiment, the at least one repeat unit of the formula (A4) is selected from the repeat unit of the following formula (A7):

(A7)

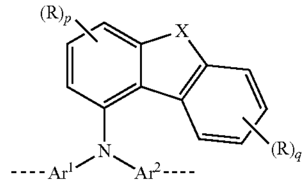

where $Ar^1$, $Ar^2$, X, R, p and q may assume the definitions given above in relation to the formulae A, A1 and A2.

Examples of preferred repeat units of the formula (A7) are shown in the following table:

(A7a)

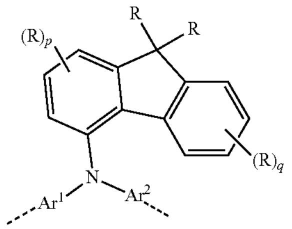

(A7b)

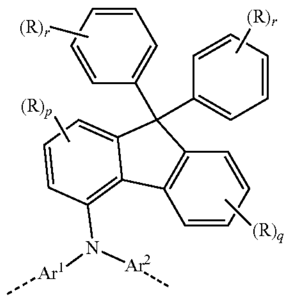

(A7c)

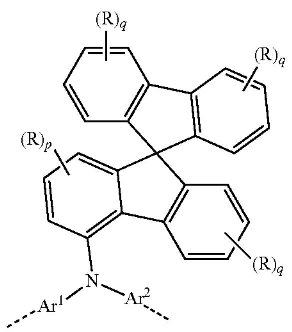

(A7d)

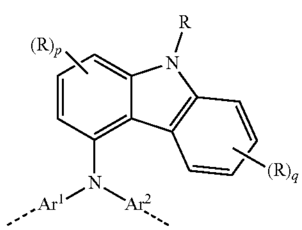

(A7e)

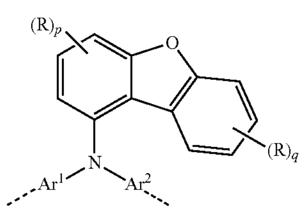

(A7f)

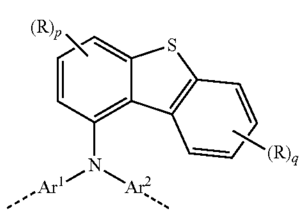

where $Ar^1$, $Ar^2$, R, p, q and r may assume the definitions given above in relation to the formulae A, A2 and A6.

In yet a further particularly preferred embodiment, the at least one repeat unit of the formula (A5) is selected from the repeat unit of the following formula (A8):

(A8)

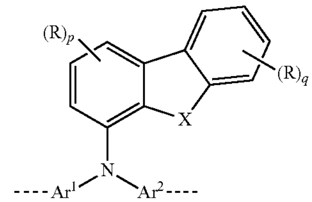

where $Ar^1$, $Ar^2$, X, R, p and q may assume the definitions given above in relation to the formulae A, A1 and A2.

Examples of preferred repeat units of the formula (A8) are shown in the following table:

(A8a)

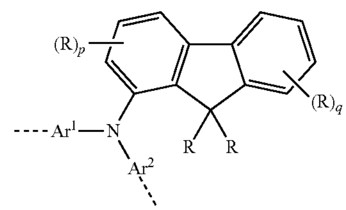

(A8b)

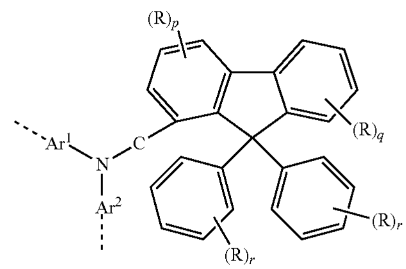

(A8c)

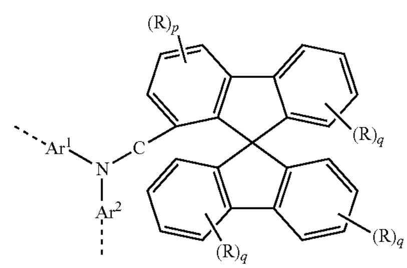

(A8d)

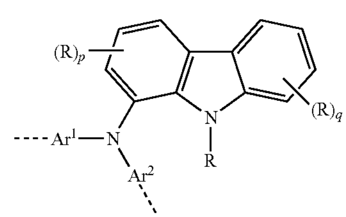

(A8e)

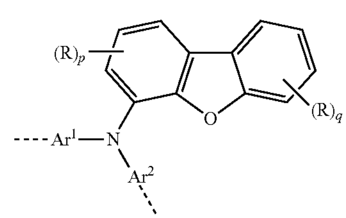

-continued (A8f)

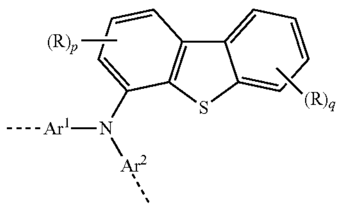

where $Ar^1$, $Ar^2$, R, p, q and r may assume the definitions given above in relation to the formulae A, A2 and A6.

In a very particularly preferred embodiment, the at least one repeat unit of the formula (A6) is selected from the repeat unit of the following formula (A9):

(A9)

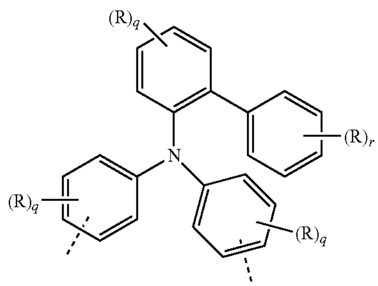

where R, q and r may assume the definitions given above in relation to the formulae A, A2 and A6.

Examples of preferred repeat units of the formula (A9) are shown in the following table:

(A9a)

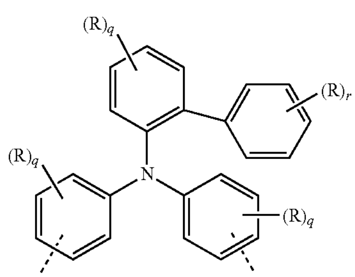

(A9b)

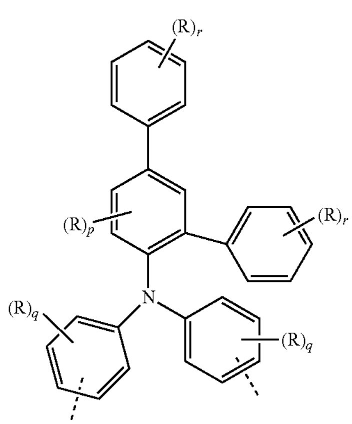

-continued (A9c)

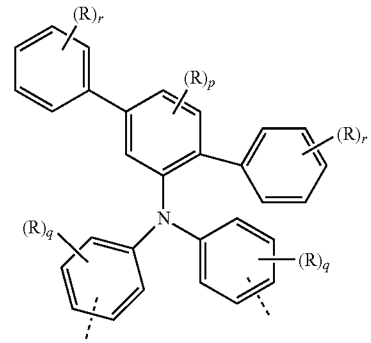

(A9d)

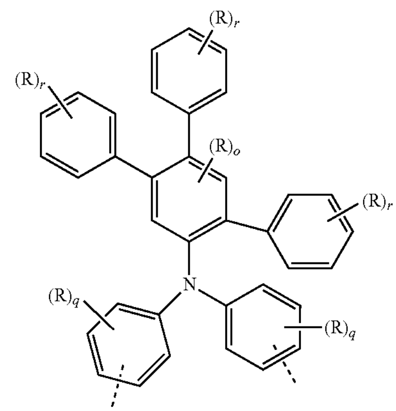

(A9e)

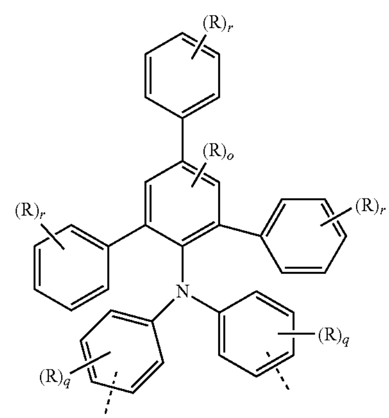

(A9f)

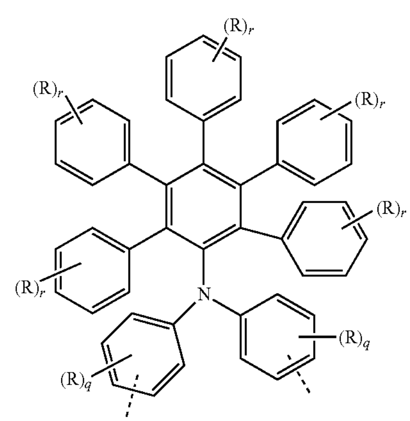

-continued (A9g)

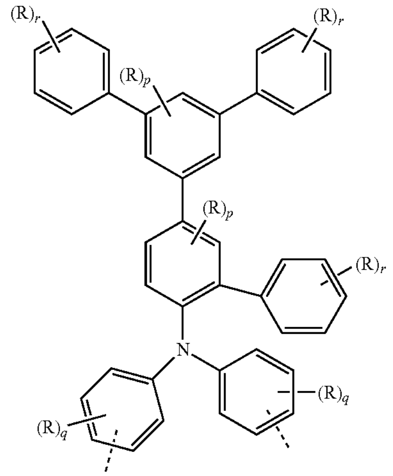

(A9h)

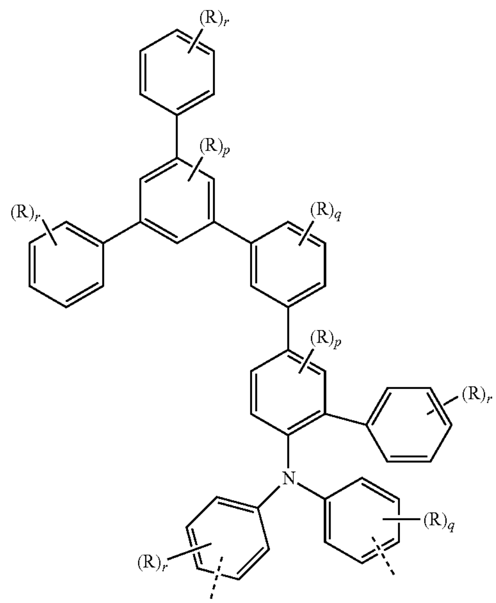

where R, o, p, q and r may assume the definitions given above in relation to the formulae A, A2 and A6.

In a further very particularly preferred embodiment, the at least one repeat unit of the formula (A7) is selected from the repeat unit of the following formula (A10):

(A10)

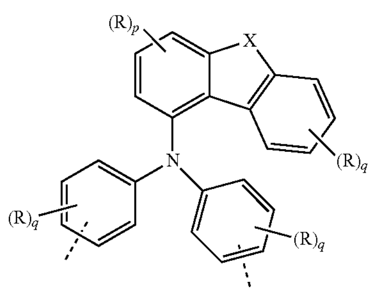

where R, X, p and q may assume the definitions given above in relation to the formulae A, A1 and A2.

Examples of preferred repeat units of the formula (A10) are shown in the following table:

(A10a)

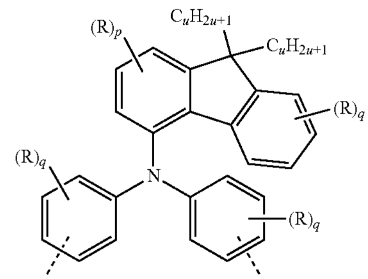

(A10b)

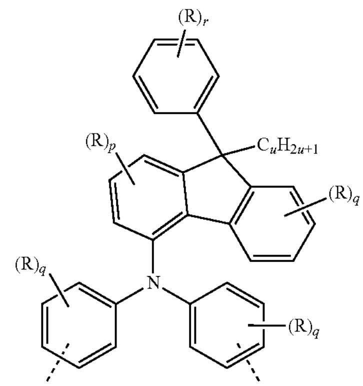

(A10c)

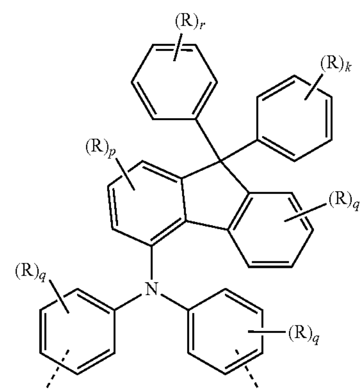

(A10d)

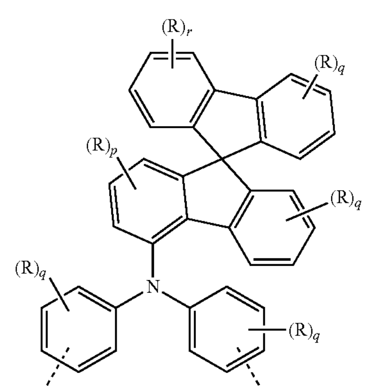

-continued (A10e)

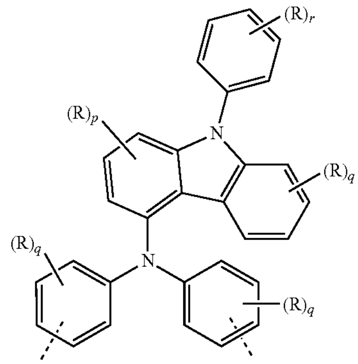

(A10f)

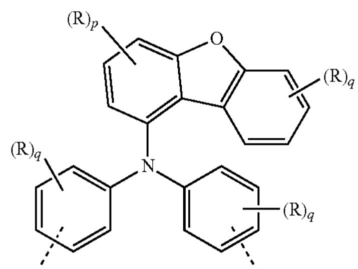

(A10g)

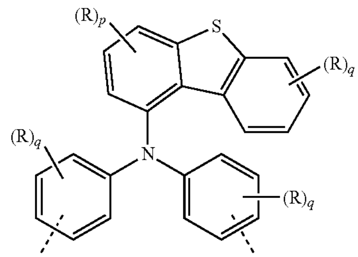

where R, p, q and r may assume the definitions given above in relation to the formulae A, A2 and A6, and u=1 to 20, preferably 1 to 10.

In yet a further very particularly preferred embodiment, the at least one repeat unit of the formula (A8) is selected from the repeat unit of the following formula (A11):

(A11)

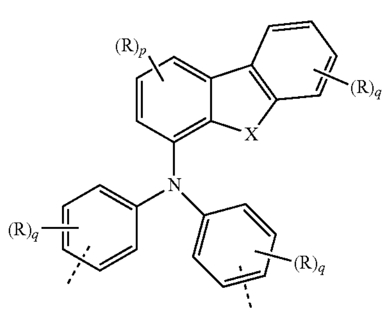

where R, X, p and q may assume the definitions given above in relation to the formulae A, A1 and A2.

Examples of preferred repeat units of the formula (A11) are shown in the following table:

(A11a)

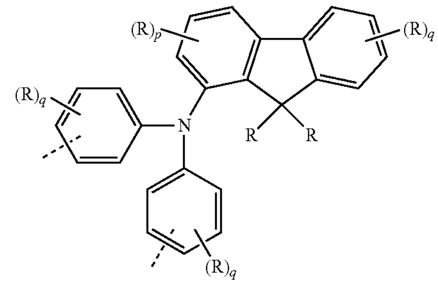

(A11b)

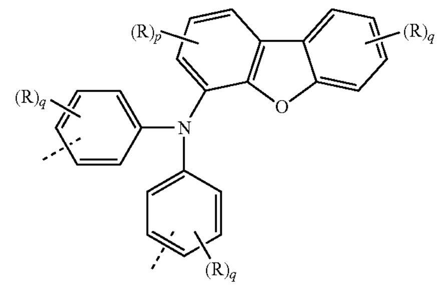

(A11c)

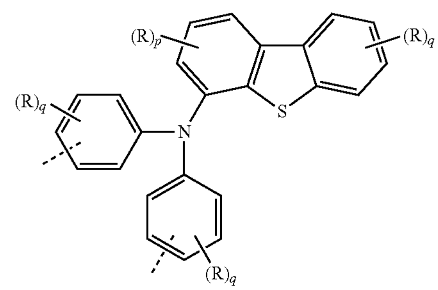

where R, p and q may assume the definitions given above in relation to the formulae A and A2.

In the formulae (A9), (A10) and (A11), and the preferred embodiments of the formulae (A9a) to (A9h), (A10a) to (A10g) and (A11a) to (A11c), the dotted lines represent the bonds to the adjacent repeat units in the polymer. They may independently be arranged identically or differently in the ortho, meta or para position, preferably identically in the ortho, meta or para position, more preferably in the meta or para position and most preferably in the para position.

Repeat units from group 2 having electron injection and/or electron transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O—, S- or N-containing heterocycles.

It may be preferable when the polymers of the invention contain units from group 3 in which structures which increase hole mobility and which increase electron mobility (i.e. units from group 1 and 2) are bonded directly to one another or structures which increase both hole mobility and electron mobility are present. Some of these units may serve as emitters and shift the emission color into the green, yellow or red. The use thereof is thus suitable, for example, for the creation of other emission colors from originally blue-emitting polymers.

Repeat units of group 4 are those which can emit light with high efficiency from the triplet state even at room temperature, i.e. exhibit electrophosphorescence rather than electrofluorescence, which frequently brings about an increase in energy efficiency. Suitable for this purpose, first of all, are compounds containing heavy atoms having an atomic number of more than 36. Preferred compounds are those which contain d or f transition metals, which fulfill the abovementioned condition. Particular preference is given here to corresponding repeat units containing elements of groups 8 to 10 (Ru, Os, Rh, Ir, Pd, Pt). Useful repeat units here for the polymers of the invention include, for example, various complexes as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Repeat units of group 5 are those which improve the transition from the singlet to the triplet state and which, used in association with the repeat units of group 4, improve the phosphorescence properties of these structural elements. Useful units for this purpose are especially carbazole and bridged carbazole dimer units, as described, for example, in WO 2004/070772 A2 and WO 2004/113468 A1. Additionally useful for this purpose are ketones, phosphine oxides, sulfoxides, sulfones, silane derivatives and similar compounds, as described, for example, in WO 2005/040302 A1.

Repeat units of group 6 are, as well as those mentioned above, those which have at least one further aromatic structure or another conjugated structure that are not covered by the abovementioned groups, i.e. have only a minor effect on charge carrier mobilities, are not organometallic complexes or do not have any influence on the singlet-triplet transition. Structural elements of this kind can affect the emission color of the resulting polymers. According to the unit, they can therefore also be used as emitters. Preference is given to aromatic structures having 6 to 40 carbon atoms or else tolane, stilbene or bisstyrylarylene derivatives which may each be substituted by one or more R radicals. Particular preference is given to the incorporation of 1,4- or 9,10-anthrylene, 1,6-, 2,7- or 4,9-pyrenylene, 3,9- or 3,10-perylenylene, 4,4'-tolanylene, 4,4'-stilbenylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives which are preferably substituted, or preferably conjugated push-pull systems (systems substituted by donor and acceptor substituents) or systems such as squarines or quinacridones which are preferably substituted.

Repeat units of group 7 are units including aromatic structures having 6 to 40 carbon atoms, which are typically used as the polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzooxepine derivatives and cis- and trans-indenofluorene derivatives, but also 1,2-, 1,3- or 1,4-phenylene, 1,2-, 1,3- or 1,4-naphthylene, 2,2'-, 3,3'- or 4,4'-biphenylylene, 2,2"-, 3,3"- or 4,4"-terphenylylene, 2,2'-, 3,3'- or 4,4'-bi-1,1'-naphthylylene or 2,2'"-, 3,3'"- or 4,4'"-quarterphenylylene derivatives.

Repeat units of group 8 are those that have conjugation-interrupting properties, for example by meta bonding, steric hindrance or the use of saturated carbon or silicon atoms. Compounds of this kind are disclosed, for example, in WO2006/063852, WO 2012/048778 and WO 2013/093490. The effects of the conjugation-interrupting properties of the repeat units of group 8 include a blue shift in the absorption edge of the polymer.

Preference is given to polymers of the invention which simultaneously contain, as well as repeat units of the formula (I), (II), (III), (IIIa), (IIIb), (IIIc), (IV), (V), (Va), (Vb) and/or (Vc), additionally one or more units selected from groups 1 to 8. It may likewise be preferable when more than one repeat unit from a group is present simultaneously.

Preference is given here to polymers of the invention which, as well as at least one repeat unit of the formula (I), (II), (III), (IIIa), (IIIb), (IIIc), (IV), (V), (Va), (Vb) and/or (Vc), also contain units from group 7.

It is likewise preferable when the polymers of the invention contain units which improve charge transport or charge injection, i.e. units from group 1 and/or 2.

The polymers of the invention have from 25 to 75 mol %, preferably from 30 to 70 mol % and more preferably from 40 to 60 mol % of at least one charge-transporting repeat unit.

It is also particularly preferable when the polymers of the invention contain repeat units from group 7 and units from group 1 and/or 2.

If the polymer of the invention contains one or more units selected from groups 1 to 8, one or more of these units, preferably a unit from group 1, may have one or more crosslinkable groups, preferably one crosslinkable group.

The polymers of the invention are either homopolymers formed from repeat units of the formula (I), (II), (III), (IIIa), (IIIb), (IIIc), (IV), (V), (Va), (Vb) and/or (Vc) or copolymers. The polymers of the invention may be linear or branched, preferably linear. Copolymers of the invention may, as well as one or more repeat units of the formula (I), (II), (III), (IIIa), (IIIb), (IIIc), (IV), (V), (Va), (Vb) and/or (Vc), potentially have one or more further units from the above-listed groups 1 to 8.

The copolymers of the invention may have random, alternating or block structures, or else have two or more of these structures in alternation. More preferably, the copolymers of the invention have random or alternating structures. More preferably, the copolymers are random or alternating copolymers. The way in which copolymers having block structures are obtainable and which further structural elements are particularly preferred for the purpose is described in detail, for example, in WO 2005/014688 A2. This is incorporated into the present application by reference. It should likewise be emphasized once again at this point that the polymer may also have dendritic structures.

In a further embodiment of the present invention, the polymers of the invention, as well as one or more repeat units of the formula (I), (II), (III), (IIIa), (IIIb), (IIIc), (IV), (V), (Va), (Vb) and/or (Vc) and optionally further repeat units selected from the abovementioned groups 1 to 8, also include at least one, preferably one, repeat unit having a crosslinkable group Q.

The polymers of the invention, in a preferred embodiment, have from 1 to 60 mol %, preferably from 2 to 55 mol % and more preferably from 5 to 50 mol % of at least one repeat unit having at least one crosslinkable group Q.

"Crosslinkable group Q" in the context of the present invention means a functional group capable of entering into a reaction and thus forming an insoluble compound. The reaction may be with a further identical Q group, a further different Q group or any other portion of the same or another polymer chain. The crosslinkable group is thus a reactive group. This affords, as a result of the reaction of the crosslinkable group, a correspondingly crosslinked compound. The chemical reaction can also be conducted in the layer, giving rise to an insoluble layer. The crosslinking can usually be promoted by means of heat or by means of UV radiation, microwave radiation, x-radiation or electron beams, optionally in the presence of an initiator. What is meant by "insoluble" in the context of the present invention is preferably that the polymer of the invention, after the crosslinking reaction, i.e. after the reaction of the crosslinkable groups, has a lower solubility at room temperature in an organic solvent by at least a factor of 3, preferably at least a factor of 10, than that of the corresponding non-crosslinked polymer of the invention in the same organic solvent.

Crosslinkable Q groups preferred in accordance with the invention are the following groups:

a) Terminal or Cyclic Alkenyl or Terminal Dienyl and Alkynyl Groups:

Suitable units are those which contain a terminal or cyclic double bond, a terminal dienyl group or a terminal triple bond, especially terminal or cyclic alkenyl, terminal dienyl or terminal alkynyl groups having 2 to 40 carbon atoms, preferably having 2 to 10 carbon atoms, where individual $CH_2$ groups and/or individual hydrogen atoms may also be replaced by the abovementioned R groups. Additionally suitable are also groups which are to be regarded as precursors and which are capable of in situ formation of a double or triple bond.

b) Alkenyloxy, Dienyloxy or Alkynyloxy Groups:

Additionally suitable are alkenyloxy, dienyloxy or alkynyloxy groups, preferably alkenyloxy groups.

c) Acrylic Acid Groups:

Additionally suitable are acrylic acid units in the broadest sense, preferably acrylic esters, acrylamides, methacrylic esters and methacrylamides. Particular preference is given to $C_{1-10}$-alkyl acrylate and $C_{1-10}$-alkyl methacrylate.

The crosslinking reaction of the groups mentioned above under a) to c) can be effected via a free-radical, cationic or anionic mechanism, or else via cycloaddition.

It may be advisable to add an appropriate initiator for the crosslinking reaction. Suitable initiators for the free-radical crosslinking are, for example, dibenzoyl peroxide, AIBN or TEMPO. Suitable initiators for the cationic crosslinking are, for example, $AlCl_3$, $BF_3$, triphenylmethyl perchlorate or tropylium hexachloroantimonate. Suitable initiators for the anionic crosslinking are bases, especially butyllithium.

In a preferred embodiment of the present invention, the crosslinking, however, is conducted without the addition of an initiator and is initiated exclusively by thermal means. The reason for this preference is that the absence of the initiator prevents contamination of the layer which could lead to worsening of the device properties.

d) Oxetanes and Oxiranes:

A further suitable class of crosslinkable groups Q is that of oxetanes and oxiranes which crosslink cationically via ring opening.

It may be advisable to add an appropriate initiator for the crosslinking reaction. Suitable initiators are, for example, $AlCl_3$, $BF_3$, triphenylmethyl perchlorate or tropylium hexachloroantimonate. It is likewise possible to add photoacids as initiators.

e) Silanes:

Additionally suitable as a class of crosslinkable groups are silane groups $SiR_3$ where at least two R groups, preferably all three R groups, are Cl or an alkoxy group having 1 to 20 carbon atoms.

This group reacts in the presence of water to give an oligo- or polysiloxane.

f) Cyclobutane Groups

The crosslinkable groups Q mentioned above under a) to f) are generally known to those skilled in the art, as are the suitable reaction conditions which are used for reaction of these groups.

Preferred crosslinkable groups Q include alkenyl groups of the following formula Q1, dienyl groups of the following formula Q2, alkynyl groups of the following formula Q3, alkenyloxy groups of the following formula Q4, dienyloxy groups of the following formula Q5, alkynyloxy groups of the following formula Q6, acrylic acid groups of the following formulae Q7 and Q8, oxetane groups of the following formulae Q9 and Q10, oxirane groups of the following formula Q11, cyclobutane groups of the following formulae Q12, Q13 and Q14:

Q1

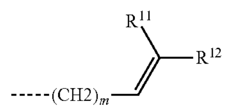

Q2

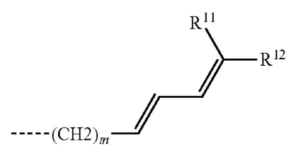

Q3

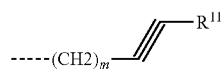

Q4

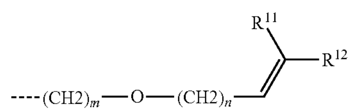

Q5

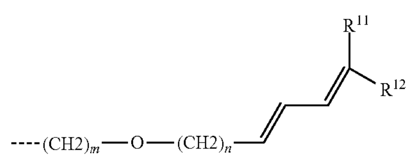

Q6

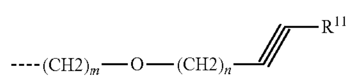

Q7

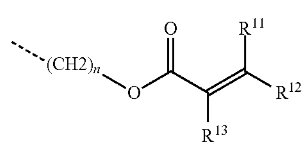

Q8

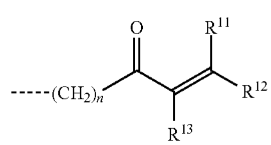

Q9

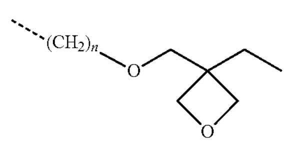

Q10

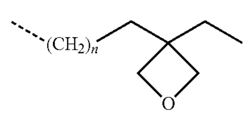

-continued

Q11

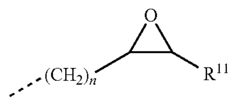

Q12

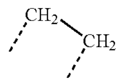

Q13

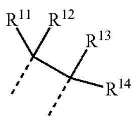

Q14

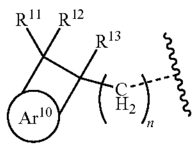

The $R^{11}$, $R^{12}$, $R^{13}$ and $R^{14}$ radicals in the formulae Q1 to Q8, Q11, Q13 and Q14 are the same or different at each instance and are H or a straight-chain or branched alkyl group having 1 to 6 carbon atoms, preferably 1 to 4 carbon atoms. More preferably, $R^{11}$, $R^{12}$, $R^{13}$ and $R^{14}$ are H, methyl, ethyl, n-propyl, isopropyl, n-butyl, sec-butyl or tert-butyl and most preferably H or methyl. The indices used have the following meaning: m=0 to 8; and n=1 to 8.

$Ar^{10}$ in the formula Q14 may assume the same definitions as $Ar^1$ in formula (I).

The dotted bond in the formulae Q1 to Q11 and Q14 and the dotted bonds in the formulae Q12 and Q13 represent the linkage of the crosslinkable group to the repeat units.

The crosslinkable groups of the formulae Q1 to Q14 may be joined directly to the repeat unit, or else indirectly, via a further mono- or polycyclic, aromatic or heteroaromatic ring system $Ar^{10}$, as shown in the following formulae Q15 to Q28:

Q15

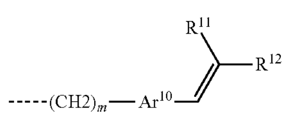

Q16

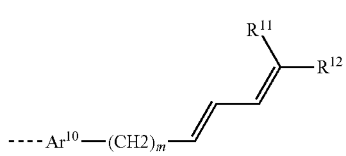

Q17

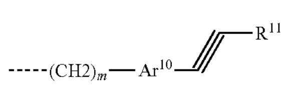

Q18

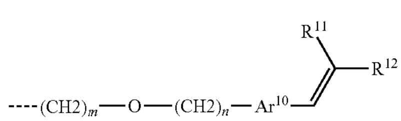

-continued

Q19

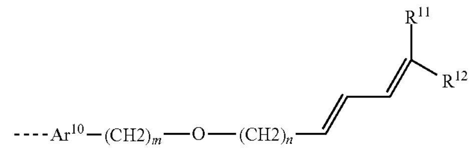

Q20

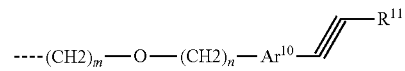

Q21

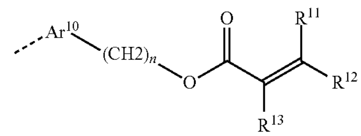

Q22

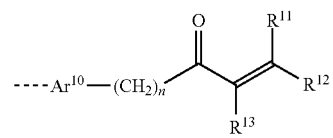

Q23

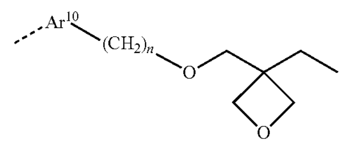

Q24

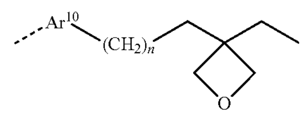

Q25

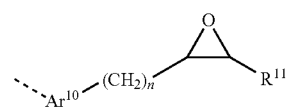

Q26

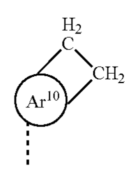

Q27

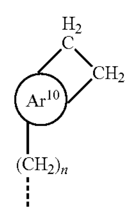

Q28

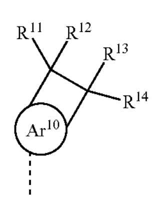

where $Ar^{10}$ in the formulae Q15 to Q28 may assume the same definitions as $Ar^1$ in formula (I).

Particularly preferred crosslinkable groups Q are as follows:

Q1a

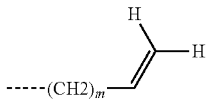

Q2a

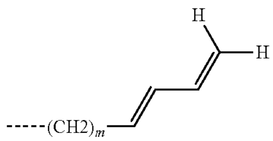

Q4a

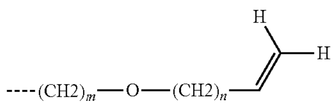

Q7a

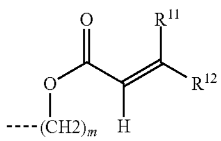

Q7b

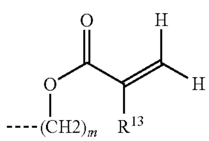

Q9a

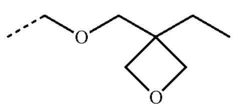

Q12

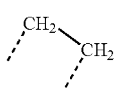

Q13

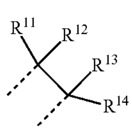

Q14a

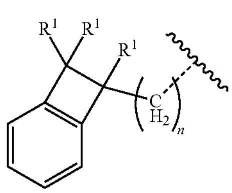

Q15a

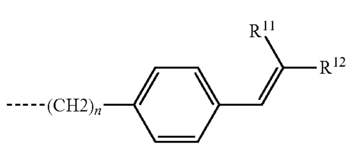

Q16a

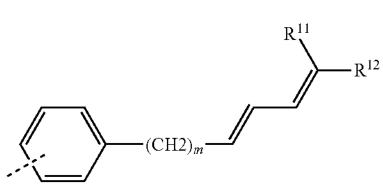

-continued

Q18a

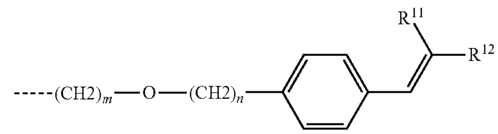

Q21a

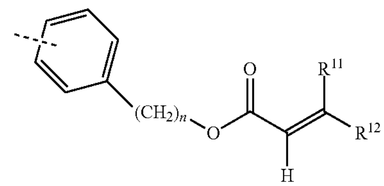

Q21b

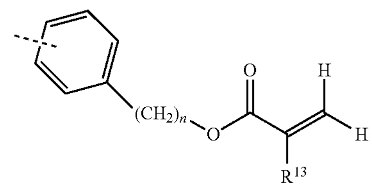

Q23q

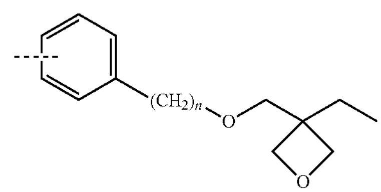

Q26a

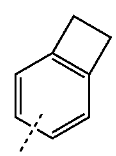

Q27a

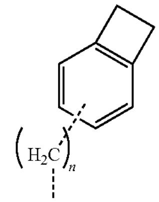

Q28a

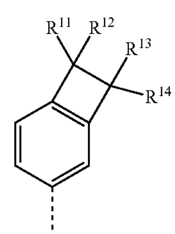

The $R^{11}$, $R^{12}$, $R^{13}$ and $R^{14}$ radicals are the same or different at each instance and are H or a straight-chain or branched alkyl group having 1 to 6 carbon atoms, preferably 1 to 4 carbon atoms. More preferably, the $R^{11}$, $R^{12}$, $R^{13}$ and $R^{14}$ radicals are methyl, ethyl, n-propyl, isopropyl, n-butyl, sec-butyl or tert-butyl and most preferably methyl.

The indices used have the following meaning: m=0 to 8 and n=1 to 8.

Very particularly preferred crosslinkable groups Q are as follows:

Q1b
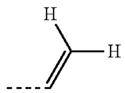
Q1c
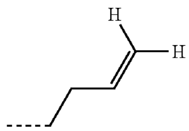
Q2b
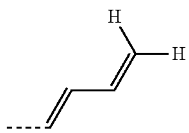
Q2c
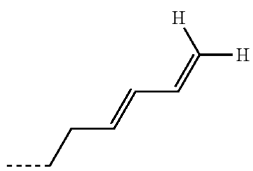
Q4b
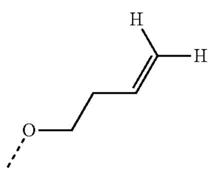
Q7c
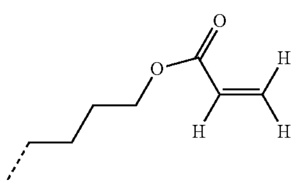
Q7d
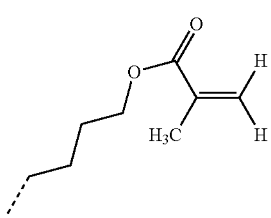
Q12b
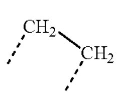
Q13a
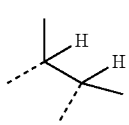
Q14b
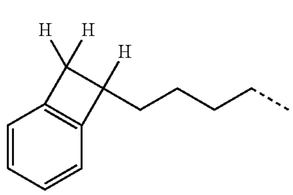
-continued
Q15b
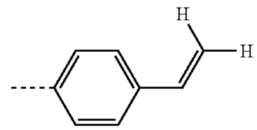
Q15c
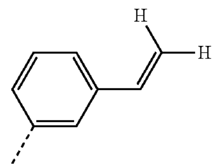
Q15d
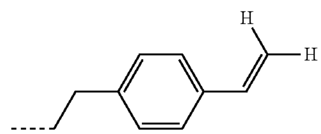
Q15e
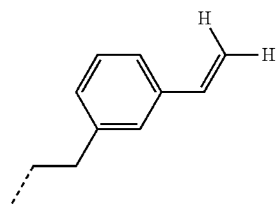
Q15f
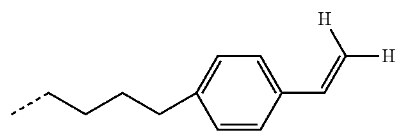
Q15g
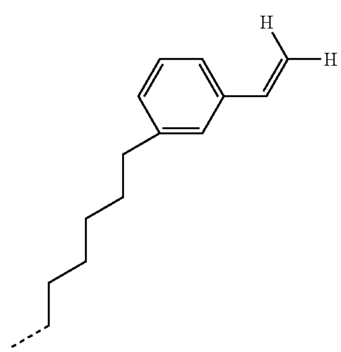
Q16b
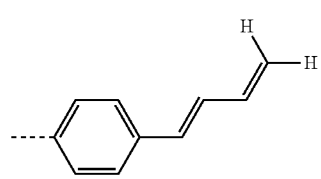
Q16c
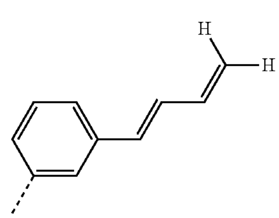

-continued

Q16d

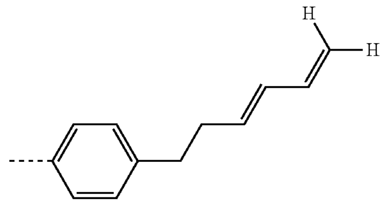

Q16e

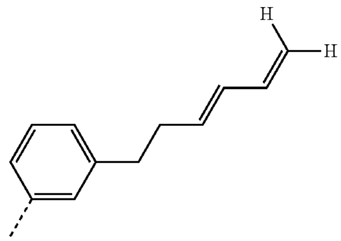

Q21c

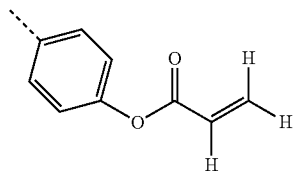

Q21d

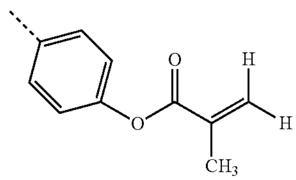

Q26b

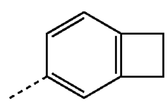

Q26c

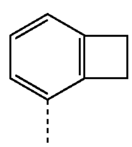

Q27b

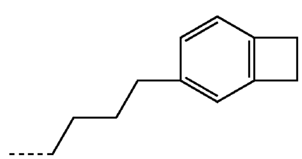

Q27c

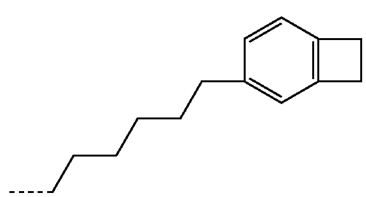

Crosslinkable repeat units used may be any of the repeat units known to the person skilled in the art that have at least one, preferably one, crosslinkable group.

The repeat unit bearing at least one crosslinkable group Q may, in a 1st embodiment, be selected from the repeat unit of the formula (Ix) derived from the repeat unit of formula (I):

(Ix)

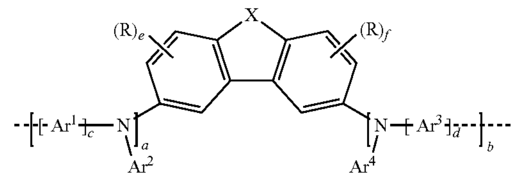

where X, $Ar^1$, $Ar^2$, $Ar^3$ and $Ar^4$, a, b, c, d, e and f, and R and $R^1$ may assume the definitions given in relation to formula (I), but with the proviso that at least one R is a crosslinkable group Q.

In a preferred 1st embodiment, the repeat unit bearing the crosslinkable group(s) Q may be selected from the repeat units of the formulae (IIx1), (IIx2) and (IIx3) derived from repeat unit of the formula (II):

(IIx1)

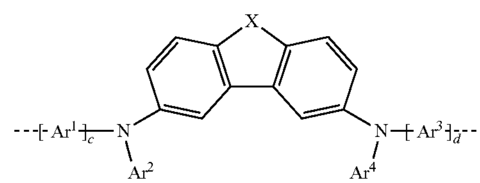

where

X NQ, CRQ or $CQ_2$; and $Ar^1$, $Ar^2$, $Ar^3$ and $Ar^4$, and c and d may assume the definitions given above in relation to formula (II);

(IIx2)

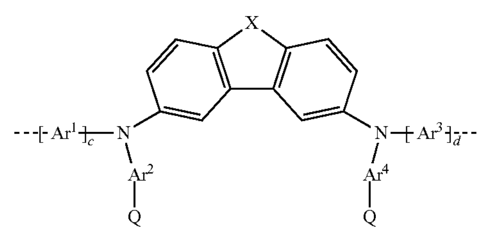

where

X, $Ar^1$, $Ar^2$, $Ar^3$ and $Ar^4$, and c and d may assume the definitions given above in relation to formula (II); and (IIx3)

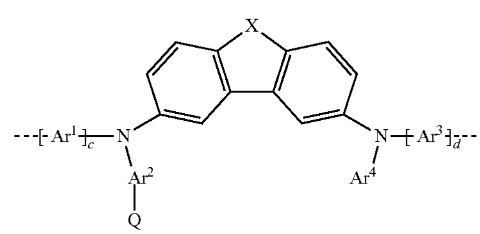

where

X, $Ar^1$, $Ar^2$, $Ar^3$ and $Ar^4$, and c and d may assume the definitions given above in relation to formula (II).

In a preferred 2nd embodiment, the repeat unit bearing the crosslinkable group(s) Q may be selected from the repeat units of the formulae (IVx1) and (IVx2) derived from repeat unit of the formula (IV):

(IVx1)

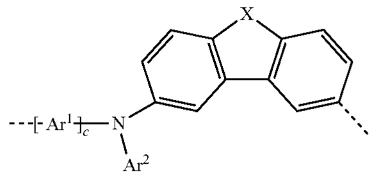

where

X NQ, CRQ or $CQ_2$; and $Ar^1$ and $Ar^2$, and c may assume the definitions given above in relation to formula (IV); and (IVx2)

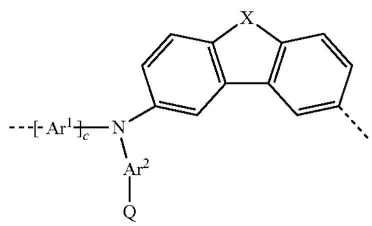

where

X, $Ar^1$ and $Ar^2$, and c may assume the definitions given above in relation to formula (IV).

In the repeat units of the formulae (IIx1) and (IVx1) in which the polycyclic aromatic or heteroaromatic ring system arranged between the two nitrogen atoms has at least one crosslinkable group Q, this is preferably selected from the following units A11 to A13:

A11

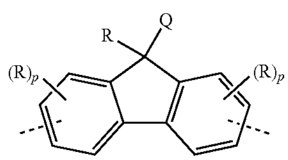

A12

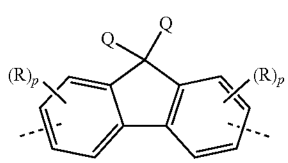

A13

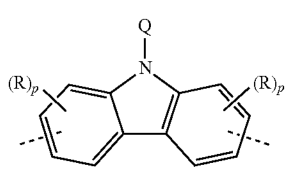

where R may assume the definitions given above, Q is a crosslinkable group, and p=0, 1, 2 or 3.

In the repeat units of the formulae (IIx1) and (IVx1) in which the polycyclic, aromatic or heteroaromatic ring system arranged between the two nitrogen atoms has at least one crosslinkable group Q, this is preferably selected from the following units A11a to A13a:

A11a

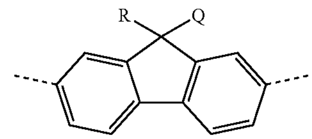

A12a

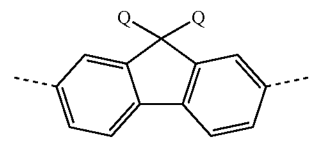

A13a

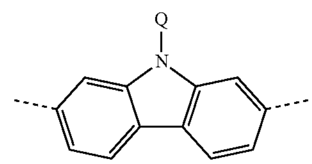

where R may assume the definitions given above and Q is a crosslinkable group.

In the repeat units of the formulae (IIx2), (IIx3) and (IVx2) in which the mono- or polycyclic, aromatic or heteroaromatic ring systems $Ar^2$ and $Ar^4$ have at least one crosslinkable group Q, $Ar^2$ and $Ar^4$ are preferably selected from the following units Ar11 to Ar28:

Ar11

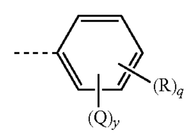

Ar12

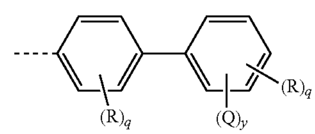

Ar13

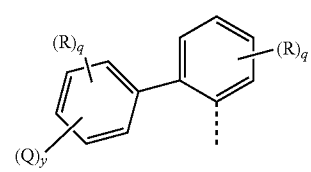

Ar14

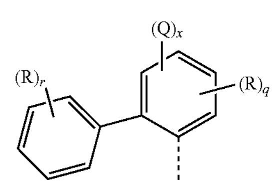

Ar15

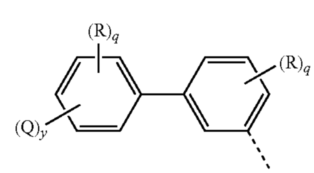

-continued
Ar16
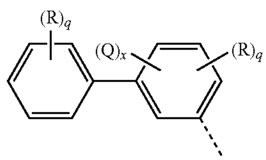
Ar17
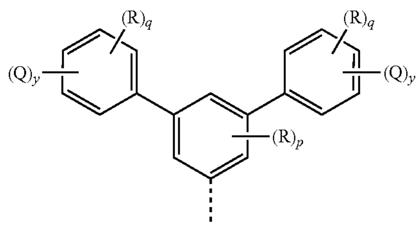
Ar18
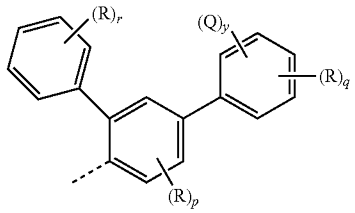
Ar19
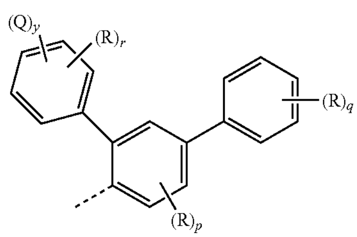
Ar20
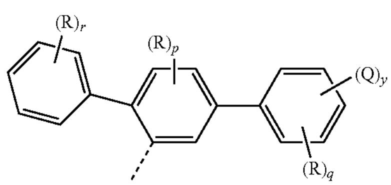
Ar21
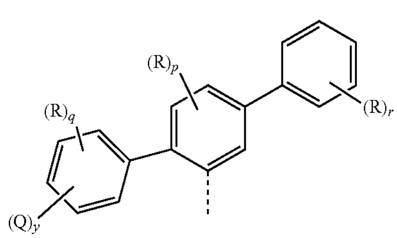
Ar22
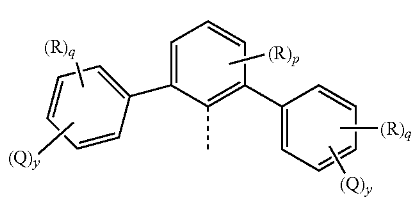
-continued
Ar23
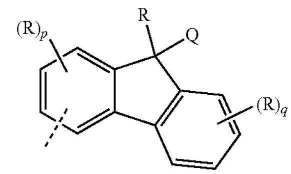
Ar24
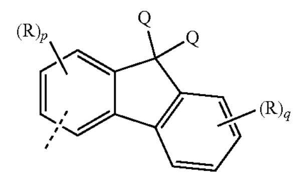
Ar25
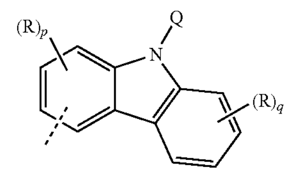
Ar26
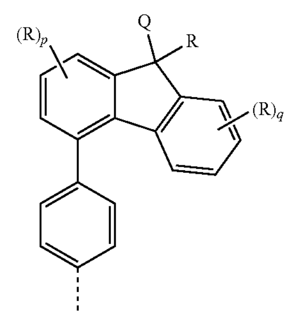
Ar27
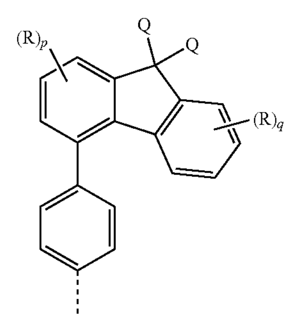
Ar28
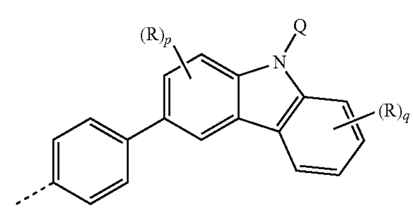
where R may assume the definitions given above, Q is a crosslinkable group,
$p=0, 1, 2$ or 3,
$q=0, 1, 2, 3$ or 4,
$r=0, 1, 2, 3, 4$ or 5,
$x=1, 2, 3$ or 4, where $x+p\leq 4$, and
$y=1, 2, 3, 4$ or 5, where $y+q\leq 5$.
In the repeat units of the formulae (IIx2), (IIx3) and (IVx2) in which the mono- or polycyclic, aromatic or heteroaromatic ring systems $Ar^2$ and $Ar^4$ have at least one crosslinkable group Q, $Ar^2$ and $Ar^4$ are more preferably selected from the following units Ar11a to Ar28a:

Ar11a

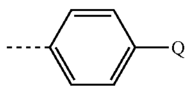

Ar11b

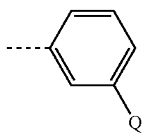

Ar12a

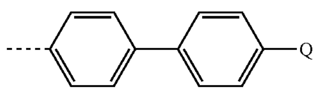

Ar12b

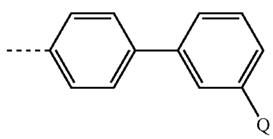

Ar13a

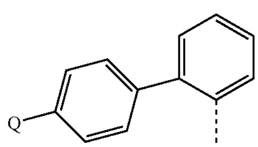

Ar15a

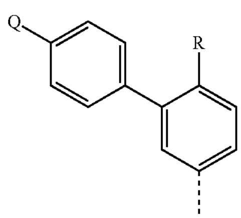

Ar15b

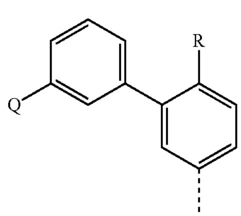

Ar23a

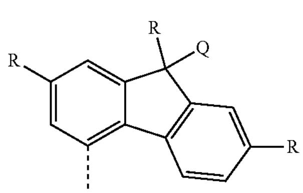

Ar23b

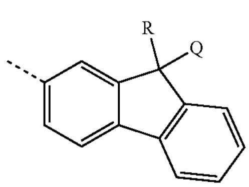

-continued

Ar24a

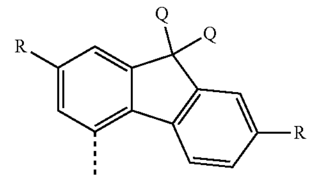

Ar24b

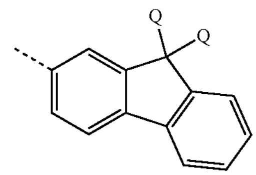

Ar25a

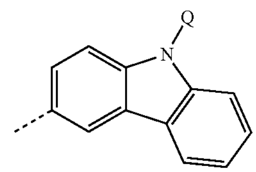

Ar26a

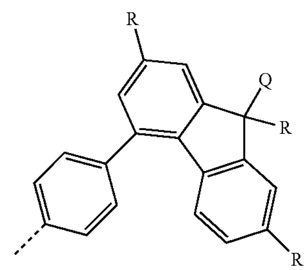

Ar27a

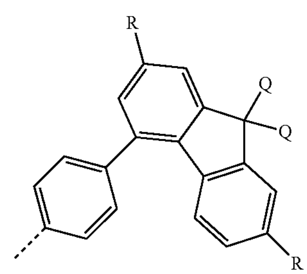

Ar28a

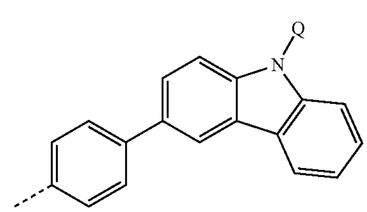

where R may assume the definitions given above and Q is a crosslinkable group.

The repeat units that bear at least one crosslinkable group Q, in a further embodiment, may be selected from the repeat units of the following formulae (D1) to (D7) derived from the triarylamine unit of the formula (A):

(D1)

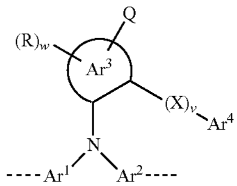

(D2)

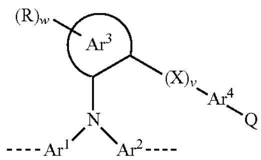

(D3)

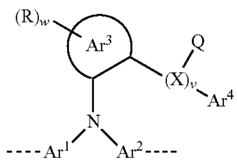

(D4)

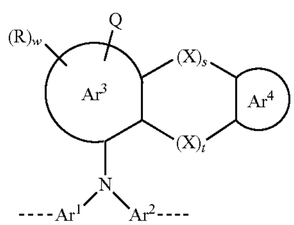

(D5)

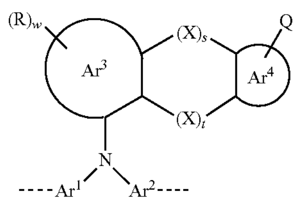

(D6)

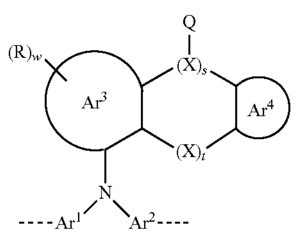

(D7)

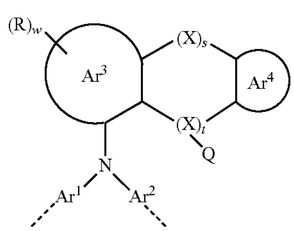

where $Ar^1$ to $Ar^4$ are the same or different at each instance and are a mono- or polycyclic, aromatic or heteroaromatic ring system which has 5 to 60 aromatic ring atoms and may be substituted by one or more R radicals;

Q is a crosslinkable group;

R is the same or different at each instance and is H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 carbon atoms, an alkenyl or alkynyl group having 2 to 40 carbon atoms or a branched or cyclic alkyl, alkoxy or thioalkoxy group having 3 to 40 carbon atoms, each of which may be substituted by one or more $R^1$ radicals, where one or more nonadjacent $CH_2$ groups may be replaced by $R^1C=CR^1$, C≡C, $Si(R^1)_2$, C=O, C=S, $C=NR^1$, $P(=O)(R^1)$, SO, $SO_2$, $NR^1$, O, S or $CONR^1$ and where one or more hydrogen atoms may be replaced by D, F, Cl, Br, I or CN, or a mono- or polycyclic, aromatic or heteroaromatic ring system which has 5 to 60 aromatic ring atoms and may be substituted in each case by one or more $R^1$ radicals, or an aryloxy or heteroaryloxy group which has 5 to 60 aromatic ring atoms and may be substituted by one or more $R^1$ radicals, or an aralkyl or heteroaralkyl group which has 5 to 60 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; or a crosslinkable group Q, where two or more R radicals together may also form a mono- or polycyclic, aliphatic, aromatic or heteroaromatic ring system;

$R^1$ is the same or different at each instance and is H, D, F or an aliphatic hydrocarbyl radical having 1 to 20 carbon atoms, an aromatic or a heteroaromatic hydrocarbyl radical having 5 to 20 carbon atoms, in which one or more hydrogen atoms may also be replaced by F; where two or more $R^1$ substituents together may also form a mono- or polycyclic, aliphatic, aromatic or heteroaromatic ring system;

X is $CR_2$, NR, $SiR_2$, O, S, C=O or P=0, preferably $CR_2$, NR, O or S, v is 0 or 1, preferably 0, w is 0, 1, 2, 3, 4, 5 or 6, preferably 0, 1, 2, 3 or 4, s and t are each 0 or 1, where the sum of (s+t)=1 or 2, preferably 1; and the dotted lines represent bonds to adjacent repeat units in the polymer.

The repeat units that bear at least one crosslinkable group Q, in yet a further embodiment, may be selected from the repeat units of the formulae (D8) to (D21) shown in the following table:

(D8)

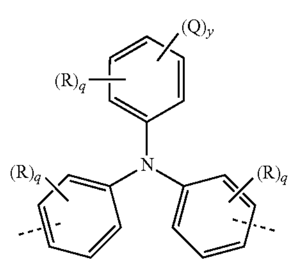

-continued (D9)

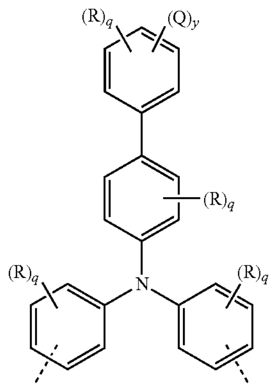

(D10)

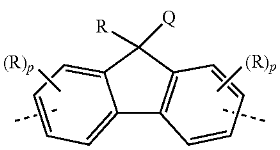

(D11)

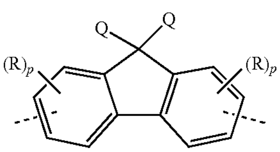

(D12)

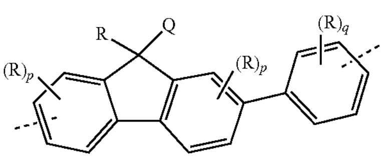

(D13)

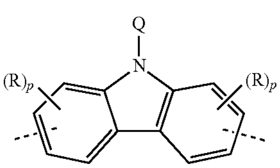

(D14)

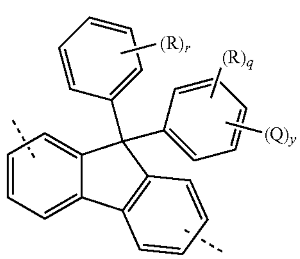

(D15)

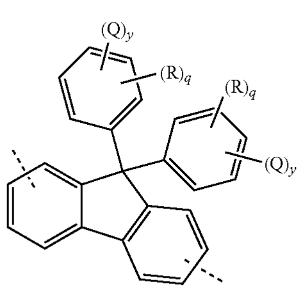

-continued (D16)

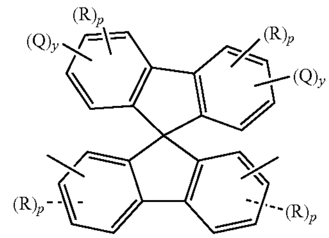

(D17)

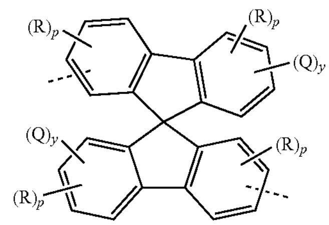

(D18)

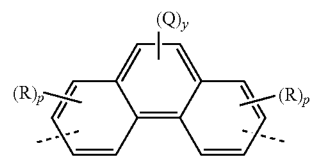

(D19)

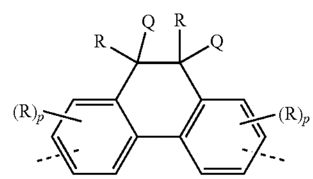

(D20)

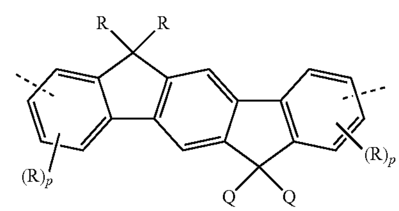

(D21)

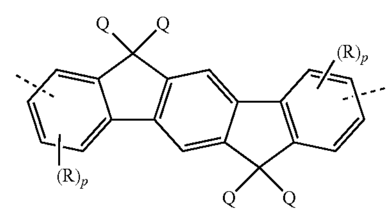

where R and Q may assume the definitions given above in relation to the repeat units of the formulae (D1) to (D7), p is 0, 1, 2 or 3, q is 0, 1, 2, 3 or 4, r is 0, 1, 2, 3, 4 or 5, y is 1 or 2, and the dotted lines represent bonds to adjacent repeat units in the polymer, but with the proviso that, in relation to a phenylene group, the sum of $(p+y)\leq 4$, and with the proviso that, in each repeat unit, at least one $y\geq 1$, but with the proviso that, in relation to a phenylene group, the sum of $(q+y)\leq 5$, and with the proviso that, in each repeat unit, at least one $y\geq 1$.

Particularly preferred crosslinkable repeat units D having at least one crosslinkable group Q are the repeat units of the formulae (D1a) to (D7a) shown in the following table:
(D1a)
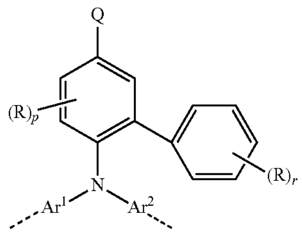
(D1b)
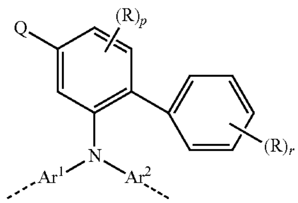
(D1c)
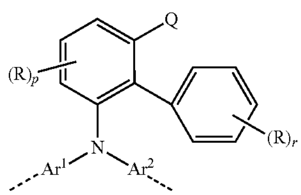
(D2a)
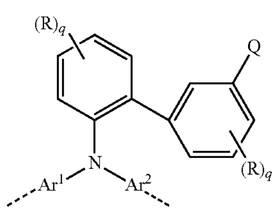
(D2b)
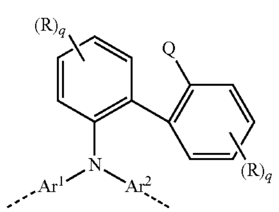
(D2c)
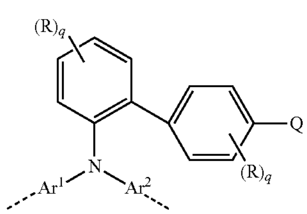
(D4a)
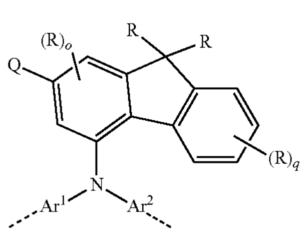
-continued
(D5a)
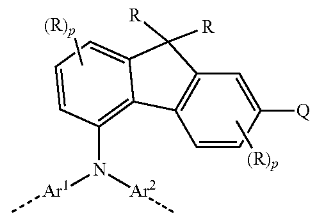
(D5b)
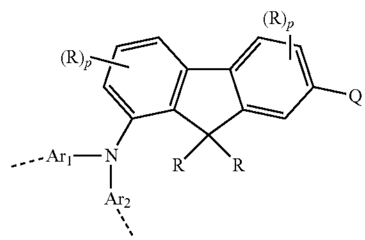
(D5c)
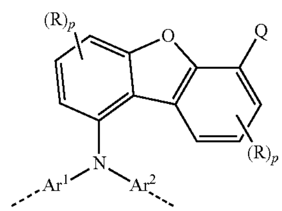
(D6a)
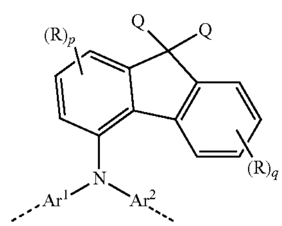
(D6b)
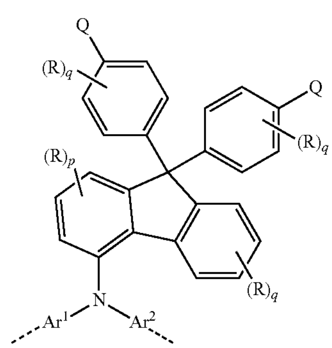
(D6c)
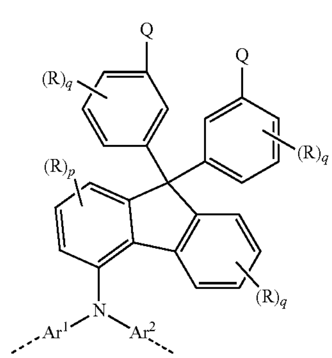

-continued (D6d)

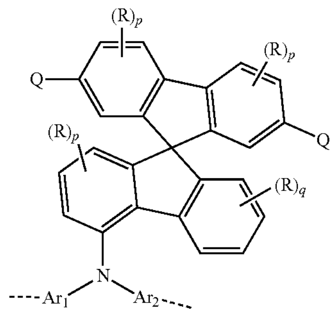

(D7a)

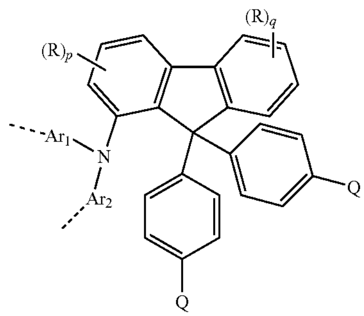

where $Ar^1$, $Ar^2$, R and Q may assume the definitions given above in relation to the formulae (D1) to (D7), is 0, 1 or 2, p is 0, 1, 2 or 3, q is 0, 1, 2, 3 or 4, and r is 0, 1, 2, 3, 4 or 5, the dotted lines represent bonds to adjacent repeat units in the polymer.

In the formulae (D1a) to (D7a), the dotted lines represent possible bonds to the adjacent repeat units in the polymer. If two dotted lines are present in the formulae, the repeat unit has one or two, preferably two, bonds to adjacent repeat units.

Further particularly preferred crosslinkable repeat units D having at least one crosslinkable group Q are the repeat units of the formulae (D8a) to (D16a) shown in the following table:

(D8a)

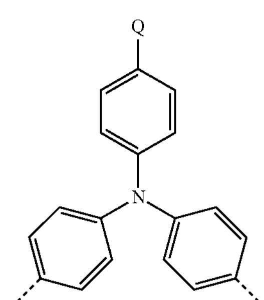

-continued (D8b)

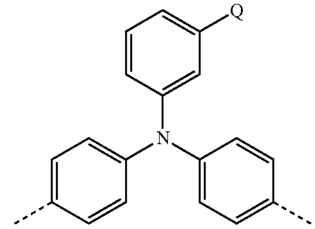

(D9a)

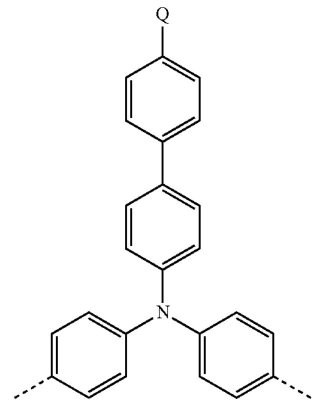

(D9b)

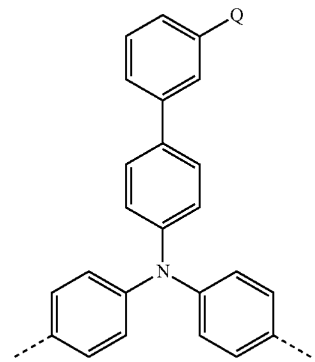

(D10a)

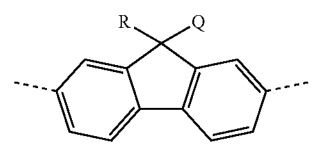

(D11a)

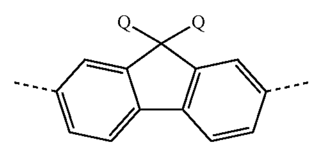

(D12a)

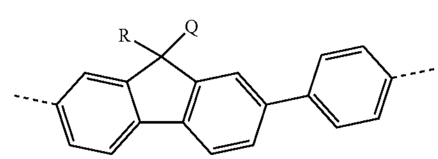

(D13a)

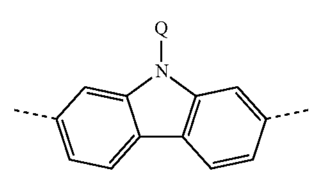

-continued (D14a)

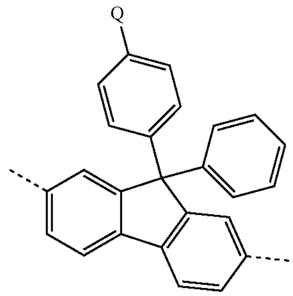

(D14b)

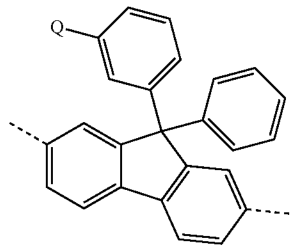

(D15a)

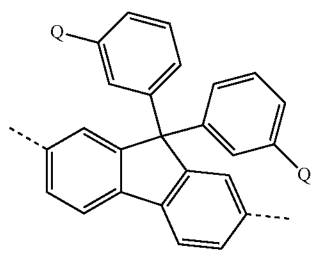

(D15b)

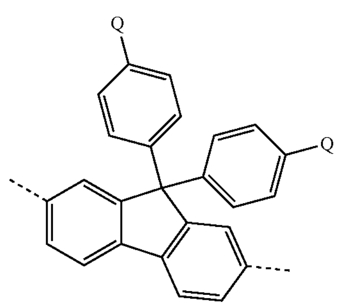

(D16a)

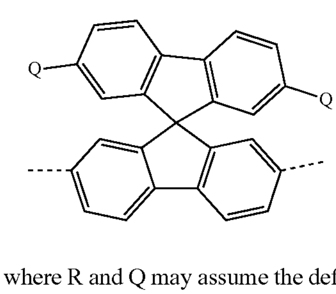

where R and Q may assume the definitions given above in relation to the formulae (D1) to (D7).

A very particularly preferred crosslinkable group D is the repeat unit of the formula (D8a) shown in the table above.

The polymers of the invention containing repeat units of the formula (I), (II), (III), (IIIa), (IIIb), (IIIc), (IV), (V), (Va), (Vb) and/or (Vc) are generally prepared by polymerization of one or more types of monomer, of which at least one monomer leads to repeat units of the formula (I), (II), (III), (IIIa), (IIIb), (IIIc), (IV), (V), (Va), (Vb) and/or (Vc) in the polymer. Suitable polymerization reactions are known to the person skilled in the art and are described in the literature. Particularly suitable and preferred polymerization reactions which lead to C—C and C—N couplings are as follows:

(A) SUZUKI polymerization;
(B) YAMAMOTO polymerization;
(C) STILLE polymerization;
(D) HECK polymerization;
(E) NEGISHI polymerization;
(F) SONOGASHIRA polymerization;
(G) HIYAMA polymerization; and
(H) HARTWIG-BUCHWALD polymerization.

How the polymerization can be conducted by these methods and how the polymers can then be separated from the reaction medium and purified is known to those skilled in the art and is described in detail in the literature, for example in WO 03/048225 A2, WO 2004/037887 A2 and WO 2004/037887 A2.

The C—C couplings are preferably selected from the groups of SUZUKI coupling, YAMAMOTO coupling and STILLE coupling; the C—N coupling is preferably a coupling according to HARTWIG-BUCHWALD.

The present invention thus also provides a process for preparing the polymers of the invention, which is characterized in that they are prepared by SUZUKI polymerization, YAMAMOTO polymerization, STILLE polymerization or HARTWIG-BUCHWALD polymerization.

The synthesis of the polymers of the invention requires the corresponding monomers of the formula (MI)

(MI)

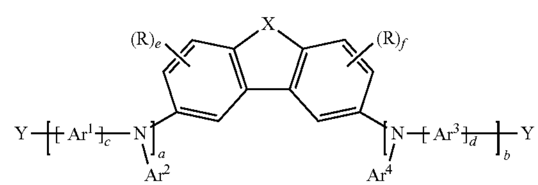

where $Ar^1$, $Ar^2$, $Ar^3$, $Ar^4$, R and X, and a, b, c, d, e and f may assume the definitions given above in relation to the repeat unit of the formula (I).

The monomers of the formula (MI) which lead to repeat units of the formula (I) in the polymers of the invention are compounds which have corresponding substitution and have suitable functionalities at two positions that allow incorporation of this monomer unit into the polymer. These monomers of the formula (MI) thus likewise form part of the subject-matter of the present invention. The Y group is the same or different and is a leaving group suitable for a polymerization reaction, such that the incorporation of the monomer units into polymeric compounds is enabled. Preferably, Y is a chemical functionality which is the same or different and is selected from the class of the halogens, O-tosylates, O-triflates, O-sulfonates, boric esters, partly fluorinated silyl groups, diazonium groups and organotin compounds.

The basic structure of the monomer compounds can be functionalized by standard methods, for example by Friedel-Crafts alkylation or acylation. In addition, the base skeleton can be halogenated by standard methods of organic chemistry. The halogenated compounds can optionally be converted further in additional functionalization steps. For example, the halogenated compounds can be used either directly or after conversion to a boronic acid derivative or an organotin derivative as starting materials for the conversion to polymers, oligomers or dendrimers.

Said methods are merely a selection from the reactions known to those skilled in the art, who are able to use these, without exercising inventive skill, to synthesize the inventive compounds.

The polymers of the invention can be used as a neat substance, or else as a mixture together with any further polymeric, oligomeric, dendritic or low molecular weight substances. A low molecular weight substance is understood in the present invention to mean compounds having a molecular weight in the range from 100 to 3000 g/mol, preferably 200 to 2000 g/mol. These further substances can, for example, improve the electronic properties or emit themselves. A mixture refers above and below to a mixture comprising at least one polymeric component. In this way, it is possible to produce one or more polymer layers consisting of a mixture (blend) of one or more polymers of the invention having a repeat unit of the formula (I), (II), (III), (IIIa), (IIIb), (IIIc), (IV), (V), (Va), (Vb) and/or (Vc) and optionally one or more further polymers with one or more low molecular weight substances.

The present invention thus further provides a polymer blend comprising one or more polymers of the invention, and one or more further polymeric, oligomeric, dendritic and/or low molecular weight substances.

The invention further provides solutions and formulations composed of one or more polymers of the invention or a polymer blend in one or more solvents. The way in which such solutions can be prepared is known to those skilled in the art and is described, for example, in WO 02/072714 A1, WO 03/019694 A2 and the literature cited therein.

These solutions can be used in order to produce thin polymer layers, for example by surface coating methods (e.g. spin-coating) or by printing methods (e.g. inkjet printing).

Polymers containing repeat units having a crosslinkable group Q are particularly suitable for producing films or coatings, especially for producing structured coatings, for example by thermal or light-induced in situ polymerization and in situ crosslinking, for example in situ UV photopolymerization or photopatterning. It is possible here to use either corresponding polymers in pure form or else formulations or mixtures of these polymers as described above. These can be used with or without addition of solvents and/or binders. Suitable materials, processes and apparatuses for the above-described methods are described, for example, in WO 2005/083812 A2. Possible binders are, for example, polystyrene, polycarbonate, poly(meth)acrylates, polyacrylates, polyvinyl butyral and similar optoelectronically neutral polymers.

Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The present invention thus further provides for the use of a polymer containing repeat units having a crosslinkable group Q for preparation of a crosslinked polymer. The crosslinkable group, which is more preferably a vinyl group or alkenyl group, is preferably incorporated into the polymer by the WITTIG reaction or a WITTIG-like reaction. If the crosslinkable group is a vinyl group or alkenyl group, the crosslinking can take place via free-radical or ionic polymerization, which can be induced thermally or by radiation. Preference is given to free-radical polymerization which is induced thermally, preferably at temperatures of less than 250° C., more preferably at temperatures of less than 230° C.

Optionally, during the crosslinking process, an additional styrene monomer is added in order to achieve a higher degree of crosslinking. Preferably, the proportion of the added styrene monomer is in the range from 0.01 to 50 mol %, more preferably 0.1 to 30 mol %, based on 100 mol % of all the copolymerized monomers present as repeat units in the polymer.

The present invention thus also provides a process for preparing a crosslinked polymer, comprising the following steps:

(a) providing polymers containing repeat units having one or more crosslinkable groups Q; and
(b) free-radical or ionic crosslinking, preferably free-radical crosslinking, which can be induced either thermally or by radiation, preferably thermally.

The crosslinked polymers prepared by the process of the invention are insoluble in all standard solvents. In this way, it is possible to produce defined layer thicknesses which are not dissolved or partly dissolved again even by the application of subsequent layers.

The present invention thus also relates to a crosslinked polymer obtainable by the aforementioned process. The crosslinked polymer is—as described above—preferably produced in the form of a crosslinked polymer layer. Because of the insolubility of the crosslinked polymer in all solvents, a further layer can be applied from a solvent to the surface of such a crosslinked polymer layer by the above-described techniques.

The present invention also encompasses what are called hybrid devices in which one or more layers which are processed from solution and layers which are produced by vapor deposition of low molecular weight substances may occur.

The polymers of the invention can be used in electronic or optoelectronic devices or for production thereof.

The present invention thus further provides for the use of the polymers of the invention in electronic or optoelectronic devices, preferably in organic electroluminescent devices (OLEDs), organic field-effect transistors (OFETs), organic integrated circuits (O-ICs), organic thin-film transistors (TFTs), organic solar cells (O-SCs), organic laser diodes (O-laser), organic photovoltaic (OPV) elements or devices or organic photoreceptors (OPCs), more preferably in organic electroluminescent devices (OLEDs).

In the case of the aforementioned hybrid device, in conjunction with organic electroluminescent devices, reference is made to combined PLED/SMOLED (polymeric light-emitting diode/small molecule organic light-emitting diode) systems.

The way in which OLEDs can be produced is known to those skilled in the art and is described in detail, for example, as a general process in WO 2004/070772 A2, which has to be adapted appropriately to the individual case.

As described above, the polymers of the invention are very particularly suitable as electroluminescent materials in OLEDs or displays produced in this way.

Electroluminescent materials in the context of the present invention are considered to mean materials which can find use as the active layer. “Active layer” means that the layer is capable of emitting light on application of an electrical field (light-emitting layer) and/or that it improves the injection and/or transport of the positive and/or negative charges (charge injection or charge transport layer).

The present invention therefore preferably also provides for the use of the polymers of the invention in OLEDs, especially as electroluminescent material.

The present invention further provides electronic or optoelectronic components, preferably organic electroluminescent devices (OLEDs), organic field-effect transistors (OFETs), organic integrated circuits (O-ICs), organic thin-film transistors (TFTs), organic solar cells (O-SCs), organic laser diodes (O-laser), organic photovoltaic (OPV) elements or devices and organic photoreceptors (OPCs), more preferably organic electroluminescent devices, having one or more active layers, wherein at least one of these active layers comprises one or more polymers of the invention. The active layer may, for example, be a light-emitting layer, a charge transport layer and/or a charge injection layer.

In the present application text and also in the examples that follow hereinafter, the main aim is the use of the polymers of the invention in relation to OLEDs and corresponding displays. In spite of this restriction of the description, it is possible for the person skilled in the art, without exercising further inventive skill, to utilize the polymers of the invention as semiconductors for the further above-described uses in other electronic devices as well.

The examples which follow are intended to illustrate the invention without restricting it. More particularly, the features, properties and advantages that are described therein for the defined compounds that form the basis of the example in question are also applicable to other compounds that are not referred to in detail but are covered by the scope of protection of the claims, unless the opposite is stated elsewhere.

WORKING EXAMPLES

Part A: Synthesis of the Monomers

All syntheses are conducted in an argon atmosphere and in dry solvents, unless stated otherwise.

The monomers are synthesized using the following starting materials that are known from the literature:

a) Substituted 3,6-dibromocarbazoles

A1

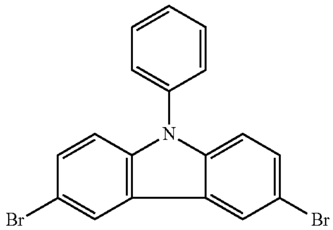

CAS-57103-20-5

-continued

A4

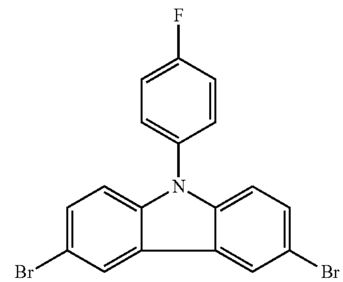

CAS-915379-37-2

A6

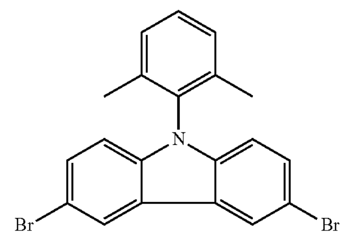

CAS-1092807-69-6

A8

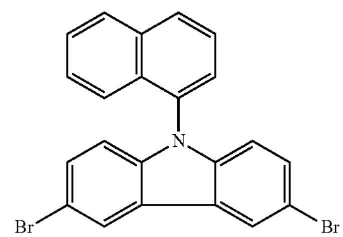

CAS-929103-28-6

A9

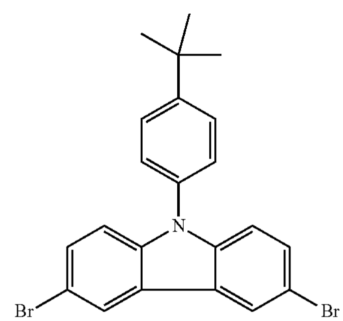

CAS-741293-42-5

A12

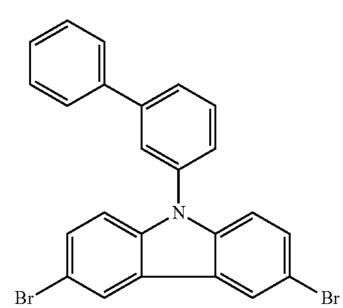

CAS-1221237-88-2

-continued
A15
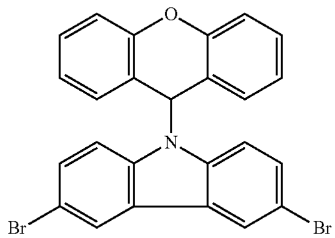
CAS-141663-09-4
A16
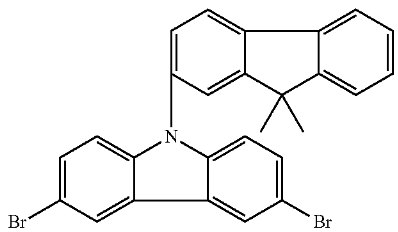
CAS-866100-17-6
A20
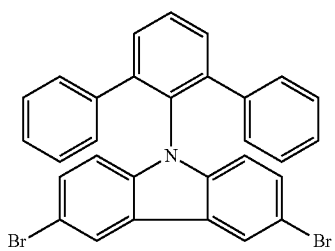
CAS-1786404-02-1
A21
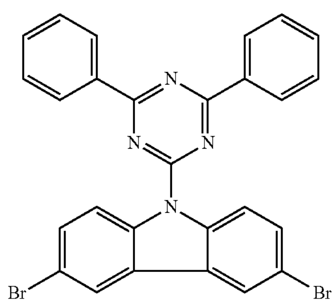
CAS-1065520-40-2
A25
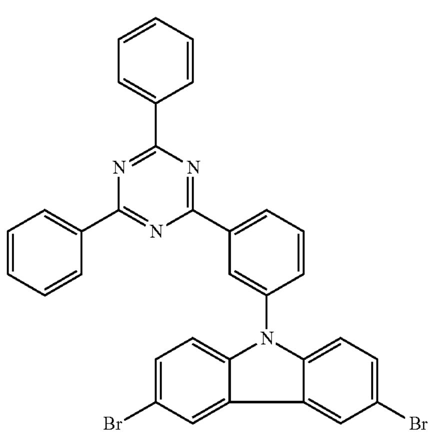
CAS-1383666-78-1
b) Substituted 3,6-dibromofluorenes
C1
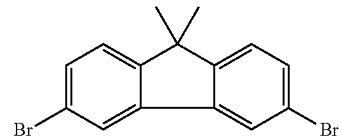
CAS-865702-19-8
C2
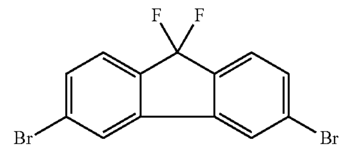
CAS-1644304-04-0
C3
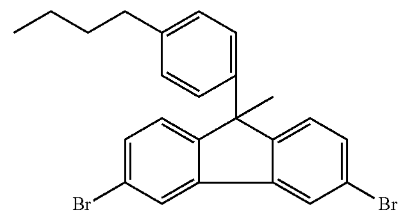
CAS-1610951-55-7
C4
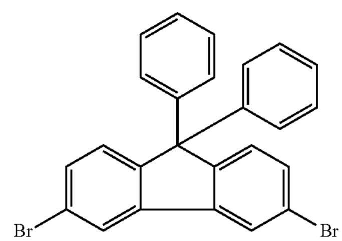
CAS-1319162-41-8
C7
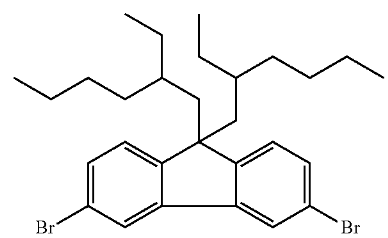
CAS-1043923-80-3
c) Dibromodibenzofurans and dibromodibenzothiophenes
D1
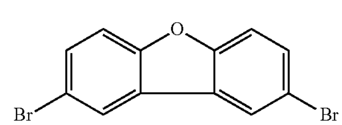
CAS-10016-52-1

-continued

D2

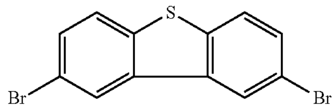

CAS-31574-87-5

D4

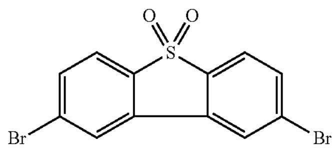

CAS-40307-15-1

D11

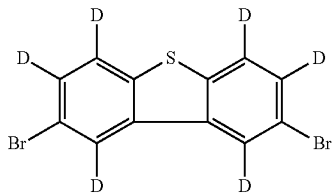

CAS-1910057-41-8 d) Secondary Amines

B1

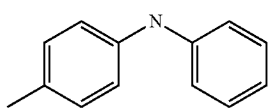

CAS-620-84-8

B2

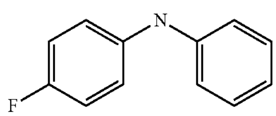

CAS-330-83-6

B5

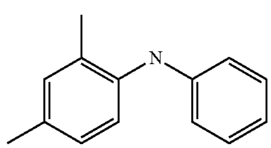

CAS-25078-04-0

B9

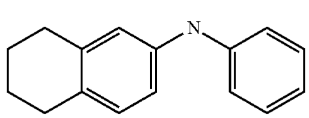

CAS-178477-21-9

B13

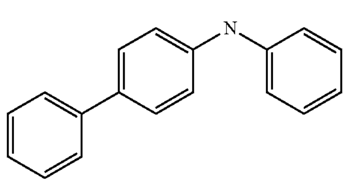

CAS-32228-99-2

-continued

B14

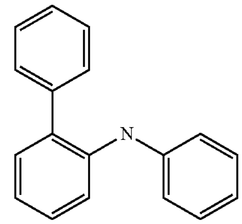

CAS-35887-50-4

Example 1

Synthesis of Monomer Mon-1

1st Step: Synthesis of the Precursor

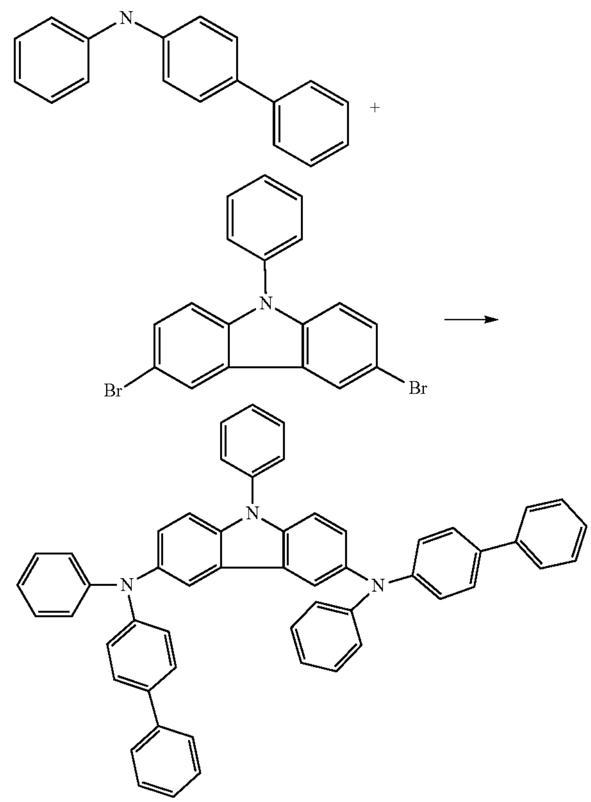

To a mixture of 36.7 g (150 mmol) of biphenyl-4-ylphenylamine, 30 g (74.8 mmol, 0.5 eq) of 3,6-dibromo-9-phenylcarbazole, 0.84 g of palladium acetate (3.74 mmol, 0.025 eq), 43.1 g of sodium tert-butoxide (449 mmol, 3 eq) and 7.5 ml of tri-tert-butylphosphine (7.5 mmol, 0.05 eq) is added 600 ml of dried toluene, and the mixture is inertized and boiled under reflux (110° C.) for 2 days. The reaction solution is cooled down and diluted with water, and the organic phase is separated off. The solvent is removed under a gentle vacuum, and the residue is purified by hot extraction over neutral alumina with cyclohexane as eluent. The residue is filtered off and dried under reduced pressure. 38.5 g (71% yield) of a colorless powder is obtained.

2nd Step: Synthesis of Monomer Mon-1-Br

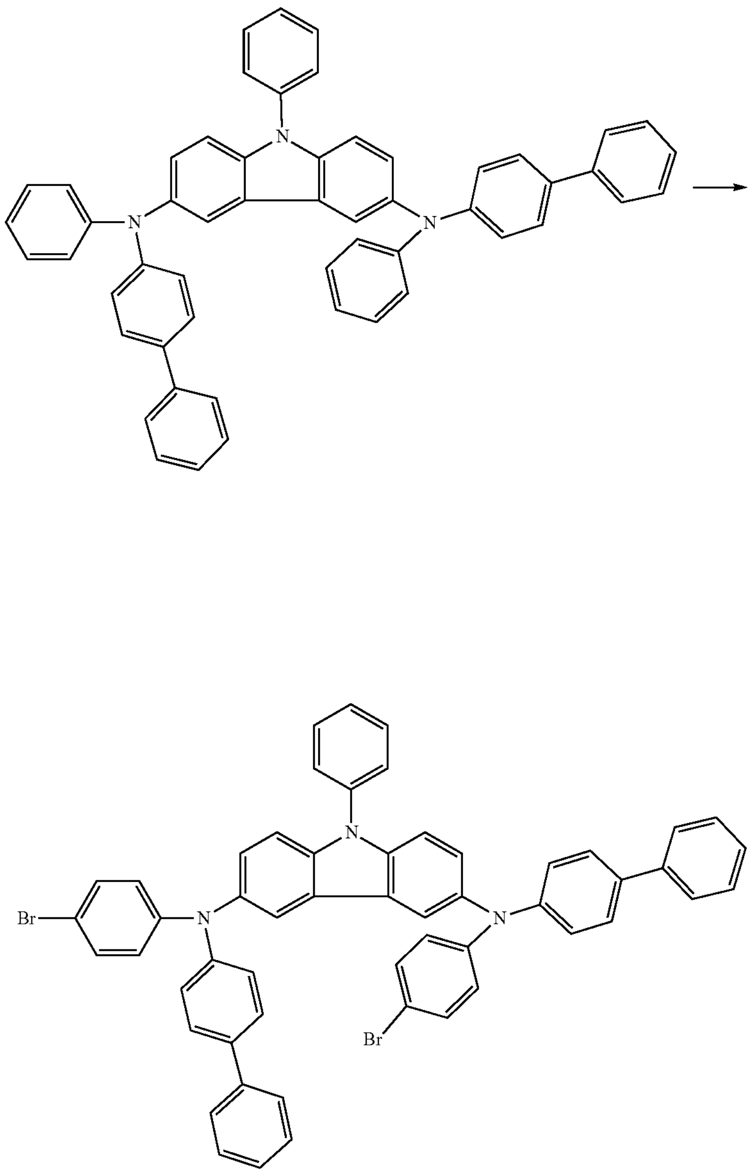

To an initial charge of 38.5 g (52.7 mmol) of N,N'-bis (biphenyl-4-yl)-9,N,N'-triphenyl-9H-carbazole-3,6-diamine in a 1000 ml flask is added 850 ml of dichloromethane. The solution is cooled down to internal temperature 0° C. by cooling with ice, and 18.78 g (105.5 mmol, 2 eq) of N-bromosuccinimide is added gradually. After the addition, the ice bath is removed, and the mixture is allowed to warm up to room temperature. The solvent is removed under reduced pressure, and the solids are filtered off and washed thoroughly with water. The residue is recrystallized first from ethyl acetate, then from toluene. 8.5 g (9.58 mmol, 18% yield) of a colorless powder having a purity of 99% is obtained.

3rd Step: Synthesis of Monomer Mon-1-Bo

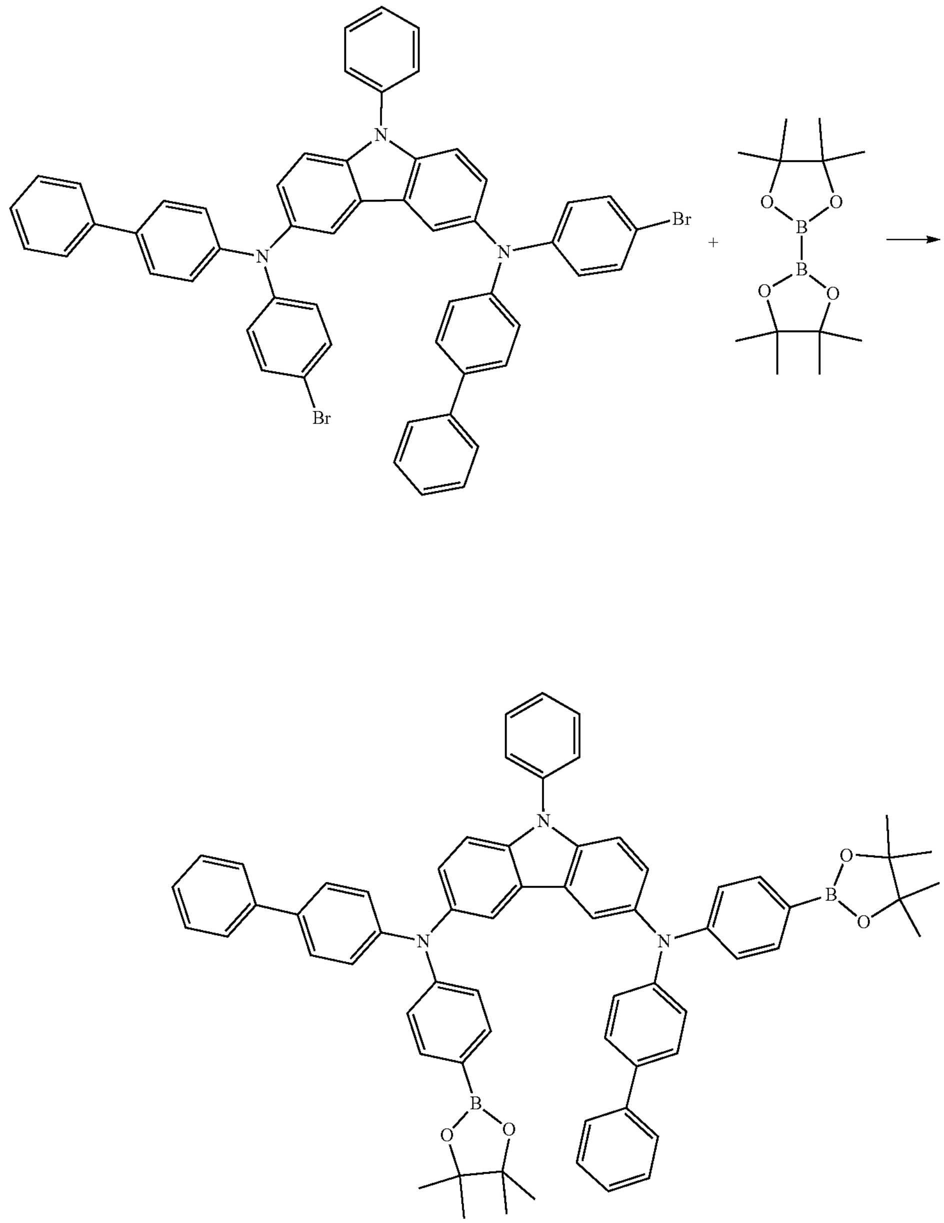

50 g of N'-bis(4-bromophenyl)-9-phenyl-N,N'-diphenyl-9H-carbazole-3,6-diamine (A1:B2:Br) (65.5 mmol), 54 g of 4,4,5,5,4',4',5',5'-octamethyl-[2,2']bi[[1,3,2]dioxaborolanyl] (212.8 mmol, 3.25 eq, CAS: 73183-34-3), 1.64 g of 1,1-bis (diphenylphosphino)ferrocenedichoropalladium (II) (2.01 mmol, 0.25 eq, CAS: 72287-26-4) and 25.7 g of potassium acetate (261.9 mmol, 4 eq) are weighed out in a 2 liter 4-neck flask with reflux condenser, precision glass stirrer, argon blanketing and internal thermometer, and 1300 ml of anhydrous THE is added. After the apparatus has been fully degassed, the mixture is boiled under reflux for 3 days, and then the reaction mixture is allowed to cool down. The solvent is removed under reduced pressure, and the solids are recrystallized repeatedly from ethyl acetate and then from toluene. 43.21 g (50.38 mmol, 77% of theory) of a colorless powder is obtained.

The following monomers can be prepared analogously to example 1:

A1:B1:BOR
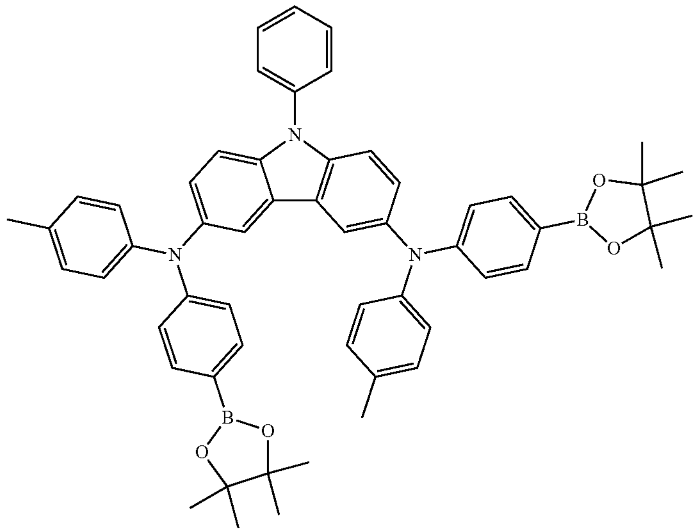
A1:B2:BOR
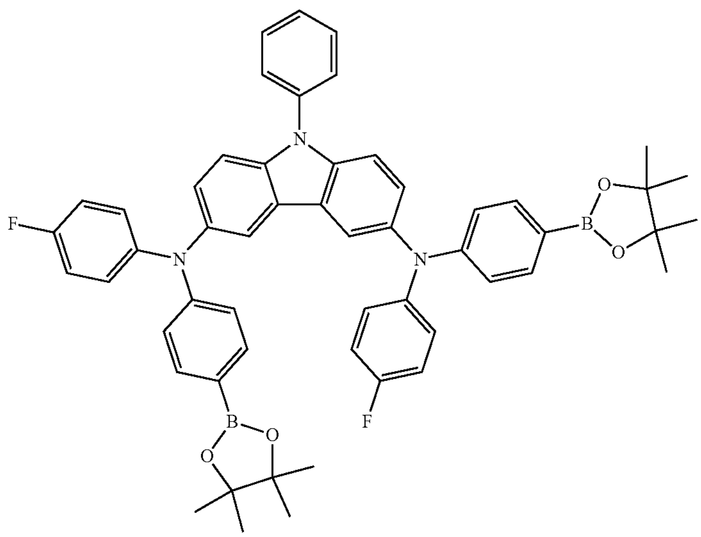
A1:B5:BOR
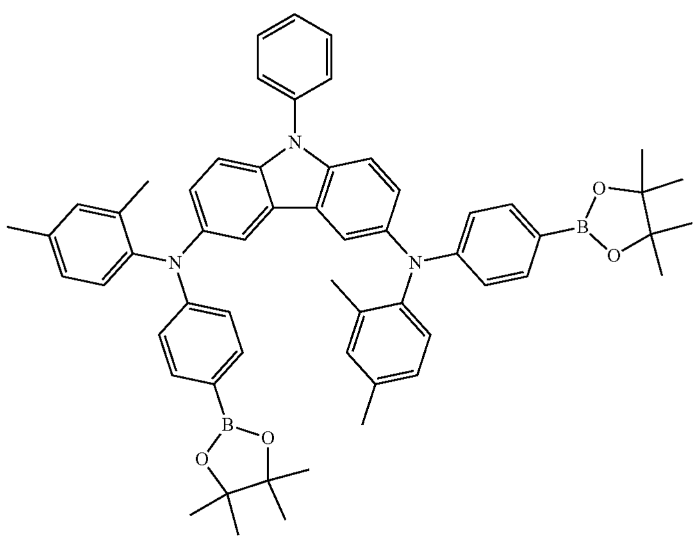

-continued
A1:B9:BOR
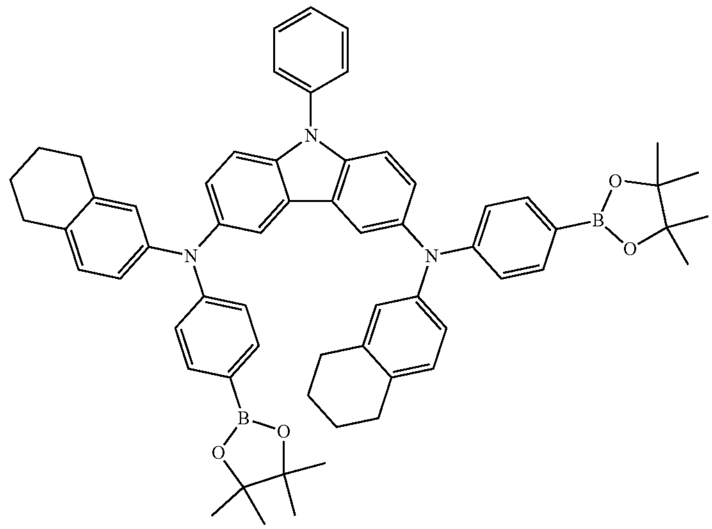
A1:B13:BOR
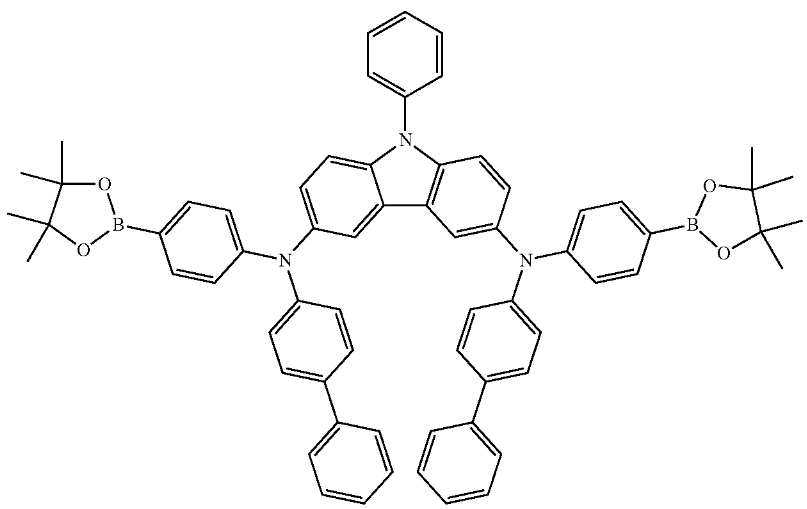
A1:B14:BOR
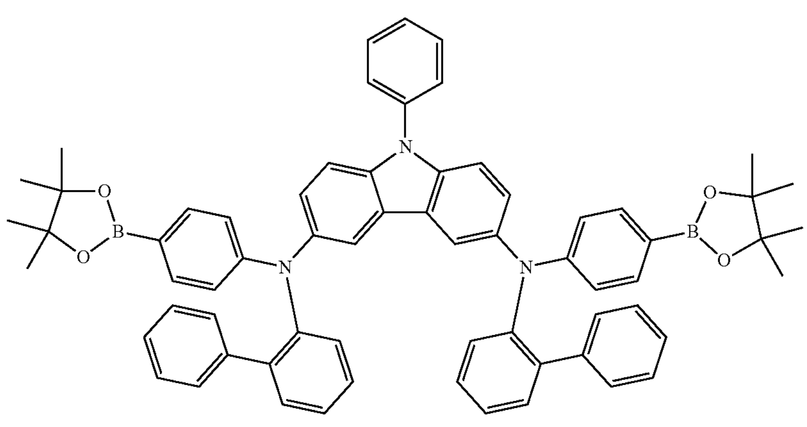

-continued
A4:B1:BOR
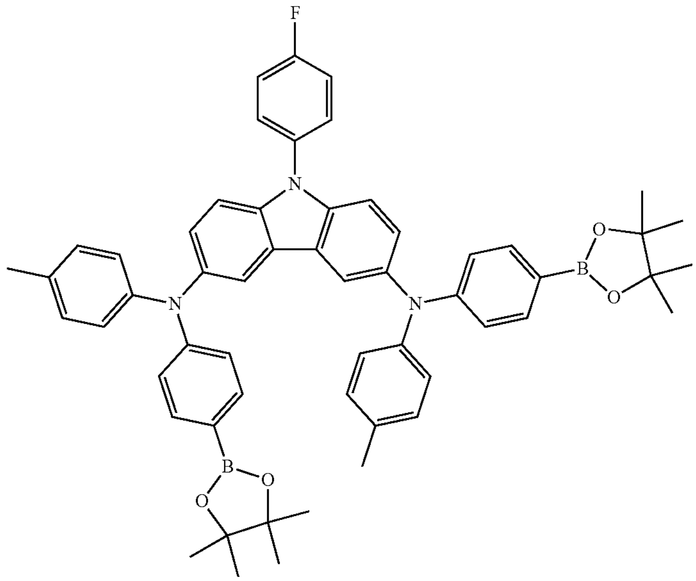
A4:B2:BOR
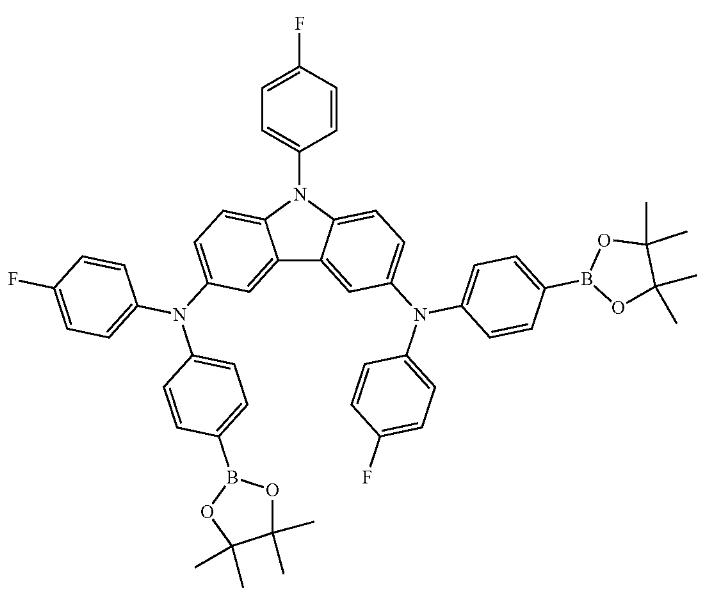

-continued
A4:B5:BOR
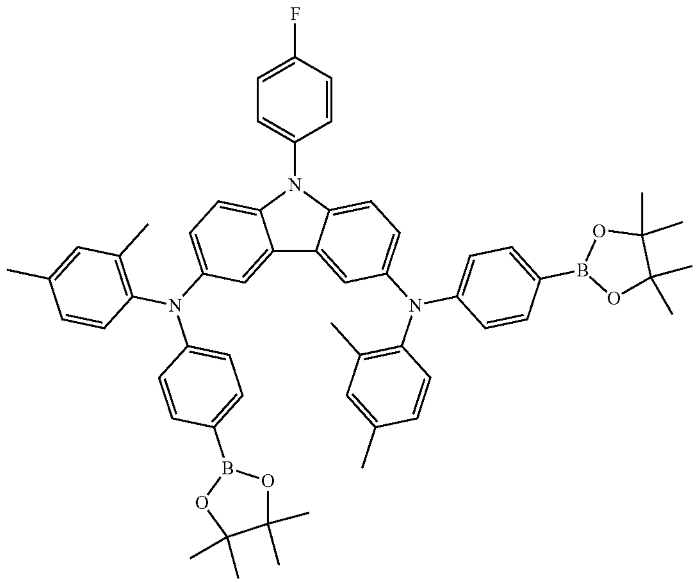
A4:B9:BOR
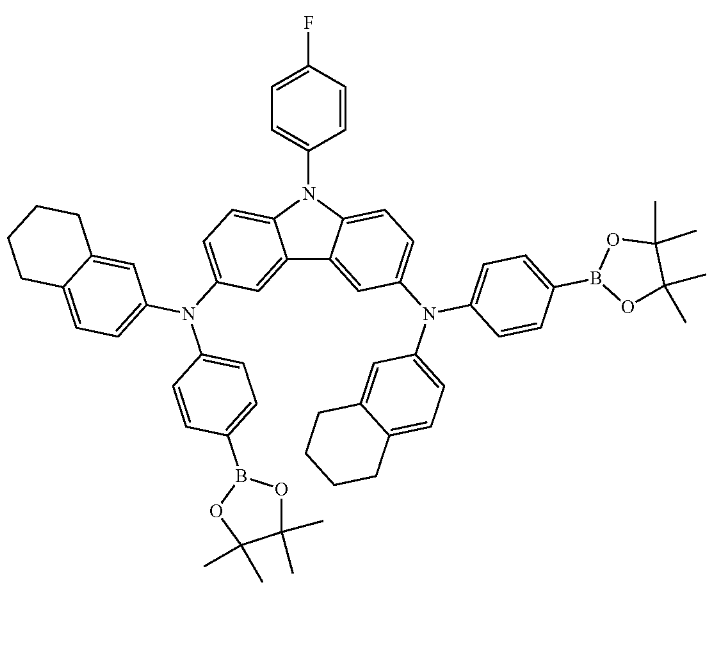

-continued
A4:B13:BOR
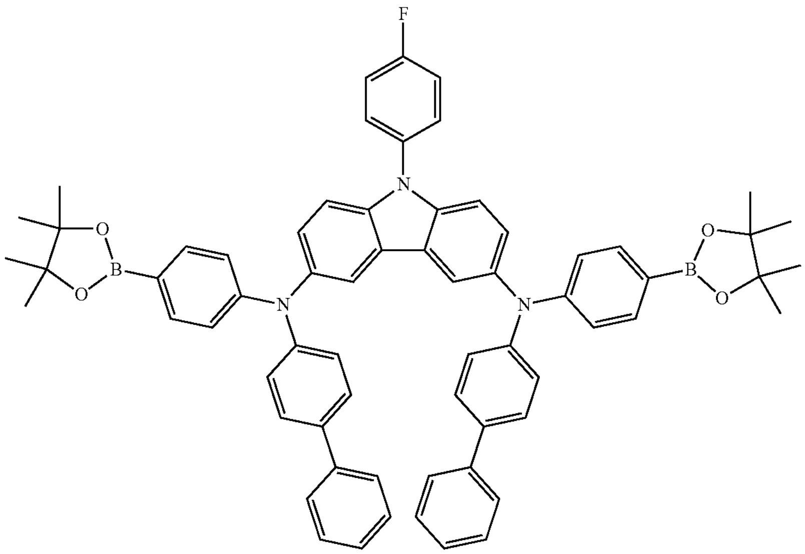
A4:B14:BOR
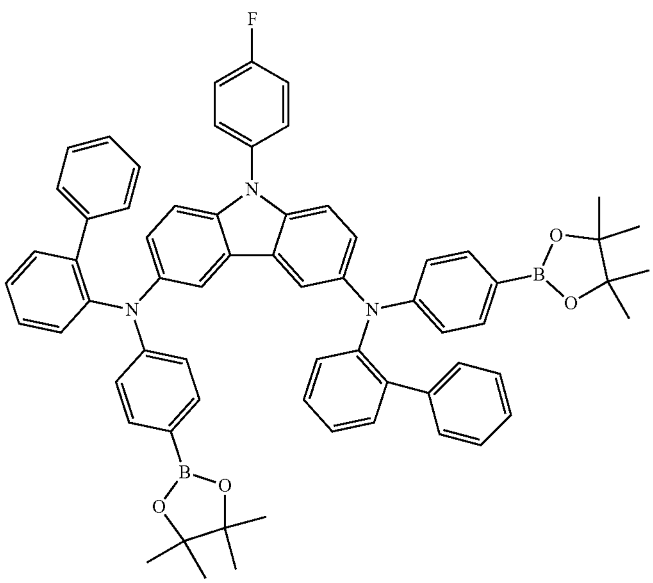
A6:B1:BOR
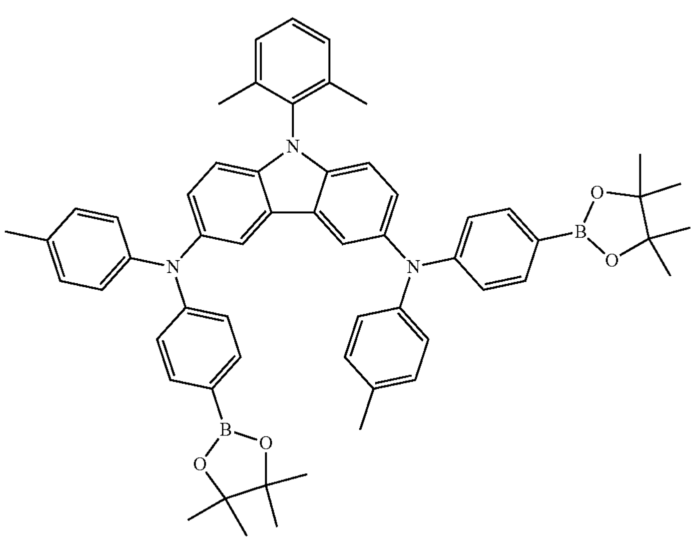

-continued
A6:B2:BOR
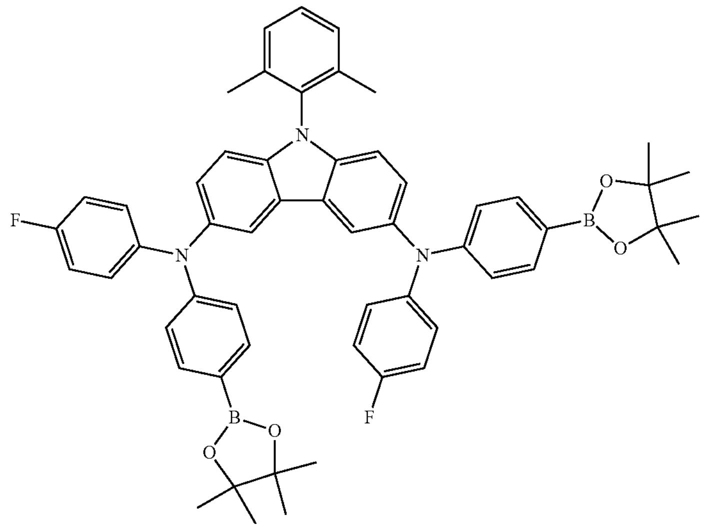
A6:B9:BOR
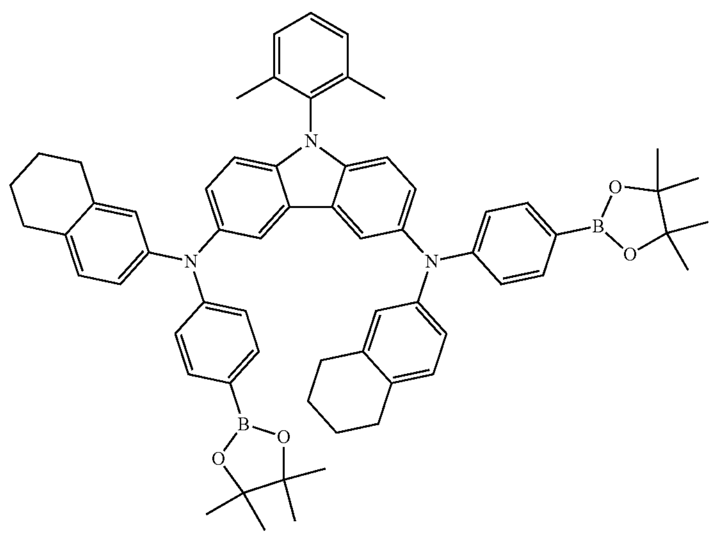
A6:B13:BOR
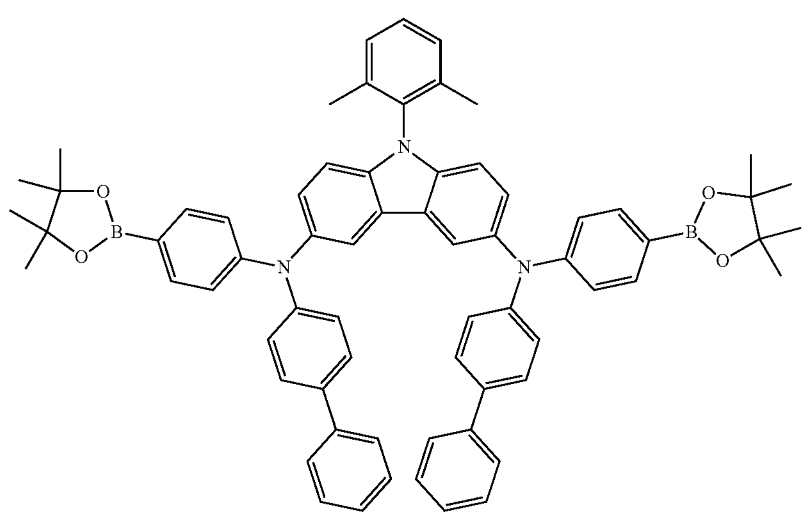

-continued
A6:B5:BOR
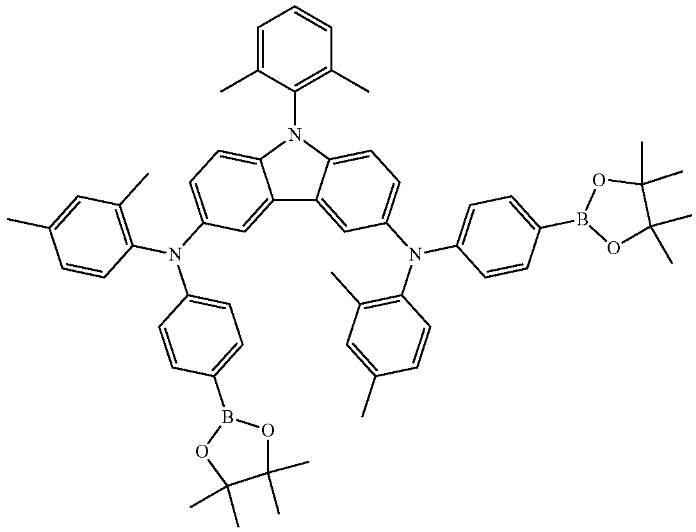
A6:B14:BOR
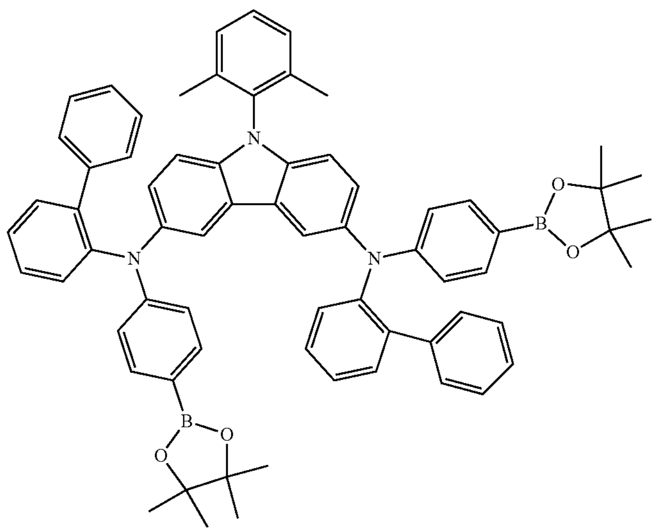
A8:B5:BOR
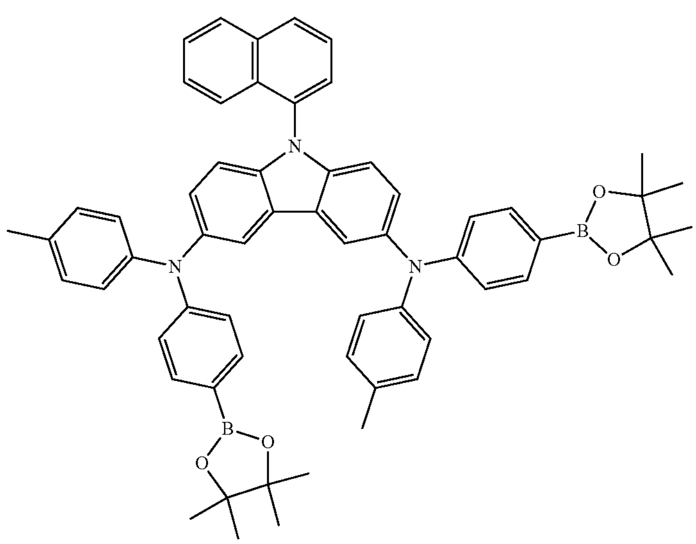

-continued
A8:B2:BOR
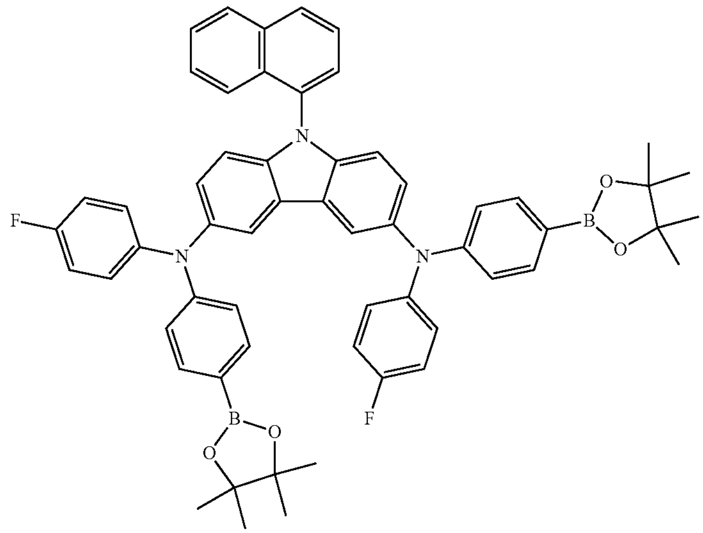
A8:B9:BOR
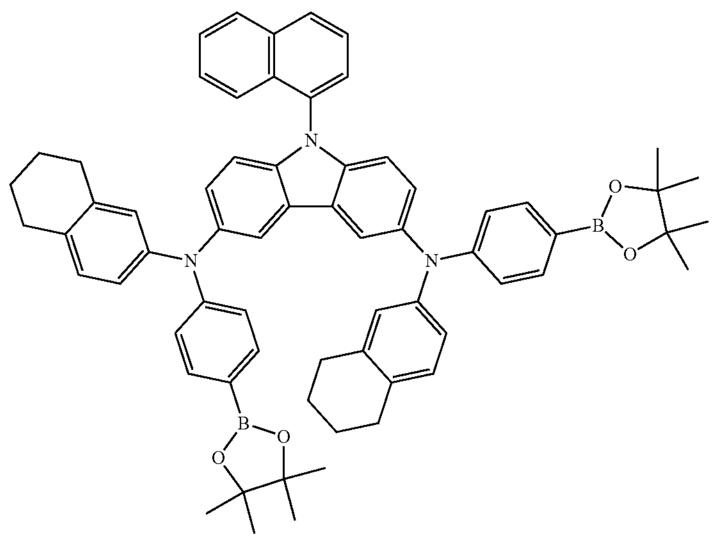
A8:B13:BOR
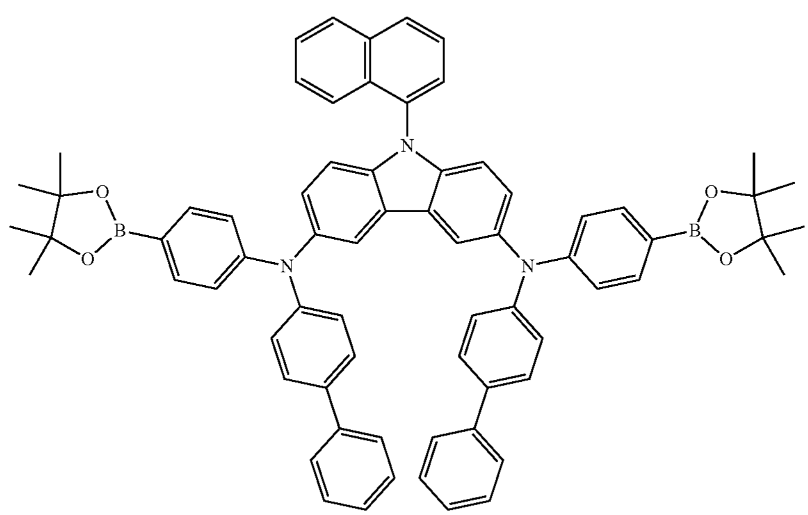

-continued
A8:B5:BOR
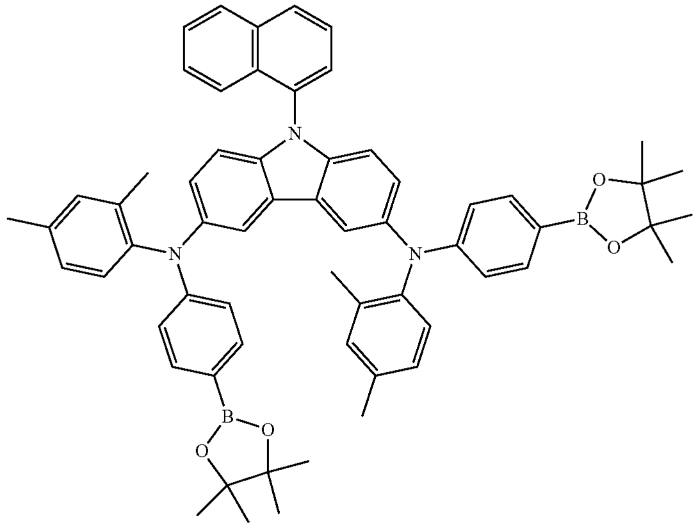
A8:B14:BOR
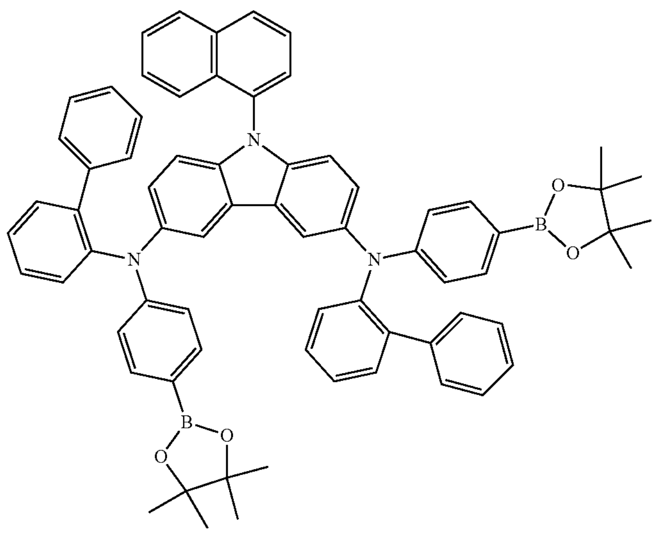
A9:B1:BOR
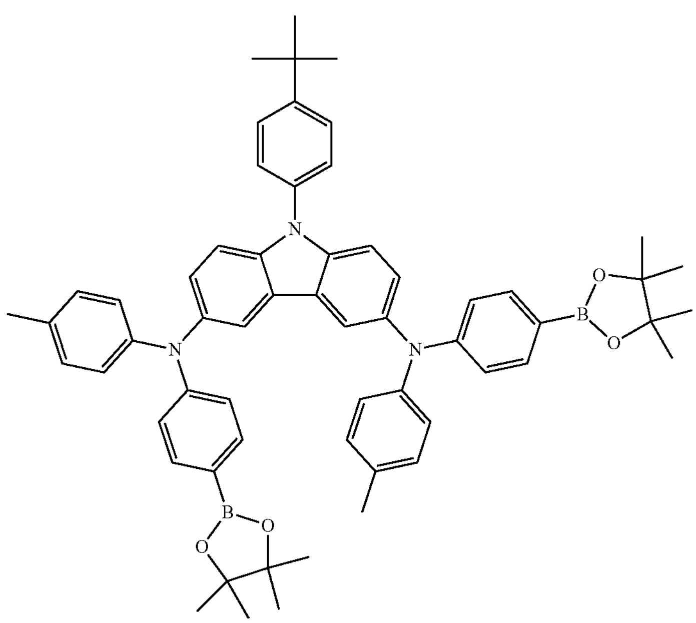

-continued
A9:B2:BOR
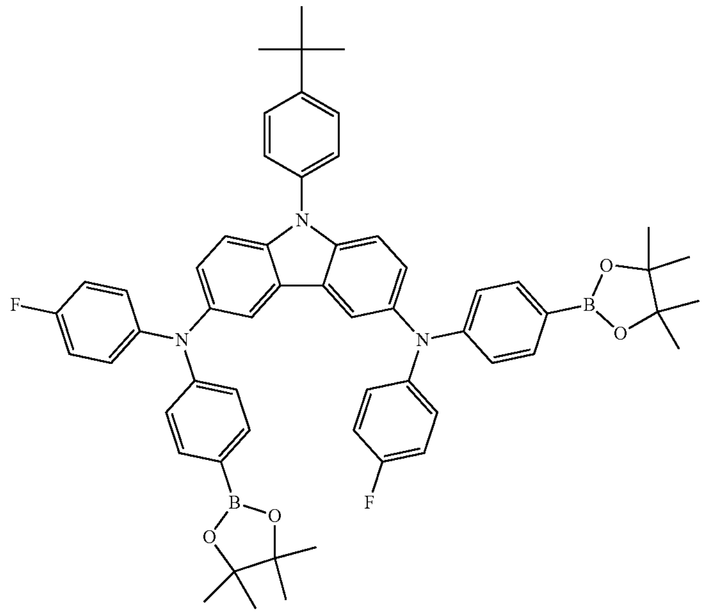
A9:B5:BOR
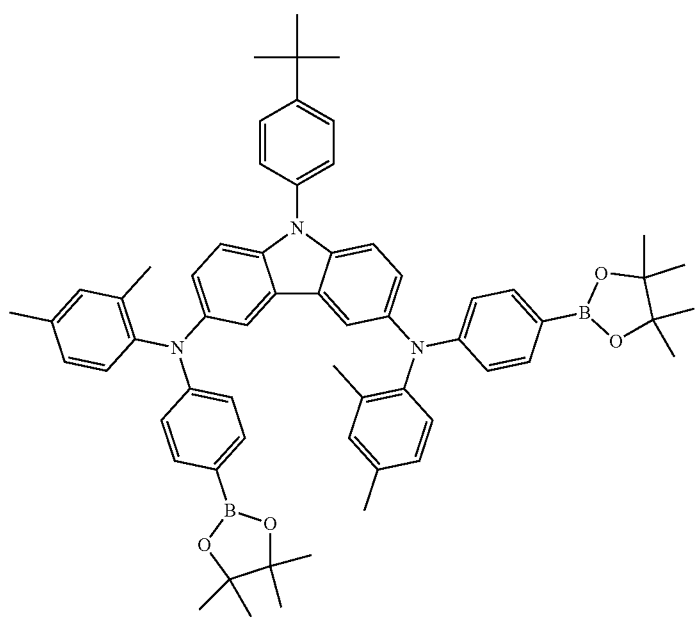

-continued
A9:B9:BOR
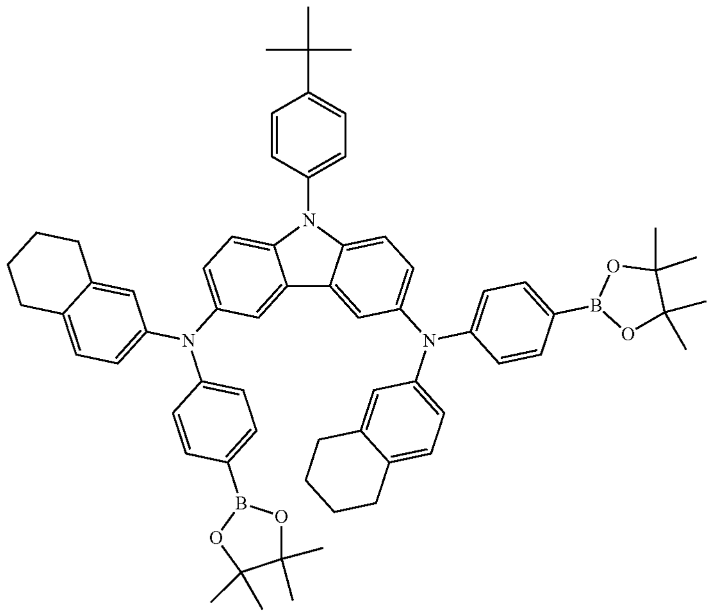
A9:B13:BOR
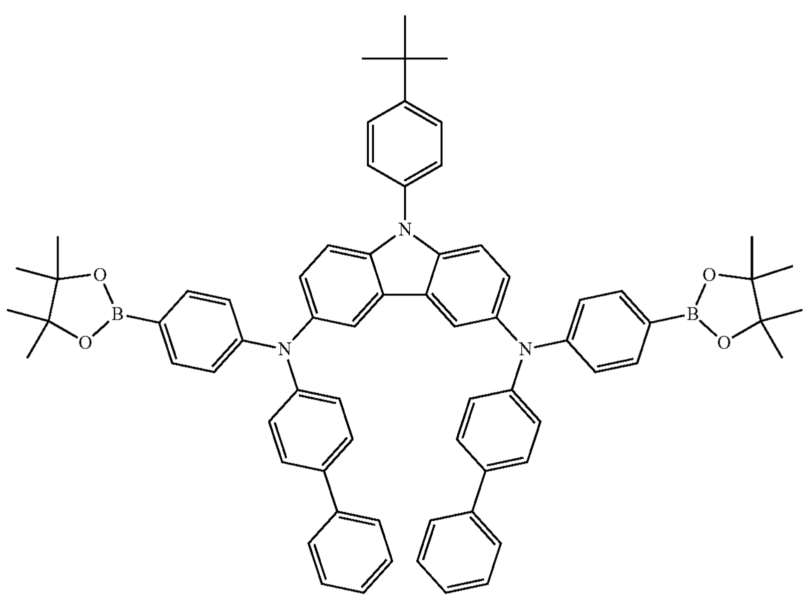

-continued
A9:B14:BOR
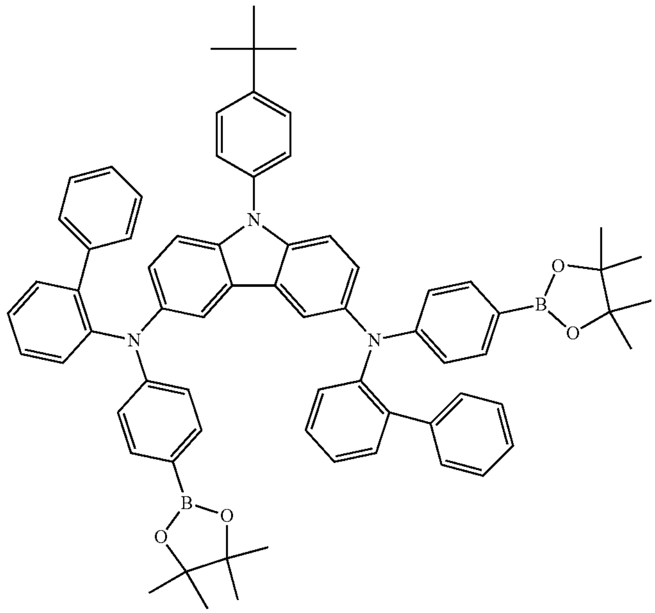
A12:B1:BOR
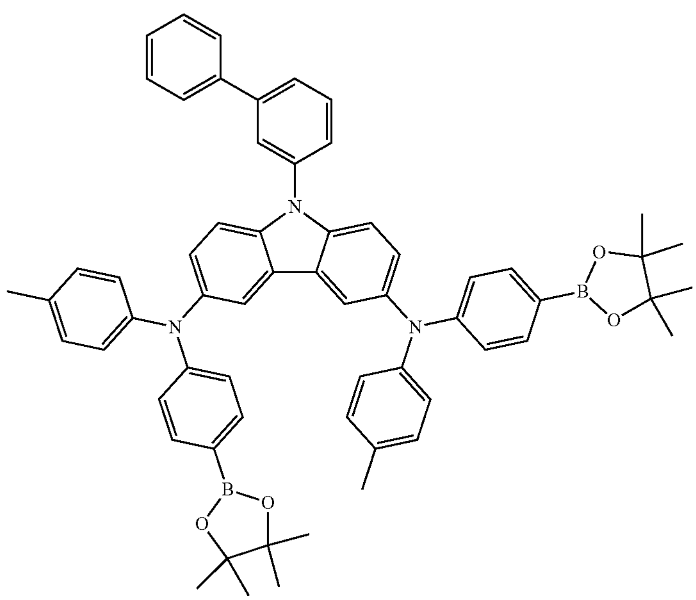

-continued
A12:B2:BOR
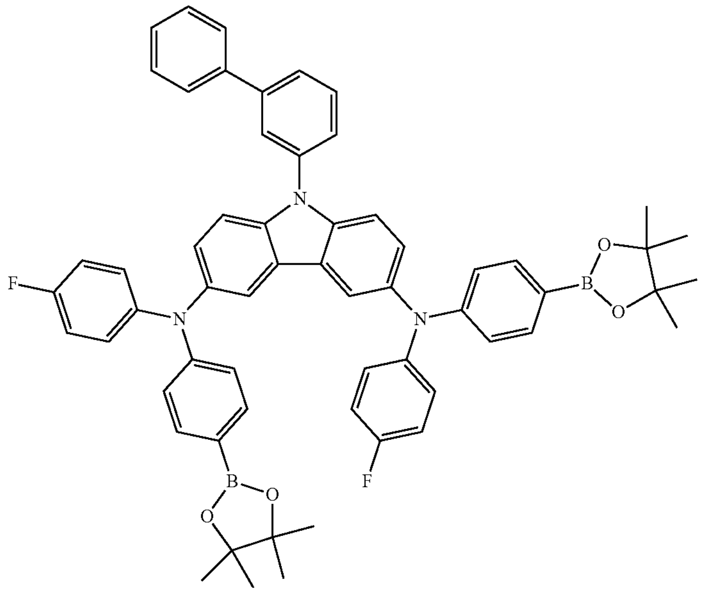
A12:B5:BOR
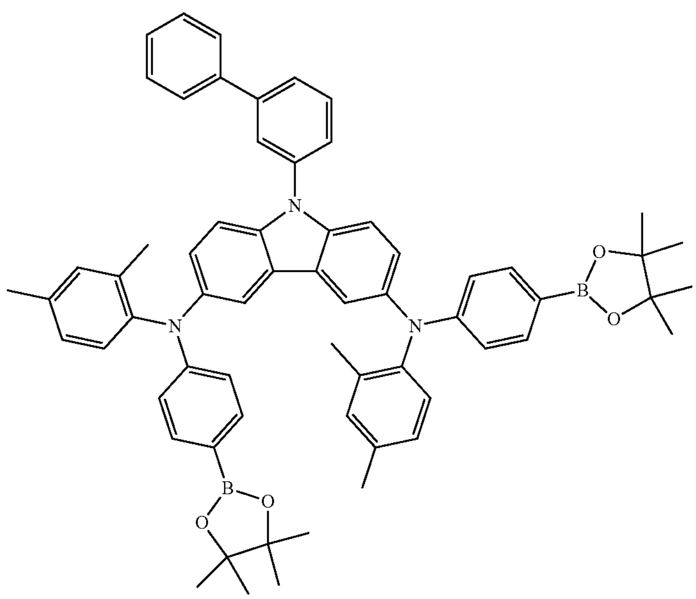

-continued
A12:B9:BOR
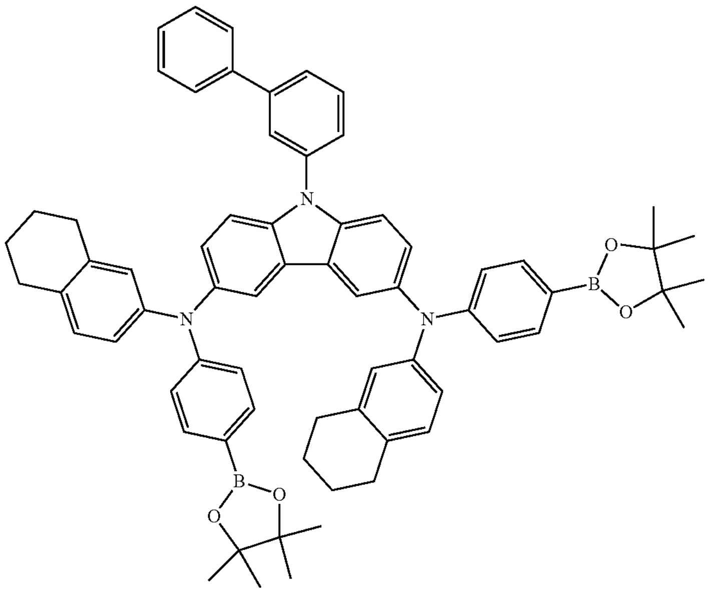
A12:B13:BOR
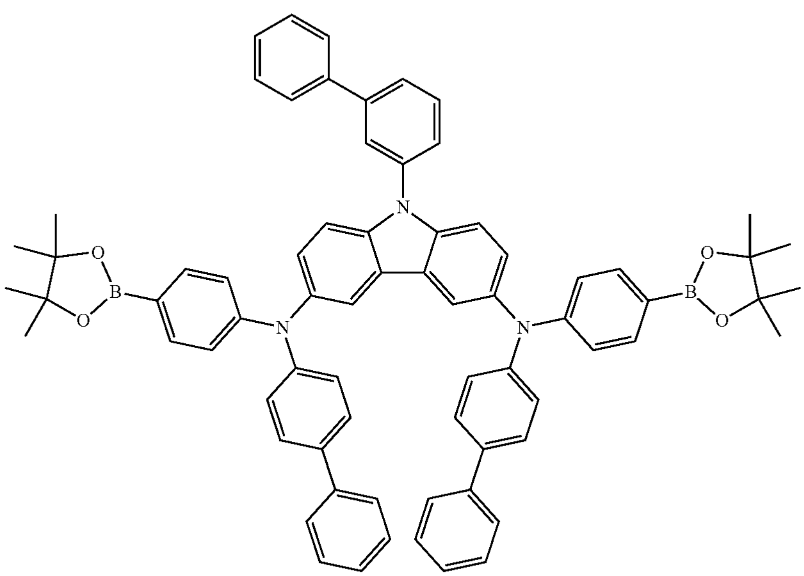

-continued
A12:B14:BOR
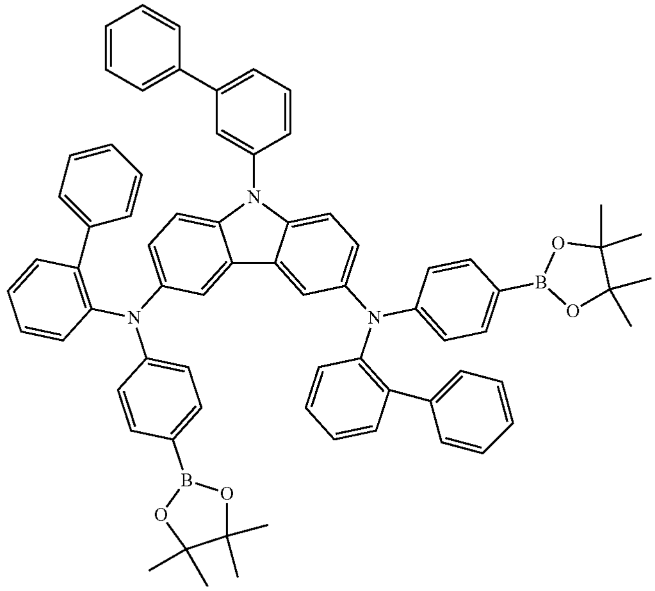
A15:B1:BOR
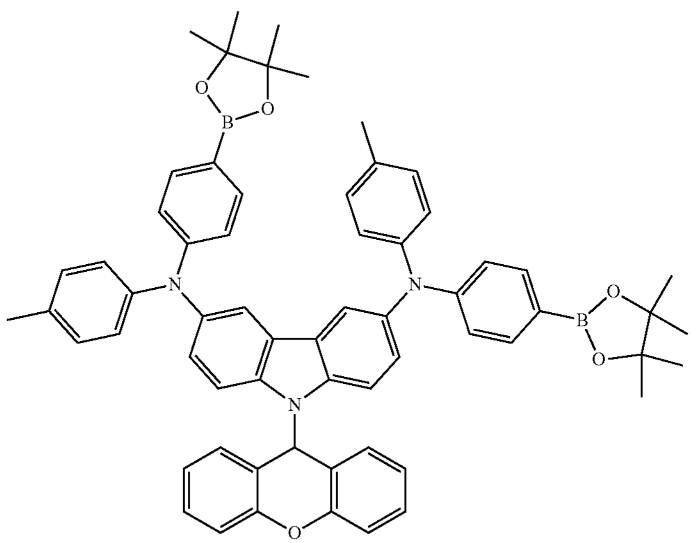
A15:B2:BOR
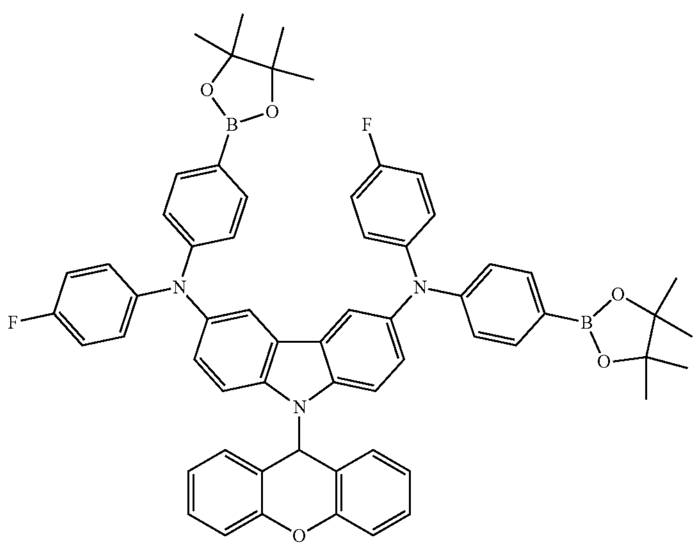

-continued
A15:B5:BOR
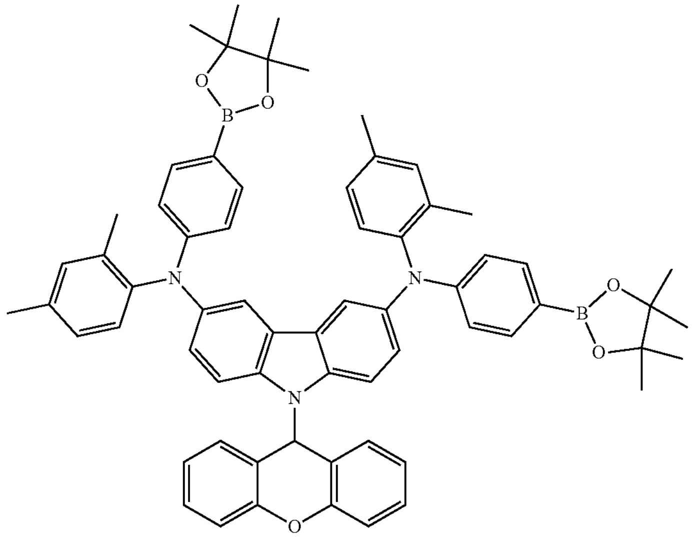
A15:B9:BOR
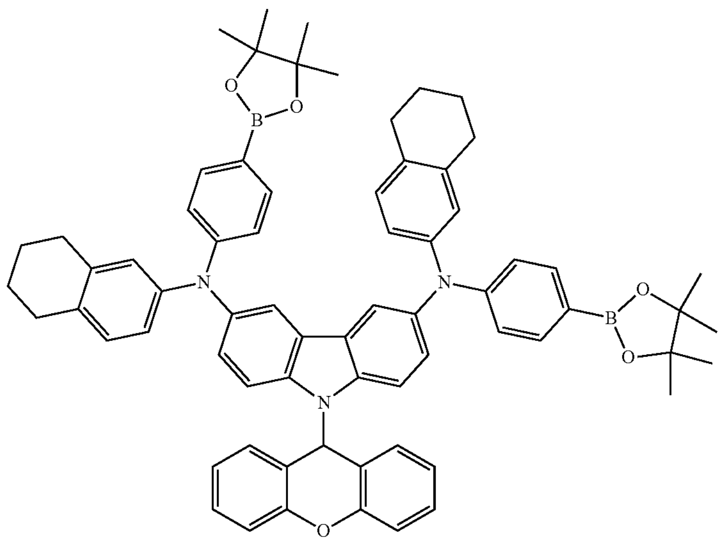
A15:B13:BOR
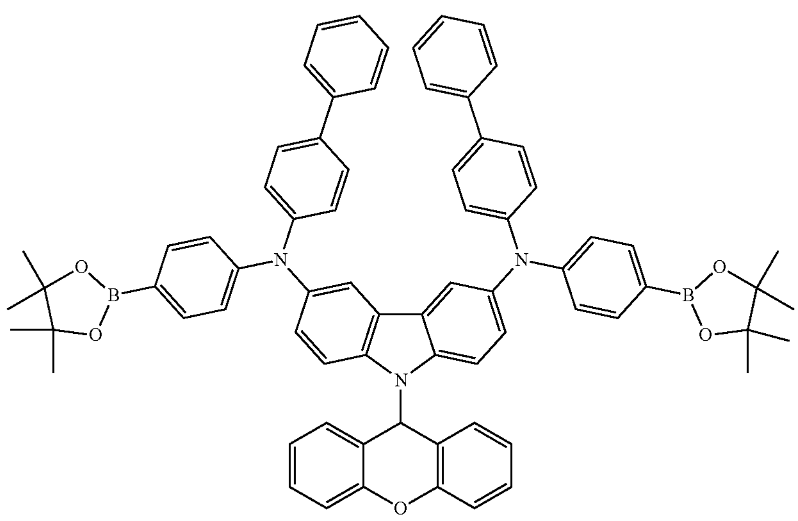

-continued
A15:B14:BOR
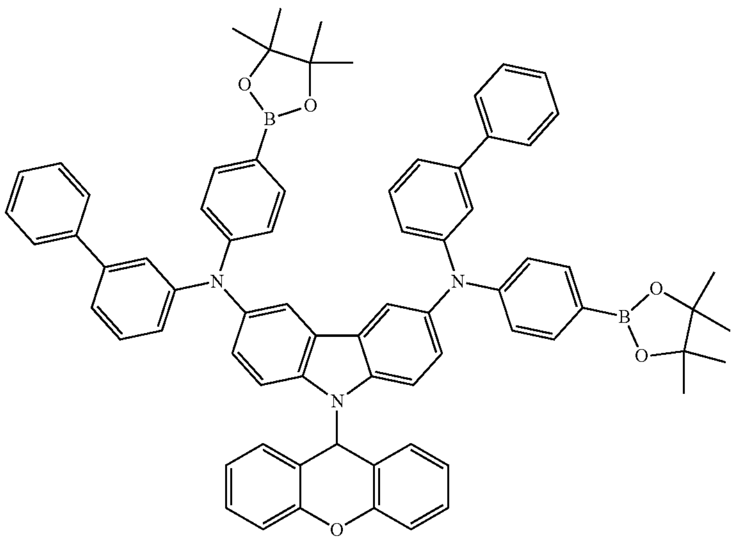
A16:B1:BOR
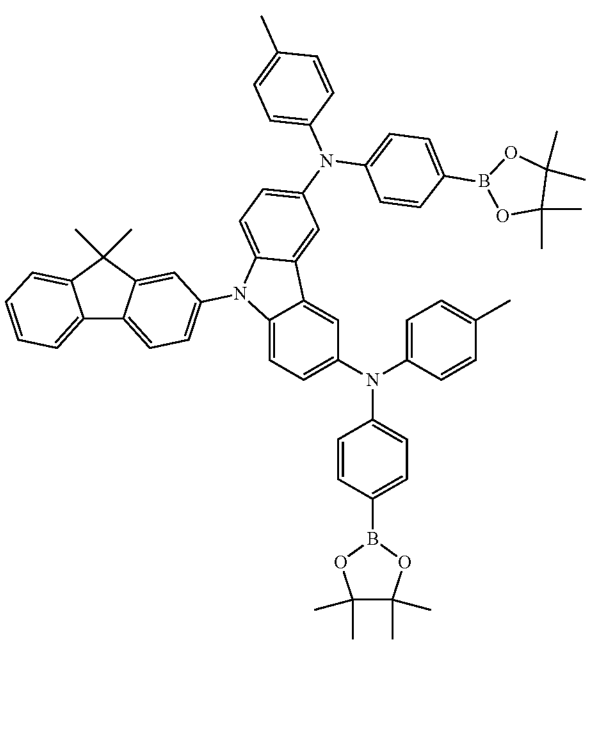

-continued
A16:B2:BOR
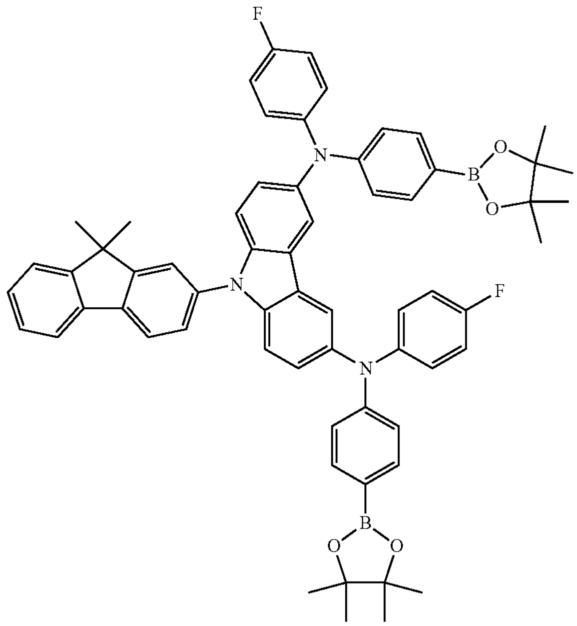
A16:B5:BOR
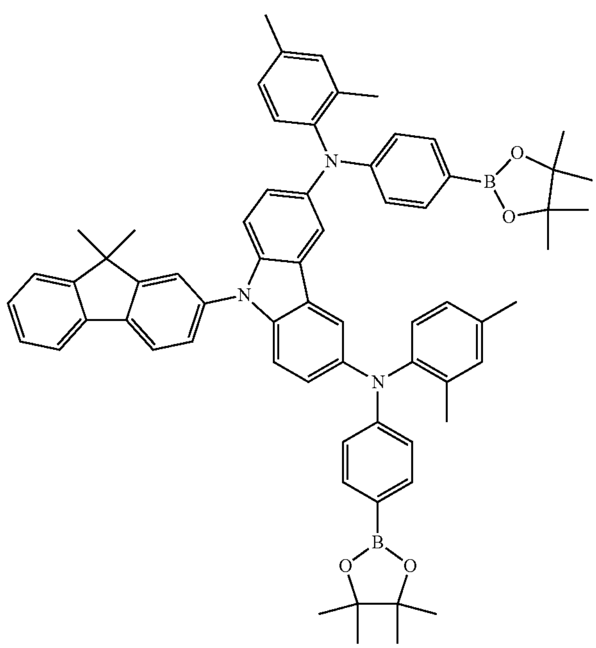

-continued
A16:B9:BOR
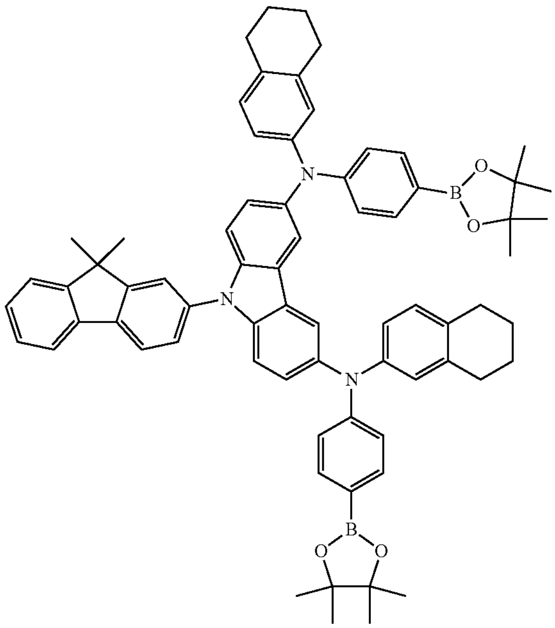
A16:B13:BOR
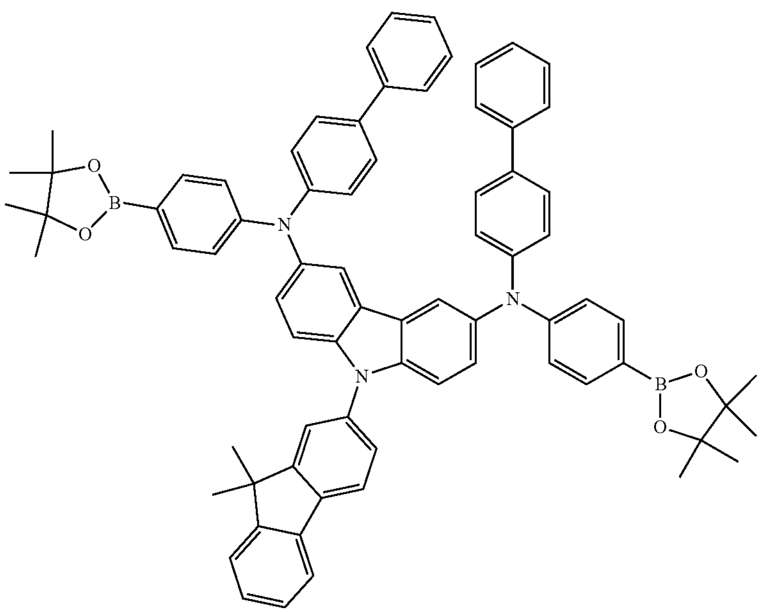

-continued
A16:B14:BOR
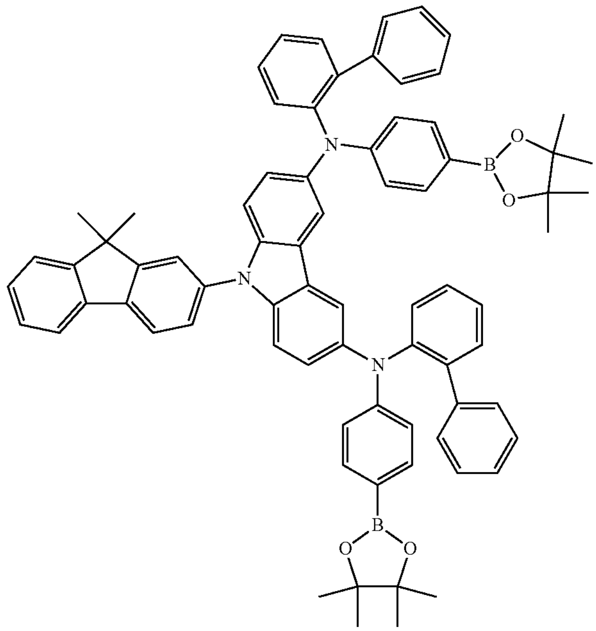
A20:B1:BOR
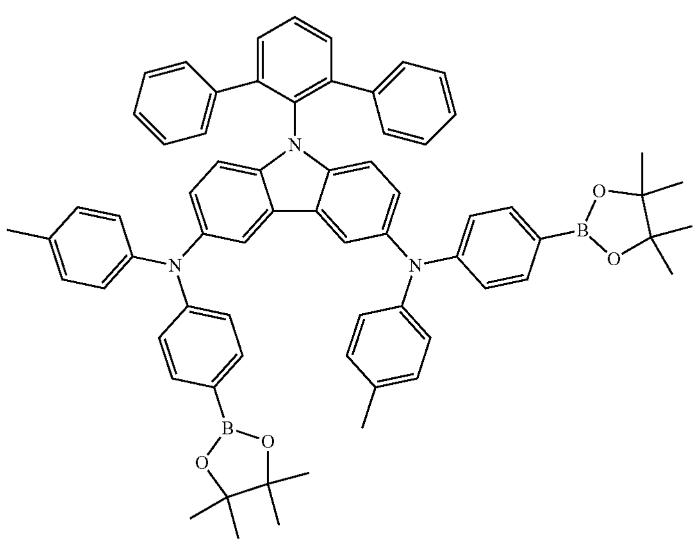

-continued
A20:B2:BOR
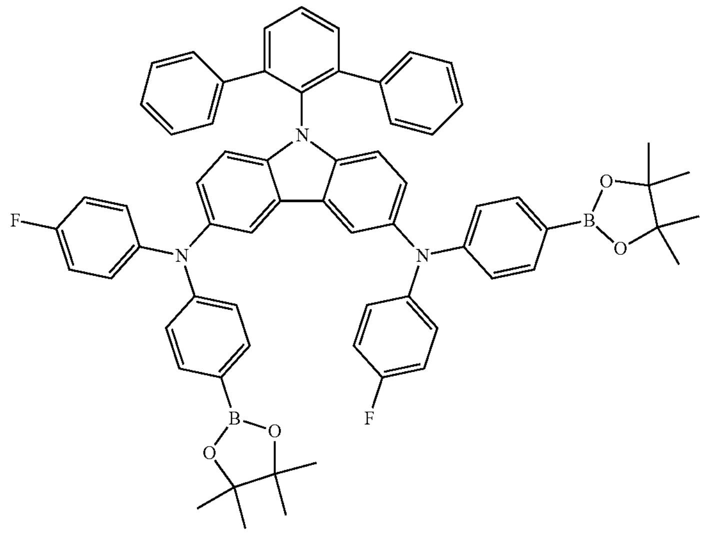
A20:B5:BOR
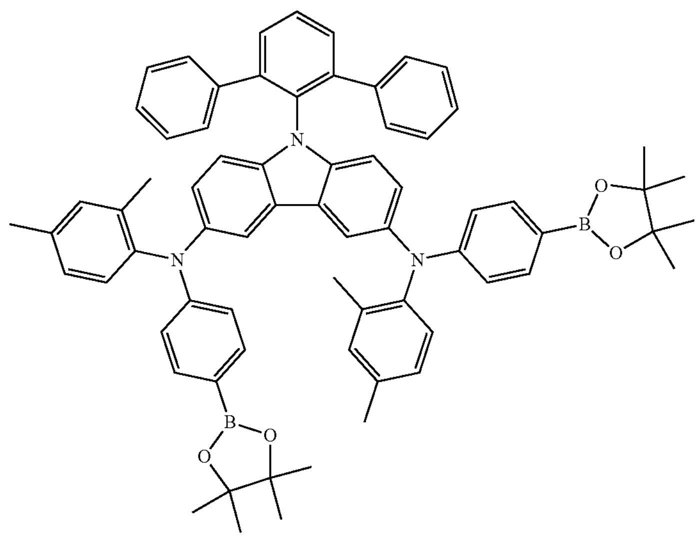
A20:B9:BOR
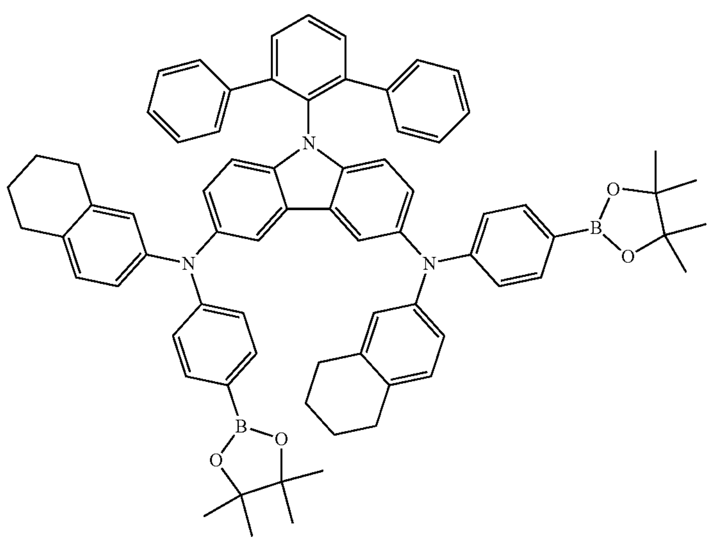

-continued
A20:B13:BOR
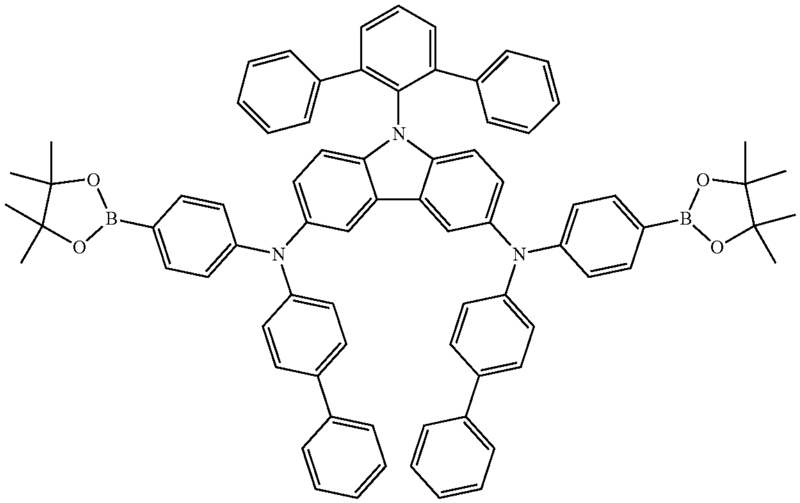
A20:B14:BOR
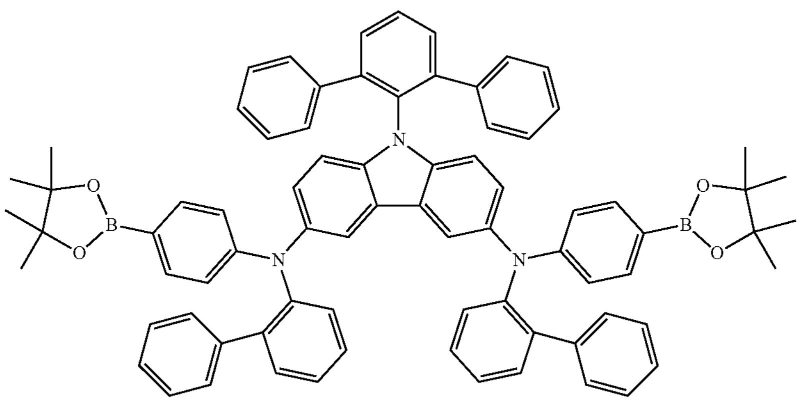
A21:B1:BOR
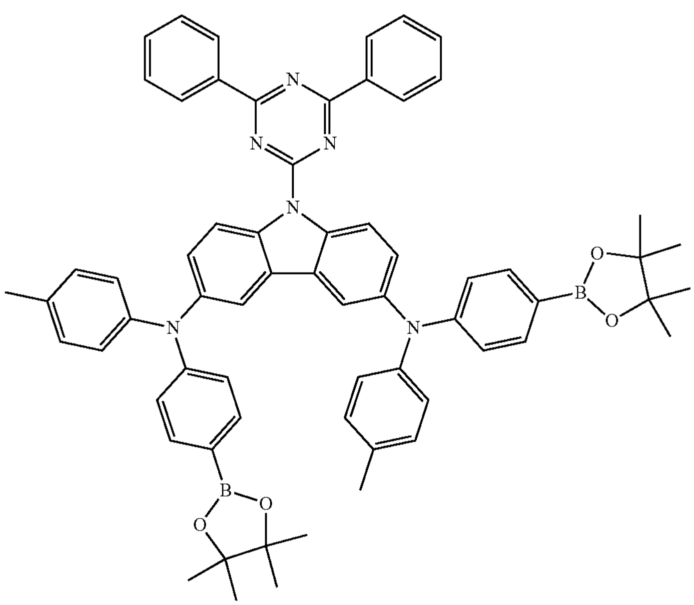

-continued
A21:B2:BOR
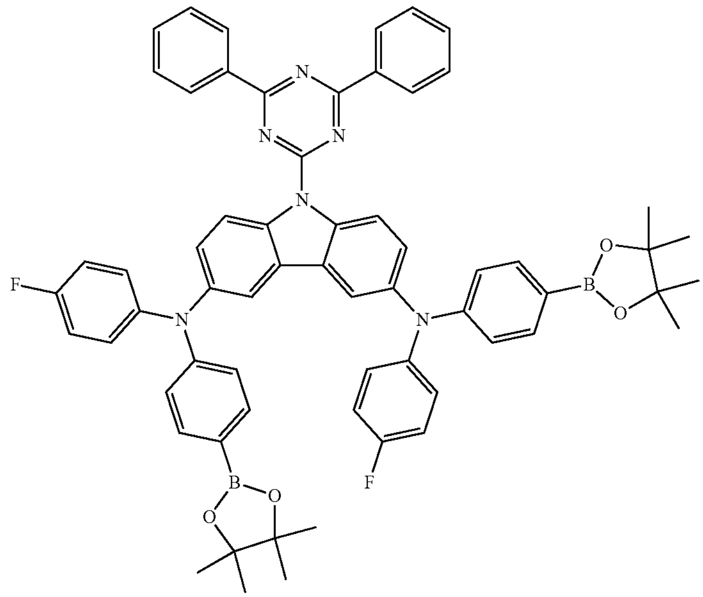
A21:B5:BOR
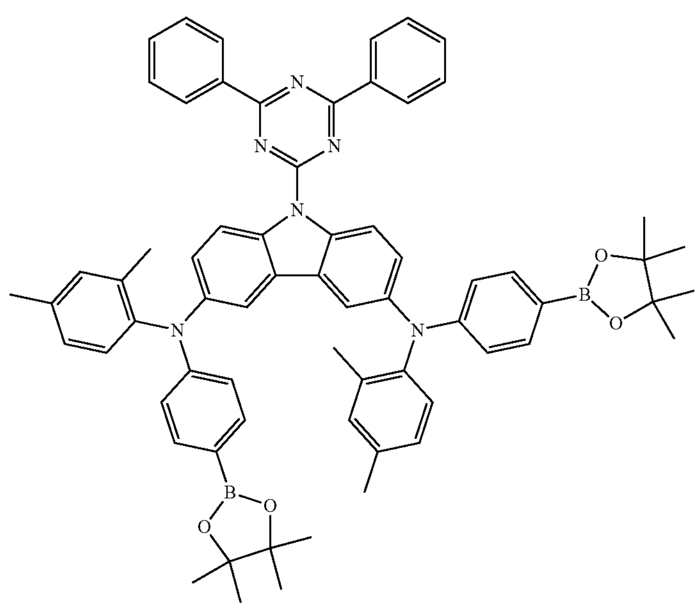

-continued
A21:B9:BOR
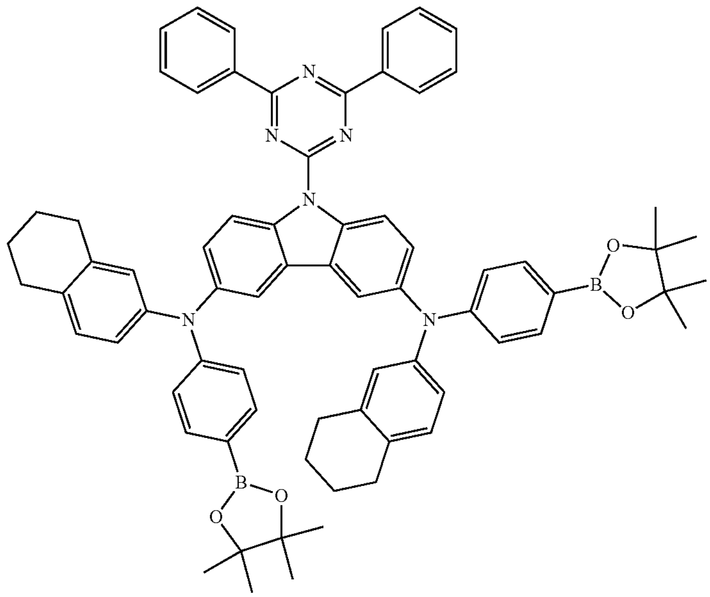
A21:B13:BOR
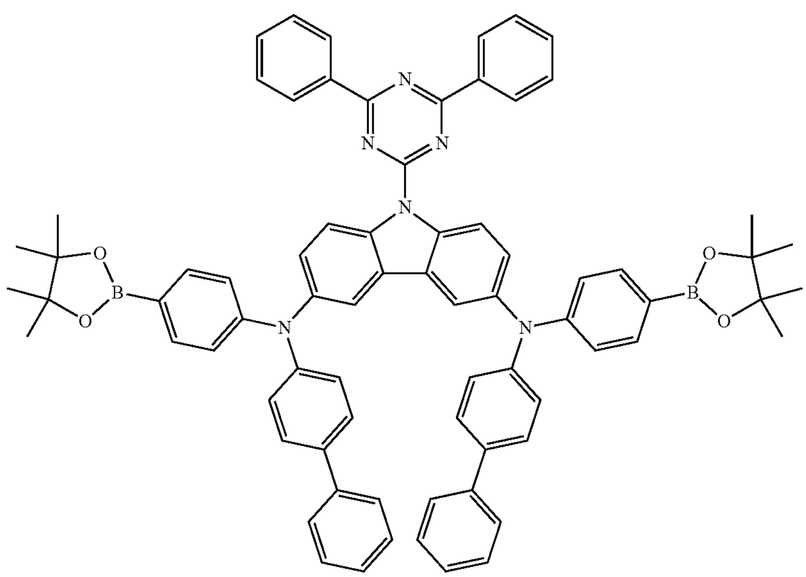

-continued
A21:B14:BOR
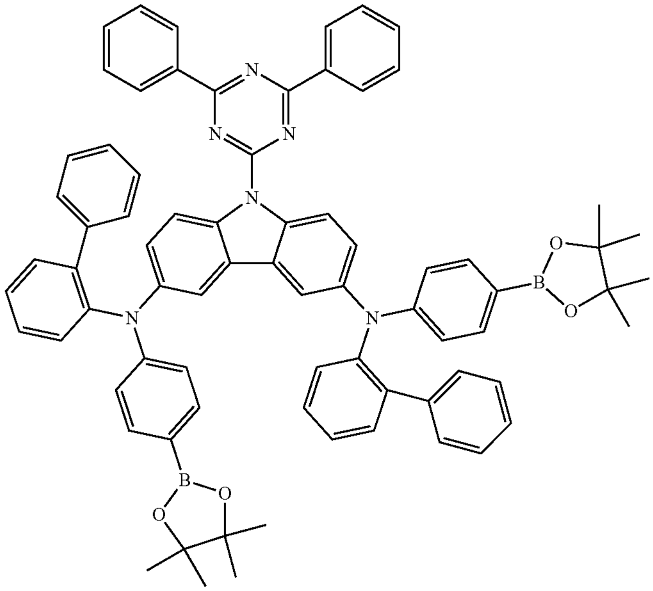
A25:B1:BOR
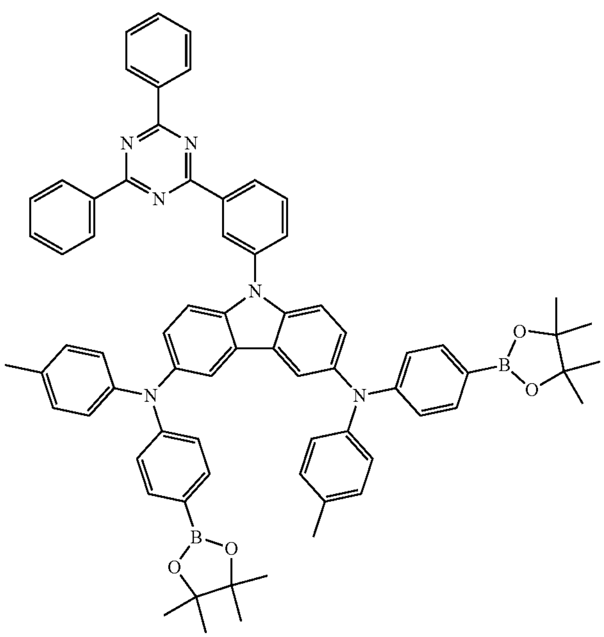

-continued
A25:B2:BOR
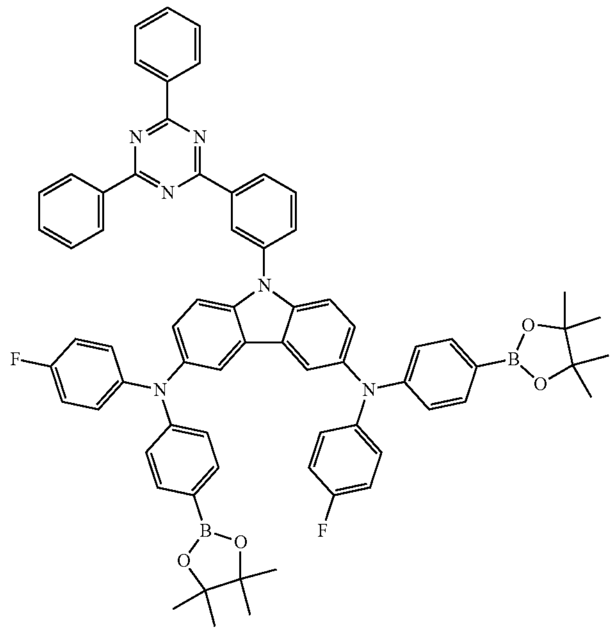
A25:B5:BOR
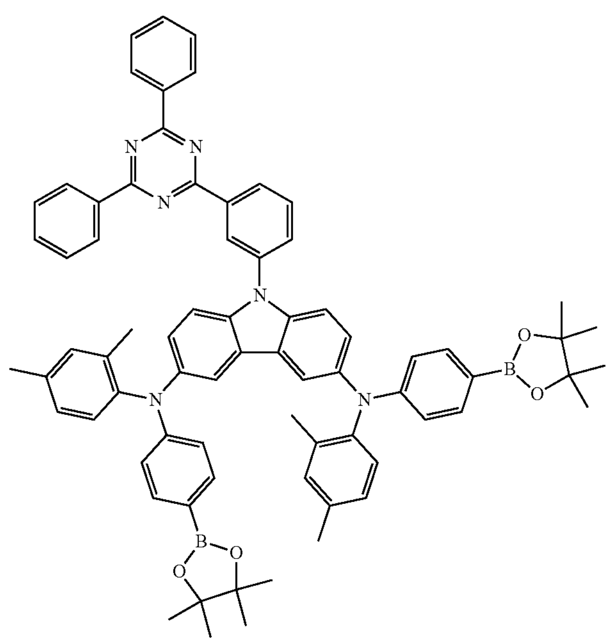

-continued
A25:B9:BOR
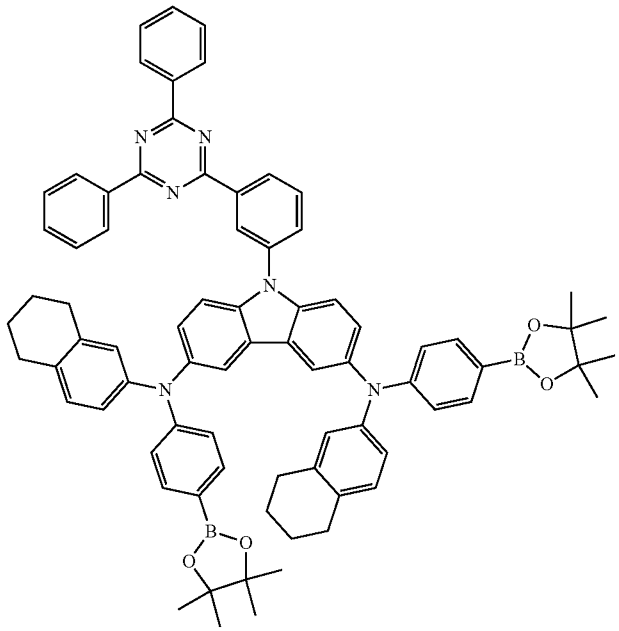
A25:B13:BOR
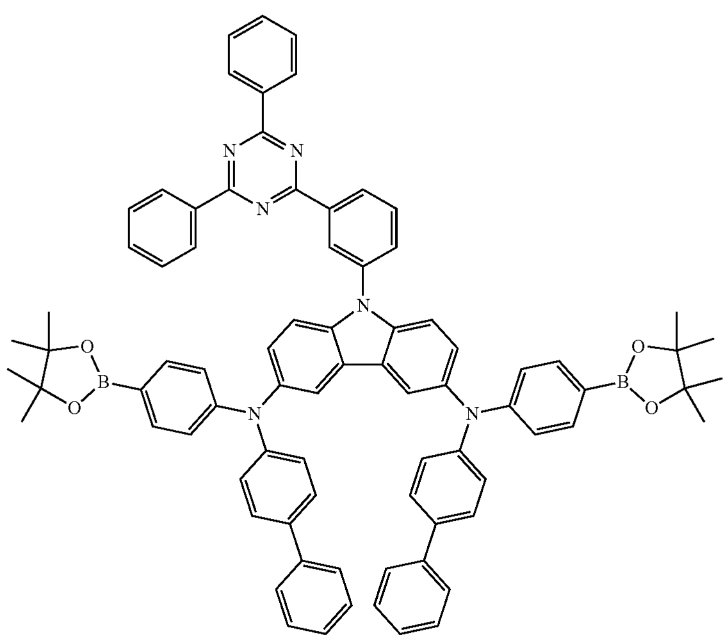

-continued

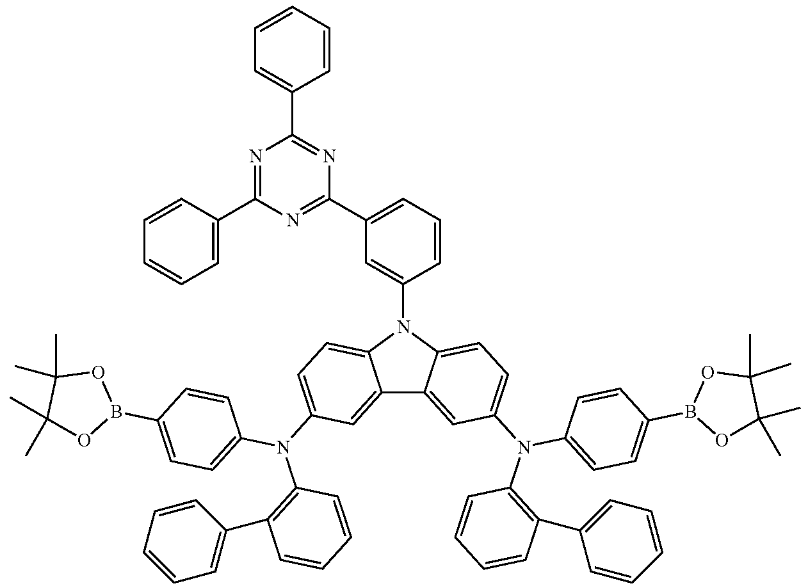

A25:B14:BOR

Example 2

Synthesis of Monomer Mon-2

1 st Step: Synthesis of the Precursor

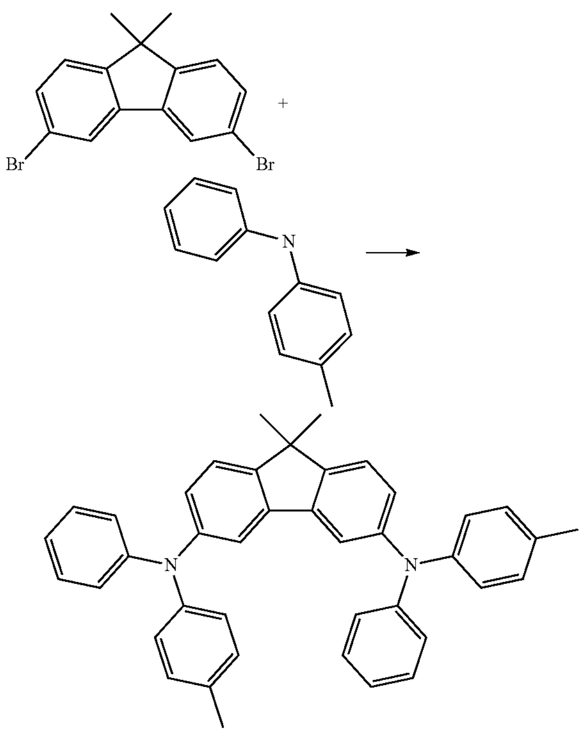

To a mixture of 41.81 g (170 mmol) of tol-4-ylphenylamine, 30 g (85.2 mmol, 0.5 eq) of 3,6-dibromo-9,9-dimethylfluorene, 0.96 g of palladium acetate (4.26 mmol, 0.025 eq), 49.1 g of sodium tert-butoxide (511 mmol, 3 eq) and 8.5 ml of tri-tert-butylphosphine (1 M, 8.5 mmol, 0.05 eq) is added 700 ml of dried toluene, and the mixture is inertized and boiled under reflux (110° C.) for 2 days. The reaction solution is cooled down and diluted with water, and the organic phase is separated off. The solvent is removed under a gentle vacuum, and the residue is purified by hot extraction over neutral alumina with cyclohexane as eluent. The residue is filtered off and dried under reduced pressure. 46.42 g (80% yield, 85.2 mmol) of a colorless powder is obtained.

2nd Step: Synthesis of Monomer Mon-2-Br

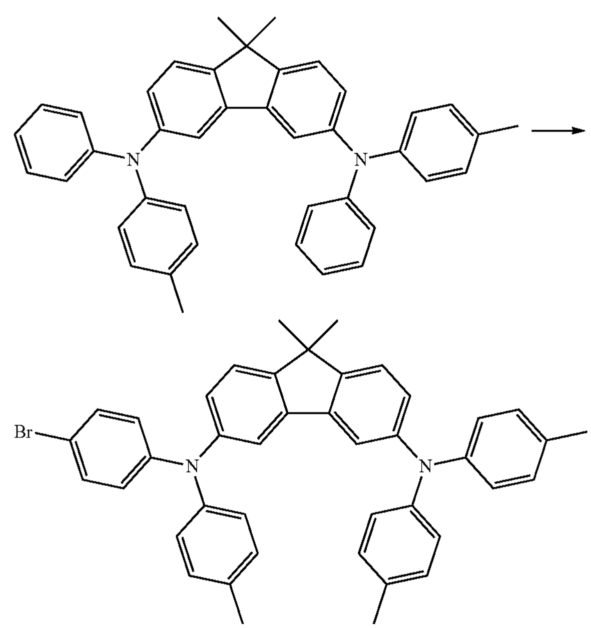

To an initial charge of 43 g (77.24 mmol) of 9,9-dimethyl-N3,N6-bis(4-methylphenyl)-N3,N6-diphenyl-9H-fluorene- 3,6-diamine in a 1000 ml flask is added 800 ml of dichloromethane. The solution is cooled down to internal temperature 0° C. by cooling with ice, and 27.5 g (154.5 mmol, 2 eq) of N-bromosuccinimide is added gradually. After the addition, the ice bath is removed, and the mixture is allowed to warm up to room temperature. The solvent is removed under reduced pressure, and the solids are filtered off and washed thoroughly with water. The residue is recrystallized first from ethyl acetate, then from toluene. 49.12 g (68.74 mmol, 89% yield) of a colorless powder having a purity of 98% is obtained.

3rd Step: Synthesis of Monomer Mon-2-Bo

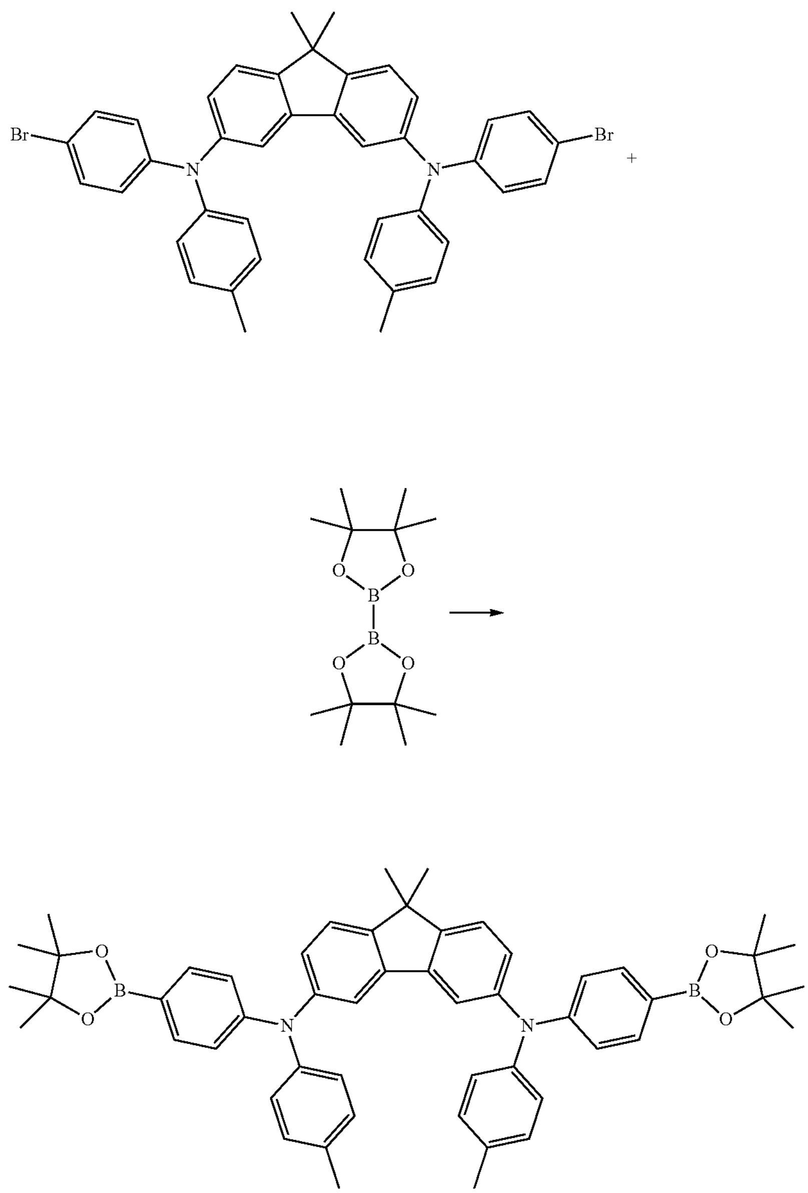

50 g of N3,N6-bis(4-bromophenyl)-9,9-dimethyl-N3,N6-bis(4-methylphenyl)-9H-fluorene-3,6-diamine (A1:B2:Br) (70 mmol), 54 g of 4,4,5,5,4',4',5',5'-octamethyl-[2,2']bi[[1,3,2]dioxaborolanyl] (227.4 mmol, 3.25 eq, CAS: 73183-34-3), 1.28 g of 1,1-bis(diphenylphosphino)ferrocenedichoropalladium (II) (1.75 mmol, 0.025 eq, CAS: 72287-26-4) and 27.5 g of potassium acetate (279.9 mmol, 4 eq) are weighed out in a 2 liter 4-neck flask with reflux condenser, precision glass stirrer, argon blanketing and internal thermometer, and 1300 ml of anhydrous THE is added. After the apparatus has been fully degassed, the mixture is boiled under reflux for 3 days, and then the reaction mixture is allowed to cool down. The solvent is removed under reduced pressure, and the solids are recrystallized repeatedly from ethyl acetate and then from toluene. 46.4 g (57.38 mmol, 82% of theory) of a colorless powder is obtained.

The following monomers can be prepared analogously to example 2:

C1:B1:BOR
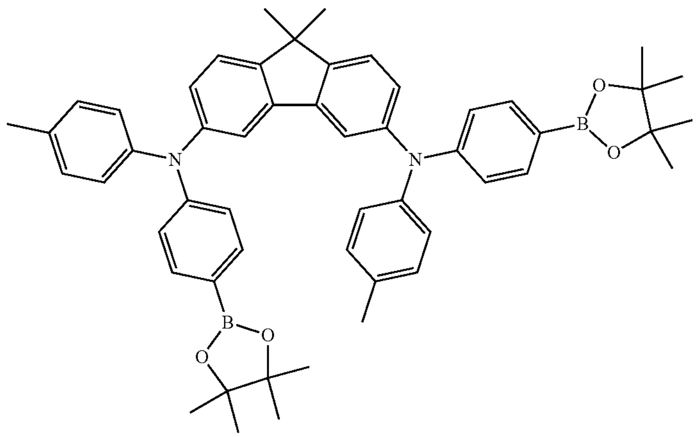
C1:B2:BOR
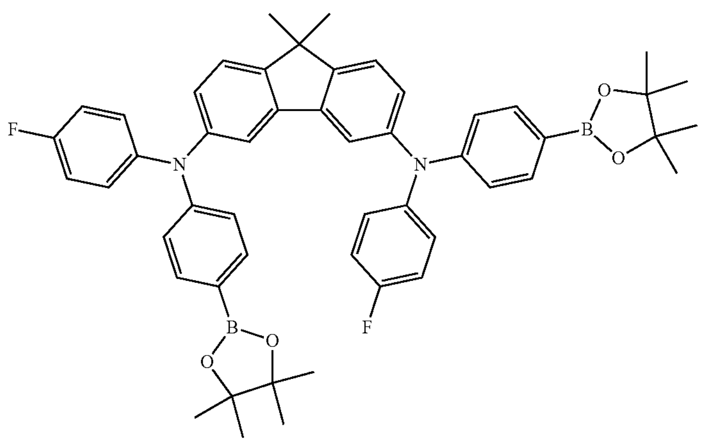
C1:B5:BOR
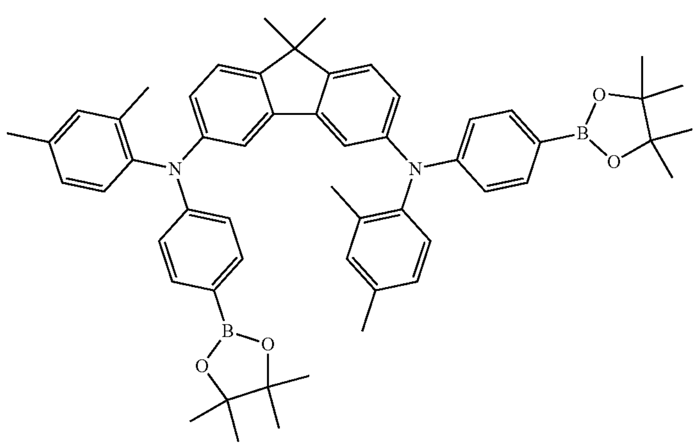

-continued
C1:B9:BOR
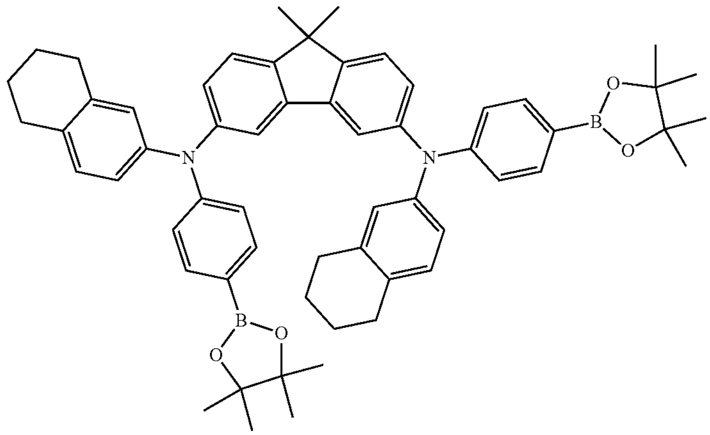
C1:B13:BOR
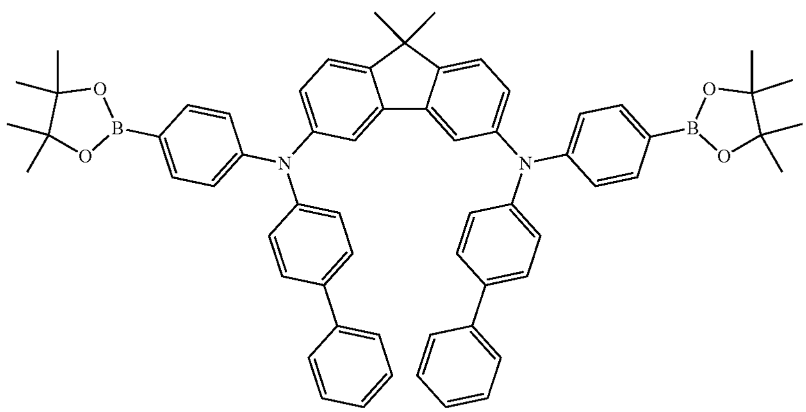
C1:B14:BOR
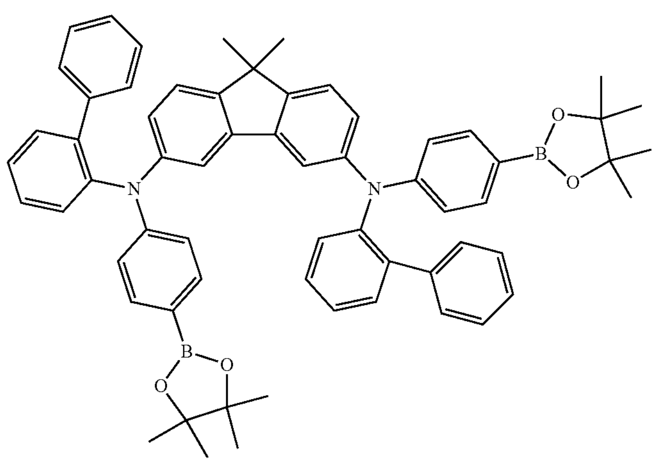

-continued
C2:B1:BOR
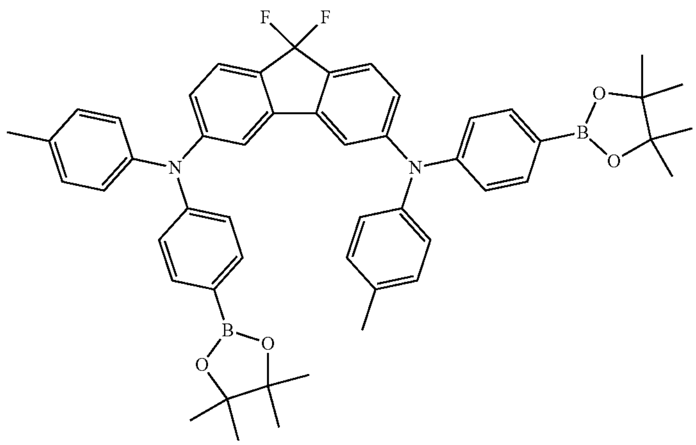
C2:B2:BOR
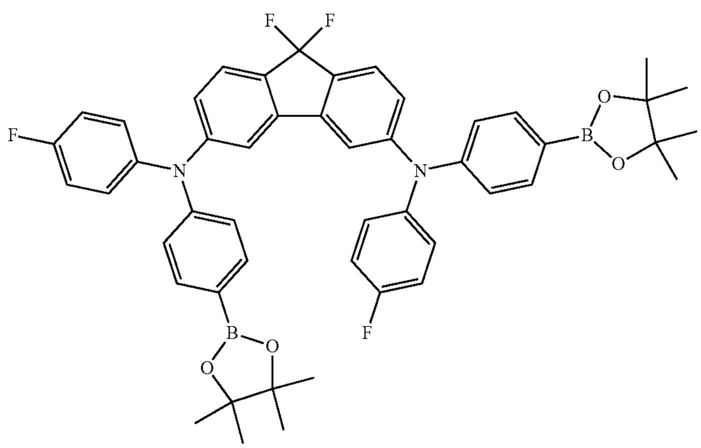
C2:B5:BOR
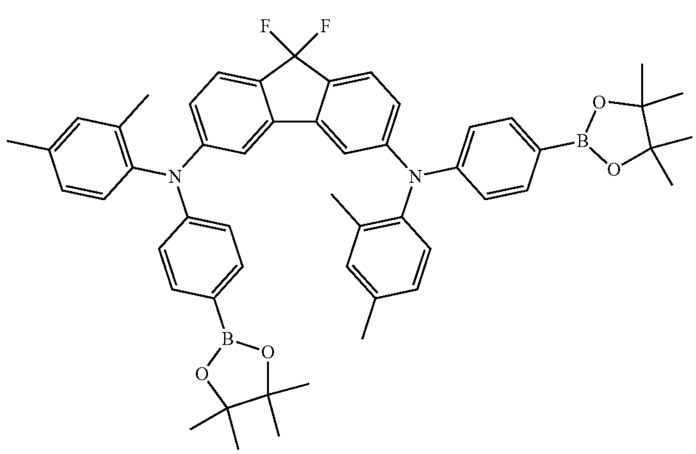

-continued
C2:B9:BOR
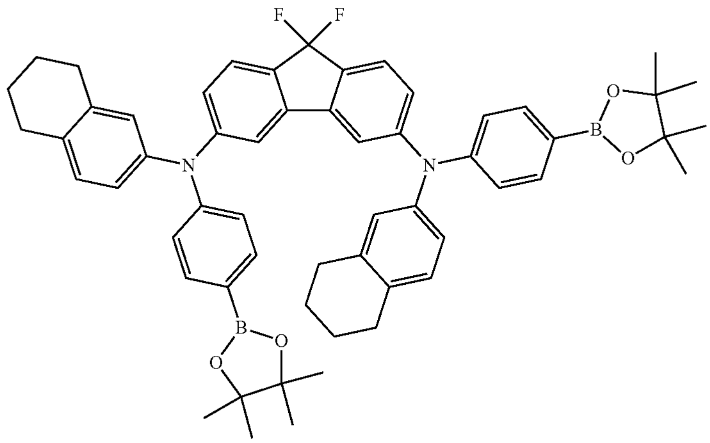
C2:B13:BOR
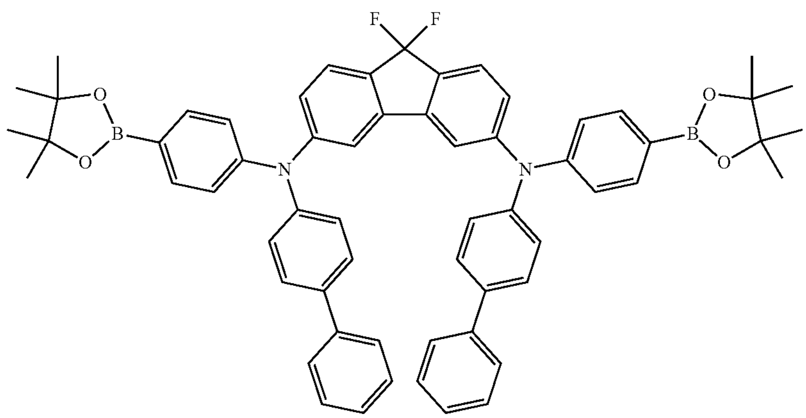
C2:B14:BOR
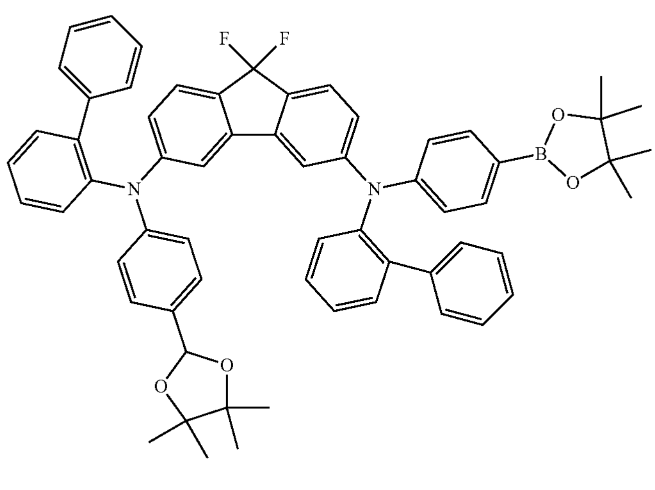

-continued
C3:B1:BOR
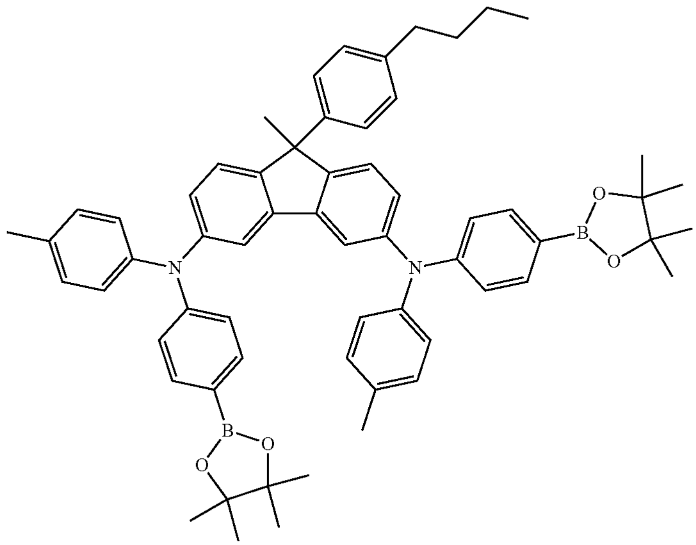
C3:B2:BOR
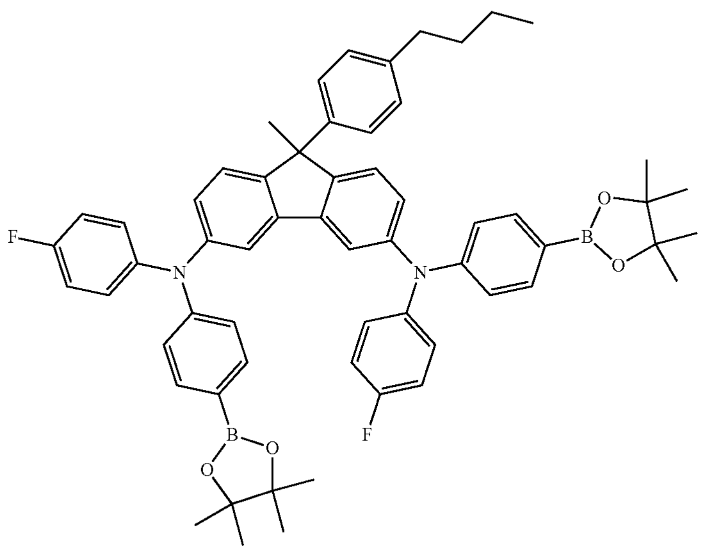
C3:B5:BOR
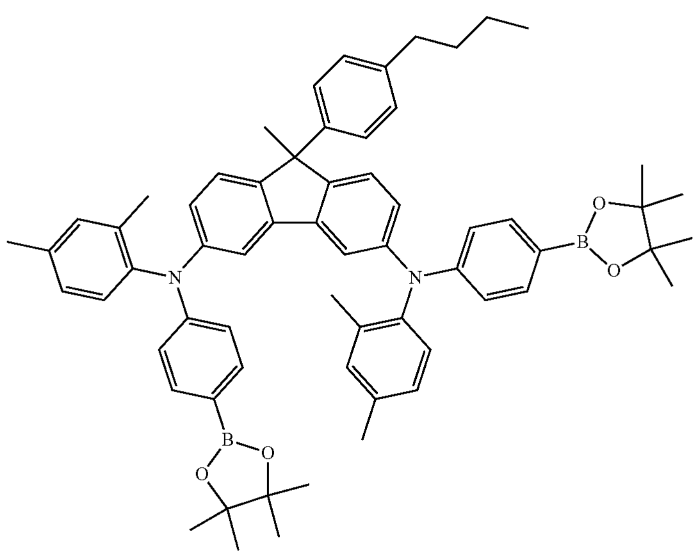

-continued
C3:B13:BOR
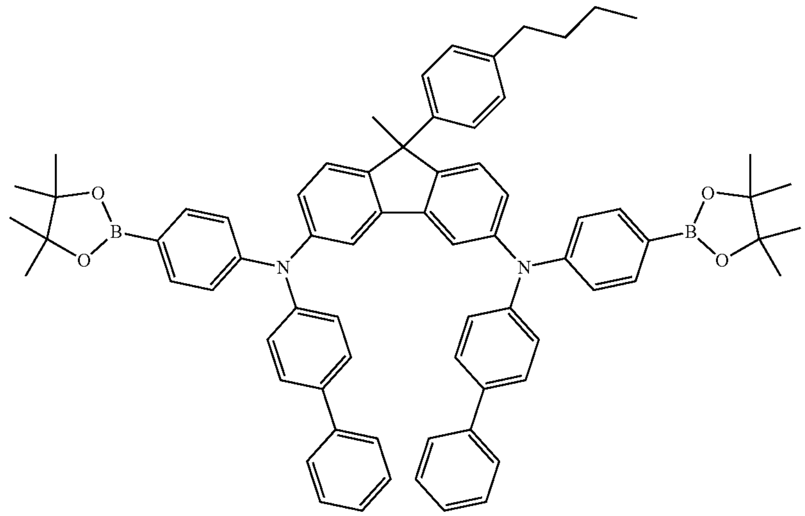
C3:B9:BOR
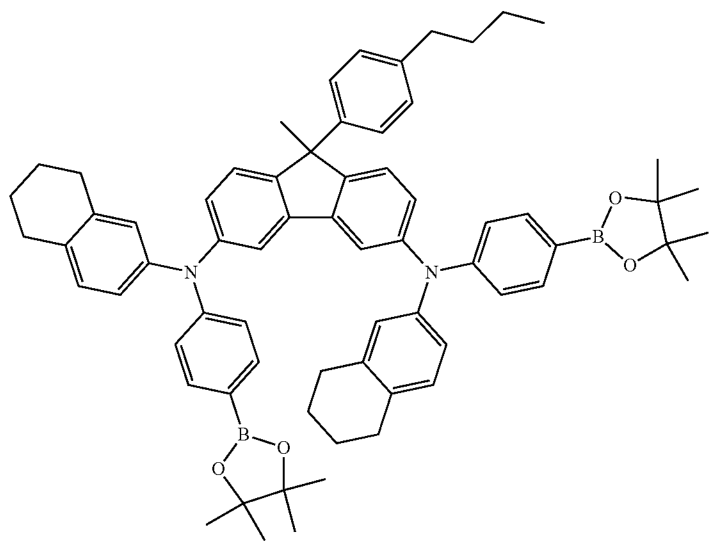
C3:B14:BOR
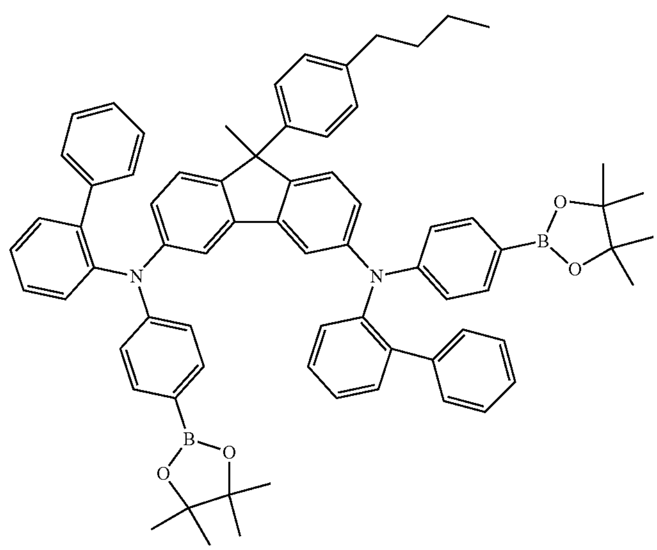

-continued
C4:B1:BOR
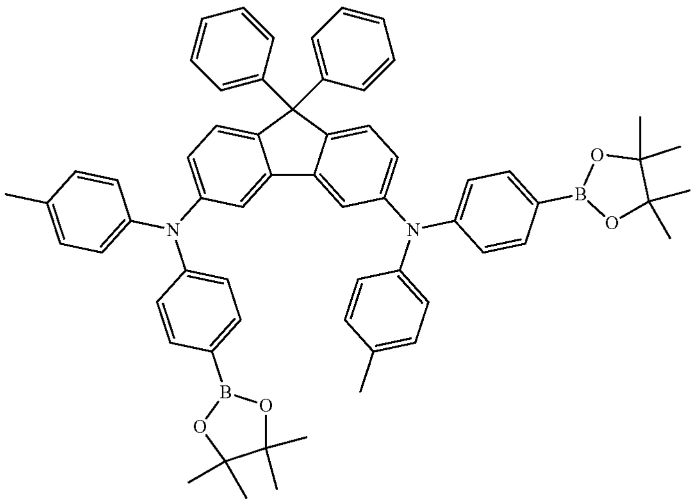
C4:B2:BOR
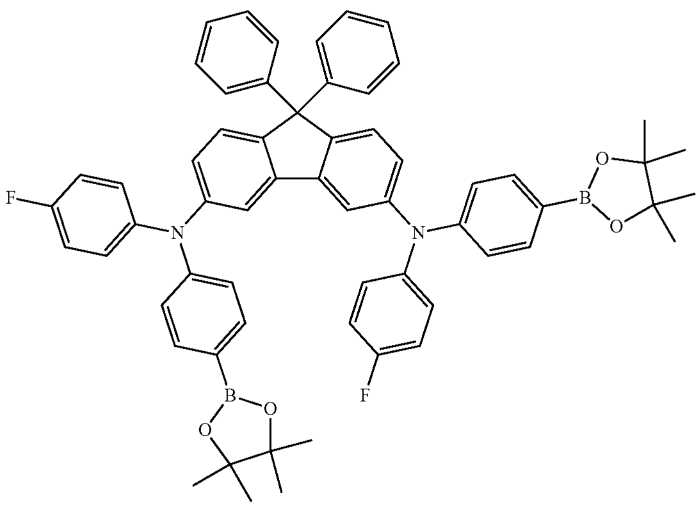
C4:B5:BOR
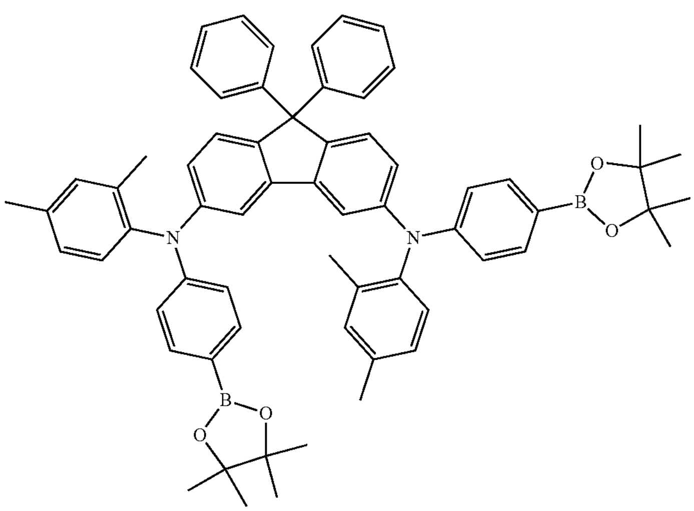

-continued
C4:B9:BOR
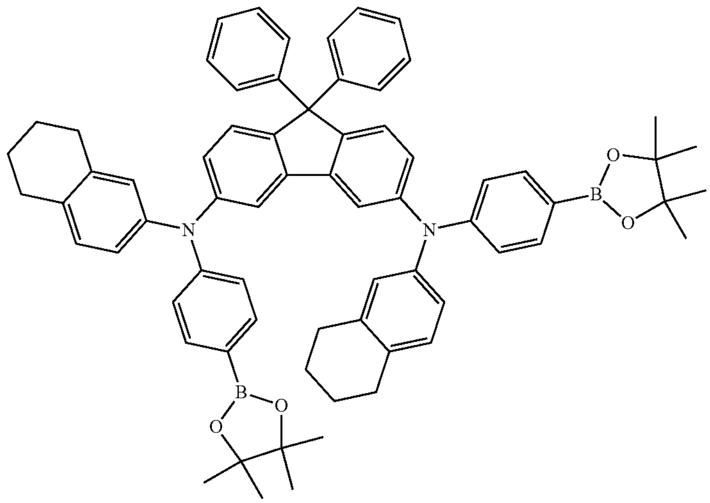
C4:B13:BOR
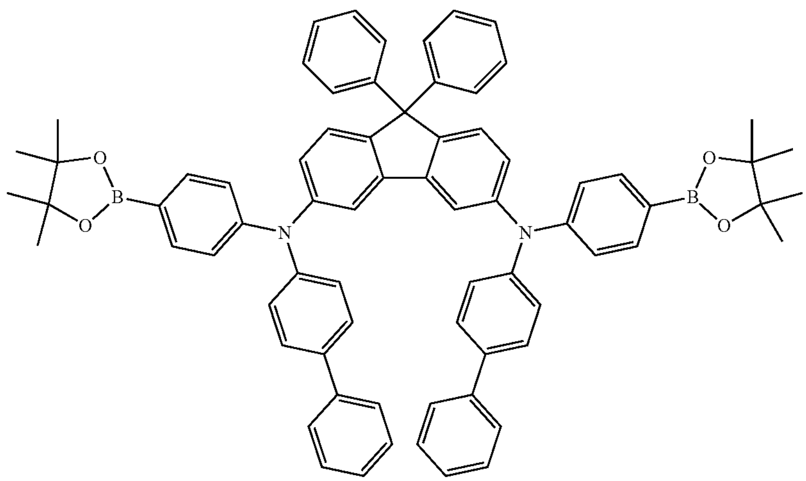
C4:B14:BOR
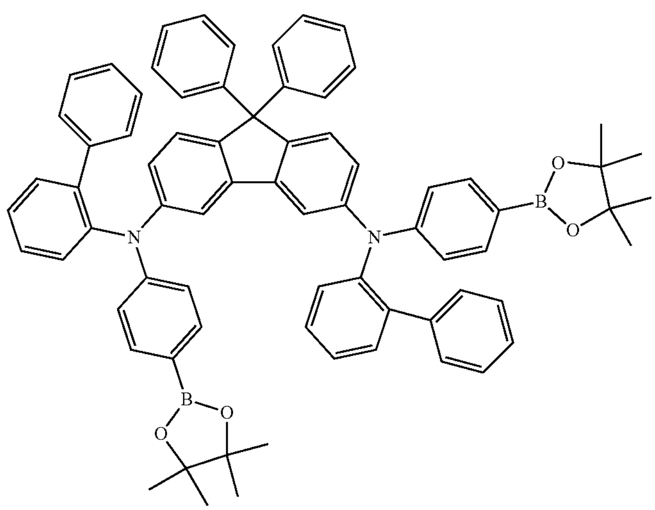

-continued
C7:B1:BOR
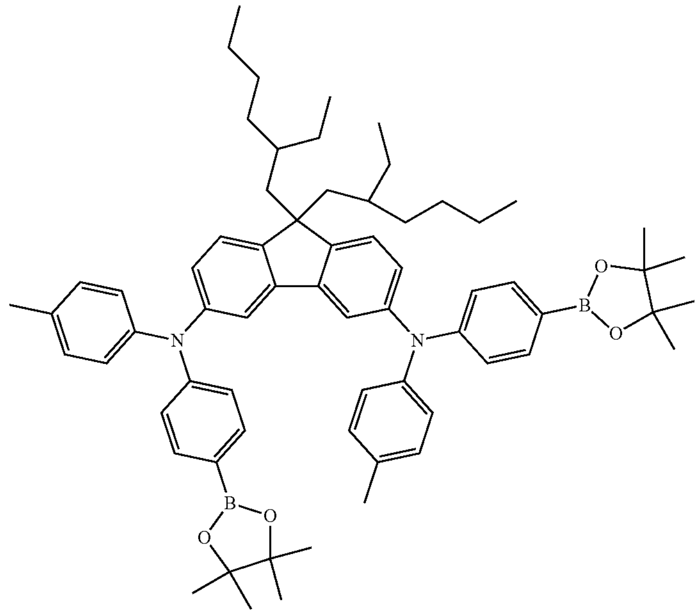
C7:B2:BOR
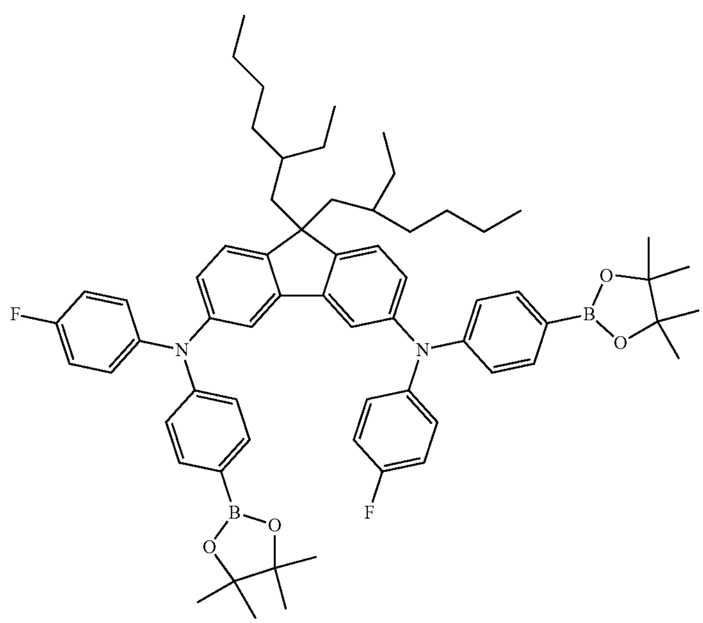

-continued
C7:B5:BOR
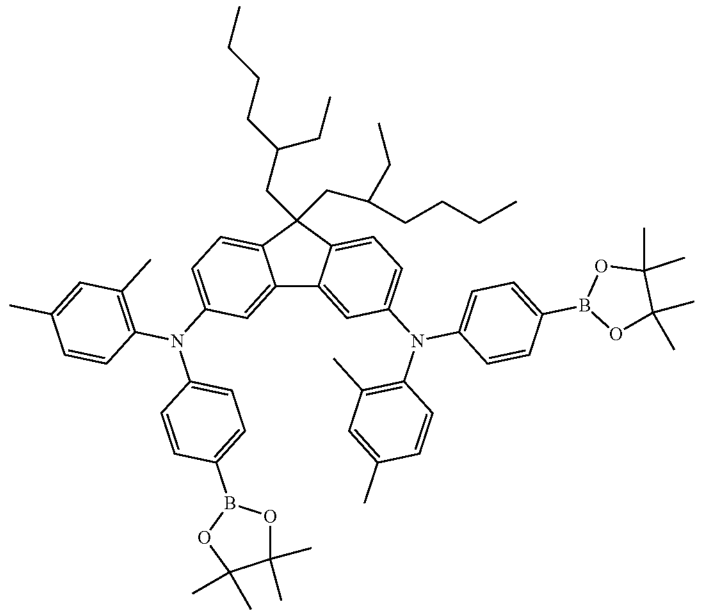
C7:B9:BOR
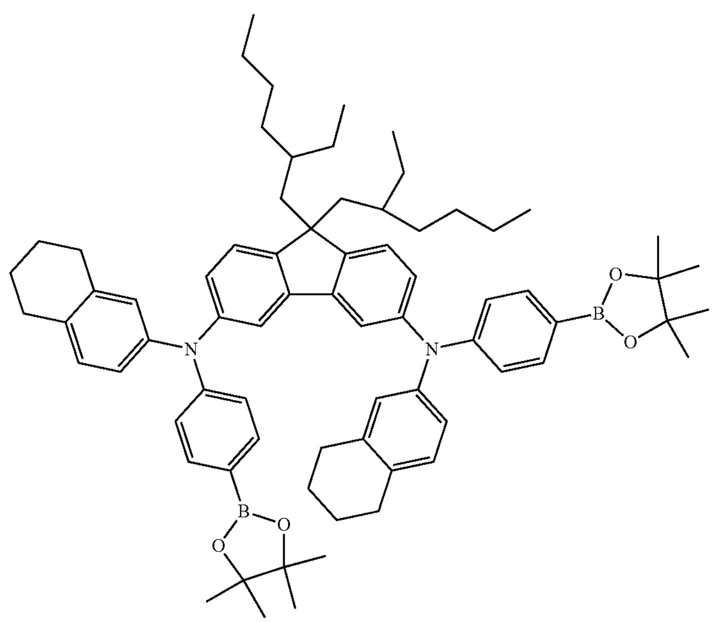

-continued
C7:B13:BOR
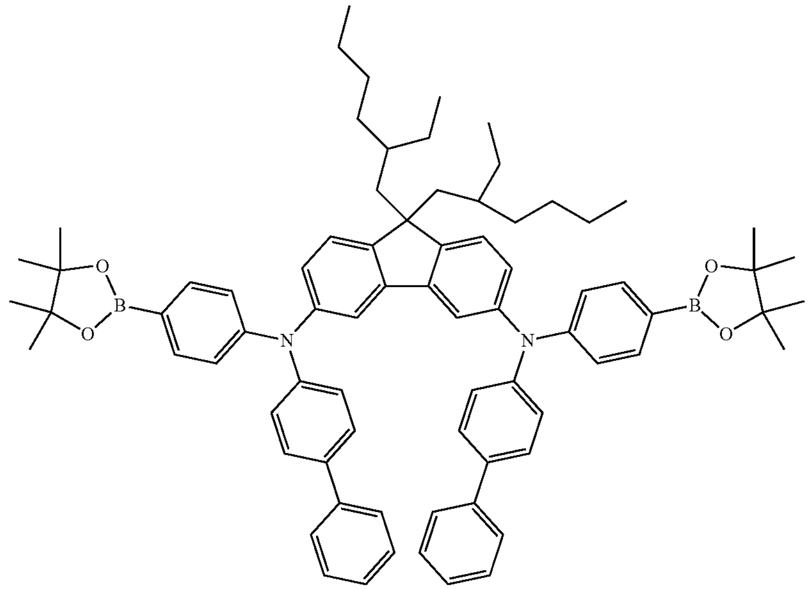
C7:B14:BOR
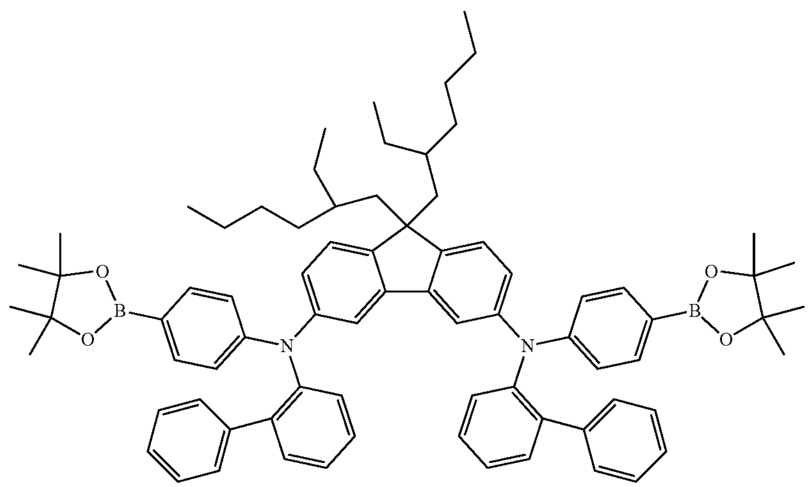
Example 3
Synthesis of Monomer Mon-3
1st Step: Synthesis of the Precursor
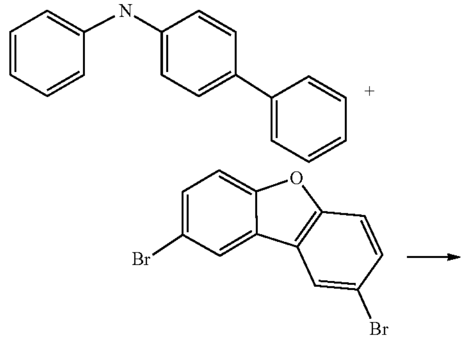
-continued
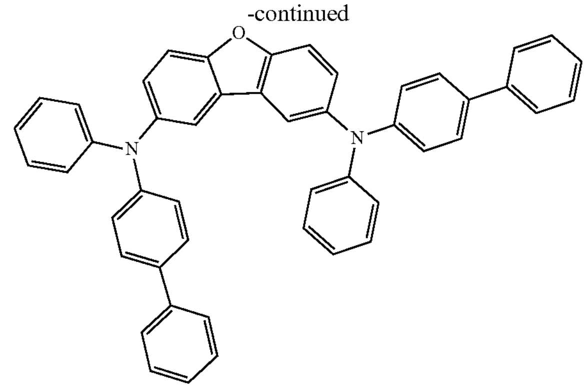
To a mixture of 52.7 g (214.7 mmol) of biphenyl-4-ylphenylamine, 35 g (107.4 mmol, 0.5 eq) of 3,6-dibromodibenzofuran, 0.60 g of palladium acetate (2.68 mmol, 0.012 eq), 31 g of sodium tert-butoxide (332.1 mmol, 1.5 eq) and 5.4 ml of tri-tert-butylphosphine (5.37 mmol, 0.05 eq) is added 750 ml of dried toluene, and the mixture is inertized and boiled under reflux (110° C.) for 2 days. The reaction solution is cooled down and diluted with water, and the organic phase is separated off. The solvent is removed under a gentle vacuum, and the residue is purified by hot extraction over neutral alumina with cyclohexane as eluent. The residue is filtered off and dried under reduced pressure. 59.1 g (84% yield) of a colorless powder is obtained.

2nd Step: Synthesis of Monomer Mon-3-Br

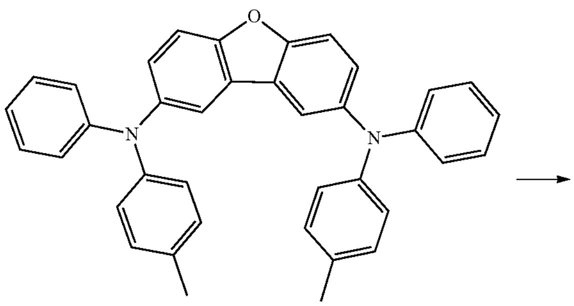

-continued

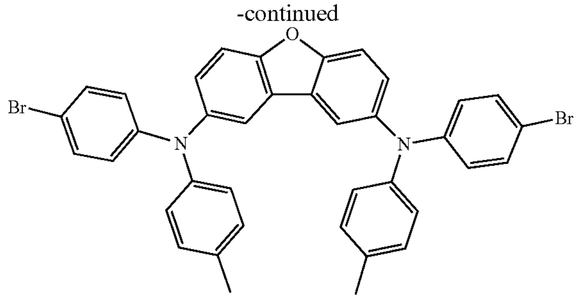

To an initial charge of 64 g (120.6 mmol) of N4,N12-bis(4-methylphenyl)-N4,N12-diphenyl-8-oxatricyclo[7.4.0.0$^{2}$,7]trideca-1(9),2,4,6,10,12-hexaene-4,12-diamine in a 1000 ml flask is added 900 ml of dichloromethane. The solution is cooled down to internal temperature 0° C. by cooling with ice, and 42.9 g (241.2 mmol, 2 eq) of N-bromosuccinimide is added gradually. After the addition, the ice bath is removed, and the mixture is allowed to warm up to room temperature. The solvent is removed under reduced pressure, and the solids are filtered off and washed thoroughly with water. The residue is recrystallized first from ethyl acetate, then from toluene. 70.58 g (102.5 mmol, 85% yield) of a colorless powder having a purity of 98% is obtained.

3rd Step: Synthesis of Monomer Mon-3-Bo

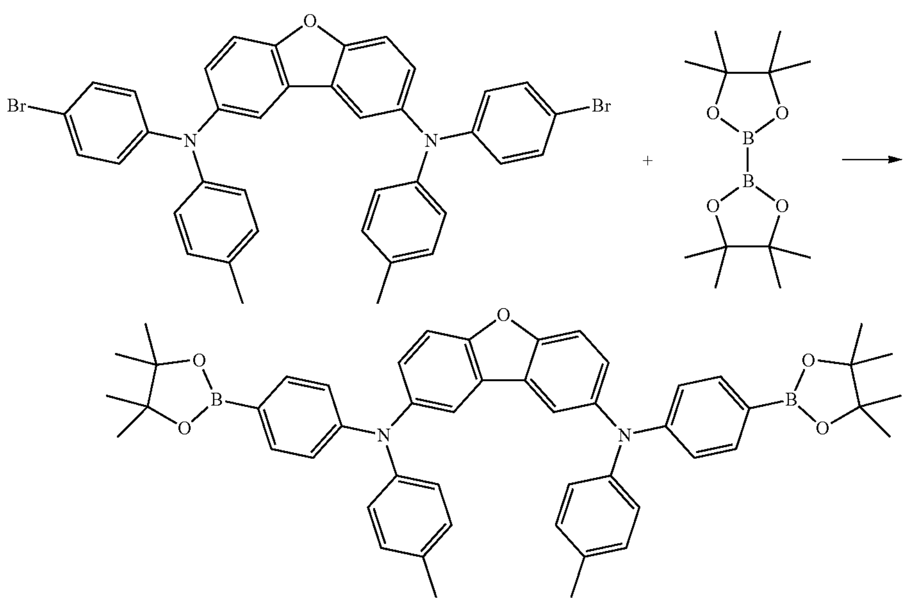

37 g of N4,N12-bis(4-bromophenyl)-N4,N12-bis(4-methylphenyl)-8-oxatricyclo[7.4.0.0$^{2}$,7]trideca-1(9),2,4,6,10,12-hexaene-4,12-diamine (D1:B1:Br) (753.7 mmol), 44.4 g of 4,4,5,5,4',4',5',5'-octamethyl-[2,2']bi[[1,3,2]dioxaborolanyl] (174.7 mmol, 3.25 eq, CAS: 73183-34-3), 0.98 g of 1,1-bis(diphenylphosphino)ferrocenedichoropalladium (II) (1.34 mmol, 0.025 eq, CAS: 72287-26-4) and 21.1 g of potassium acetate (215 mmol, 4 eq) are weighed out in a 2 liter 4-neck flask with reflux condenser, precision glass stirrer, argon blanketing and internal thermometer, and 1300 ml of anhydrous THE is added. After the apparatus has been fully degassed, the mixture is boiled under reflux for 3 days, and then the reaction mixture is allowed to cool down. The solvent is removed under reduced pressure, and the solids are recrystallized repeatedly from ethyl acetate and then from toluene. 38.3 g (48.9 mmol, 91% of theory) of a colorless powder is obtained.

The following monomers can be prepared analogously to example 3:
D1:B1:BOR
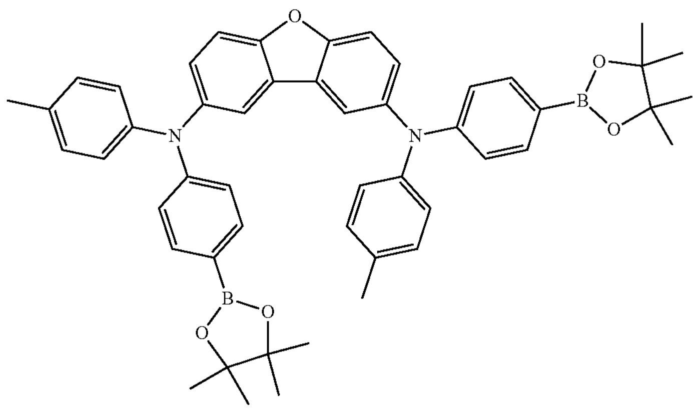
D1:B2:BOR
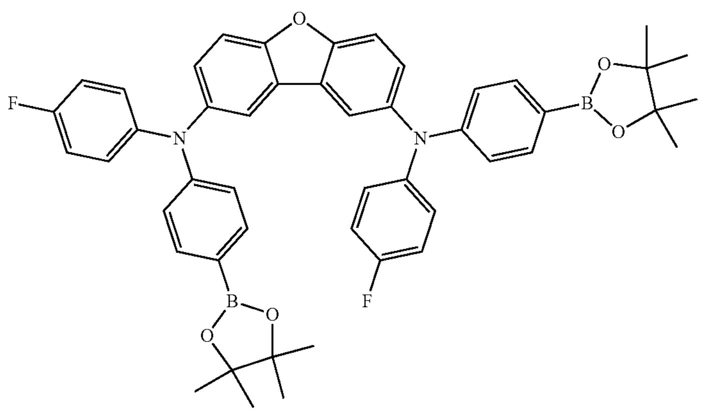
D1:B5:BOR
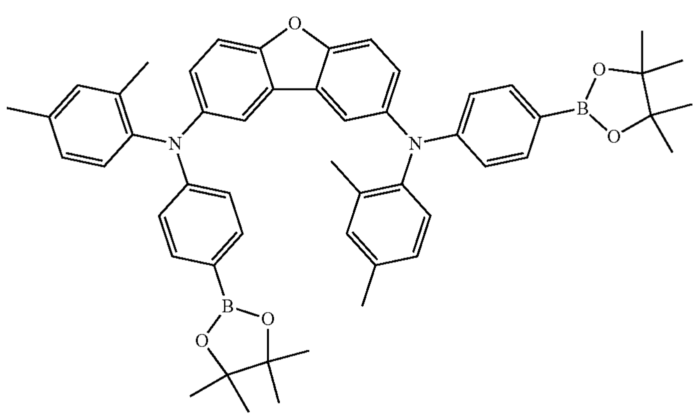

-continued
D1:B9:BOR
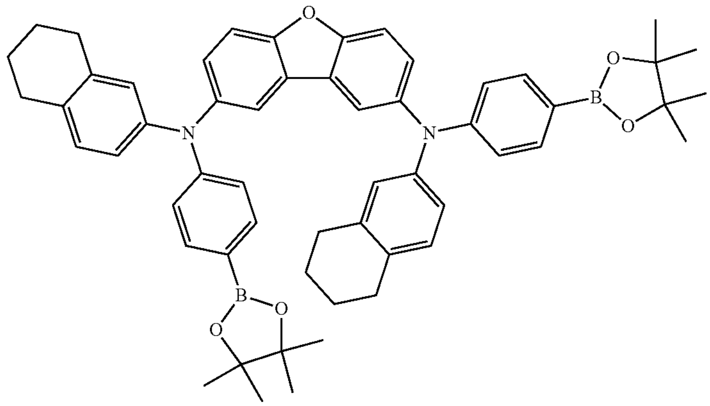
D1:B13:BOR
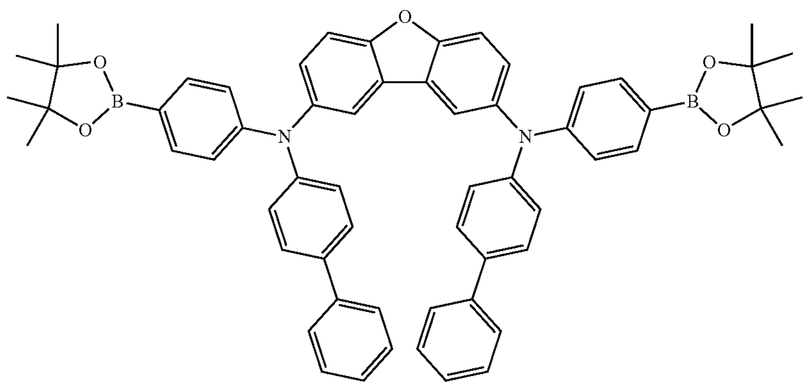
D1:B14:BOR
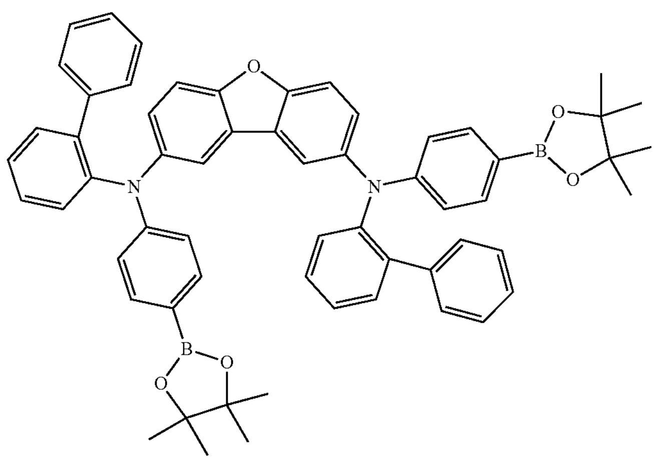
D2:B1:BOR
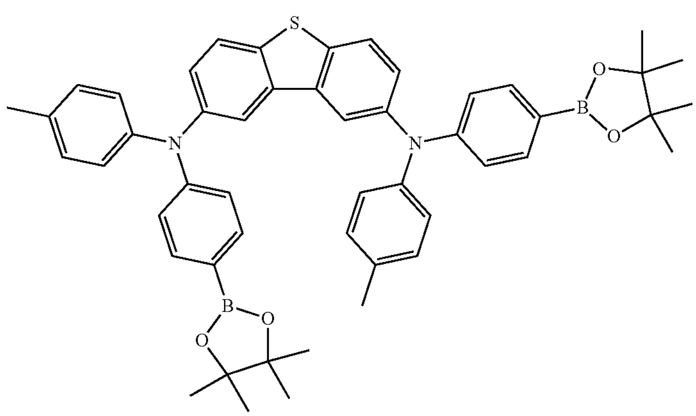

-continued
D2:B2:BOR
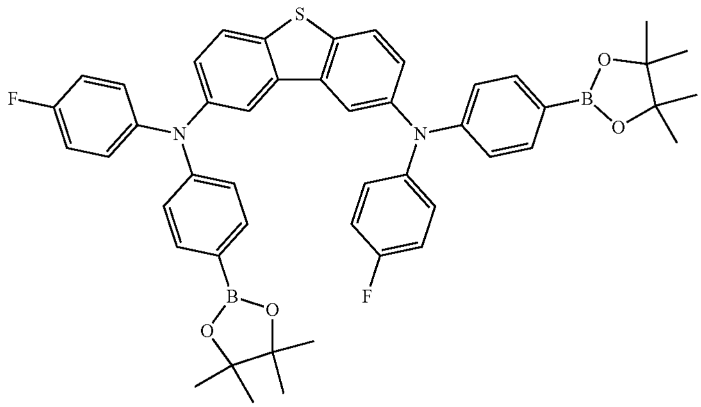
D2:B5:BOR
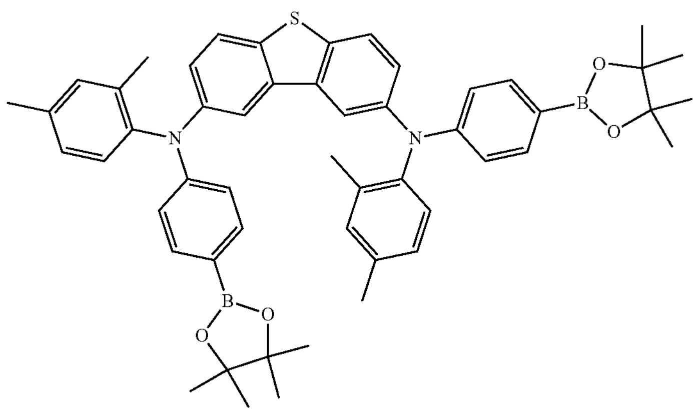
D2:B9:BOR
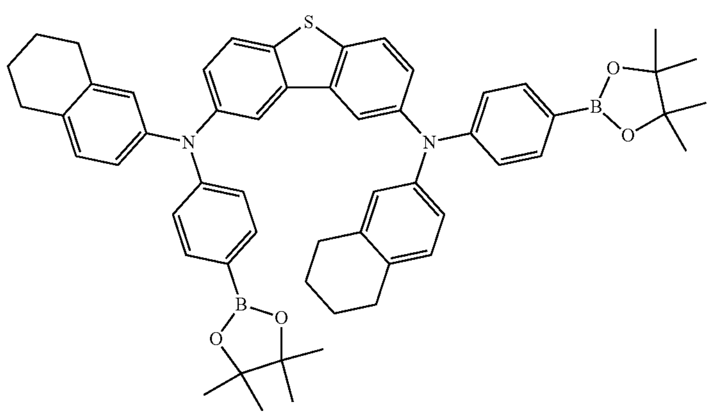
D2:B13:BOR
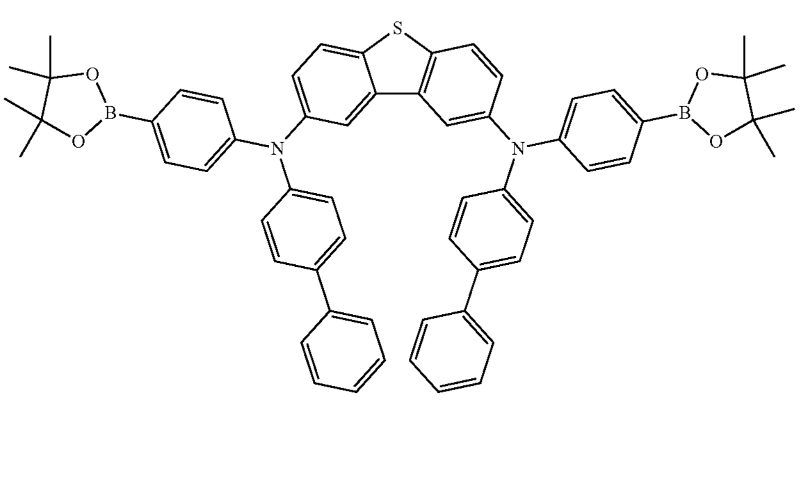

-continued
D2:B14:BOR
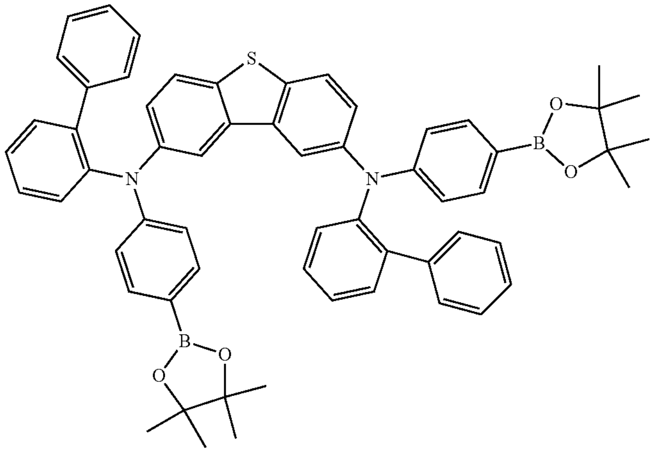
Further Monomers
Further monomers for production of the polymers of the invention are already described in the prior art, are commercially available or are prepared according to a literature method, and are summarized in the following table:
| Monomer | Structure | Synthesis according to |
| --- | --- | --- |
| Mo1-Bo | 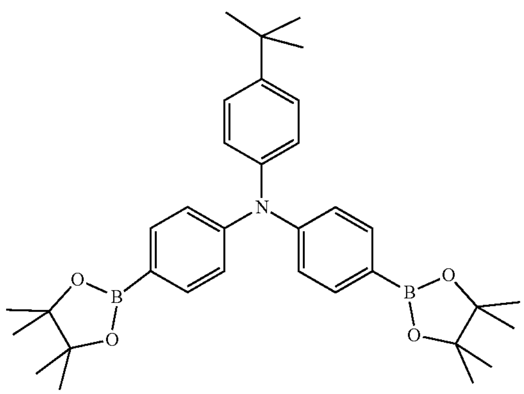 | WO 99/048160 A1 |
| Mo2-Br | 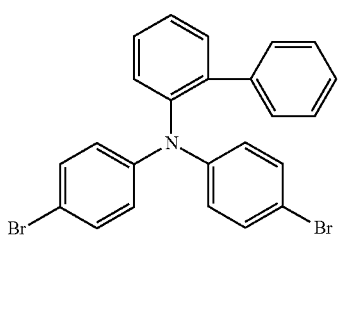 [SMILES: Brc1ccc(N(c2ccc(Br)cc2)c2ccccc2-c2ccccc2)cc1] | WO 2013/156130 A1 |

-continued
| Monomer | Structure | Synthesis according to |
|---|---|---|
| Mo2-Bo | 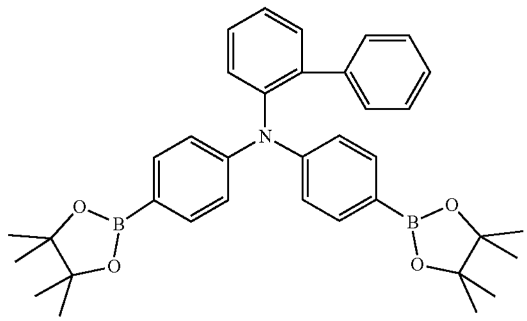 | WO 2013/156130 A1 |
| Mo3-Br | 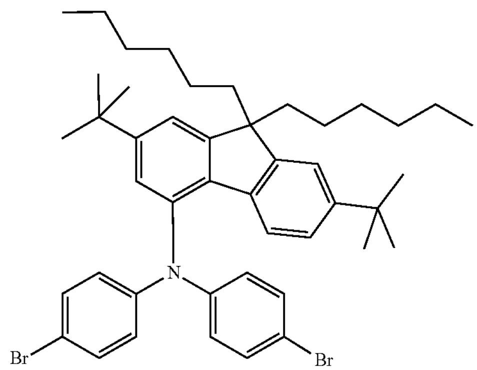 [SMILES: CCCCCCC1(CCCCCC)c2cc(C(C)(C)C)ccc2-c2c(N(c3ccc(Br)cc3)c3ccc(Br)cc3)cc(C(C)(C)C)cc21] | Borylation analogous to WO 2013/156130 A1 |
| Mo4-Br | 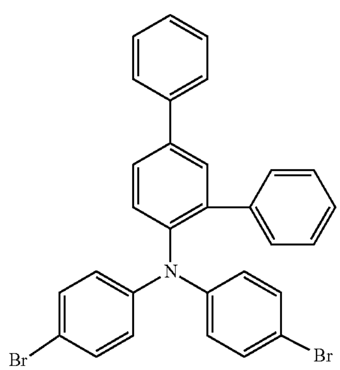 [SMILES: Brc1ccc(N(c2ccc(Br)cc2)c2ccc(-c3ccccc3)cc2-c2ccccc2)cc1] | CAS 2043618-74-0 |
| Mo5-Bo | 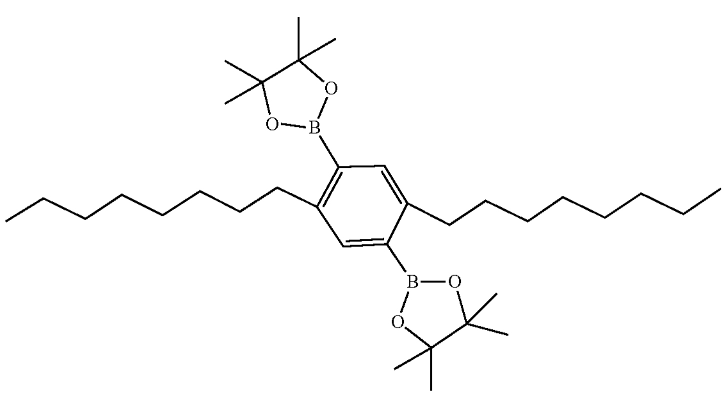 [SMILES: CCCCCCCCc1cc(B2OC(C)(C)C(C)(C)O2)c(CCCCCCCC)cc1B1OC(C)(C)C(C)(C)O1] | CAS 897404-05-6 |

-continued
| Monomer | Structure | Synthesis according to |
|---|---|---|
| Mo5-Br | 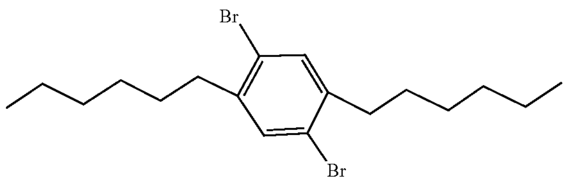 [SMILES: CCCCCCc1cc(Br)c(CCCCCC)cc1Br] | CAS 117635-21-9 |
| Mo6-Br | 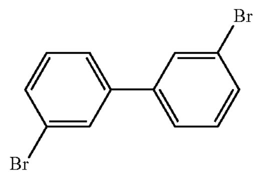 [SMILES: Brc1cccc(-c2cccc(Br)c2)c1] | CAS 16400-51-4 |
| Mo7-Br | 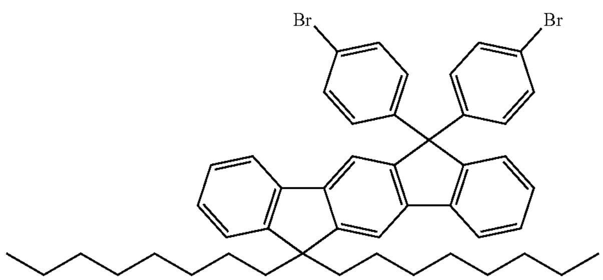 [SMILES: CCCCCCCCC1(CCCCCCCC)c2ccccc2-c2cc3c(cc21)-c1ccccc1C3(c1ccc(Br)cc1)c1ccc(Br)cc1] | WO 2010/136111 A1 |
| Mo7-Bo | 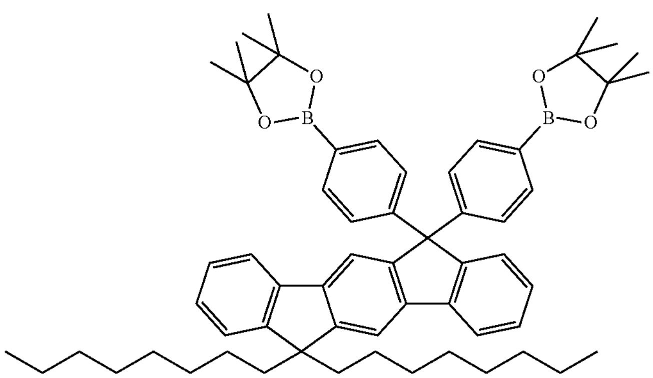 [SMILES: CCCCCCCCC1(CCCCCCCC)c2ccccc2-c2cc3c(cc21)-c1ccccc1C3(c1ccc(B2OC(C)(C)C(C)(C)O2)cc1)c1ccc(B2OC(C)(C)C(C)(C)O2)cc1] | WO 2010/136111 A1 |
| Mo8-Bo | 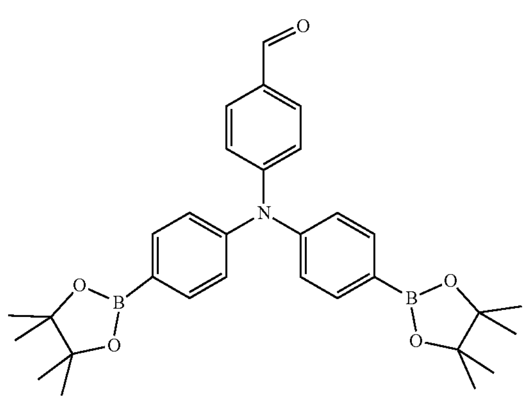 | WO 2010/097155 A1 |

-continued
| Monomer | Structure | Synthesis according to |
|---|---|---|
| Mo8-Br | 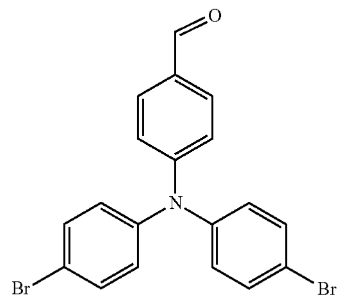 [SMILES: O=Cc1ccc(N(c2ccc(Br)cc2)c2ccc(Br)cc2)cc1] | WO 2010/097155 A1 |
| Mo9-Br | 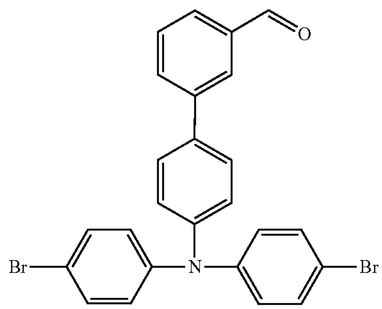 [SMILES: O=Cc1cccc(-c2ccc(N(c3ccc(Br)cc3)c3ccc(Br)cc3)cc2)c1] | WO 2018/114882 A1 |
| Mo9-Bo | 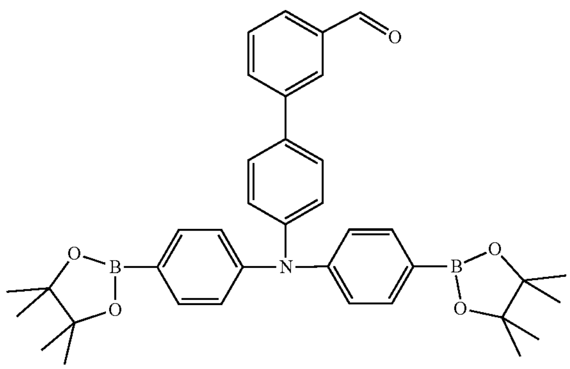 | Borylation analogous to WO 2013/156130 A1 |
| Mo10-Br | 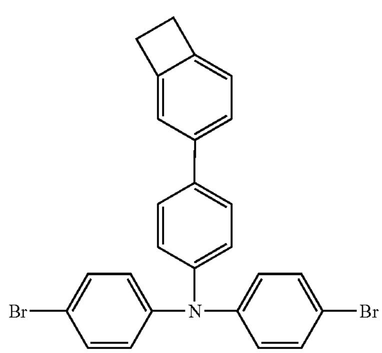 [SMILES: Brc1ccc(N(c2ccc(Br)cc2)c2ccc(-c3ccc4c(c3)CC4)cc2)cc1] | WO 2018/114882 A1 |

-continued
| Monomer | Structure | Synthesis according to |
|---|---|---|
| Mo10-Bo | 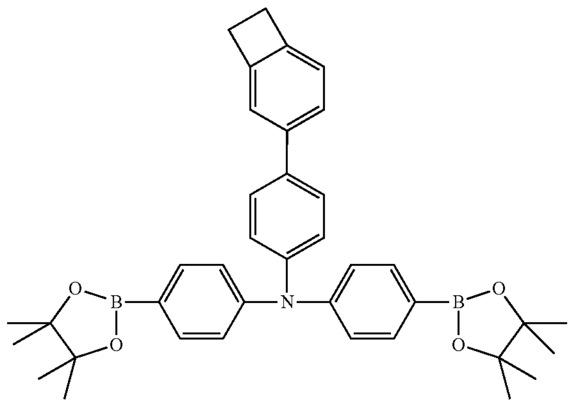 | Borylation analogous to WO 2013/156130 A1 |
| Mo11-Br | 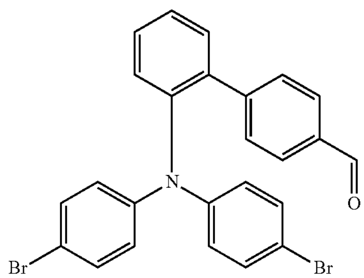 [SMILES: O=Cc1ccc(-c2ccccc2N(c2ccc(Br)cc2)c2ccc(Br)cc2)cc1] | WO 2018/114882 A1 |
| Mo12-Br | 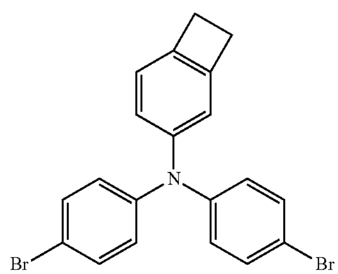 [SMILES: Brc1ccc(N(c2ccc(Br)cc2)c2ccc3c(c2)CC3)cc1] | WO 2009/102027 A1 |
| Mo12-Bo | 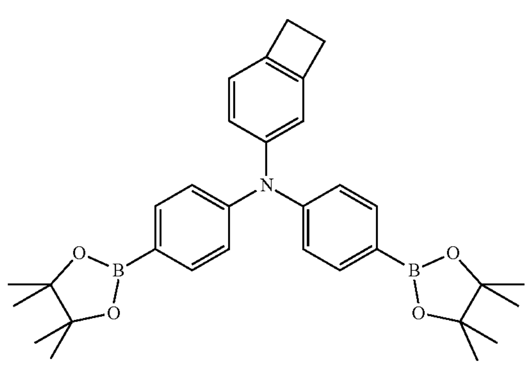 | WO 2009/102027 A1 |

-continued
| Monomer | Structure | Synthesis according to |
| --- | --- | --- |
| Mo13-Br | 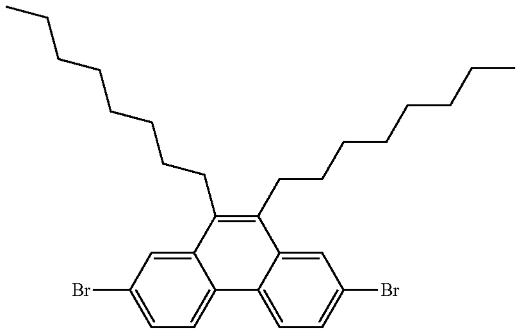 [SMILES: CCCCCCCCc1c(CCCCCCCC)c2cc(Br)ccc2c2ccc(Br)cc12] | CAS 868704-91-0 |
| Mo13-Bo | 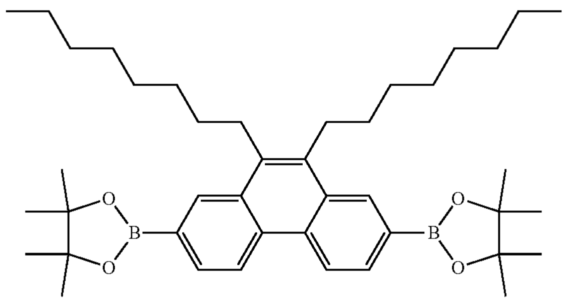 [SMILES: CCCCCCCCc1c(CCCCCCCC)c2cc(B3OC(C)(C)C(C)(C)O3)ccc2c2ccc(B3OC(C)(C)C(C)(C)O3)cc12] | Borylation analogous to WO 2013/156130 A1 |
| Mo14-Bo | 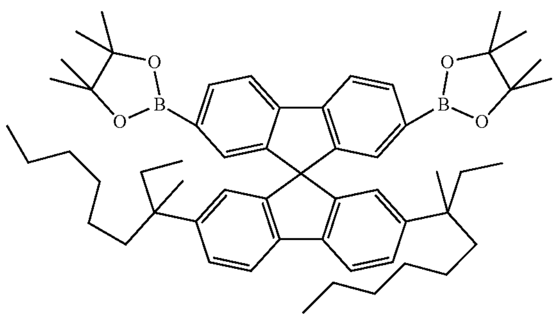 [SMILES: CCCCCCC(C)(CC)c1ccc2c(c1)C1(c3cc(B4OC(C)(C)C(C)(C)O4)ccc3-c3ccc(B4OC(C)(C)C(C)(C)O4)cc31)c1cc(C(C)(CC)CCCCCC)ccc1-2] | WO 03/020790 A2 |
| Mo15-Br | 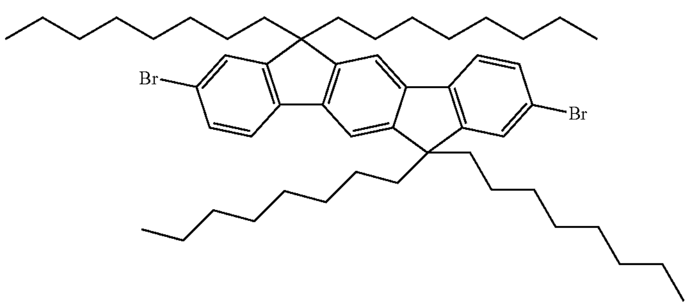 [SMILES: CCCCCCCCC1(CCCCCCCC)c2cc(Br)ccc2-c2cc3c(cc21)-c1ccc(Br)cc1C3(CCCCCCCC)CCCCCCCC] | Macromolecules 2000, 33, 2016-2020 |
| Mo15-Bo | 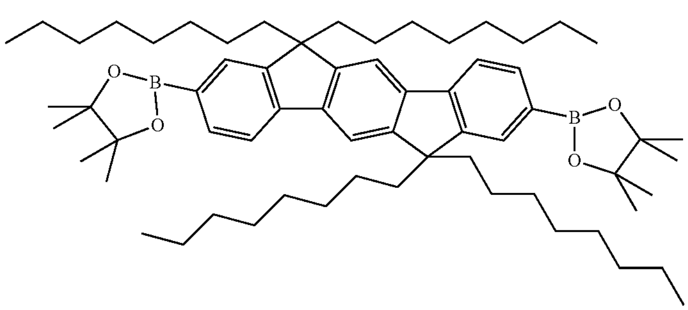 [SMILES: CCCCCCCCC1(CCCCCCCC)c2cc(B3OC(C)(C)C(C)(C)O3)ccc2-c2cc3c(cc21)-c1ccc(B2OC(C)(C)C(C)(C)O2)cc1C3(CCCCCCCC)CCCCCCCC] | CAS 628303-20-8 |

-continued

| Monomer | Structure | Synthesis according to |
|---|---|---|
| Mo16-Br | 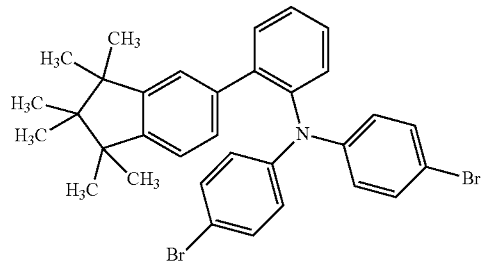 [SMILES: CC1(C)c2ccc(-c3ccccc3N(c3ccc(Br)cc3)c3ccc(Br)cc3)cc2C(C)(C)C1(C)C] | CAS 2231251-18-4 |
| Mo16-Bo | 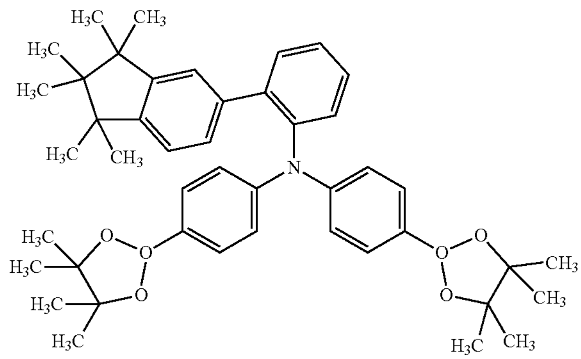 | CAS 2231251-19-5 |

Part B: Synthesis of the Polymers

Examples 1 to 36

Preparation of Inventive Polymers P1 to P35 and of Comparative Polymer V1

Inventive polymers P1 to P35 and comparative polymer V1 are prepared by SUZUKI coupling by the method described in WO 03/048225 from the monomers disclosed in part A.

The polymers P1 to P35 and V1 that have been prepared in this way contain the repeat units, after elimination of the leaving groups, in the percentages specified in the table below (percentages=mol %). In the case of the polymers which are prepared from monomers having aldehyde groups, the latter are converted to crosslinkable vinyl groups after the polymerization by WITTIG reaction by the process described in WO 2010/097155. The polymers correspondingly listed in the table below and used in part C thus have crosslinkable vinyl groups in place of the aldehyde groups originally present.

The palladium and bromine contents of the polymers are determined by ICP-MS. The values determined are below 10 ppm.

The molecular weights $M_w$ and the polydispersities D ascertained by means of gel permeation chromatography (GPC) (model: Agilent HPLC System Series 1100) (column: PL-RapidH from Polymer Laboratories; solvent: THE with 0.12% by volume of o-dichlorobenzene; detection: UV and refractive index; temperature: 40° C.). Calibration is effected with polystyrene standards.

| Polymer | Inventive monomers | Further monomers | (Mw) [g/mol]/D |
|---|---|---|---|
| P1 | 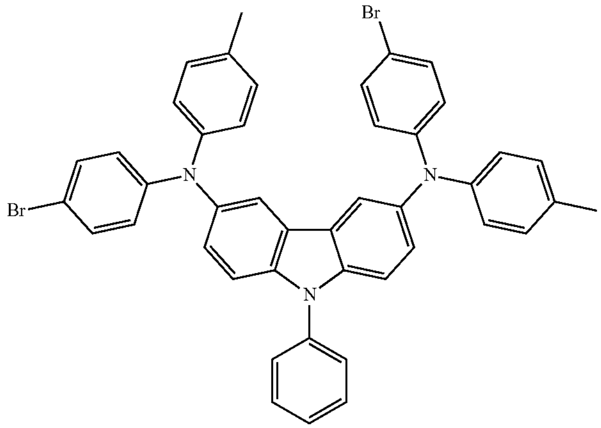 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 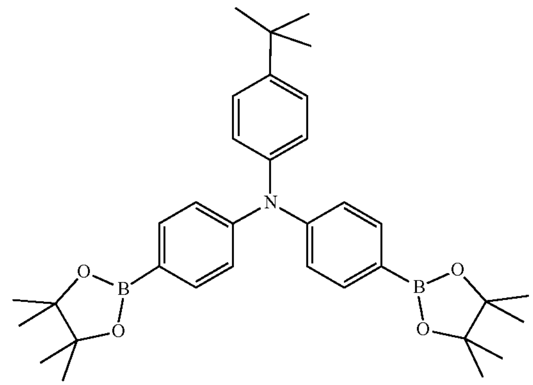 Mo1-Bo 50% | 77.000 4.3 |
| P2 | 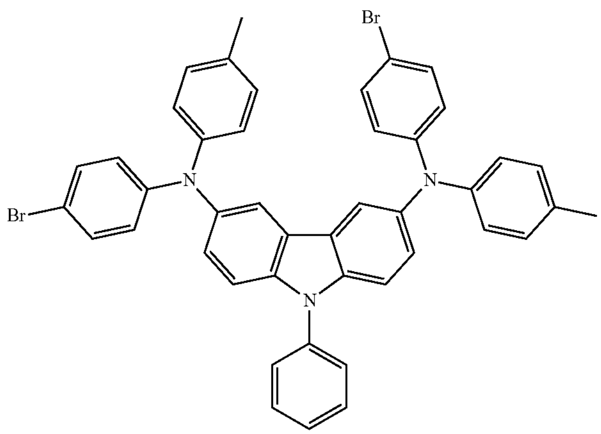 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 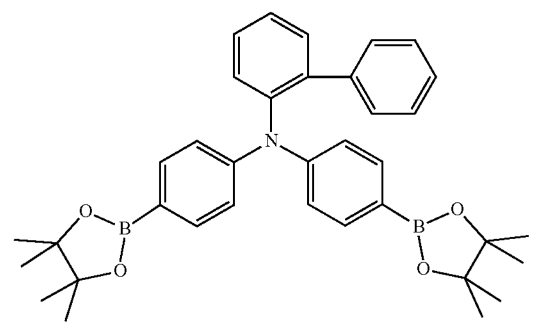 Mo2-Bo 50% | 85.000 5.2 |

-continued
| Poly-mer | Inventive monomers | Further monomers | (Mw) [g/mol]/D |
| --- | --- | --- | --- |
| P3 | 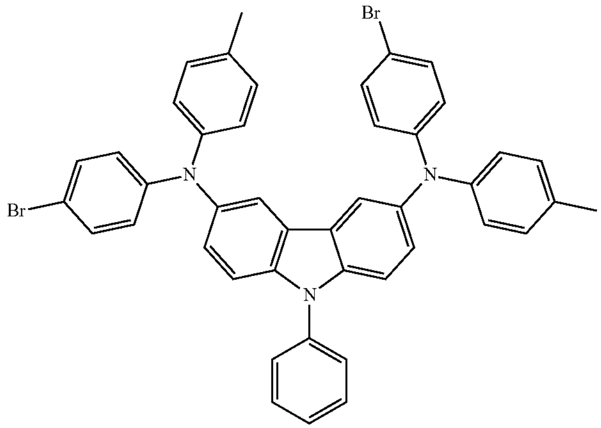 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 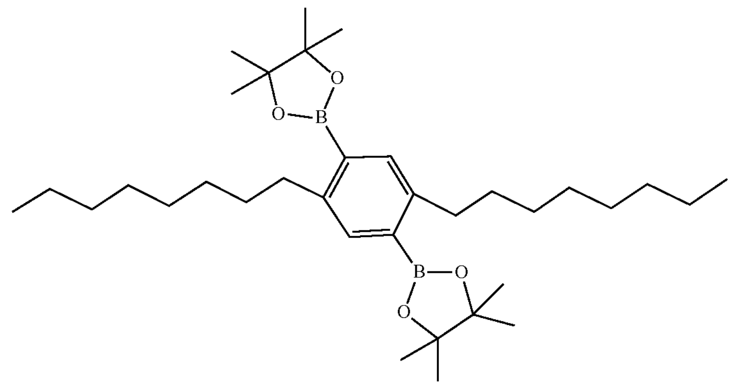 [SMILES: CCCCCCCCc1cc(B2OC(C)(C)C(C)(C)O2)c(CCCCCCCC)cc1B1OC(C)(C)C(C)(C)O1] Mo5-Bo 50% | 53.000 6.3 |
| P4 | 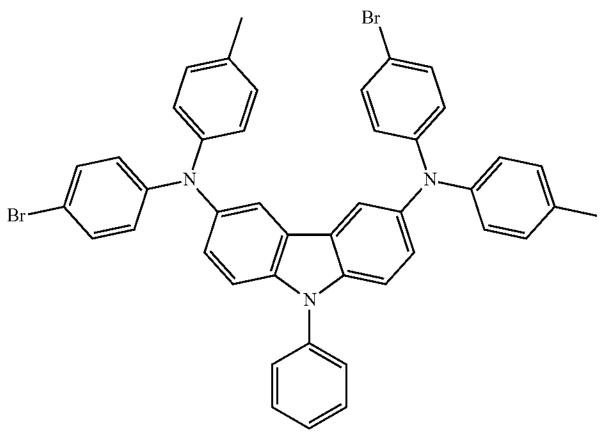 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 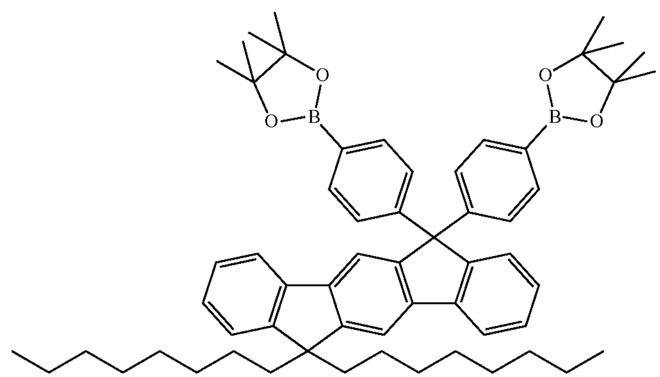 [SMILES: CCCCCCCCC1(CCCCCCCC)c2ccccc2-c2cc3c(cc21)-c1ccccc1C3(c1ccc(B2OC(C)(C)C(C)(C)O2)cc1)c1ccc(B2OC(C)(C)C(C)(C)O2)cc1] Mo7-Bo 50% | 55.000 6.3 |

-continued
| Poly-mer | Inventive monomers | Further monomers | (Mw) [g/mol]/D |
|---|---|---|---|
| P5 | 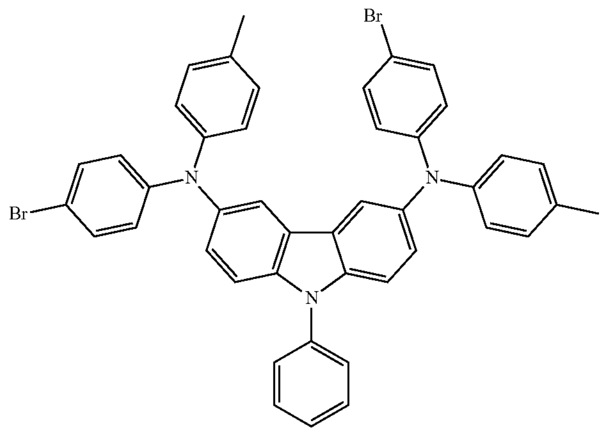 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 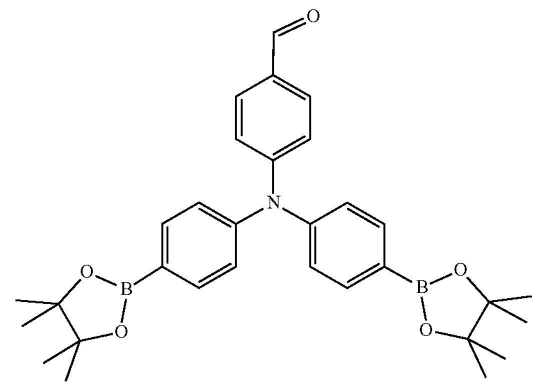 Mo8-Bo 50% | 90.000 5.4 |
| P6 | 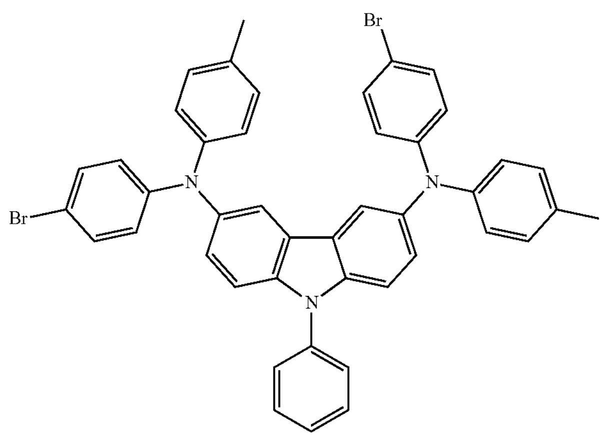 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 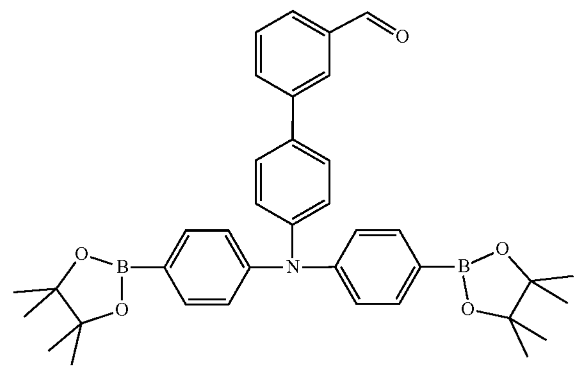 Mo9-Bo 50% | 89.000 5.3 |

-continued
| Polymer | Inventive monomers | Further monomers | (Mw) [g/mol]/D |
|---|---|---|---|
| P7 | 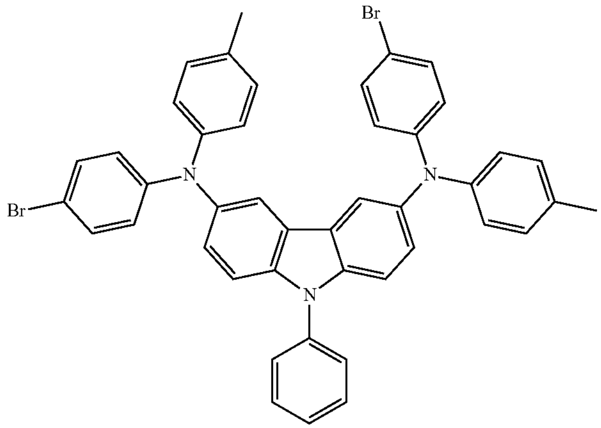 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 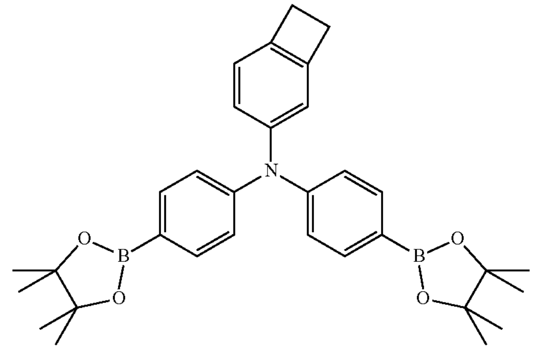 Mo12-Bo 50% | 92.000 5.5 |
| P8 | 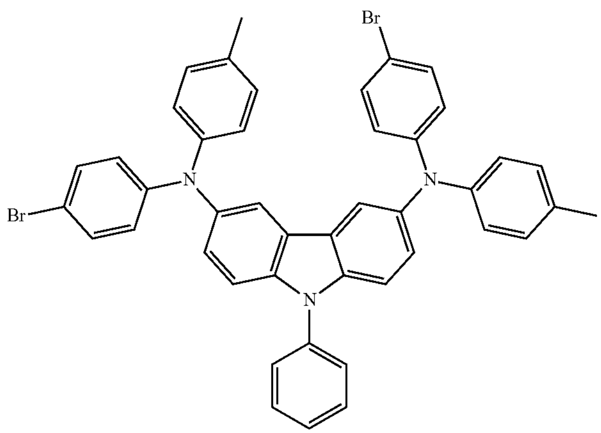 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 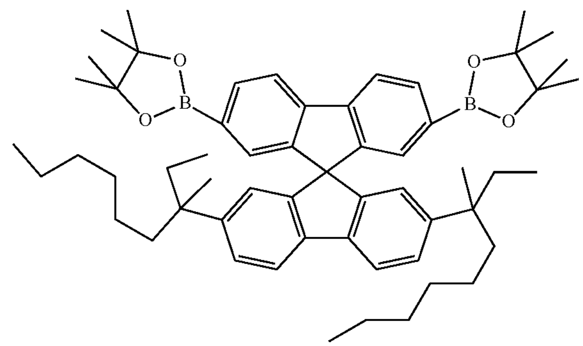 [SMILES: CCCCCCC(C)(CC)c1ccc2c(c1)C1(c3cc(B4OC(C)(C)C(C)(C)O4)ccc3-c3ccc(B4OC(C)(C)C(C)(C)O4)cc31)c1cc(C(C)(CC)CCCCCC)ccc1-2] Mo14-Bo 50% | 105.000 4.2 |

-continued
| Poly-mer | Inventive monomers | Further monomers | (Mw) [g/mol]/D |
|---|---|---|---|
| P9 | 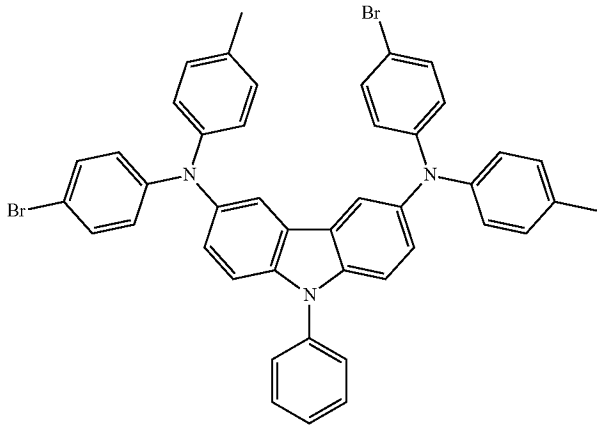 [SMILES: Cc1ccc(N(c2ccc(Br)cc2)c2ccc3c(c2)c2cc(N(c4ccc(C)cc4)c4ccc(Br)cc4)ccc2n3-c2ccccc2)cc1] A1:B1:Br 50% | 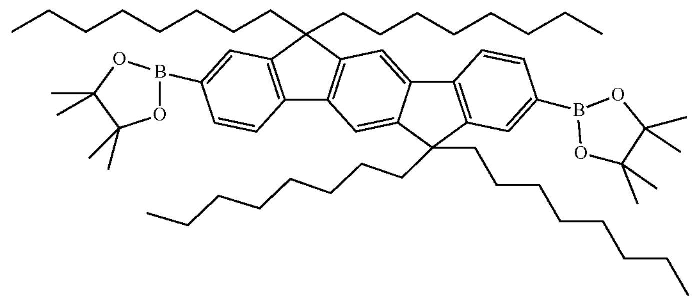 [SMILES: CCCCCCCCC1(CCCCCCCC)c2cc(B3OC(C)(C)C(C)(C)O3)ccc2-c2cc3c(cc21)-c1ccc(B2OC(C)(C)C(C)(C)O2)cc1C3(CCCCCCCC)CCCCCCCC] Mo15-Bo 50% | 97.000 4.5 |
| P10 | 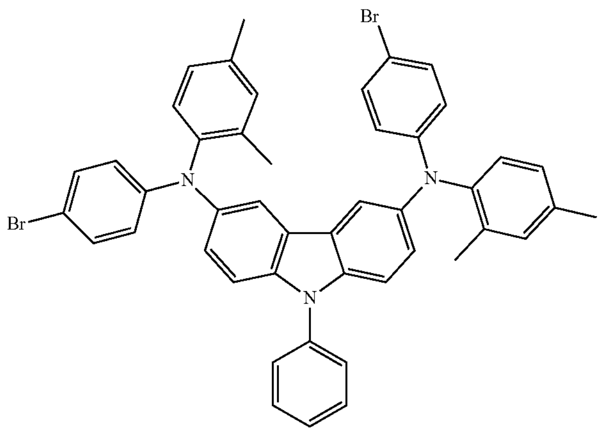 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 50% | 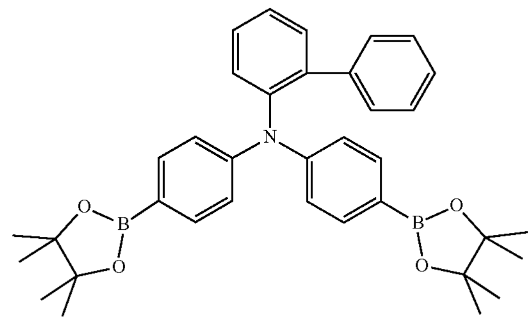 Mo2-Bo 50% | 78.000 5.3 |

-continued
| Poly-mer | Inventive monomers | Further monomers | (Mw) [g/mol]/D |
|---|---|---|---|
| P11 | 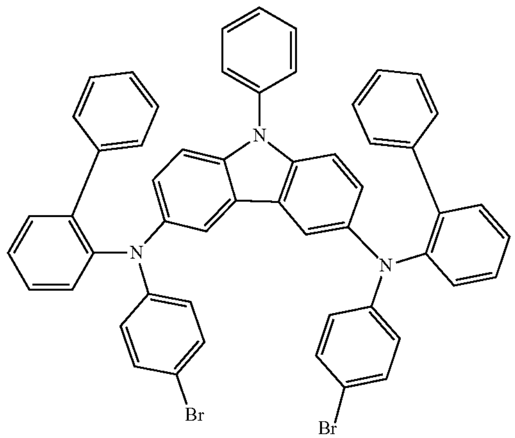 [SMILES: Brc1ccc(N(Cc2ccc3c(c2)c2cc(N(c4ccc(Br)cc4)c4ccccc4-c4ccccc4)ccc2n3-c2ccccc2)c2ccccc2-c2ccccc2)cc1] A1:B14:Br 40% | 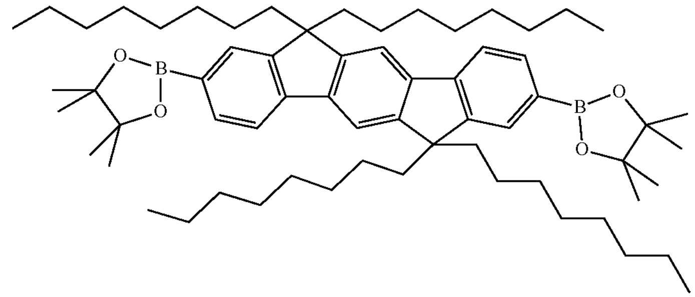 [SMILES: CCCCCCCCC1(CCCCCCCC)c2cc(B3OC(C)(C)C(C)(C)O3)ccc2-c2cc3c(cc21)-c1ccc(B2OC(C)(C)C(C)(C)O2)cc1C3(CCCCCCCC)CCCCCCCC] Mo15-Bo 50% 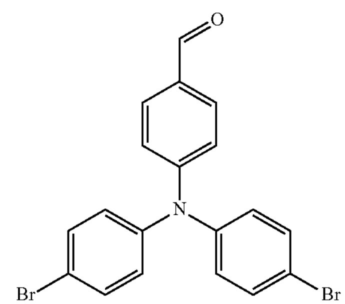 [SMILES: O=Cc1ccc(N(c2ccc(Br)cc2)c2ccc(Br)cc2)cc1] Mo8-Br 10% | 108.000 3.3 |

-continued
| Polymer | Inventive monomers | Further monomers | (Mw) [g/mol]/D |
| --- | --- | --- | --- |
| P12 | 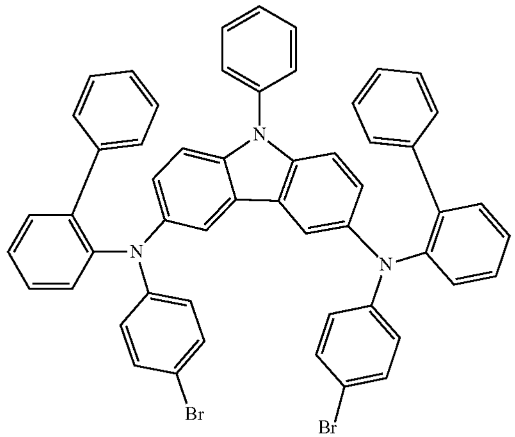 [SMILES: Brc1ccc(N(Cc2ccc3c(c2)c2cc(N(c4ccc(Br)cc4)c4ccccc4-c4ccccc4)ccc2n3-c2ccccc2)c2ccccc2-c2ccccc2)cc1] A1:B14:Br 40% | 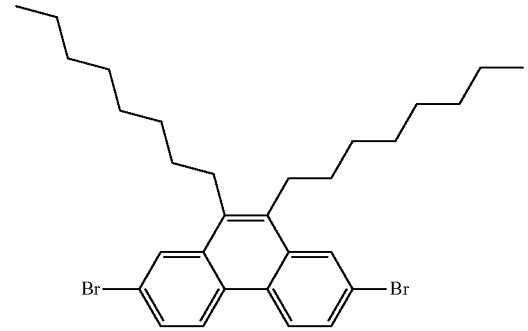 [SMILES: CCCCCCCCc1c(CCCCCCCC)c2cc(Br)ccc2c2ccc(Br)cc12] Mo13-Br 50% 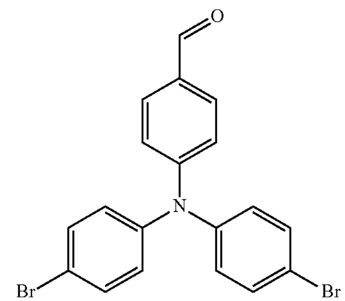 [SMILES: O=Cc1ccc(N(c2ccc(Br)cc2)c2ccc(Br)cc2)cc1] Mo8-Br 10% | 60.000 3.0 |

-continued
| Polymer | Inventive monomers | Further monomers | (Mw) [g/mol]/D |
|---|---|---|---|
| P13 | 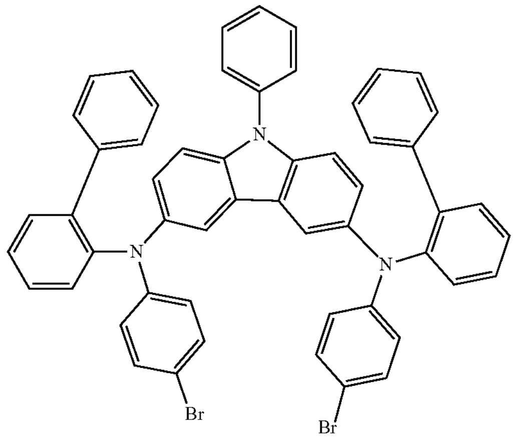 [SMILES: Brc1ccc(N(Cc2ccc3c(c2)c2cc(N(c4ccc(Br)cc4)c4ccccc4-c4ccccc4)ccc2n3-c2ccccc2)c2ccccc2-c2ccccc2)cc1] A1:B14:Br 50% | 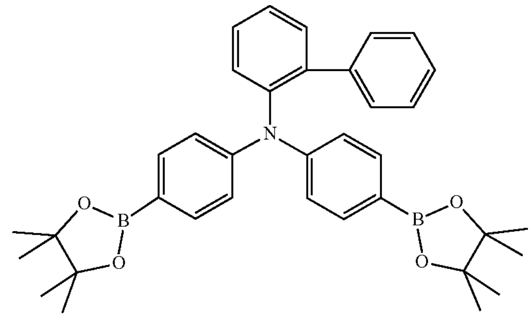 Mo2-Bo 30% 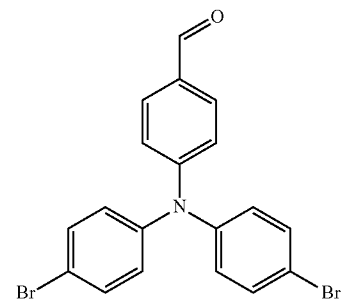 [SMILES: O=Cc1ccc(N(c2ccc(Br)cc2)c2ccc(Br)cc2)cc1] Mo8-Br 20% | 85.000 2.5 |

-continued
| Poly-mer | Inventive monomers | Further monomers | (Mw) [g/mol]/D |
|---|---|---|---|
| P14 | 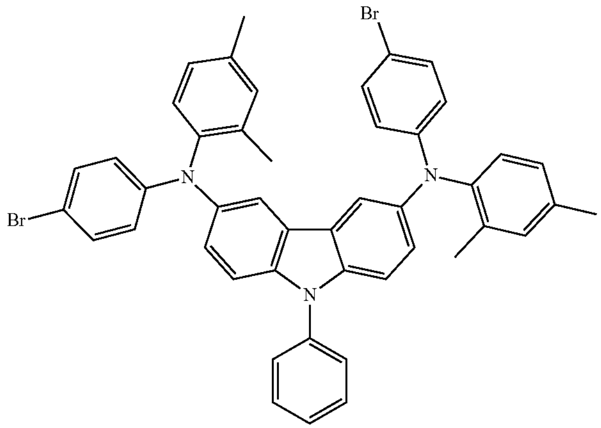 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 30% | 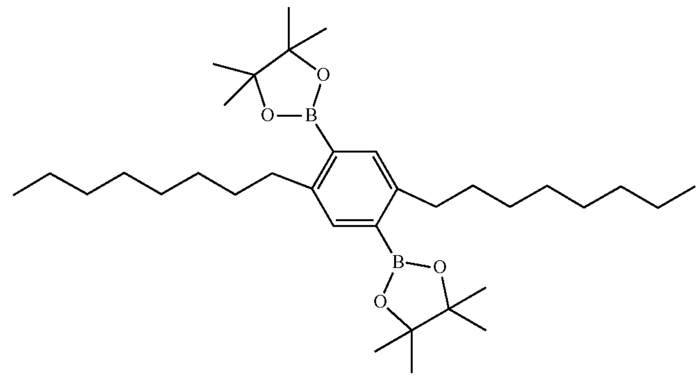 [SMILES: CCCCCCCCc1cc(B2OC(C)(C)C(C)(C)O2)c(CCCCCCCC)cc1B1OC(C)(C)C(C)(C)O1] Mo5-Bo 50% 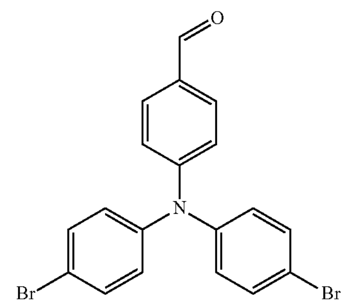 [SMILES: O=Cc1ccc(N(c2ccc(Br)cc2)c2ccc(Br)cc2)cc1] Mo8-Br 20% | 96.000 2.7 |

-continued
| Poly-mer | Inventive monomers | Further monomers | (Mw) [g/mol]/D |
|---|---|---|---|
| P15 | 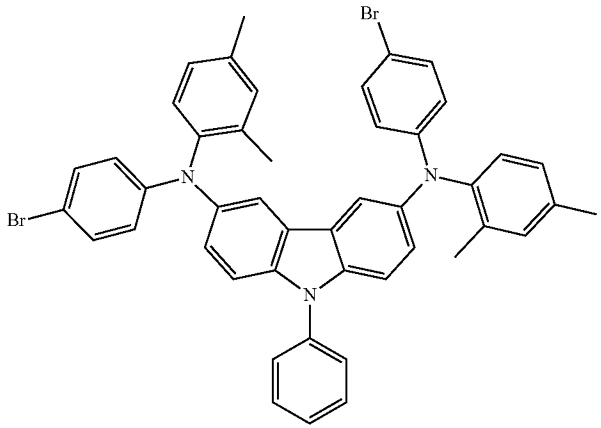 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 50% | 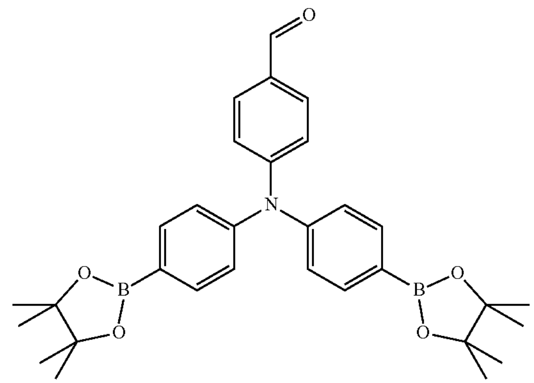 Mo8-Bo 50% | 120.000 2.9 |

-continued
| Poly-mer | Inventive monomers | Further monomers | (Mw) [g/mol]/D |
|---|---|---|---|
| P16 | 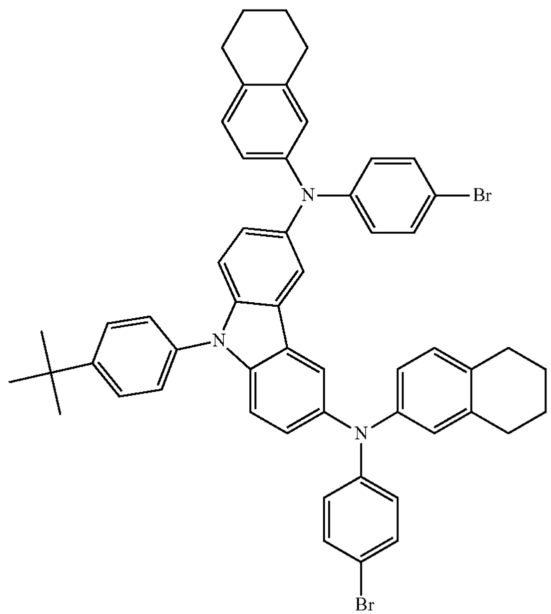 [SMILES: CC(C)(C)c1ccc(-n2c3ccc(N(c4ccc(Br)cc4)c4ccc5c(c4)CCCC5)cc3c3cc(N(c4ccc(Br)cc4)c4ccc5c(c4)CCCC5)ccc32)cc1] A9:B9:Br 50% | 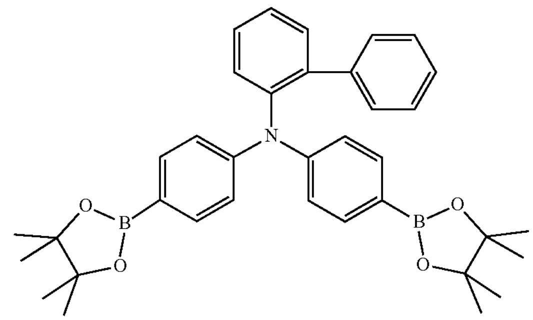 Mo2-Bo 50% | 75.000 5.4 |

-continued
| Polymer | Inventive monomers | Further monomers | (Mw) [g/mol]/D |
|---|---|---|---|
| P17 | 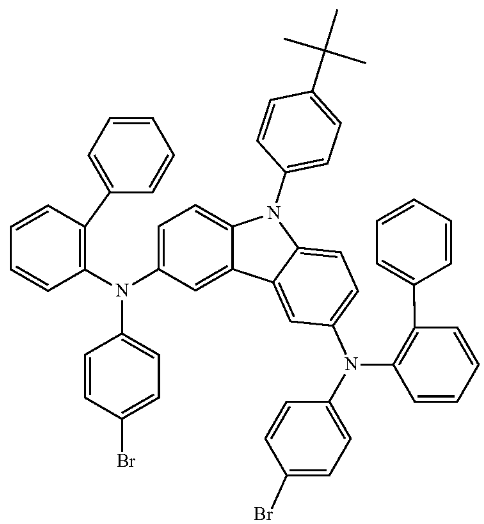 [SMILES: CC(C)(C)c1ccc(-n2c3ccc(N(c4ccc(Br)cc4)c4ccccc4-c4ccccc4)cc3c3cc(N(c4ccc(Br)cc4)c4ccccc4-c4ccccc4)ccc32)cc1] A9:B14:Br 50% | 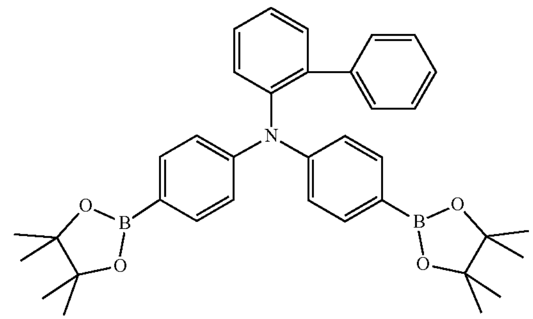 Mo2-Bo 50% | 67.000 6.6 |

-continued
| Poly-mer | Inventive monomers | Further monomers | (Mw) [g/mol]/D |
|---|---|---|---|
| P18 | 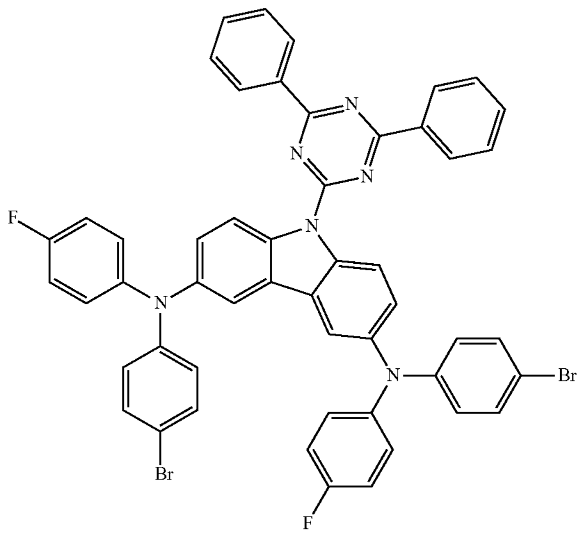 [SMILES: Fc1ccc(N(c2ccc(Br)cc2)c2ccc3c(c2)c2cc(N(c4ccc(F)cc4)c4ccc(Br)cc4)ccc2n3-c2nc(-c3ccccc3)nc(-c3ccccc3)n2)cc1] A21:B2:Br 50% | 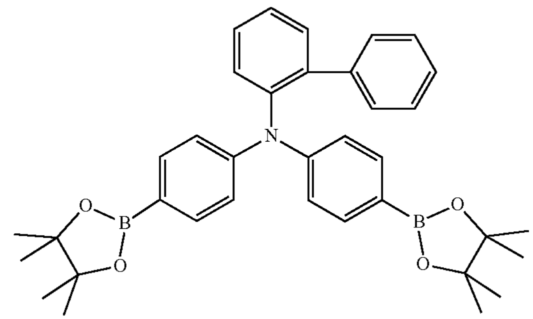 Mo2-Bo 50% | 78.000 5.2 |

-continued
| Polymer | Inventive monomers | Further monomers | (Mw) [g/mol]/D |
| --- | --- | --- | --- |
| P19 | 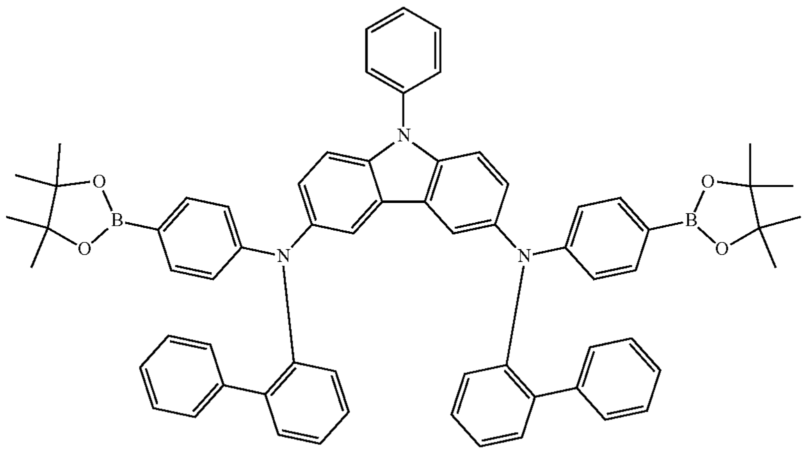 A1:B14:BOR 50% | 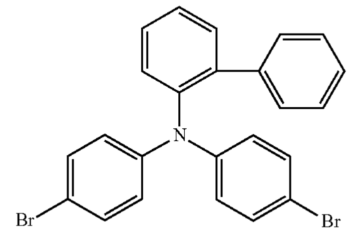 [SMILES: Brc1ccc(N(c2ccc(Br)cc2)c2ccccc2-c2ccccc2)cc1] Mo2-Br 50% | 64.000 5.3 |

-continued
| Poly-mer | Inventive monomers | Further monomers | (Mw) [g/mol]/D |
|---|---|---|---|
| P20 | 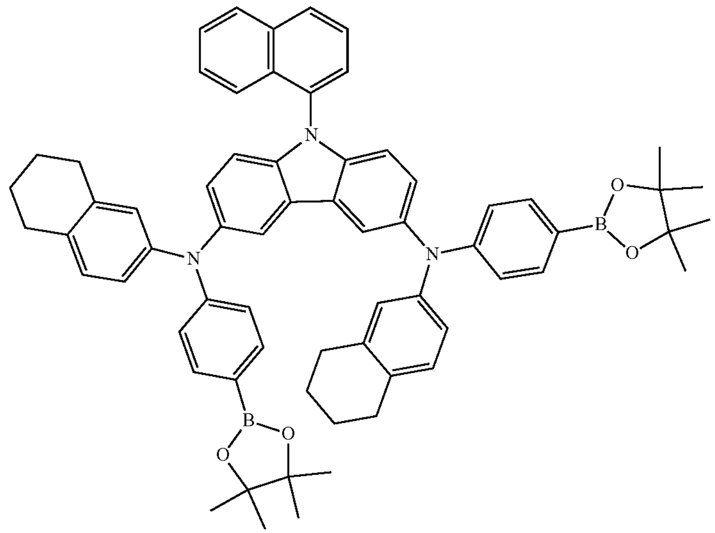 [SMILES: CC1(C)OB(c2ccc(N(c3ccc4c(c3)CCCC4)c3ccc4c(c3)c3cc(N(c5ccc(B6OC(C)(C)C(C)(C)O6)cc5)c5ccc6c(c5)CCCC6)ccc3n4-c3cccc4ccccc34)cc2)OC1(C)C] A8:B9:BOR 50% | 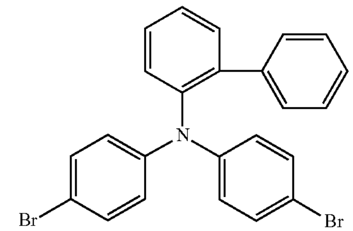 [SMILES: Brc1ccc(N(c2ccc(Br)cc2)c2ccccc2-c2ccccc2)cc1] Mo2-Br 50% | 74.000 5.1 |

-continued
| Poly-mer | Inventive monomers | Further monomers | (Mw) [g/mol]/D |
|---|---|---|---|
| P21 | 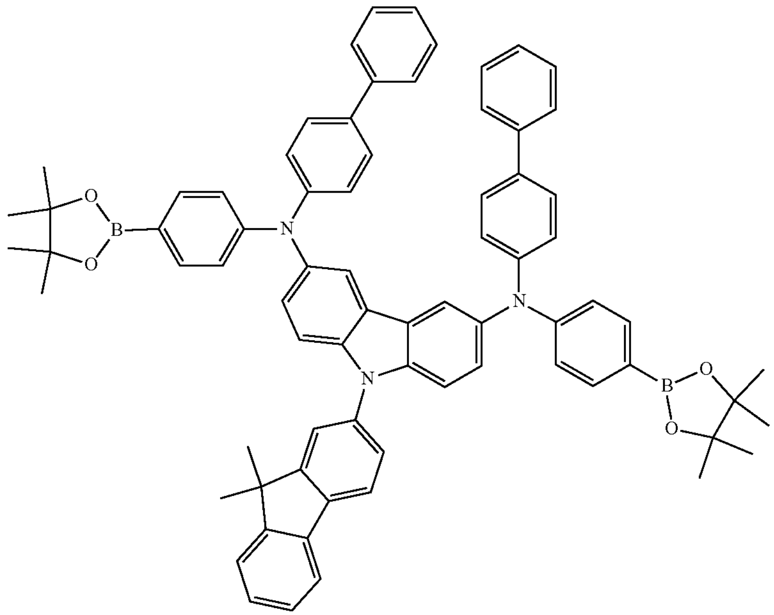 A16:B13:BOR 50% | 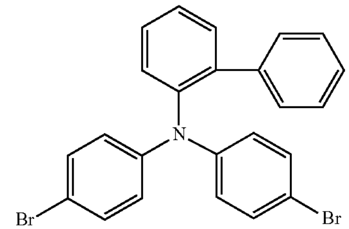 [SMILES: Brc1ccc(N(c2ccc(Br)cc2)c2ccccc2-c2ccccc2)cc1] Mo2-Br 50% | 83.000 5.7 |

-continued
| Poly-mer | Inventive monomers | Further monomers | (Mw) [g/mol]/D |
|---|---|---|---|
| P22 | 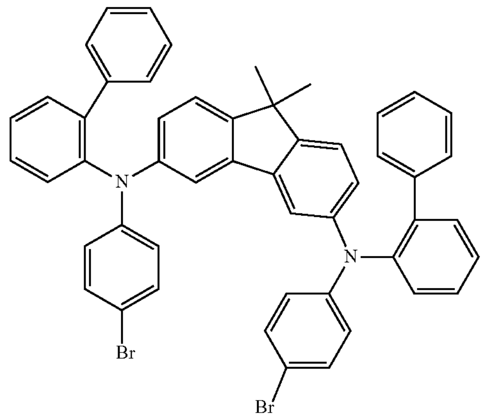 [SMILES: CC1(C)c2ccc(N(c3ccc(Br)cc3)c3ccccc3-c3ccccc3)cc2-c2cc(N(c3ccc(Br)cc3)c3ccccc3-c3ccccc3)ccc21] C1:B14:Br 50% | 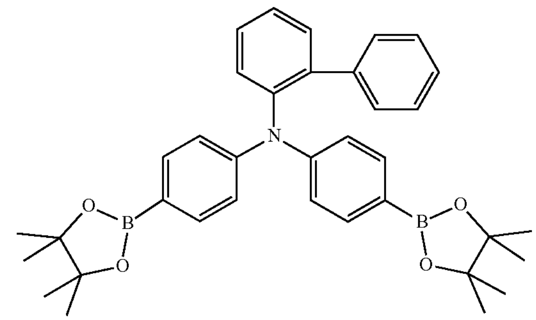 Mo2-Bo 50% | 68.000 6.2 |

-continued
| Polymer | Inventive monomers | Further monomers | (Mw) [g/mol]/D |
|---|---|---|---|
| P23 | 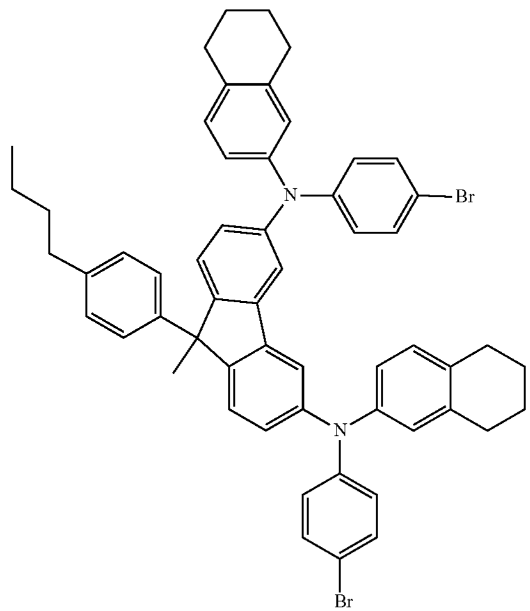 [SMILES: CCCCc1ccc(C2(C)c3ccc(N(c4ccc(Br)cc4)c4ccc5c(c4)CCCC5)cc3-c3cc(N(c4ccc(Br)cc4)c4ccc5c(c4)CCCC5)ccc32)cc1] C3:B9:Br 50% | 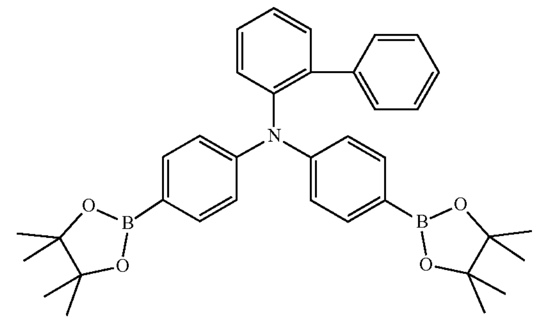 Mo2-Bo 50% | 107.000 5.9 |

-continued
| Poly-mer | Inventive monomers | Further monomers | (Mw) [g/mol]/D |
|---|---|---|---|
| P24 | 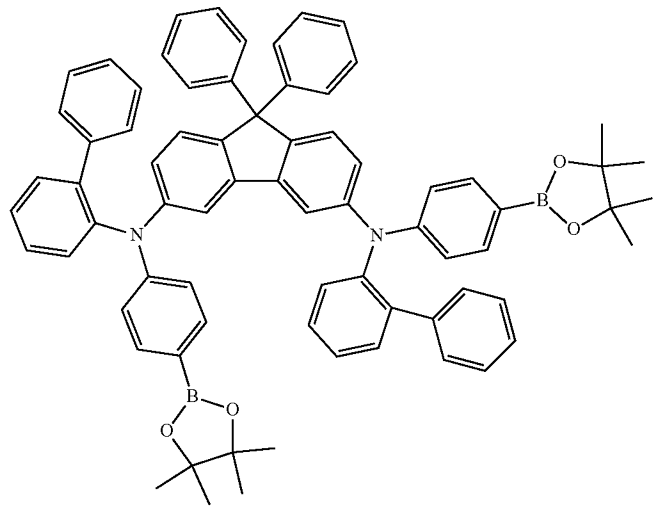 [SMILES: CC1(C)OB(c2ccc(N(c3ccc4c(c3)-c3cc(N(c5ccc(B6OC(C)(C)C(C)(C)O6)cc5)c5ccccc5-c5ccccc5)ccc3C4(c3ccccc3)c3ccccc3)c3ccccc3-c3ccccc3)cc2)OC1(C)C]<br>C4:B14:BOR<br>50% | 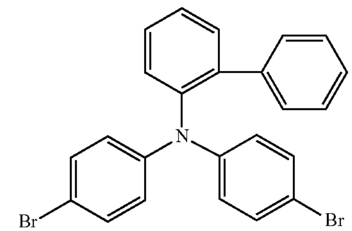 [SMILES: Brc1ccc(N(c2ccc(Br)cc2)c2ccccc2-c2ccccc2)cc1]<br>Mo2-Br<br>50% | 77.000<br>5.3 |

-continued
| Poly-mer | Inventive monomers | Further monomers | (Mw) [g/mol]/D |
|---|---|---|---|
| P25 | 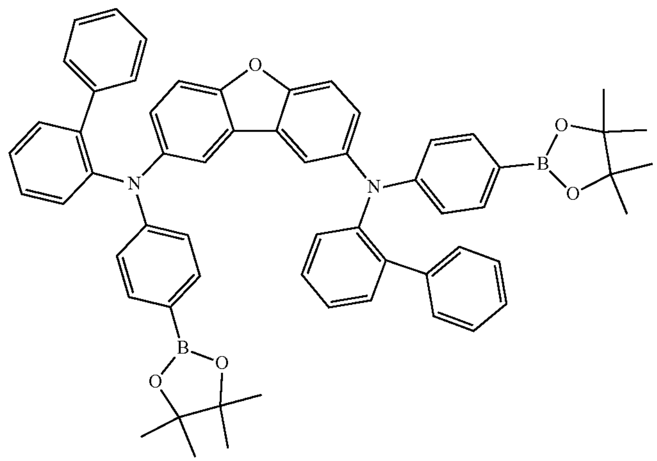 [SMILES: CC1(C)OB(c2ccc(N(c3ccc4oc5ccc(N(c6ccc(B7OC(C)(C)C(C)(C)O7)cc6)c6ccccc6-c6ccccc6)cc5c4c3)c3ccccc3-c3ccccc3)cc2)OC1(C)C] D1:B14:BOR 50% | 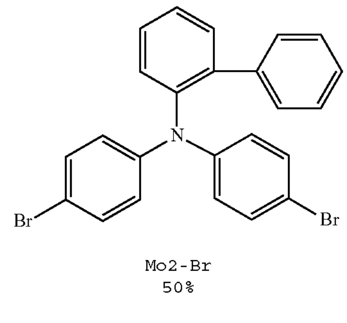 Mo2-Br 50% | 61.000 4.8 |
| P26 | 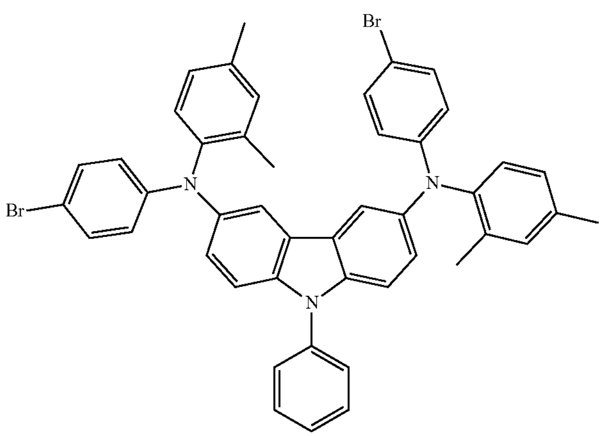 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 50% | 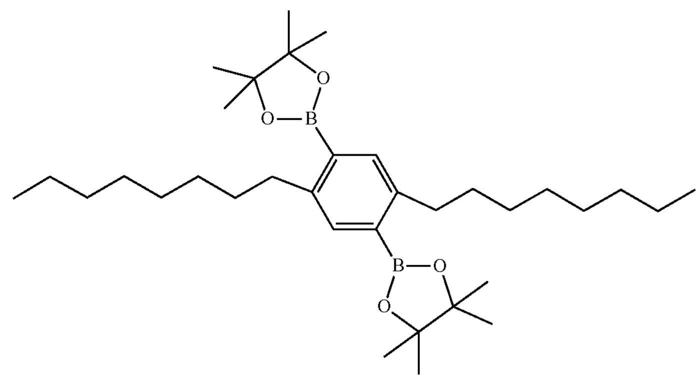 [SMILES: CCCCCCCCc1cc(B2OC(C)(C)C(C)(C)O2)c(CCCCCCCC)cc1B1OC(C)(C)C(C)(C)O1] Mo5-Bo 50% | 55.000 6.0 |

-continued
| Poly-mer | Inventive monomers | Further monomers | (Mw) [g/mol]/D |
| --- | --- | --- | --- |
| P27 | 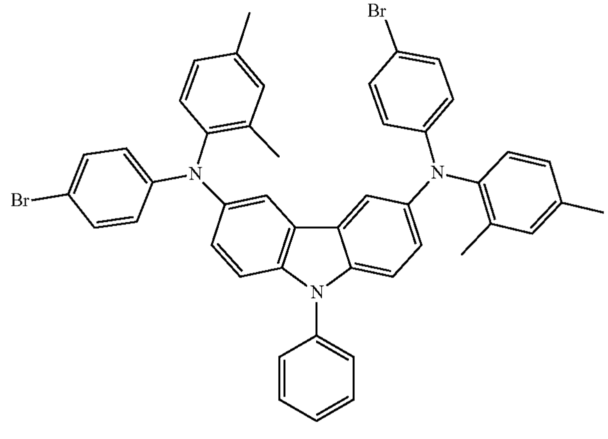 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 50% | 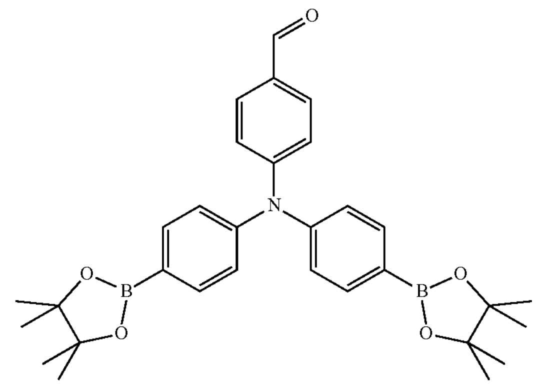 Mo8-Bo 50% | 68.000 5.1 |
| P28 | 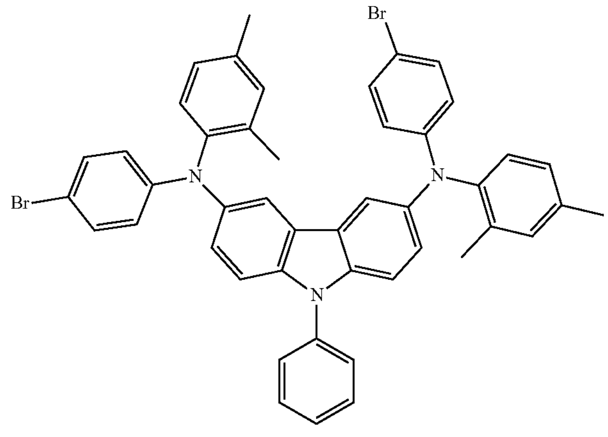 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 50% | 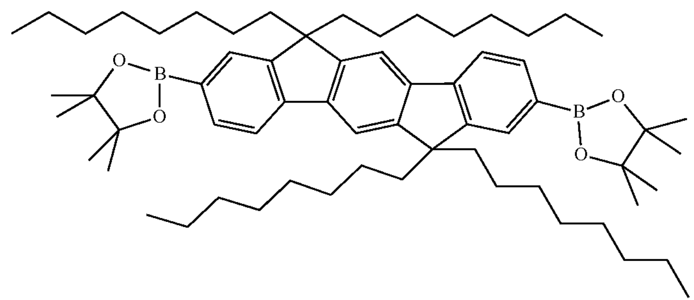 [SMILES: CCCCCCCCC1(CCCCCCCC)c2cc(B3OC(C)(C)C(C)(C)O3)ccc2-c2cc3c(cc21)-c1ccc(B2OC(C)(C)C(C)(C)O2)cc1C3(CCCCCCCC)CCCCCCCC] Mo15-Bo 50% | 88.000 5.0 |

-continued
| Poly-mer | Inventive monomers | Further monomers | (Mw) [g/mol]/D |
|---|---|---|---|
| P29 | 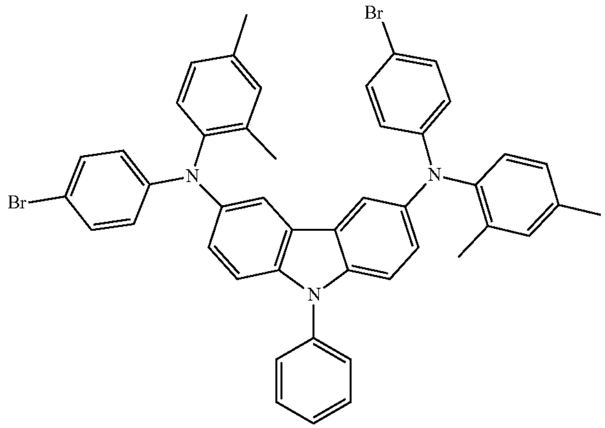 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 25% | 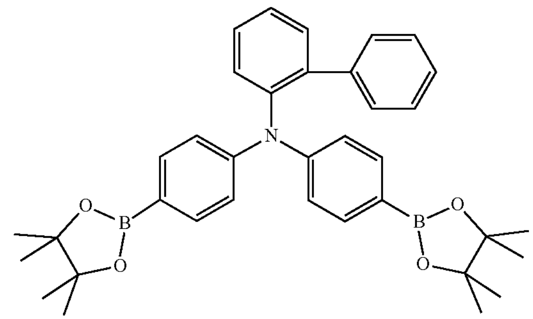 Mo2-Bo 50% 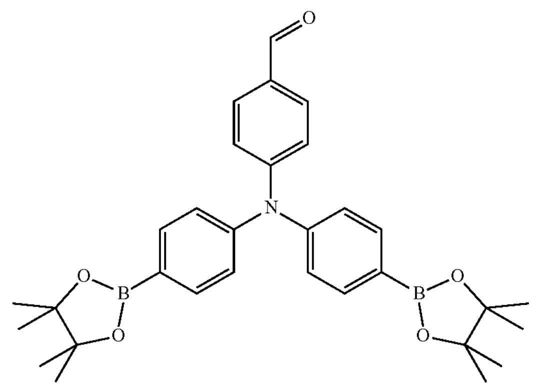 Mo8-Bo 25% | 93.000 5.6 |

-continued
| Polymer | Inventive monomers | Further monomers | (Mw) [g/mol]/D |
|---|---|---|---|
| P30 | 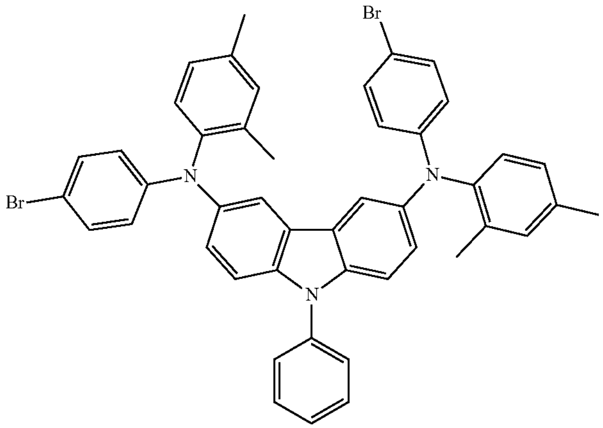 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 40% | 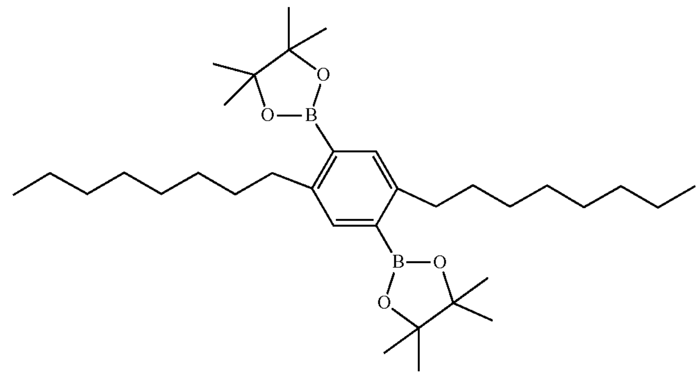 [SMILES: CCCCCCCCc1cc(B2OC(C)(C)C(C)(C)O2)c(CCCCCCCC)cc1B1OC(C)(C)C(C)(C)O1] Mo5-Bo 50% 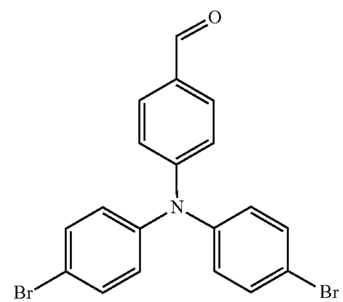 [SMILES: O=Cc1ccc(N(c2ccc(Br)cc2)c2ccc(Br)cc2)cc1] Mo8-Br 10% | 55.000 6.8 |

-continued
| Polymer | Inventive monomers | Further monomers | (Mw) [g/mol]/D |
|---|---|---|---|
| P31 | 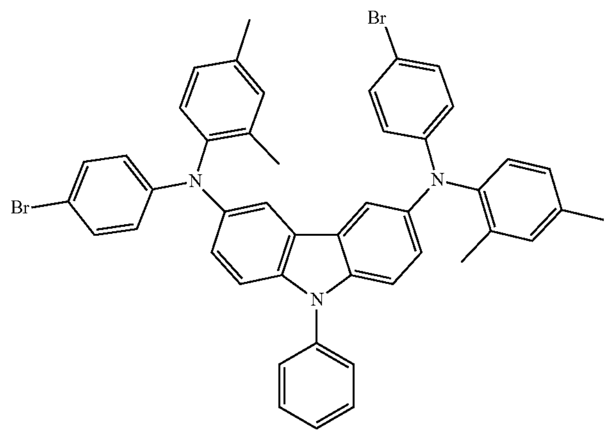 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 50% | 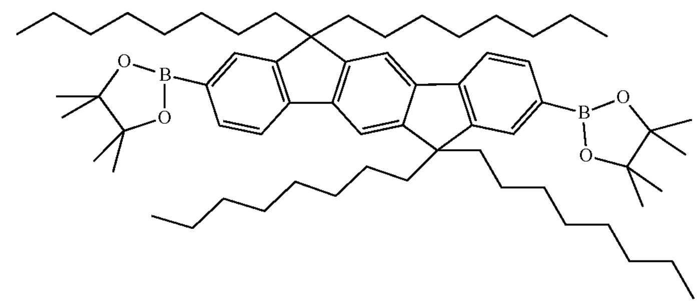 [SMILES: CCCCCCCCC1(CCCCCCCC)c2cc(B3OC(C)(C)C(C)(C)O3)ccc2-c2cc3c(cc21)-c1ccc(B2OC(C)(C)C(C)(C)O2)cc1C3(CCCCCCCC)CCCCCCCC] Mo15-Bo 30% 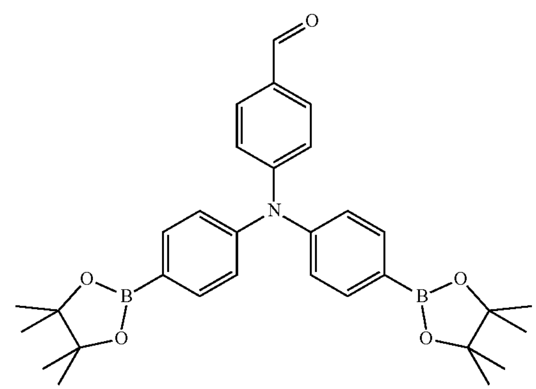 Mo8-Bo 20% | 74.000 5.7 |

-continued
| Poly-mer | Inventive monomers | Further monomers | (Mw) [g/mol]/D |
|---|---|---|---|
| P32 | 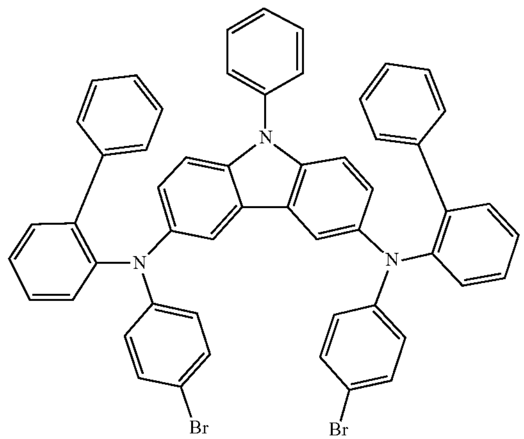 [SMILES: Brc1ccc(N(c2ccc3c(c2)c2cc(N(c4ccc(Br)cc4)c4ccccc4-c4ccccc4)ccc2n3-c2ccccc2)c2ccccc2-c2ccccc2)cc1] A1:B14:Br 20% | 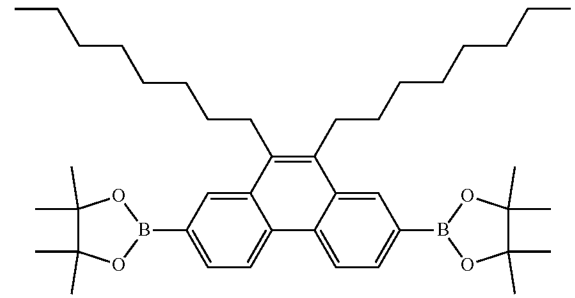 [SMILES: CCCCCCCCc1c(CCCCCCCC)c2cc(B3OC(C)(C)C(C)(C)O3)ccc2c2ccc(B3OC(C)(C)C(C)(C)O3)cc12] Mo13-Bo 50% 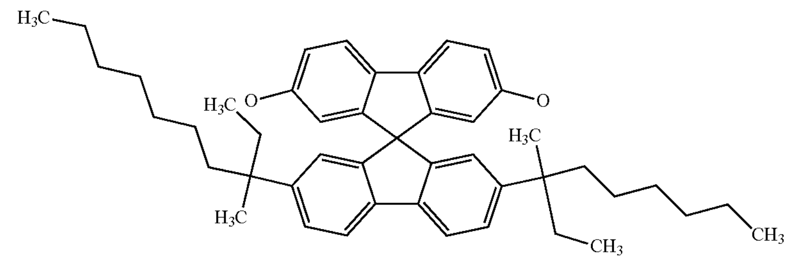 [SMILES: CCCCCCCC(C)(CC)c1ccc2c(c1)C1(c3cc(O)ccc3-c3ccc(O)cc31)c1cc(C(C)(CC)CCCCCC)ccc1-2] Mo14-Br 20% 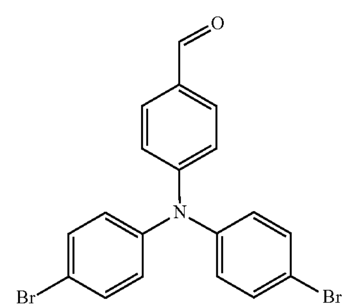 [SMILES: O=Cc1ccc(N(c2ccc(Br)cc2)c2ccc(Br)cc2)cc1] Mo8-Br 10% | 80.000 |

-continued
| Polymer | Inventive monomers | Further monomers | (Mw) [g/mol]/D |
|---|---|---|---|
| P33 | 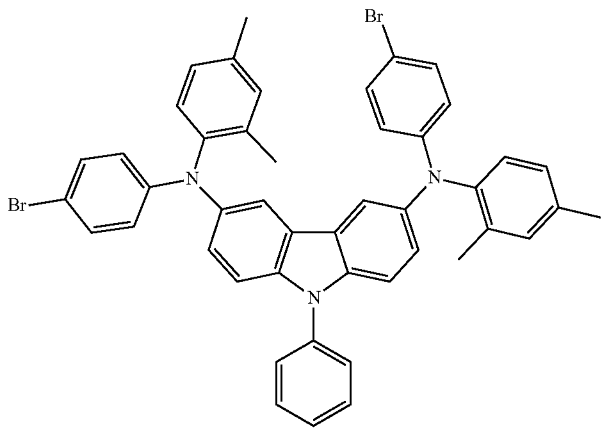 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 50% | 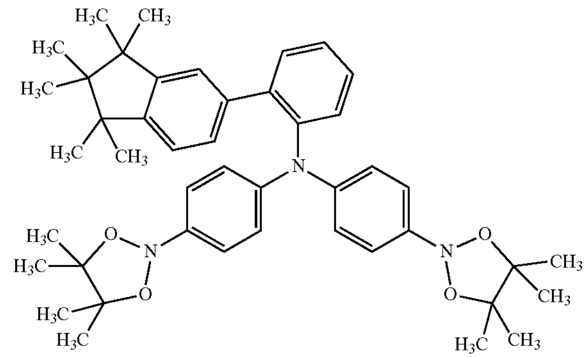 Mo16-Bo 30% 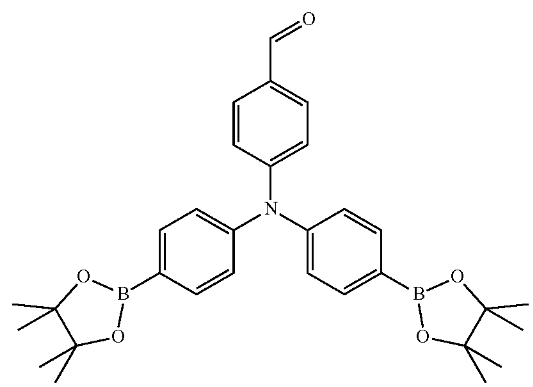 Mo8-Br 20% | 68.000 |

-continued
| Polymer | Inventive monomers | Further monomers | (Mw) [g/mol]/D |
|---|---|---|---|
| P34 | 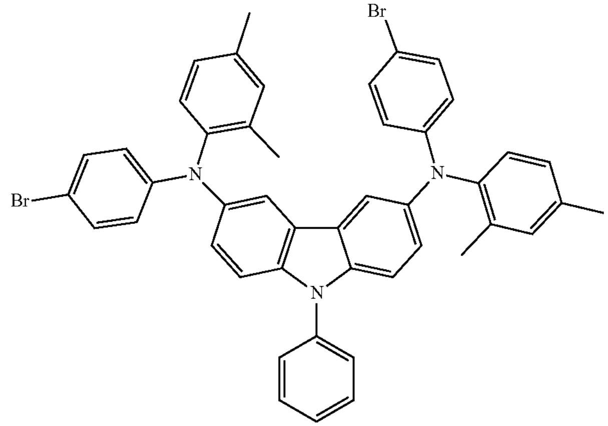 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 40% | 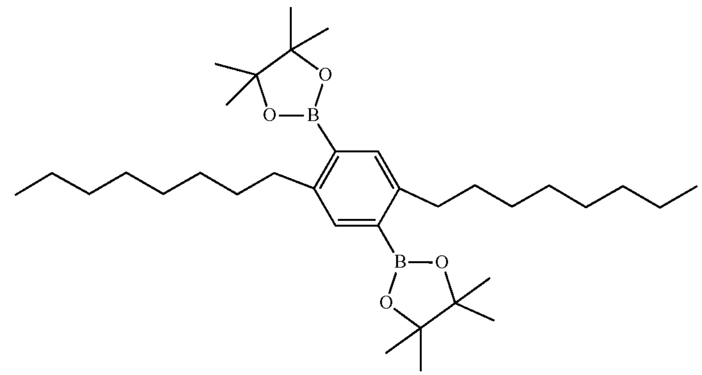 [SMILES: CCCCCCCCc1cc(B2OC(C)(C)C(C)(C)O2)c(CCCCCCCC)cc1B1OC(C)(C)C(C)(C)O1] Mo5-Bo 50% 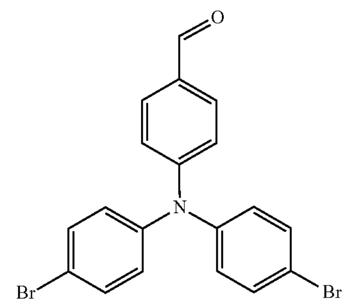 [SMILES: O=Cc1ccc(N(c2ccc(Br)cc2)c2ccc(Br)cc2)cc1] Mo8-Br 10% | 86.000 |

-continued
| Polymer | Inventive monomers | Further monomers | (Mw) [g/mol]/D |
|---|---|---|---|
| P35 | 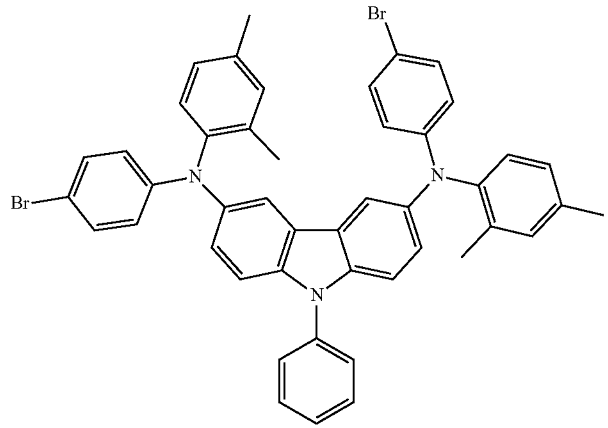 [SMILES: Cc1ccc(N(c2ccc(Br)cc2)c2ccc3c(c2)c2cc(N(c4ccc(Br)cc4)c4ccc(C)cc4C)ccc2n3-c2ccccc2)c(C)c1] A1:B5:Br 20% | 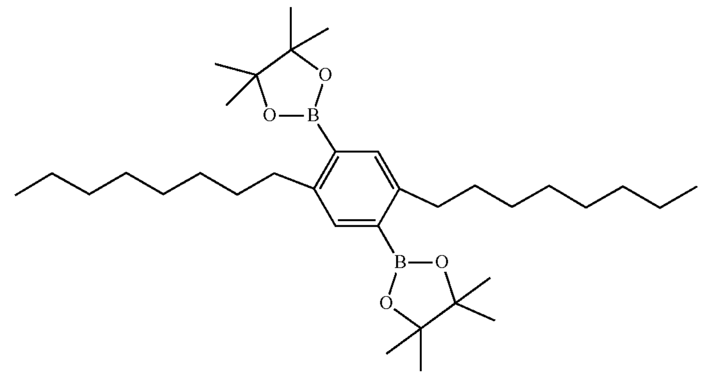 [SMILES: CCCCCCCCc1cc(B2OC(C)(C)C(C)(C)O2)c(CCCCCCCC)cc1B1OC(C)(C)C(C)(C)O1] Mo5-Bo 50% 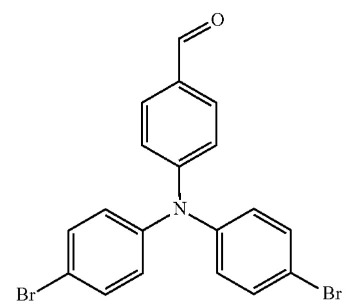 [SMILES: O=Cc1ccc(N(c2ccc(Br)cc2)c2ccc(Br)cc2)cc1] Mo8-Br 30% | 76.000 |

Polymer V1 is Synthesized as Comparative Polymer

| Polymer | Further monomers | (Mw) [g/mol]/D |
|---|---|---|
| V1 | 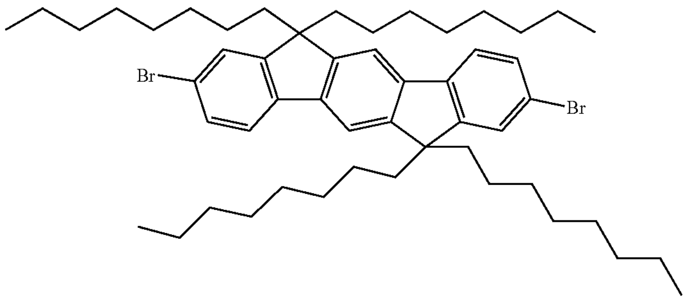 [SMILES: CCCCCCCCC1(CCCCCCCC)c2cc(Br)ccc2-c2cc3c(cc21)-c1ccc(Br)cc1C3(CCCCCCCC)CCCCCCCC] Mo15-Br 40% 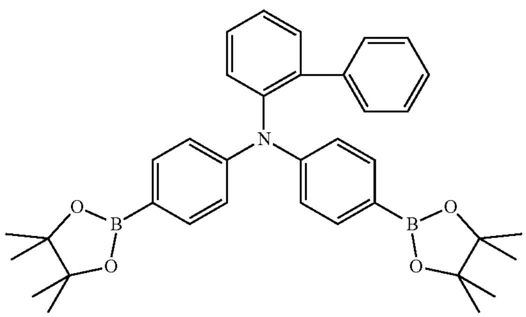 Mo2-Bo 50% 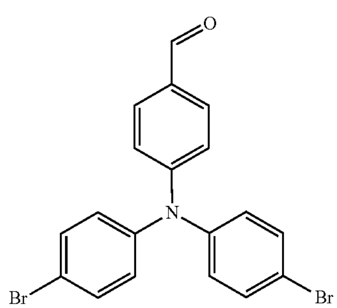 [SMILES: O=Cc1ccc(N(c2ccc(Br)cc2)c2ccc(Br)cc2)cc1] Mo8-Br 10% | 98.000 |

Part C: Production of the OLEDs

There are already many descriptions of the production of solution-based OLEDs in the literature, for example in WO 2004/037887 and WO 2010/097155. The process is matched to the circumstances described hereinafter (variation in layer thickness, materials).

The polymers of the invention are used in the following layer sequence:

substrate,
ITO (50 nm),
PEDOT:PSS (20 nm),
hole transport layer (HTL) (20 nm),
emission layer (EML) (60 nm),
hole blocker layer (HBL) (10 nm),
electron transport layer (ETL) (40 nm),
cathode.

The substrates used are glass plates coated with structured ITO (indium tin oxide) of thickness 50 nm. These are coated with PEDOT:PSS. Spin-coating is effected under air from water. The layer is baked at 180° C. for 10 minutes. PEDOT:PSS is sourced from Heraeus Precious Metals GmbH & Co. KG, Germany. The hole transport layer and the emission layer are applied to these coated glass plates.

The hole transport layers used are the compounds of the invention and comparative compounds, each dissolved in toluene. The typical solids content of such solutions is about 5 g/l when, as here, the layer thicknesses of 20 nm which are typical of a device are to be achieved by means of spin-coating. The layers are spun on in an inert gas atmosphere, argon in the present case, and baked at 220° C. for 30 minutes.

The emission layer is always composed of at least one matrix material (host material) and an emitting dopant (emitter). It is also possible for there to be mixtures of multiple matrix materials and co-dopants. What is meant here by details given in such a form as H1 30%; H2 55%; TEG 15% is that material H1 is present in the emission layer in a proportion by weight of 30%, the co-dopant in a proportion by weight of 55%, and the dopant in a proportion by weight of 8%. The mixture for the emission layer is dissolved in toluene. The typical solids content of such solutions is about 18 g/I when, as here, the layer thickness of 60 nm which is typical of a device is to be achieved by means of spin-coating. The layers are spun on in inert gas atmosphere, argon in the present case, and baked at 150° C. for 10 minutes.

The materials used in the present case are shown in table 1.

TABLE 1

| Structural formulae of the materials used in the emission layer |
| --- |
| 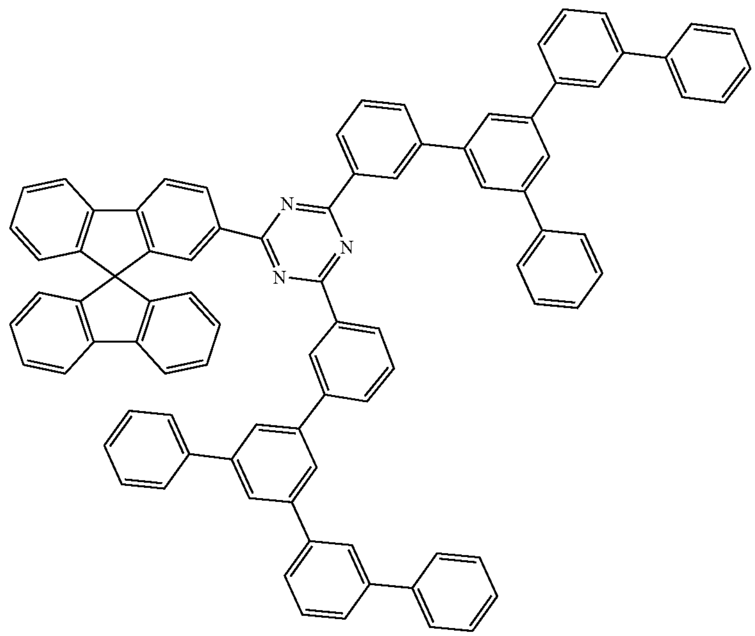 H1 |
| 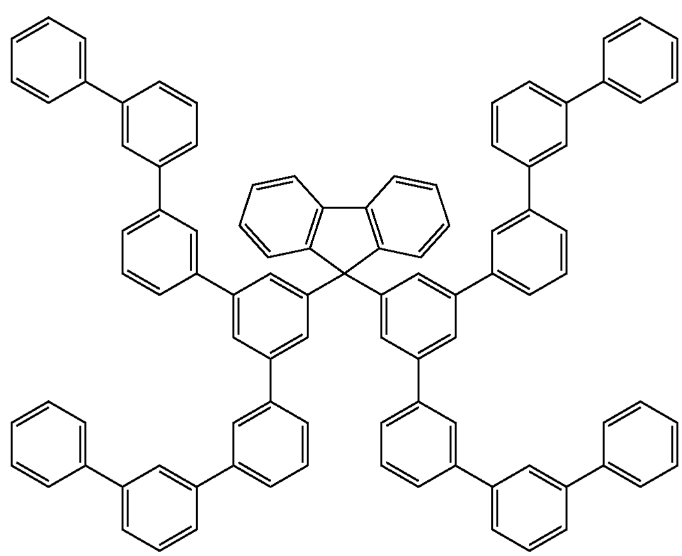 H2 |

TABLE 1-continued

Structural formulae of the materials used in the emission layer

TEG

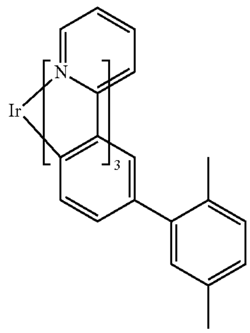

The materials for the hole blocker layer and electron transport layer are likewise applied by thermal vapor deposition in a vacuum chamber and are shown in table 2. The hole blocker layer consists of ETM1. The electron transport layer consists of the two materials ETM1 and ETM2, which are added to one another by co-evaporation in a proportion by volume of 50% each.

TABLE 2

HBL and ETL materials used

ETM1

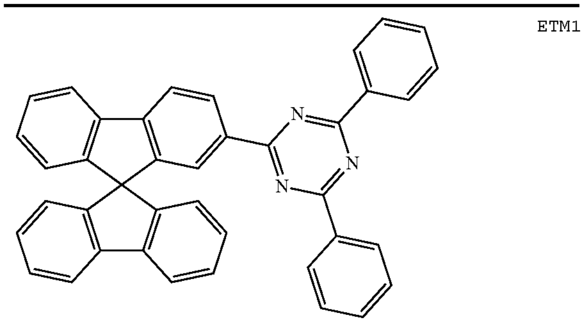

ETM2

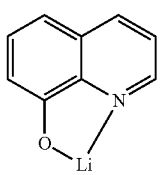

The cathode is formed by the thermal evaporation of an aluminum layer of thickness 100 nm.

The exact structure of the OLEDs can be found in table 3.

TABLE 3

| Structure of the OLEDs | | |
|---|---|---|
| Example | HTL polymer | EML composition |
| Ph1 | V1 | H1 30%; H2 55%; TEG 15% |
| Ph2 | P11 | H1 30%; H2 55%; TEG 15% |

The OLEDs are characterized in a standard manner. For this purpose, the electroluminescence spectra, current-voltage-luminance characteristics (IUL characteristics) assuming Lambertian radiation characteristics and the (operating) lifetime are determined. The IUL characteristics are used to determine parameters such as the operating voltage (in V) and the external quantum efficiency (in %) at a particular brightness. LT80 @1000 cd/m$^2$ is the lifetime until the OLED, given a starting brightness of 1000 cd/m$^2$, has dropped to 80% of the starting intensity, i.e. to 800 cd/m$^2$.

The properties of the various LEDs are compiled in table 4. Example Ph1 shows the comparative component; example Ph2 shows the properties of the OLEDs of the invention.

TABLE 4

Properties of the OLEDs

| Example | Efficiency at 1000 cd/m$^2$ % EQE | Voltage at 1000 cd/m$^2$ [V] | LT80 at 10000 cd/m$^2$ [h] | LT80 at 8000 cd/m$^2$ [h] | LT90 at 8000 cd/m$^2$ [h] |
|---|---|---|---|---|---|
| Ph1 | 16.6 | 5.0 | 134 | 512 | 156 |
| Ph2 | 17.6 | 4.5 | 121 | 487 | 153 |

As table 4 shows, the polymer of the invention, when used as hole transport layer in OLEDs, results in improvements over the prior art. Its higher triplet level improves the efficiencies in particular of the green-emitting OLEDs produced.

The fact that the polymers of the invention have a higher triplet level T1 than their direct comparative polymers is shown by quantum-mechanical calculations using some selected polymers. The results are shown in table 5.

TABLE 5

Comparison of the calculated T1 level

| Polymer | V1 | P13 | P11 | P32 | P33 | P34 |
|---|---|---|---|---|---|---|
| T1 (eV) | 2.38 | 2.44 | 2.41 | 2.51 | 2.44 | 2.57 |

The invention claimed is:

1. A polymer having at least one repeat unit of the following formula (I):

(I)

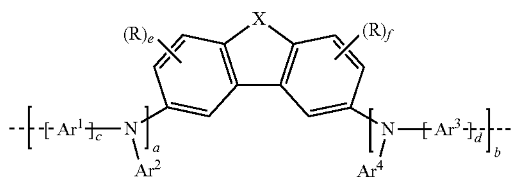

wherein

X is selected from O, S, NR or $CR_2$;

$Ar^1$, $Ar^2$, $Ar^3$ and $Ar^4$ are the same or different at each instance and are independently a mono- or polycyclic, aromatic or heteroaromatic ring system which has 5 to 60 aromatic ring atoms and optionally substituted by one R radical;

a and b are the same at each instance and are 1; where (a+b)=2;

c and d are the same at each instance and are 1;

e and f are the same at each instance and are independently 0, 1, 2 or 3;

R is the same at each instance and is independently H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 carbon atoms, an alkenyl or alkynyl group having 2 to 40 carbon atoms or a branched or cyclic alkyl, alkoxy or thioalkoxy group having 3 to 40 carbon atoms, each of which optionally substituted by one or more $R^1$ radicals, where one or more nonadjacent $CH_2$ groups optionally replaced by $R^1C=CR^1$, C≡C, $Si(R^1)_2$, C=O, C=S, $C=NR^1$, $P(=O)R^1$, SO, $SO_2$, $NR^1$, O, S or $CONR^1$ and where one or more hydrogen atoms optionally replaced by D, F, Cl, Br, I or CN, or a mono- or polycyclic, aromatic or heteroaromatic ring system which has 5 to 60 aromatic ring atoms and optionally substituted in each case by one or more $R^1$ radicals, or an aryloxy or heteroaryloxy group which has 5 to 60 aromatic ring atoms and optionally substituted by one or more $R^1$ radicals, or an aralkyl or heteroaralkyl group which has 5 to 60 aromatic ring atoms and optionally substituted by one or more $R^1$ radicals, or a diarylamino group, diheteroarylamino group or arylheteroarylamino group which has 10 to 40 aromatic ring atoms and optionally substituted by one or more $R^1$ radicals; or a crosslinkable group Q, where two or more R radicals together optionally form a mono- or polycyclic, aliphatic, aromatic or heteroaromatic ring system;

is the same at each instance and is independently H, D, F or an aliphatic hydrocarbyl radical having 1 to 20 carbon atoms, an aromatic or a heteroaromatic hydrocarbyl radical having 5 to 20 carbon atoms, in which one or more hydrogen atoms optionally be replaced by F; where two or more $R^1$ substituents together optionally form a mono- or polycyclic, aliphatic, aromatic or heteroaromatic ring system; and the dotted lines represent bonds to adjacent repeat units in the polymer, and wherein the polymer contains from 5 to 75 mol %, based on 100 mol % of all copolymerizable monomers present as repeat units in the polymer, of the at least one repeat unit of the formula (I).

2. The polymer as claimed in claim 1, wherein the at least one repeat unit of the formula (I) is selected from the repeat unit of the following formula (II):

(II)

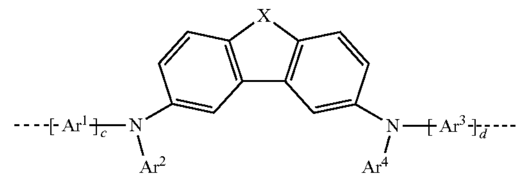

where $Ar^1$, $Ar^2$, $Ar^3$, $Ar^4$, c and d may assume the definitions given in claim 1.

3. The polymer as claimed in claim 1, wherein the at least one repeat unit of the formula (I) is selected from the repeat unit of the following formula (III):

(III)

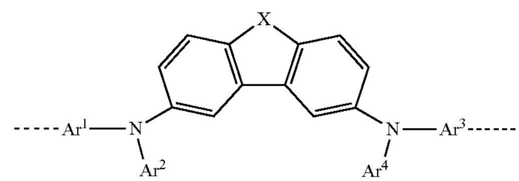

where $Ar^1$, $Ar^2$, $Ar^3$ and $Ar^4$ assume the definitions given in claim 1.

4. The polymer as claimed in claim 1, wherein the mono- or polycyclic, aromatic or heteroaromatic ring systems $Ar^2$ and $Ar^4$ in the repeat units of the formulae (I), (II), (III), (IIIa), (IIIb), (IIIc), (IV), (V), (Va), (Vb) and (Vc) are selected from the following units Ar1 to Ar10:

Ar1

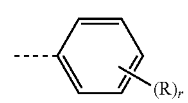

Ar2

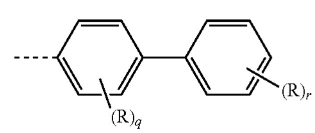

Ar3

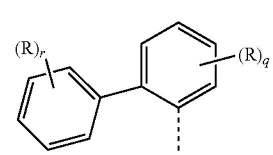

Ar4

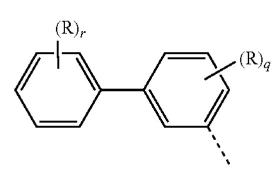

-continued

Ar5

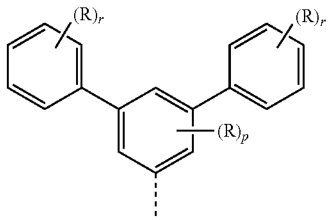

Ar6

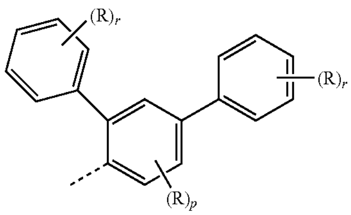

Ar7

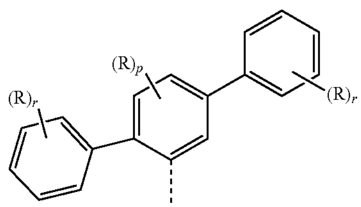

Ar8

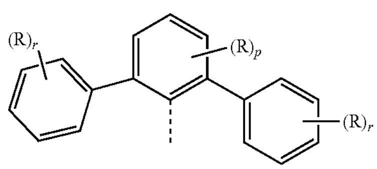

Ar9

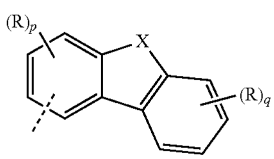

Ar10

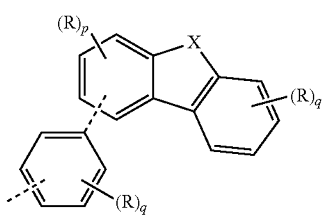

where R assume the definitions given in claim 1,

X═$CR_2$, NR, $SiR^2$, O, S, C═O or P═O, p=0, 1, 2 or 3, q=0, 1, 2, 3 or 4, and r=0, 1, 2, 3, 4 or 5.

5. The polymer as claimed in claim 1, wherein the mono- or polycyclic, aromatic or heteroaromatic ring systems $Ar^1$ and $Ar^3$ in the of repeat units of the formula (I), (II), (III), (IIIa), (IIIb), (IIIc), (IV), (V), (Va), (Vb) and (Vc) are selected from the following units Ar11 to Ar18:

Ar11

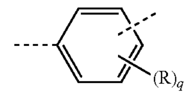

Ar12

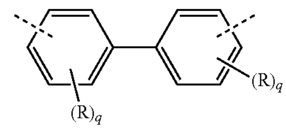

Ar13

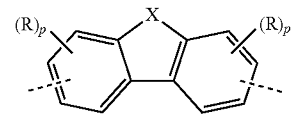

Ar14

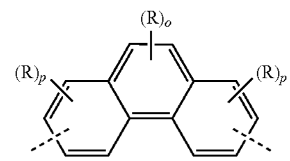

Ar15

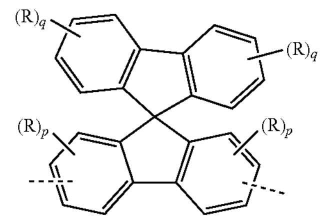

Ar16

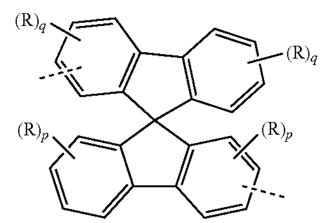

Ar17

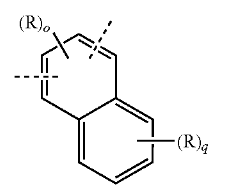

Ar18

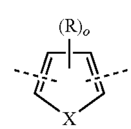

where R assume the definitions given in claim 1,

X═$CR_2$, NR, $SiR^2$, O, S, C═O or P═O, o=0, 1 or 2, p=0, 1, 2 or 3, and q=0, 1, 2, 3 or 4.

6. The polymer as claimed in claim 1, wherein the proportion of repeat units of the formula (I), (II), (III), (IIIa), (IIIb), and/or (IIIc)

(II)

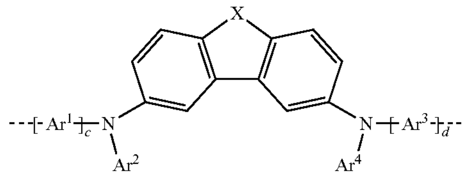

(III)

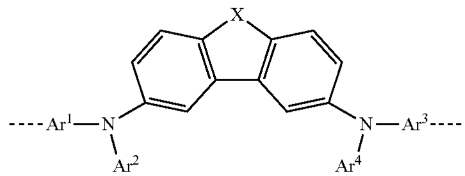

(IIIa)

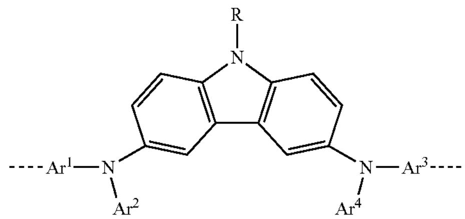

(IIIb)

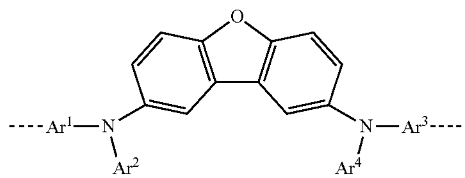

(IIIc)

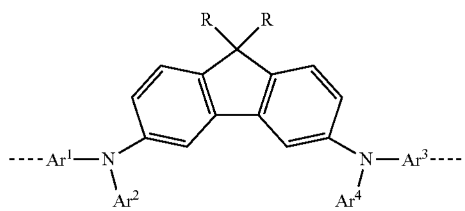

in the polymer is in the range from 5 to 75 mol %, based on 100 mol % of all copolymerizable monomers present as repeat units in the polymer.

7. The polymer as claimed in claim 1, wherein the polymer comprises one or more repeat units of the formulae (I), (II), (III), (IIIa), (IIIb), and/or (IIIc), (II)

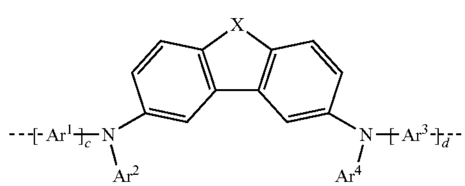

(III)

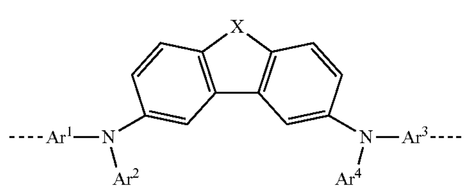

-continued (IIIa)

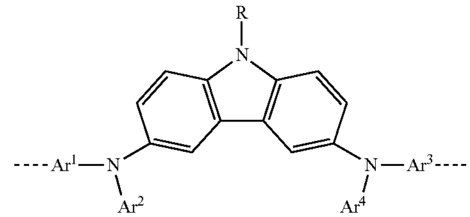

(IIIb)

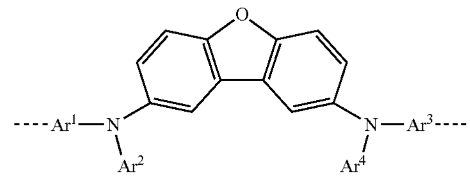

(IIIc)

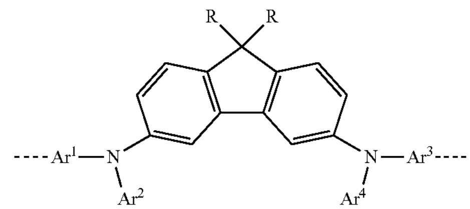

and comprises further repeat units other than the repeat units of the formulae (I), (II), (III), (IIIa), (IIIb), and/or (IIIc).

8. The polymer as claimed in claim 1, wherein the polymer comprises one or more repeat units of the formulae (I), (II), (III), (IIIa), (IIIb), and/or (IIIc)

(II)

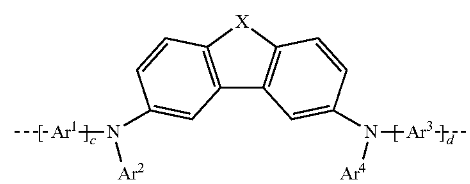

(III)

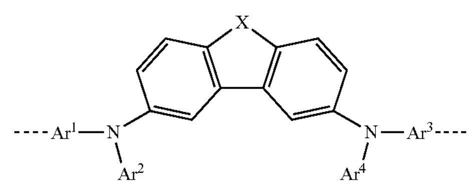

(IIIa)

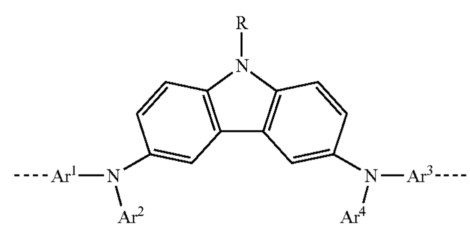

(IIIb)

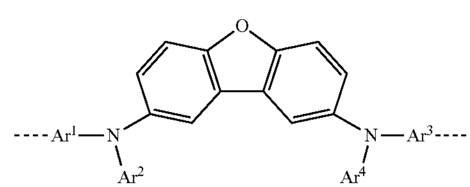

-continued (IIIc)

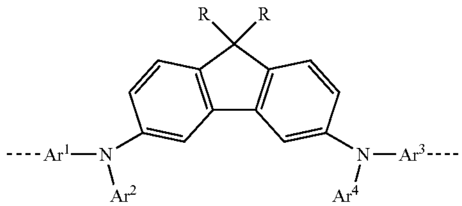

and optionally further repeat units, and further comprises at least one repeat unit having at least one crosslinkable group Q.

9. The polymer as claimed in claim 8, wherein the repeat unit having at least one crosslinkable group is selected from the repeat unit of the formula (Ix)

(Ix)

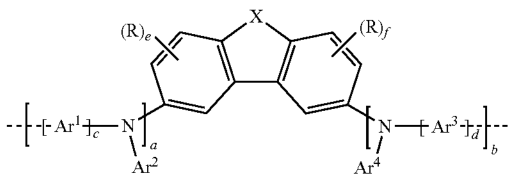

where $Ar^1$, $Ar^2$, $Ar^3$, $Ar^4$, R and X and a, b, c, d, e and f assume the definitions given in claim 1 in relation to formula (I), but with the proviso that at least one R is a crosslinkable group Q.

10. The polymer as claimed in claim 8, wherein the repeat unit having the at least one crosslinkable group is selected from the repeat units of the formulae (IIx1), (IIx2) and (IIx3)

(IIx1)

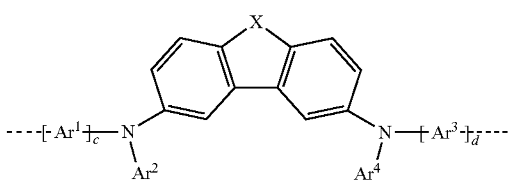

where X in formula (IIx1): is NQ, CRQ or $CQ_2$;

(IIx2)

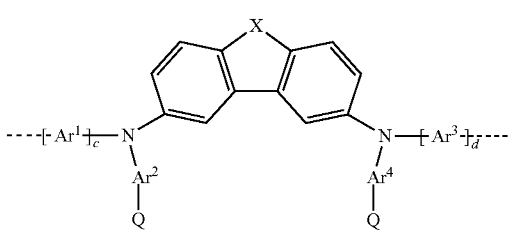

where X in formula (IIx2): is O, S, NR or $CR_2$; and (IIx3)

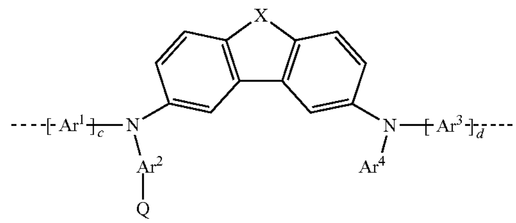

where X in formula (IIx3): is O, S, NR or $CR_2$;

Q is a crosslinkable group;

and $Ar^1$, $Ar^2$, $Ar^3$ and $Ar^4$, and c and d in the formulae (IIx1), (IIx2) and (IIx3) assume the definitions given in claim 1 in relation to formula (I).

11. A process for preparing the polymer as claimed in claim 1, which comprises preparing the polymer by SUZUKI polymerization, YAMAMOTO polymerization, STILLE polymerization or HARTWIG-BUCHWALD polymerization.

12. A polymer blend comprising one or more polymers as claimed in claim 1 containing at least one repeat unit of the formula (I) and one or more further polymeric, oligomeric, dendritic and/or low molecular weight substances.

13. A solution or formulation composed of one or more polymers as claimed in claim 1 in one or more solvents.

14. A solution or formulation composed the polymer blend as claimed in claim 12 in one or more solvents.

15. An electronic or optoelectronic device comprising the polymer as claimed in claim 1.

16. An organic electroluminescent device (OLED), organic light-emitting electrochemical cell (OLEC), organic field-effect transistor (OFET), organic integrated circuit (O-IC), organic thin-film transistor (TFT), organic solar cell (O-SC), organic laser diode (O-laser), organic photovoltaic (OPV) element or device or organic photoreceptor (OPC) having one or more active layers, wherein at least one of these active layers comprises one or more polymers as claimed in claim 1.

17. An organic electroluminescent device, having one or more active layers, wherein at least one of these active layers comprises one or more polymers as claimed in claim 1.

* * * * *